United States Patent

Shida et al.

[11] Patent Number: 6,060,207
[45] Date of Patent: May 9, 2000

[54] PHOTOSENSITIVE MATERIAL

[75] Inventors: Naomi Shida, Kawasaki; Toru Ushirogouchi, Yokohama; Takuya Naito; Makoto Nakase, both of Tokyo, all of Japan

[73] Assignee: Kabushiki Kaisha Toshiba, Kawasaki, Japan

[21] Appl. No.: 08/499,974

[22] Filed: Jul. 10, 1995

[30] Foreign Application Priority Data

Jul. 11, 1994 [JP] Japan ..................... 6-158512

[51] Int. Cl.$^7$ ............... G03F 7/008; G03F 7/039; G03F 7/004
[52] U.S. Cl. ............. 430/176; 430/270.1; 430/914; 430/910; 430/921; 522/31
[58] Field of Search .................. 430/914, 910, 430/921, 270.1, 176; 522/31

[56] References Cited

U.S. PATENT DOCUMENTS

| | | | |
|---|---|---|---|
| 3,507,761 | 4/1970 | Kropp | 204/162 |
| 3,650,754 | 3/1972 | Jones | 430/270.1 |
| 3,713,831 | 1/1973 | Hayes et al. | 430/270.1 |
| 4,035,320 | 7/1977 | Lawson | 430/270.1 |
| 4,631,111 | 12/1986 | Williston | 156/630 |
| 4,883,740 | 11/1989 | Schwalm et al. | 430/270.1 |
| 5,087,550 | 2/1992 | Blum et al. | 430/270.1 |
| 5,180,756 | 1/1993 | Rehmer et al. | 522/35 |
| 5,230,984 | 7/1993 | Tachiki et al. | 430/910 |
| 5,348,838 | 9/1994 | Ushirogouchi et al. | 430/270.1 |
| 5,395,736 | 3/1995 | Grasshoff et al. | 430/270.1 |
| 5,556,734 | 9/1996 | Yamachika et al. | 430/270.1 |
| 5,558,976 | 9/1996 | Urano et al. | 430/326 |
| 5,558,978 | 9/1996 | Schädeli et al. | 430/270.1 |
| 5,585,219 | 12/1996 | Kaimoto et al. | 430/270.1 |
| 5,672,463 | 9/1997 | Hozumi et al. | 430/281.1 |
| 5,736,297 | 4/1998 | Roeschert et al. | 430/270.1 |

FOREIGN PATENT DOCUMENTS

| | | |
|---|---|---|
| 0 492 953 | 7/1992 | European Pat. Off. . |
| 34 16 131 | 11/1984 | Germany . |
| 35 41 427 | 6/1986 | Germany . |
| 37 21 741 | 1/1989 | Germany . |

OTHER PUBLICATIONS

Carlini et al, Polymer, 1983, vol. 24, May, pp. 599–606.

(List continued on next page.)

*Primary Examiner*—Cynthia Hamilton
*Attorney, Agent, or Firm*—Oblon, Spivak, McClelland, Maier & Neustadt, P.C.

[57] ABSTRACT

A photosensitive material which is very low in absorption of a light source of short wavelength and excellent in dry etch resistance. This photosensitive material comprises a compound having a terpenoid skeleton. Preferably, the compound having a terpenoid skeleton is a compound having a monovalent menthyl group or menthyl derivative group which can be represented by the general formula (1).

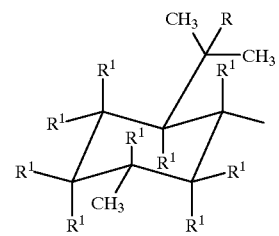

formula (I)

wherein R is a hydrogen atom or a monovalent hydrocarbon group, $R^1$ may be the same with or different from each other and individually represents a hydrogen atom, a halogen atom, a hydrocarbon group, a hydroxyl group, an alkoxyl group, an amino group, an alkoxy group, an amino group, an imide group, an amide group, or a sulfonyl group, a carboxyl group, a carbonyl group, or a sulfonamide group, and a pair of neighboring $R^1$ may be connected together to form a closed ring.

21 Claims, 1 Drawing Sheet

OTHER PUBLICATIONS

H. Mivechi, Iranian Journal of Polymer Science & Technology, vol. 1, No. 1, pp. 11–14, "Investigations on Photochemical Reactions of Sensitized Novolac Resin Composition as Positive Working Lithographic and Microlithographic Applications", Jan., 1992.

Shangxian, Yu et al, Journal of Photopolymer Science and Technology, vol. 3, No. 3 (1990) pp. 307–326.

Kimura et al, Chemistry Letters, Jan. 1994, No. 1, pp. 27–28.

Sonawane et al, Tetrahedron Letters, vol. 26, No. 29, 1985, pp. 3507–3510.

Kirk–Othmer Encyclopedia of Chemical Technology, third Edition, vol. 22, (John Wiley & Sons, N.Y., N.Y., 1983) pp. 709–762.

Kaichiro Nakano, et al., "Transparent Photoacid Generator (ALS) for ArF Excimer Laser Lithography and Chemically Amplified Resist", SPIE proc., vol. 2195, 194, 1994.

Kazuhiro Yamashita, et al., Performance of 0.2 $\mu$m Optical Lithography Using KrF and ArF Excimer Laser Sources, J. Vac. Sci. Technol. B11(6), Nov./Dec. American Vacuum Society, 1993, pp. 2692–2696.

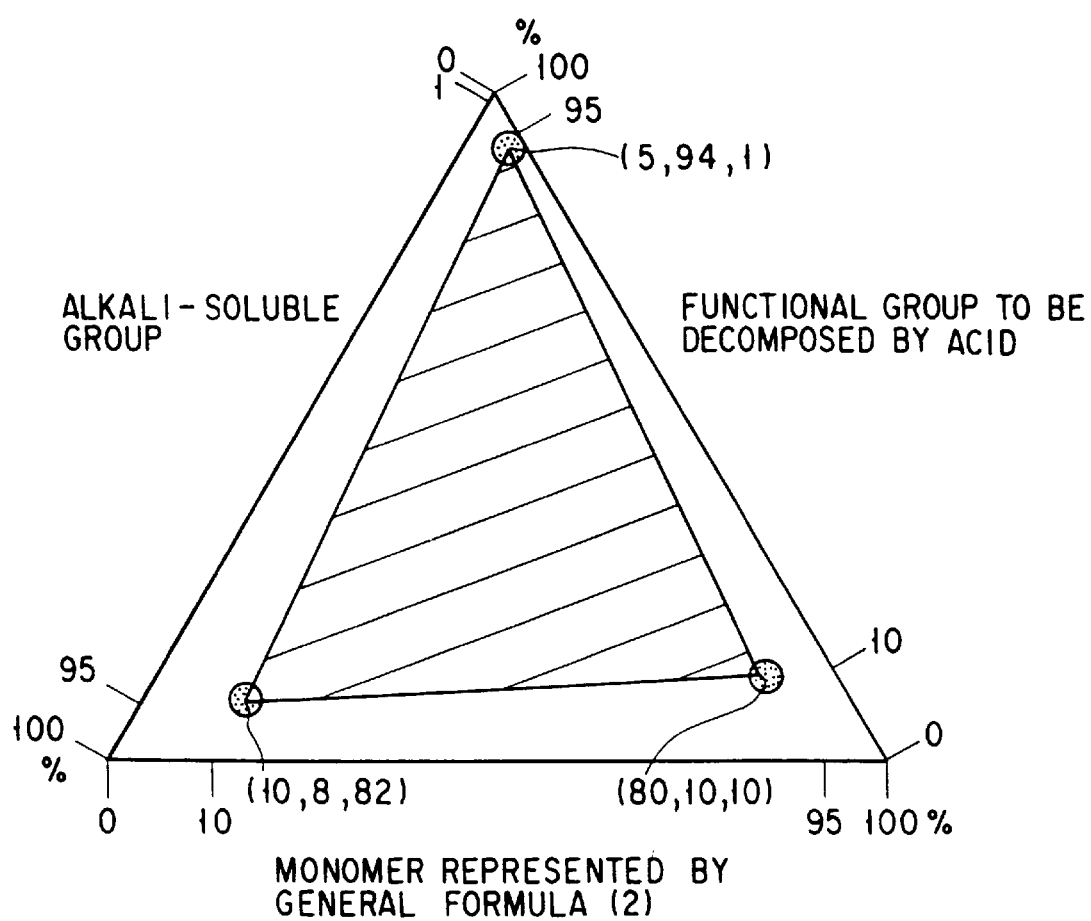

PHOTOSENSITIVE MATERIAL

BACKGROUND OF THE INVENTION

1. Field of the Invention

This invention relates to a photosensitive material useful for forming a fine pattern in the manufacture of a semiconductor device and the like.

2. Description of the Related Art

In the manufacture of electronic parts such as a semiconductor element, a fine pattern is formed by way of a photolithography. This technique of photolithography is performed as follows. Namely, a photoresist thin film is first formed by coating a resist material onto a semiconductor substrate for example. The photoresist thin film thus formed is then exposed to light through a prescribed mask pattern, and subsequently subjected to various processes such as development and rinsing, thereby forming a resist pattern. This resist pattern is then utilized as an etch resistant mask in an etch process, and the exposed portions of the substrate are etched to form a pattern of fine line or window thereby obtaining a desired pattern. Finally, the resist pattern remaining on the substrate is removed, thereby obtaining a thin film pattern.

In view of a trend in recent years toward further increasing the integration of semiconductor elements, there has been demanded the development of a photolithographic technique which is capable of realizing a still finer pattern. In order to meet such a demand, the use of exposure light source of shorter wavelength is now studied. For example, a process of forming a finer resist pattern through the use of ArF excimer laser (193 nm in wavelength) or the quintuple harmonic of YAG laser (218 nm in wavelength) has been developed. With the use of such a light source, it has become possible to narrow the minimum line width of wiring pattern down to the order of submicrons. However, studies for forming such a finer pattern are still continuing.

In view of effectively performing a fine patterning process, a development of a resist material which is excellent in dry etch resistance in the step of forming a wiring pattern is now demanded.

In this connection, there has been known to use a photosensitive composition comprising an aromatic compound as a resist material. As for this type of resist material, various kinds of resist materials containing as a base material phenol resin have been developed. However, when this conventional type of resist material is used in a patterning process utilizing as an exposure light source a light of short wavelength as mentioned above, it is impossible, because of its high light absorption, to allow the exposure light to reach deep enough to a required portion remote from the surface of the resist film. As a result, it has been very difficult to form a fine pattern with this conventional resist material, thereby raising a problem.

On the other hand, there has been studied to use polymethylmethacrylate (PMMA) having no aromatic ring since the resin is low in light absorption. However, the resins of this type are accompanied with a problem that they are poor in dry etch resistance.

As explained above, there has been demanded, in order to realize a fine pattern of the order of submicron, to develop a photosensitive material which is low in light absorption and has a sufficient dry etch resistance.

SUMMARY OF THE INVENTION

Therefore, the object of the present invention is to provide a photosensitive material which is excellent in transparency to a light source of short wavelength, in particular to KrF excimer laser beam as well as to ArF excimer laser beam, and has a sufficient dry etch resistance.

According to this invention, there is provided a photosensitive material for forming a pattern, which comprises a compound having a terpenoid skeleton.

Preferably the compound having terpenoid skeleton is a compound having a monovalent menthyl or menthyl derivative group represented by a general formula (1);

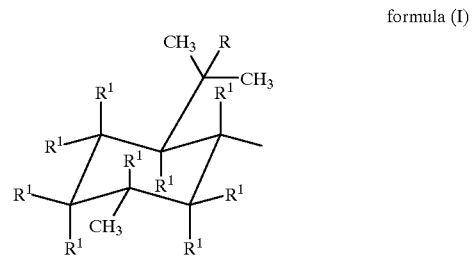

formula (I)

wherein R is a hydrogen atom or a monovalent hydrocarbon group, $R^1$ may be the same with or different from each other and individually represents a hydrogen atom, a halogen atom, a hydrocarbon group, hydroxyl group, an alkoxyl group, an amino group, an imide group, an amide group, a sulfonyl group, a carboxyl group, a carbonyl group or a sulfonamide group, and a pair of neighboring $R^1$ may be connected together to form a closed ring.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWING

The accompanying drawing, which is incorporated in and constitutes a part of the specification, illustrates presently preferred embodiments of the invention and, together with the general description given above and the detailed description of the preferred embodiments given below, serves to explain the principles of the invention.

FIGURE is a graph showing relationships among the content of monomer, the content of an alkali-soluble group and the content of a functional group to be decomposed by an acid.

DETAILED DESCRIPTION OF THE PREFERRED EMBODIMENTS

It has been found by the present inventors that a compound having a terpenoid skeleton is excellent in dry etch resistance even though it has no aromatic ring. This invention has been accomplished on the basis of this finding.

Since this terpenoid skeleton-containing compound has no aromatic ring in its molecule, the terpenoid skeleton-containing compound is inherently low in absorption of a light in a short wavelength region such as KrF or ArF excimer laser beam, i.e. excellent in transparency to a light of such short wavelength.

With the inclusion of such a terpenoid skeleton-containing compound, it is possible to obtain a photosensitive material which is excellent in transparency to a light of short wavelength, such as ultra-violet rays, deep UV light, KrF excimer laser beam of 248 nm in wavelength or ArF excimer laser beam of 193 nm in wavelength, and at the same time exhibits an excellent dry etch resistance. It has been made possible to accurately form a quarter micron pattern by the employment of a photosensitive material as proposed by this invention.

In particular, if a terpenoid skeleton-containing compound containing a menthyl group or menthyl derivative group is used, it is possible to obtain a photosensitive material exhibiting a higher dry etch resistance. The reasons for this can be explained as follows. First, since menthyl group or menthyl derivative group is composed of a ring structure, even if a carbon-carbon bond thereof is cut off, other carbon-carbon bonds are still left remained. Secondly, this excellent dry etch resistance may be ascribed to the effect derived from the fact that the compound containing a menthyl or menthyl derivative group is chiral, or to the steric effect derived from the fact that an alkyl substituent group such as isopropyl group or methyl group is present on the menthyl group. Thirdly, the presence of a substituent group contributes to the stabilization of conformation of the ring, thereby giving a desirable influence to the dry etch resistance.

It should be noted that terpene is excellent in safety as terpene is existing in nature and used as a raw material for a perfume, as a foodstuff or as a medicament. Accordingly, even if the terpenoid skeleton-containing compound is used in a polymer, a photosensitive material to be derived therefrom is excellent in safety because the compound to be obtained from the decomposition of the photosensitive material would be terpene.

Details of the photosensitive material of this invention will be explained as follows.

Examples of the photosensitive material are a resin whose backbone is adapted to be cut off by a light exposure, a resin composition containing a compound whose solubility is to be enhanced upon exposure to light (positive resist), a resin which is capable of being cross-linked upon exposure to light, and a resin composition containing a compound whose solubility is to be decreased upon exposure to light (negative resist).

Another useful resist is a chemically amplified resist whose sensitivity can be increased through a photochemical reaction or a thermal reaction after being exposed to light.

Examples of positive chemically amplified resist are a photosensitive composition comprising a compound which is capable of generating acid upon being irradiated by light (or a so-called photo-acid generator), a compound containing at least one linkage which can be decomposed by an acid, e.g., a compound having solubility-inhibiting group, and an alkali-soluble resin in addition to the above-mentioned compounds as required.

Examples of negative chemically amplified resist are a photosensitive composition comprising a photo-acid generator, an alkali-soluble resin and a compound which is capable of cross-linking the alkali-soluble resin in the presence of an acid or a compound whose solubility is lowered in the presence of an acid.

The photosensitive material according to this invention is featured in that a group having terpenoid skeleton is introduced into the molecular skeleton of a compound constituting these photosensitive materials, for example the backbone chain or side chain of resin component, or into the skeleton of other components such as a photosensitive component, or another component including a photo-acid generator or a solubility-inhibitor.

The content of a terpenoid skeleton in the solid content of the photosensitive material should preferably be 5 to 95% by weight. If the content of the terpenoid skeleton is less than 5% by weight, the dry etch resistance of a pattern to be attained would be lowered. On the other hand, if the content of the terpenoid skeleton exceeds over 95% by weight, it may give rise to the lowerings of resolution and sensitivity of the photosensitive material. More preferable content of a terpenoid skeleton is in the range of 20 to 75%.

In this invention, the term of "a compound or compounds having a terpenoid skeleton" should be understood as being a compound or compounds which are hydrocarbon compounds having a basic composition of $C_5H_8$ conforming to the isoprene rule, which may be oxygen-containing compounds derived from such hydrocarbon compounds, compounds which differ in degree of unsaturation, or derivatives of such compounds. It is also required for "a compound or compounds having a terpenoid skeleton" to be useful as a component for the photosensitive material of this invention.

Examples of the hydrocarbon compounds, oxygen-containing compounds derived from the hydrocarbon, compounds which differ in degree of unsaturation, or derivatives of the compounds are ones having in their molecular structures a terpenoid skeleton such as myrcene, carene, ocimene, pinene, limonene, camphene, terpinolene, tricyclene, terpinene, fenchene, phellandrene, sylvestrene, sabinene, citronellol, pinocampheol, geraniol, fenchyl alcohol, nerol, borneol, linalol, menthol, terpineol, carveol, thujyl alcohol, citronellal, ionone, irone, cinerole, citral, menthone, pinol, cyclocitral, carvomethone, ascaridole, safranal, carvotanacetone, phellandral, pimelintenone, citronellic acid, perillaldehyde, thujone, caron, tagetone, camphor, bisabolene, santalene, zingiberene, caryophyllene, curcumene, cedrene, cadinene, longifolene, sesquibenihene, farnesol, patchouli alcohol, nerolidol, carotol, cadinol, lanceol, eudesmol, cedrol, guajol, kessoglycol, cyperone, hinokiic acid, eremophilone, santalic acid, zerumbone, camphorene, podocarprene, mirene, phyllocladene, totarene, phytol, sclareol, manool, hinokiol, ferruginol, totarol, sugiol, ketomanoyl oxide, manoyl oxide, abietic acid, pimaric acid, neoabietic acid, levopimaric acid, iso-d-pimaric acid, agathenedicarboxylic acid, rubenic acid, triterpene, or carotinoide.

Of these compounds, compounds having a monocyclic terpenoid skeleton; hemiterpene, monoterpene, diterpene and sesquiterpene are particularly advantageous in terms of alkali-solubility.

These compounds are used by converting them into a component of the photosensitive material of this invention.

When a compound having a terpenoid skeleton is to be used as a resin component in a photosensitive material, the use of polymer containing a menthyl group or a menthyl derivative group is preferred. Menthol ($C_{10}H_{20}O$) which is useful as a raw material for the preparation of a polymer containing a menthyl group or a menthyl derivative group is easily available, safe in use, cheap in cost and chemically stable.

In the followings, details on the compounds containing a terpenoid skeleton to be used in the photosensitive material of this invention will be explained with reference to menthyl group or menthyl derivative group.

The menthyl group or menthyl derivative group can be represented by the general formula (1).

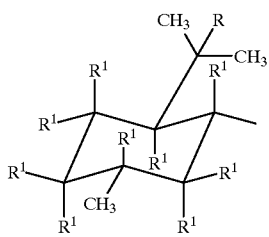

formula (I)

In this general formula (1), R is a hydrogen atom or a monovalent hydrocarbon group, $R^1$ may be the same with or different from each other and individually represents a hydrogen atom, a halogen atom, a hydrocarbon group, a hydroxyl group, an alkoxyl group, an amino group, an imide group, an amide group, a sulfonyl group, a carboxyl group, a carbonyl group or a sulfonamide group, and a pair of neighboring $R^1$ may be connected together to form a closed ring.

The hydrocarbon group in this general formula (1) may be an aliphatic group or an aromatic group. These aliphatic or aromatic groups may be substituted by a hetero atom such as nitrogen atom, oxygen atom, sulfur atom or phosphorus. Further, the aliphatic group may contain a saturated or unsaturated bond, and may be of straight chain or branched chain substituted or unsubstituted by a cyclic compound. The aromatic group may be unsubstituted or substituted by the above-mentioned aliphatic group.

When $R^1$ is amino group, the hydrogen atom thereof may be substituted by the above-mentioned hydrocarbon group.

Examples of menthyl group or menthyl derivative group represented by the general formula (1) are 8-butylmenthyl group, 8-β-naphthylmenthyl group and 8-α-naphthylmenthyl group. There is no restriction as for the position of these menthyl group and menthyl derivative group in a polymer, so that they may be disposed any desired position in the polymer. A polymer containing any of these groups may be generally manufactured by the steps of introducing the group into a compound having a polymerizable double bond as a side chain of the compound thereby obtaining a compound having a menthyl group or a menthyl derivative group, and polymerizing the compound by way of homopolymeri- zation or copolymerization to obtain an aimed polymer.

The content of the compound having a menthyl group or a menthyl derivative group in its skeleton in the solid content of a photosensitive material should preferably be at least 5% by weight and at most 95% by weight. Because if the content of this compound is less than 5% by weight, the dry etch resistance of the pattern would be undesirably lowered. On the other hand, if the content of this compound is more than 95% by weight, the resolution and sensitivity of the photosensitive material would be lowered. Therefore, more preferable content of a menthyl group or a menthyl derivative group in its skeleton in the solid content of a photosensitive material is 20 to 75% by weight.

In the present invention, the menthyl group or the menthyl derivative group can be made to exist in any desired component of the photosensitive material. If this is the case, the group should preferably exist in a solid component of the photosensitive material, in an amount which falls within the range described above.

It is desired that the compound having a menthyl group or a menthyl derivative group in its skeleton is used in the form of copolymer by copolymerizing it with a vinyl compound thereby serving it as a resin component of the photosensitive material. In this case, it is possible to achieve a high resolution of the photosensitive material.

Vinyl compounds useful in this case are methyl acrylate, methyl methacrylate, α-chloroacrylate, cyanoacrylate, trifluoromethyl acrylate, α-methyl styrene, trimethylsilyl methacrylate, trimethylsilyl α-chloroacrylate, trimethylsilylmethyl α-chloroacrylate, maleic anhydride, tetrahydropyranyl methacrylate, tetrahydropyranyl α-chloroacrylate, t-butyl methacrylate, t-butyl α-chloroacrylate, butadiene, glycidyl methacrylate, isobornyl methacrylate, menthyl methacrylate, norbornyl methacrylate, adamantyl methacrylate and allyl methacrylate.

If an acrylic compound such as methyl methacrylate, α-chloromethacrylate, trifluoroethyl α-chloromethacrylate trifluoromethyl acrylate or olefin sulfonic acid is to be employed for the copolymer composition, it may be preferably used for the preparation of a positive resist. On the other hand, if an acrylic compound having vinyl group, allyl group or epoxy group on an alcohol moiety of ester, or an acrylic compound having an alcohol moiety of ester containing 4 or more carbon atoms is to be employed for the copolymer composition, it may be preferably used for the preparation of a negative-tone resist. Acrylic compounds useful in this case can be represented by the following general formula (5).

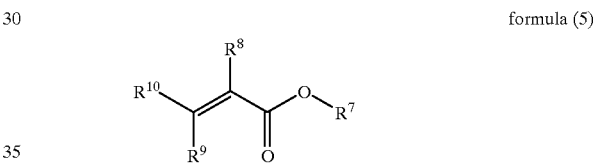

formula (5)

wherein $R^7$ is hydrogen atom or a monovalent organic group, $R^8$, $R^9$ and $R^{10}$ are individually hydrogen atom, halogen atom or alkyl group and may be the same or different from one another.

If a compound containing menthyl group or menthyl derivative group, which can be used for preparing the polymer is an acrylic compound represented by the general formula (5) mentioned above, it can be easily polymerized or copolymerized and therefore the employment of such a compound is preferable. The acrylic compound mentioned above can also be represented by the following general formula (2). This compound can be homopolymerized or copolymerized thereby obtaining an aimed polymer.

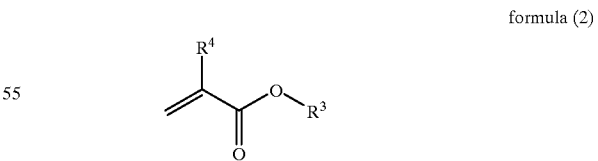

formula (2)

wherein $R^3$ is menthyl group or menthyl derivative group, and $R^4$ is alkyl group, carboxyl group, alkoxycarbonyl group, halogen atom or hydrogen atom.

The above mentioned menthyl group or a menthyl derivative group may be introduced into a poly-carboxylic acid having a polymerizable structure as shown in the following general formula (3). This is preferable in view of high resolution to be obtained therefrom.

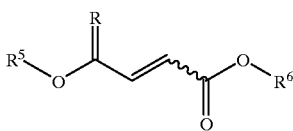

formula (3)

wherein $R^5$ and $R^6$ are monovalent organic group or hydrogen atom, and at least one of them includes a menthyl group or a menthyl derivative group represented by the general formula (1).

Either $R^5$ or $R^6$ may contain a group which is decomposed or cross-linked with acid.

The compounds represented by the general formula (3) may not be restricted to Z-type or E-type. This monomer is first homopolymerized or copolymerized and then the resultant polymer is used for the manufacture of a photosensitive material.

The compound represented by the general formula (2) or the general formula (3) may copolymerized with a compound which can be decomposed or cross-linked with acid. The compound which can be decomposed or cross-linked with acid is represented by the following general formula (4):

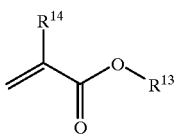

formula (4)

In this general formula (4), wherein $R^{13}$ is a monovalent organic group and $R^{14}$ is alkyl, halogen atom or hydrogen atom.

When a compound represented by the general formula (4) is the one to be decomposed by an acid, the group, —(C=O)O—$R^{13}$ may be the one to be decomposed by an acid explained hereinafter, or the one wherein $R^{13}$ is to be decomposed by such an acid.

When the monomer or copolymer containing menthyl group or menthyl derivative group becomes soluble to a developing solution as a result of decomposition thereof by the action of an acid, the photosensitive material of this invention derived from such a monomer or copolymer can be used as a positive chemically amplified resist. On the other hand, if the monomer or copolymer containing menthyl group or menthyl derivative group becomes insoluble to a developing solution as a result of the action of an acid, the photosensitive material of this invention derived from such a monomer or copolymer can be used as a negative-tone chemically amplified resist.

Thus, the positive chemically amplified resist is a photosensitive material comprising three components, i.e., (a) an alkali-soluble resin constituting a resin component of the photosensitive material, (b) a dissolution-inhibitor which is a compound to be decomposed by an acid, and (c) a photo-acid generator which is a compound capable of generating an acid upon being irradiated with light such as chemical radiation, energy radiation or material radiation. The alkali-soluble resin may contain a group to be decomposed by acid, i.e., a solubility-inhibiting group as a copolymer component, thereby making it to function also as a solubility-inhibitor. Since the positive type chemically amplified resist is accompanied by a solubility-inhibitor, it is insoluble in an alkali solution before being irradiated with light (chemical radiation non-irradiation state). Thus, the chemically amplified resist is treated such that after being coated on a substrate, the chemically amplified resist layer is exposed to light and then subjected to a baking treatment, thereby causing an acid to be generated from the photo-acid generator. The acid thus generated decomposes the solubility-inhibitor, thereby making the resist soluble in an alkali solution. The resist having this formulation is a positive type resist. However, when a chemically amplified resist is negative type is desired, a compound which is capable of cross-linking the resin component with an acid, or a compound whose solubility is lowered with an acid should be incorporated in place of the above component (b).

The chemically amplified resist can be used either in the form of positive-type or negative-type resist depending on the selection of its component to be included. For example, if the resist is to be used as positive-tone resist, the resin component should preferably be a copolymer of vinyl compound having as a side chain a molecular structure represented by the general formula (1) or an acrylic compound represented by the general formula (5) and a monomer having a functional group to be decomposed by an acid.

In particular, when the resin component is a copolymer of a monomer represented by the general formula (2) or a monomer represented by the general formula (3) and a compound containing a functional group to be decomposed or cross-linked by an acid, e.g., represented by the general formula (4), it can be formulated into a suitable chemically amplified resist by incorporating therein a photo-acid generator.

However, when at least one of $R^5$ and $R^6$ in the general formula (3) is an organic group having a menthyl group or menthyl derivative group represented by the general formula (1) and the other is an organic group to be decomposed or cross-linked by an acid, the homopolymer of the compound can be suitably employed as a chemically amplified resist by simply admixing a photo-acid generator with the homopolymer.

Examples of functional group to be decomposed with an acid are esters such as isopropyl ester, ethyl ester, methyl ester, methoxymethyl ester, ethoxyethyl ester, methylthiomethyl ester, tetrahydropyranyl ester, tetrahydrofuranyl ester, methoxyethoxymethyl ester, 2-trimethylsilylethoxymethyl ester, 2,2,2-trichloroethyl ester, 2-chloroethyl ester, 2-bromoethyl ester, 2-iodoethyl ester, 2-fluoroethyl ester, ω-chloroalkyl ester, 2-trimethylsilylethyl ester, 2-methylthioethyl ester, 1,3-dithianyl-2-methyl ester, t-butyl ester, cyclopentyl ester, cyclohexyl ester, 3-oxocyclohexyl ester, allyl ester, 3-buten-1-yl ester, isobornyl ester, 4-trimethylsilyl-2-buten-1-yl ester, 9-anthrylmethyl ester, 2-9',10'-dioxoanthrylmethyl ester, 1-pyrenylmethyl ester, 2-trifluoromethyl-6-chromylmethyl ester, piperonyl ester, 4-picolyl ester, trimethylsilyl ester, triethylsilyl ester, isopropyldimethylsilyl ester, di-t-butyldimethylsilyl ester, thiol ester, oxazole, 2-alkyl-1,3-oxazoline, 4-alkyl-5-oxo-1,3-oxazoline, 5-alkyl-4-oxo-1,3-dioxsolane, ortho ester, pentaamine-cobalt complex, triethylstannyl ester, tri-n-butylstanyl ester, N,N-dimethyl amide, pyrrolidine amide, piperidine amide, 5,6-dihydrophenanthridine amide, N-7-nitroindoril ester, N-8-nitro-1,2,3,4-tetrahydroquinolyl amide, hydrazide, N-phenylhydrazide and N,N'-diisopropylhydrazide; ethers such as t-butoxycarbonylether, methylether, methoxymethylether, methylthiomethylether, t-butylthiomethylether, t-butoxymethylether, 4-pentenyloxymethylether, t-butyldimethylsiloxymethylether, thexyldimethylsiloxymethylether, 2-methoxyethoxymethylether, 2,2,2-trichloroethoxymethylether, bis-2'-chloroethoxymethylether, 2'-trimethylsilylethoxy-methylether, 2'-triethylsilylethoxymethylether, 2'-triisopropylsilylethoxymethylether, 2'-t-butyldimethylsilylethoxymethylether, tetrahydropyranylether, tetrahydrothiopyranylether, 3-bromotetrahydropyranylether, 1-methoxycyclohexylether, 4-methoxytetrahydropyranylether, 4-methoxytetrahydrothiopyranylether, 4-methoxytetrahydrothiopyranylether S,S-dioxide, 1,4-dioxan-2-ylether, tetrahydrofuranylether, tetrahydrothiofuranylether, 2,3,3a,4,5,6,7,7a-octahydro-7,8,8-trimethyl-4,7-methanobenzofuran-2-ylether, 1-ethoxyethylether, 1-2'-chloroethoxyethylether, 1-methyl-1-methoxyethylether, 2,2,2-trichloroethylether, 2-trimethylsilylethylether, t-butylether, allylether, 4,4',4"-tris-4',5'-dichlorophthalimidephenyl-methylether, 4,4',4"-tris-4',5'-dibromophthalimidephenyl-methylether, 4,4',4"-tris-4',5'-iodophthalimidephenyl-methylether, 9-anthlylether, 9-9'-phenyl-10'-oxo-anthlylether (tritiron ether), 1,3-benzodithiolan-2-ylether, benzisothiazolyl-S,S-dioxideether, trimethylsilylether, triethylsilylether, triisopropylsilylether, dimethylisopropylsilylether, diethylisopropylsilylether, dimethylthexyltsilylether and t-butyldimethylsilylether; acetals such as methyleneacetal, ethylideneacetal, 2,2,2-trichloroethylideneacetal, 2,2,2-tribromoethylideneacetal and 2,2,2-triiodoethylideneacetal; ketals such as 1-t-butylethylideneketal, isopropylideneketal (acetonide), cyclopentylideneketal, cyclohexylideneketal and cycloheptylideneketal; cyclic ortho-esters such as methoxymethyleneacetal, ethoxymethyleneacetal, dimethoxymethylene ortho-ester, 1-methoxyethylidene ortho-ester, 1-ethoxyethylidene ortho-ester, 1,2-dimethoxyethylidene ortho-ester, 1-N,N-dimethylaminoethylidene ortho-ester and 2-oxacyclopentylidene ortho-ester; silylketeneacetals such as trimethylsilylketeneacetal, triethylsilylketeneacetal, triisopropylsilylketeneacetal and t-butyldimethylsilylketeneacetal; silylethers such as di-t-butylsilylether, 1,3-1',1',3',3'-tetraisopropyldisiloxanylidene ether and tetra-t-buthoxydisiloxane-1,3-diylidene ether; acyclicacetals or ketals such as dimethylacetal, dimethylketal, bis-2,2,2-trichloroethylacetal, bis-2,2,2-tribromoethylacetal, bis-2,2,2-triiodoethylacetal, bis-2,2,2-trichloroethylketal, bis-2,2,2-tribromoethylketal, bis-2,2,2-triiodoethylketal, diacetylacetal and diacetylketal; cyclicacetals or cyclicketals such as 1,3-dioxane, 5-methylene-1,3-dioxane, 5,5-dibromo-1,3-dioxane, 1,3-dioxolane, 4-bromomethyl-1,3-dioxorane, 4-3'-butenyl-1,3-dioxorane and 4,5-dimethoxymethyl-1,3-dioxoran; acyclic dithioacetals or dithioketals such as S,S'-dimethylacetal, S,S'-dimethyl ketal, S,S'-diethyl acetal, S,S'-diethylketal, S,S'-dipropylacetal, S,S'-dipropylketal, S,S'-dibutylacetal, S,S'-dibutylketal, S,S'-dipentylacetal, S,S'-dipentylketal, S,S'-diacetylacetal and S,S'-diacetylketal; cyclic dithioacetals or dithioketals such as 1,3-dithianacetal, 1,3-dithianketal, 1,3-dithiolanacetal and 1,3-dithiolanketal; O-trimethylsilyl-S-alkylacetals; O-trimethylsilyl-S-alkylketals; acyclic monothioacetals such as O-methyl-S-2-methylthioethylacetal; acyclic monothioketals such as O-methyl-S-2-methylthioethylketal; cyclic monothioacetals or monothioketals such as 1,3-oxathiolanacetal, diselenoacetal and diselenoketal; cyanohydrines such as O-trimethylsilyl cyanohydrine, O-1-ethoxyethylcyanohydrine and O-tetrahydropyranylcyanohydrine; hydrazones such as N,N-dimethylhydrazone; oximes such as an oxime dirivatives and O-methyloxime; and cyclic derivatives such as oxazolidine, 1-methyl-2-1'-hydroxyalkyl-imidazole and N,N-dimethylimidazolidine.

Among them, those more preferable are t-butyl esters such as t-butyl methacrylate, ethoxyethyl methacrylate, 3-oxocyclohexyl methacrylate, t-butyl-3-naphthyl-2-propenoate, isobornyl methacrylate, trimethylsilyl methacrylate and tetrahydropyranyl methacrylate; trimethylsilyl ester; and tetrahydropyranyl ester. In this case, it is also possible to employ acrylates in place of above exemplified methacrylates.

The content of the monomer having a menthyl group or a menthyl derivative group in its skeleton in these copolymers should preferably be at least 5 mole % and at most 95 mole % based on the total moles of monomers. Because if the content of the monomer is less than 5 mole %, the dry etch resistance of the pattern would be undesirably lowered. On the other hand, if the content of the monomer is more than 95 mole %, the resolution and sensitivity of the photosensitive material would be undesirably lowered. Therefore, more preferable content of the monomer is 20 to 75 mole %.

When the base resin contains a monomer having a solubility-inhibiting group in its skeleton, the content of the monomer should preferably be in the range of 10 mole % to 95 mole % based on the total moles of monomers. Because if the content of the monomer is less than 10 mole %, it would be impossible to provide the resist with a sufficient degree of solubility-inhibiting function. On the other hand, if the content of the monomer is more than 95% mole, the resolution of the photosensitive material would be undesirably lowered. Therefore, more preferable content of the monomer is 15 to 70 mole %.

The base resin component of the photosensitive material according to this invention may also contain an alkali-soluble group. In this case, as an example of a monomer containing an alkali-soluble group, it is possible to employ a monomer which itself is capable of being dissolved in alkali or basic solution. Examples of such a monomer are carboxylic acid, sulfonic acid and acid anhydride. It is also possible to employ a monomer containing two or more alkali-soluble groups. These monomers may also contain other functional groups such as ester, alcohol, amine, imine, imide, sulfonamide or amide.

The monomers as mentioned above may be used as a polymer to be blended with a polymer derived from a monomer compound represented by the general formula (2) or the general formula (3), or as a copolymer thereof with a monomer compound represented by the general formula (3).

As for the compound having an alkali-soluble group, it is preferable to employ a compound represented by the general formula (5). If $R^7$ in this compound is a monovalent organic group, a functional group capable of dissolved in an alkaline or basic solution may be included in this organic group.

In the case a photosensitive material comprising (a) an alkali-soluble resin, (b) a solubility-inhibitor and (c) a photo-acid generator, if a menthyl or menthyl derivative group is present in the skeleton of the alkali-soluble resin, it is preferable to employ a copolymer derived from a compound having an alkali-soluble group and represented by the general formula (5) and a compound either represented by the general formula (2) or by the general formula (3). Further, when at least one of $R^5$ and $R^6$ in the general formula (3) is an organic group having a menthyl group or menthyl derivative group represented by the general formula (1) and the other is an organic group having hydrogen atom or an alkali-soluble group, it is possible to employ the homopolymer thereof as an alkali-soluble resin. It is of course possible to employ a monomer having a solubility-inhibiting group as a copolymer component.

The base resin component of the photosensitive material according to this invention may also contain an acrylate monomer represented by the general formula (5), an imide monomer, a sulfonamide monomer, an amide monomer or an acrylic acid-based alkylaminosulfonylalkyl ester. Examples of such an acrylic acid-based ester monomer are methacrylate monomer, acrylate monomer, crotonate monomer and tiglate monomer.

In this case, any organic group may be contained in $R^7$ of the general formula (5) to control the alkali-solubility of the resin component.

When the copolymer composition contains an alkali-soluble group, the content of a monomer having the alkali-soluble group should preferably be in the range of 1 mole % to 95 mole % based on the total moles of monomers. Because if the content of the monomer is less than 1 mole %, it may give rise to an insufficient alkali-solubility after a light exposure. On the other hand, if the content of the monomer is more than 95 mole %, the sensitivity of the photosensitive material would be undesirably lowered. The content of the alkali-soluble group is 1 to 70 mole %.

If the base resin component contains an acrylate monomer represented by the general formula (5), the content of the monomer should preferably be in the range of 1% to 80% based on the total moles of monomers. Because if the content of the monomer is less than the lower limit or more than the upper limit, it may give rise to a lowering of resolution. The preferable content of the methacrylic acid monomer to be included is 1 to 70%. It is also possible to employ a mixture of plurality of copolymers as a base resin component.

The compounds represented by the general formulas (3) to (5) may be employed not only as a copolymer but also as a separate homopolymer to be suitably blended together for use as a base polymer.

The photo-acid generator to be included as component in the composition of chemically amplified resist is a compound which give off an acid upon being irradiated with a chemical radiation. For example, an arylonium salt, a naphthoquinone diazide compound, a diazonium salt, sulfonate compound, a sulfonium compound, an iodonium compound and sulfonyl diazomethane compound are useful for this purpose.

Specific examples of these compounds are triphenylsufonium triflate, diphenyliodonium triflate, 2,3,4,4-tetrahydroxybenzophenone-4-naphthoquinonediazide sulfonate, 4-N-phenylamino-2-methoxyphenyldiazonium sulfate, 4-N-phenylamino-2-methoxyphenyldiazonium p-ethylphenylsulfate, 4-N-phenylamino-2-methoxyphenyldiazonium 2-naphthylsulfate, 4-N-phenylamino-2-methoxyphenyldiazonium phenylsulfate, 2,5-diethoxy-4-N-4'-methoxyphenylcarbonylphenyldiazonium 3-carboxy-4-hydroxyphenylsulfate, 2-methoxy-4-N-phenylphenyldiazonium 3-carboxy-4-hydroxyphenylsulfate, diphenylsulfonylmethane, diphenylsulfonyldiazomethane, diphenyldisulfone α-methylbenzointosylate, benzointosylate and pyrogallol trimecylate.

It is also possible to employ, as a photo-acid generator, compounds represented by the following tables and chemical formulas;

TABLE 1

| (Midori Kagaku Co., Ltd.) | MPI-103 (CAS.No.[87709-41-9]), BDS-105 (CAS.No.[145612-66-4]), NDS-103 (CAS.No.[110098-97-0]), MDS-203 (CAS.No.[127855-15-6]), Di-Boc Bisphenol A (CAS.No. [117458-06-7]), Pyrogallol tritosylate (CAS.No. [20032-64-8]), DTS-102 (CAS.No. [75482-18-7]), DTS-103 (CAS.No.[71449-78-0]), MDS-103 (CAS.No.[127279-74-7]), MDS-105 (CAS.No.[116808-67-4]), MDS-205 (CAS.No.[81416-37-7]), BMS-105 (CAS.No.[149934-68-9]), TMS-105 (CAS.No.[127820-38-6]), NB-101 [20444-09-1]), |
|---|---|

TABLE 2

| (Midori Kagaku Co., Ltd.) | NB-201 | | [4450-68-4]), |
|---|---|---|---|
| | NBC-101 | | [119137-03-0]), |
| | DNB-101 | | [114719-51-6]), |
| | DNB-102 | | [131509-55-2]) |
| | DNB-103 | | [132898-35-2]), |
| | DNB-104 | | [132898-36-3]), |
| | DNB-105 | | [132898-37-4]), |
| | DAM-101 | (CAS. No. | [1886-74-4]), |
| | DAM-102 | (CAS. No. | [28343-24-0]), |
| | DAM-103 | (CAS. No. | [14159-45-6]), |
| | DAM-104 | (CAS. No. | [130290-80-1]), |
| | | ( | [130290-82-3]), |
| | DAM-201 | (CAS. No. | [28322-50-1]), |

FDS-105

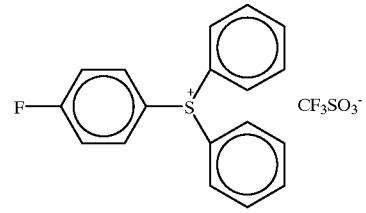

MDS-305

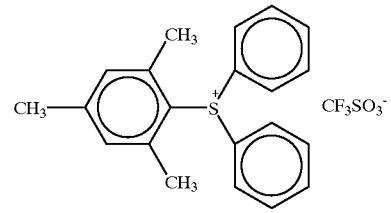

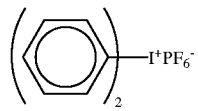

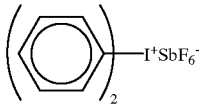

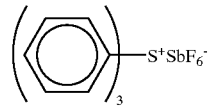

TABLE 2-continued

[Structures shown including: CH₂O-phenyl-I⁺-phenyl CF₃SO₃⁻; dibenzothiophenium with phenyl AsF₆⁻; triphenylsulfonium (with t-butyl phenyl) BF₄⁻; triphenylsulfonium ClO₄⁻; triphenylselenonium PF₆⁻; phenacyl dimethylsulfonium BF₄⁻; (dimethylhydroxyphenyl)dimethylsulfonium SbF₆⁻; phenylthio-phenyl-diphenylsulfonium SbF₆⁻; diphenyliodonium oxide PF₆⁻]

TABLE 2-continued

[Structures shown including: triphenylsulfoxonium BF₄⁻; bis-sulfonium linked by phenyl-S-phenyl (PF₆⁻)₂; diethylamino-phenyl-diazonium PF₆⁻; bis(t-butylphenyl)iodonium CF₃SO₃⁻; (C₆H₅Fe⁺C₆H₅)PF₆⁻]

and an Iodonium salt, a sulfonium salt, a disulfonic derivative or imidosulfonic derivative represented by the following chemical formulas;

[Iodonium salt structures:
diphenyliodonium BF₄⁻;
diphenyliodonium AsF₆⁻;
diphenyliodonium CF₃SO₃⁻;
bis(4-methylphenyl)iodonium PF₆⁻;
(phenyl)(4-methoxyphenyl)iodonium AsF₆⁻;
bis(4-chlorophenyl)iodonium SbF₆⁻;
diphenyliodonium PF₆⁻;
diphenyliodonium SbF₆⁻;
(phenyl)(4-nitrophenyl)iodonium BF₄⁻]

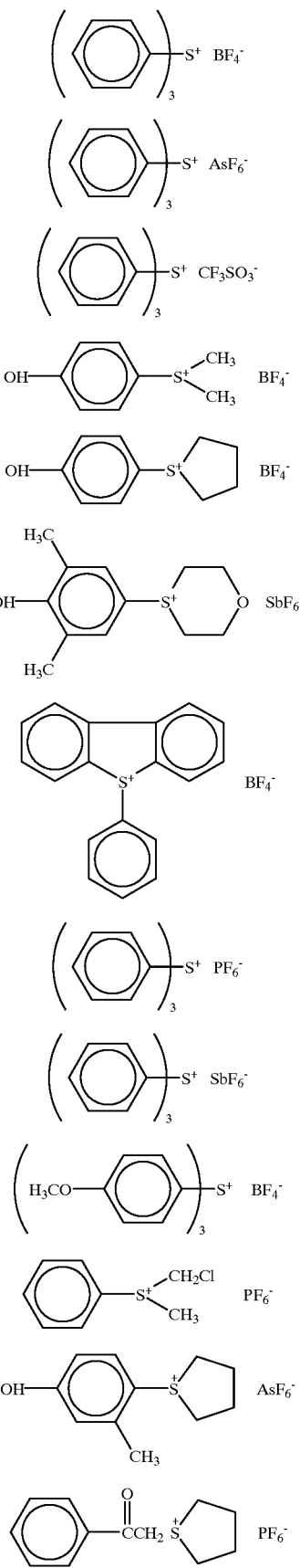
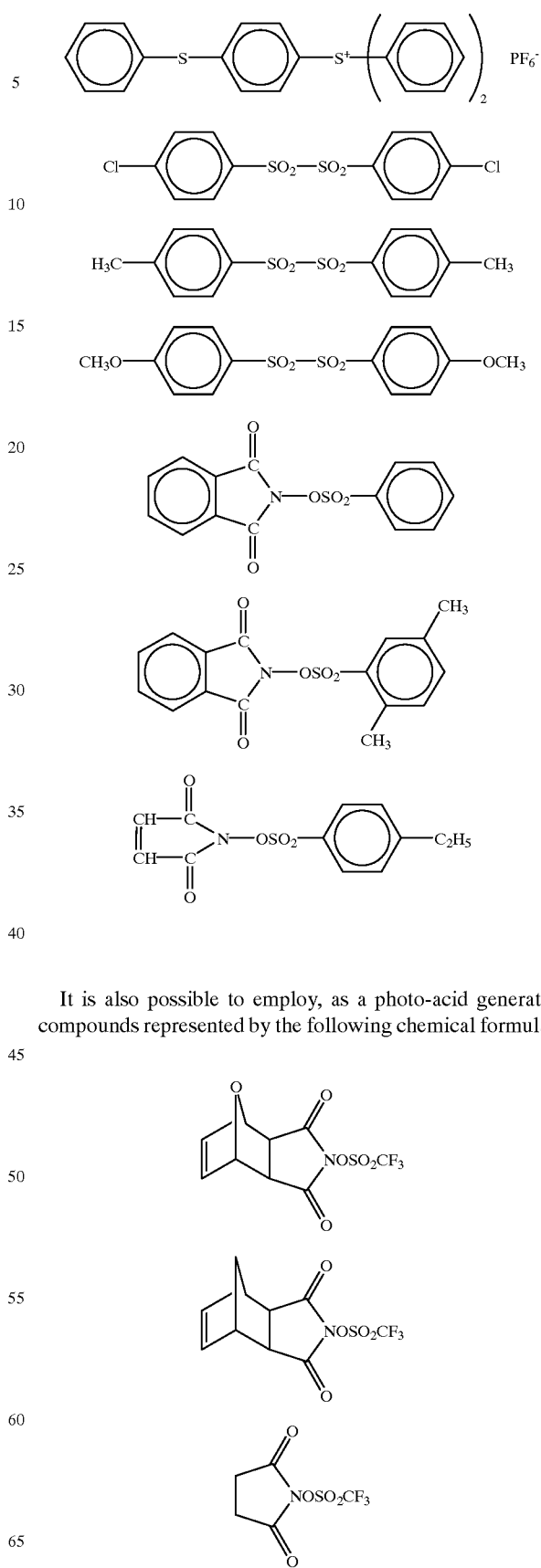
It is also possible to employ, as a photo-acid generator, compounds represented by the following chemical formulas;

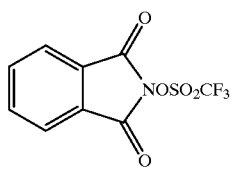
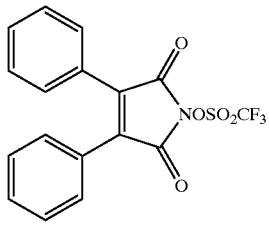
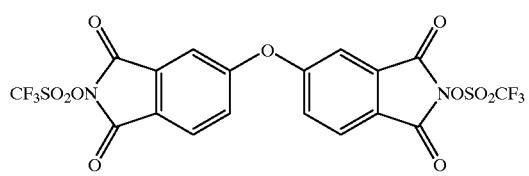
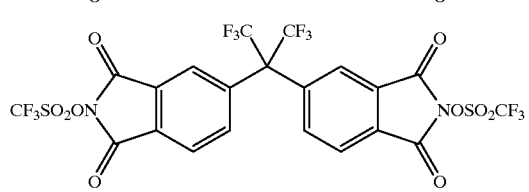
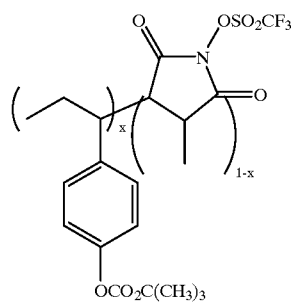
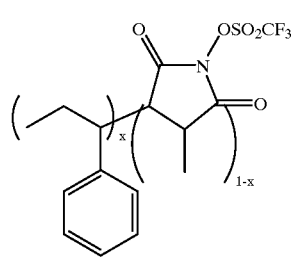
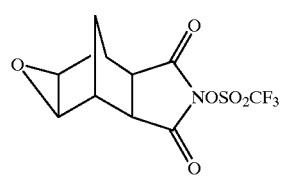
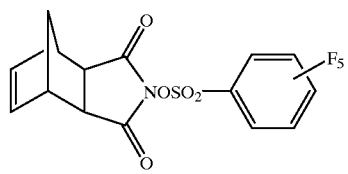

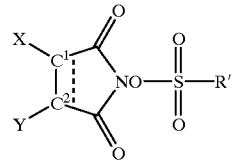

wherein $C^1$ and $C^2$ are individually a single bond or double bond, R' is a group selected from the group consisting of —$CF_3$, —$CF_2CF_3$, —$CF_2CF_2H$ and —$(CF2)_n$—Z' (n=1 to 4, Z' is a group selected from H, alkyl, aryl or the following chemical formula), and X' and Y' may be (1) connected together to form a monocyclic ring or a polycyclic ring each optionally containing one or more hetro atoms; (2) connected together to form an aromatic ring; (3) individually hydrogen atom, alkyl or aryl; (4) combined to a residual group containing another sulfonyloxy imide; or (5) combined to a polymerizable chain or a backbone chain.

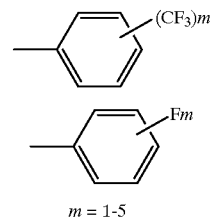

$m = 1$-$5$

In particular, if a photo-acid generator having a naphthalene skeleton is employed, light penetration near a wavelength of 193 nm can be preferably improved.

Examples of the photo-acid generator having a naphthalene skeleton are sulfonyl or sulfonate compounds having a cyclic group such as naphthalene, pentalene, indene, azulene, heptalene, biphenylene, as-indacene, s-indacene, acenaphthylene, fluorene, phenalene, phenanthrene, anthracene, fluoranthene, acephenanthrylene, aceanthrylene, triphenylene, pyrene, chrysene, naphtacene, pleiadene, picene, perylene, pentaphene, pentacene, tetraphenylene, hexaphene, hexacene, rubicene, coronene, trinaphthylene, heptaphene, heptacene, pyranthrene, ovalene, dibenzophenanthrene, benz[a]anthracene, dibenzo[a,j]anthracene, indeno[1,2-a]indene, anthra[2,1-a]naphthacene or 1H-benzo[a]cyclopent[j]anthracene ring; 4-quinone diazide compounds having a cyclic group and a hydroxyl compound attached to the cyclic group, examples of the cyclic group being naphthalene, pentalene, indene, azulene, heptalene, biphenylene, as-indacene, s-indacene, acenaphthylene, fluorene, phenalene, phenanthrene, anthracene, fluoranthene, acephenanthrylene, aceanthrylene, triphenylene, pyrene, chrysene, naphtacene, pleiadene, picene, perylene, pentaphene, pentacene, tetraphenylene, hexaphene, hexacene, rubicene, coronene, trinaphthylene, heptaphene, heptacene, pyranthrene, ovalene, dibenzophenanthrene, benz[a]anthracene, dibenzo[a,j]anthracene, indeno[1,2-a]indene, anthra[2,1-a]naphthacene or 1H-benzo[a]cyclopent[j]anthracene ring; and a salt to be derived from the reaction between a triflate and sulfonium or iodonium having, as a side chain, naphthalene, pentalene, indene, azulene, heptalene, biphenylene, as-indacene, s-indacene, acenaphthylene, fluorene, phenalene, phenanthrene, anthracene, fluoranthene, acephenanthrylene, aceanthrylene, triphenylene, pyrene, chrysene, naphtacene, pleiadene, picene, perylene, pentaphene, pentacene, tetraphenylene, hexaphene, hexacene, rubicene, coronene, trinaphthylene, heptaphene, heptacene, pyranthrene, ovalene, dibenzophenanthrene, benz[a]anthracene, dibenzo [a,j]anthracene, indeno[1,2-a]indene, anthra[2,1-a] naphthacene or 1H-benzo [a]cyclopent[j]anthracene ring.

Particularly preferred among them are sulfonyl or sufonate having a naphthalene ring or anthracene ring; 4-quinone diazide compounds having a hydroxyl compound attached to naphthalene or anthracene; and a salt to be derived from the reaction between a triflate and sulfonium or iodonium having naphthalene side chain or anthracene side chain. Specifically, trinaphthylsulfonium triflate, dinaphthyliodonium triflate, dinaphthylsulfonylmethane, NAT-105 (CAS.No.[137867-61-9], Midori Kagaku Co., Ltd.), NAT-103 (CAS.No.[131582-00-8], Midori Kagaku Co., Ltd.), NAI-105 (CAS.No.[85342-62-7], Midori Kagaku Co., Ltd.), TAZ-106 (CAS.No.[69432-40-2], Midori Kagaku Co., Ltd.), NDS-105 (Midori Kagaku Co., Ltd.), CMS-105 (Midori Kagaku Co., Ltd.), DAM-301 (CAS.No.[138529-81-4], Midori Kagaku Co., Ltd.), SI-105 (CAS.No.[34694-40-7], Midori Kagaku Co., Ltd.), NDI-105 (CAS.No. [133710-62-0], Midori Kagaku Co., Ltd.), EPI-105 (CAS.No.[135133-12-9], Midori Kagaku Co., Ltd.) and PI-105 (CAS.No.[41580-58-9], Midori Kagaku Co., Ltd.) are preferred. It is also possible to employ a compound represented by the following chemical formula.

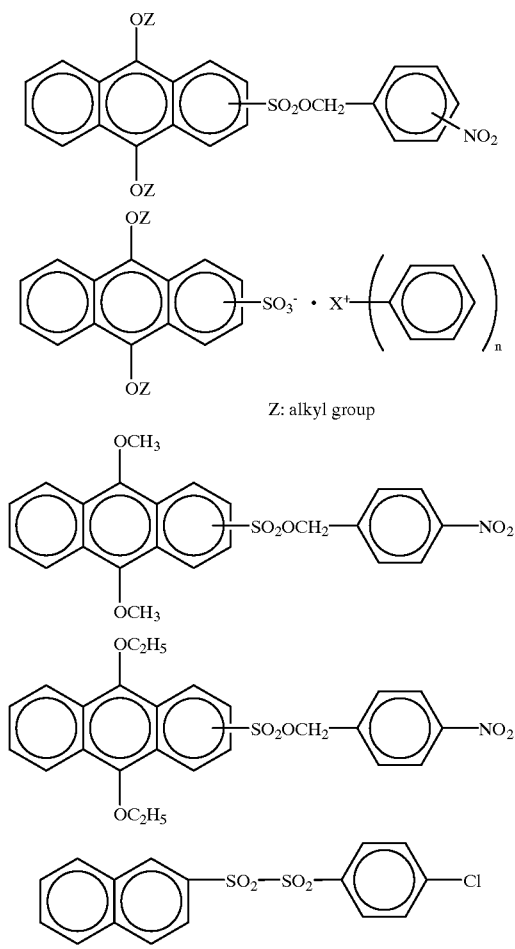

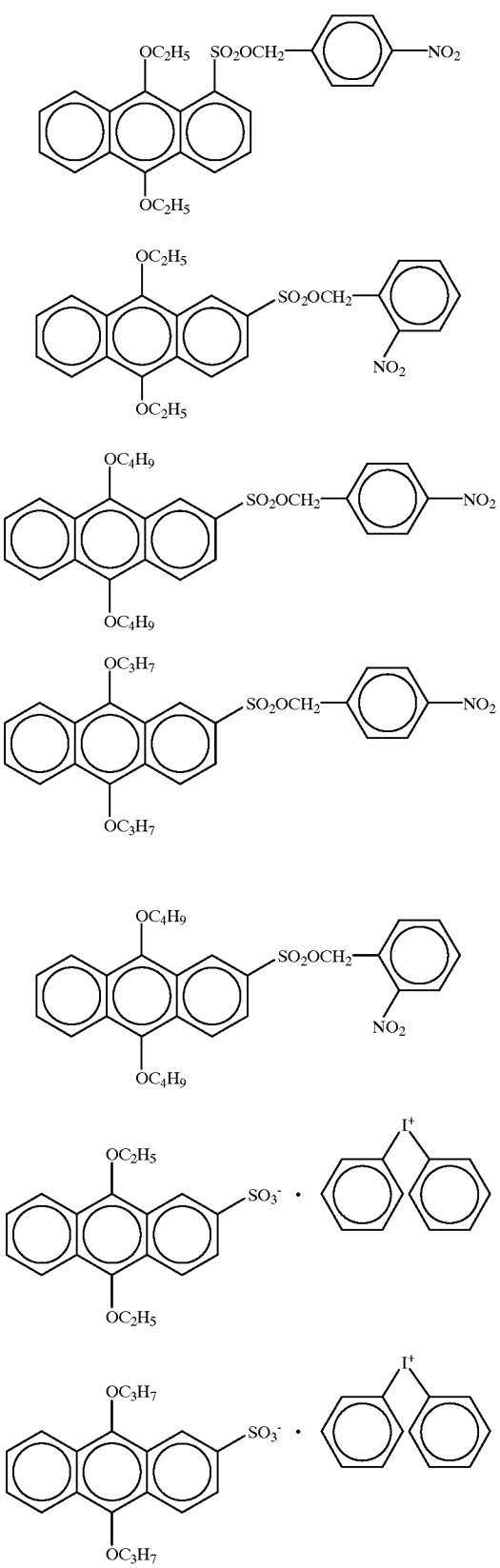

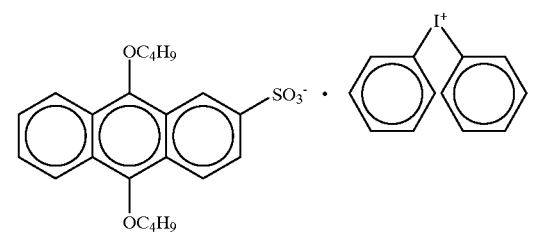
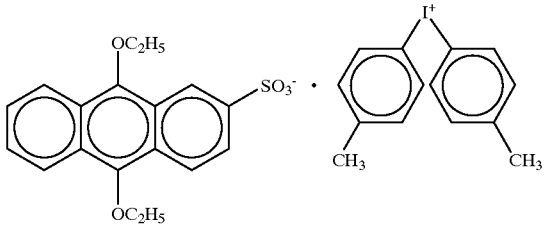
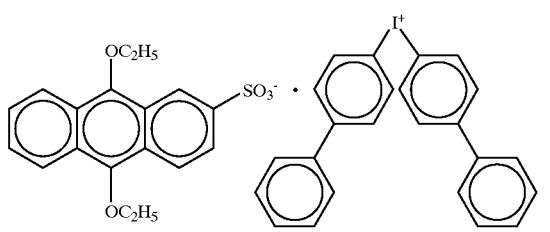
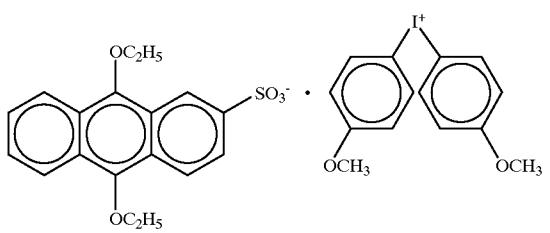
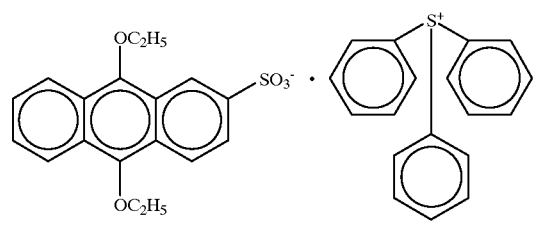
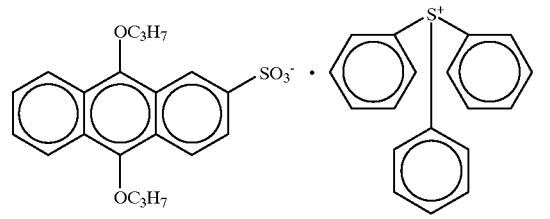
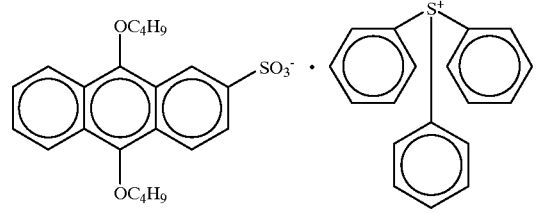

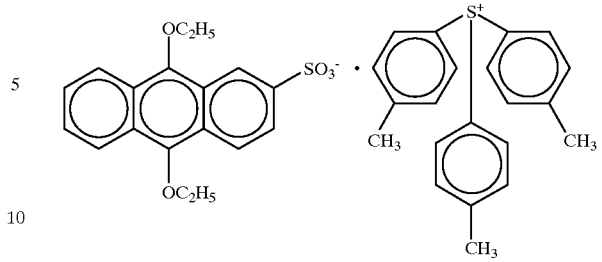
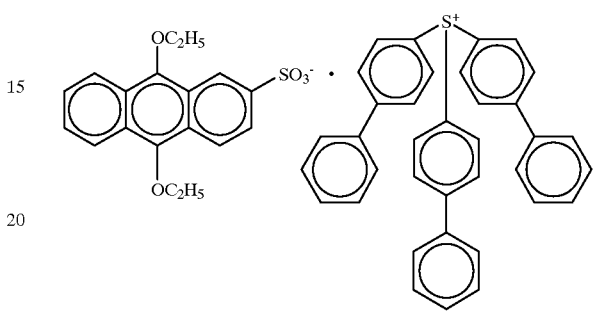
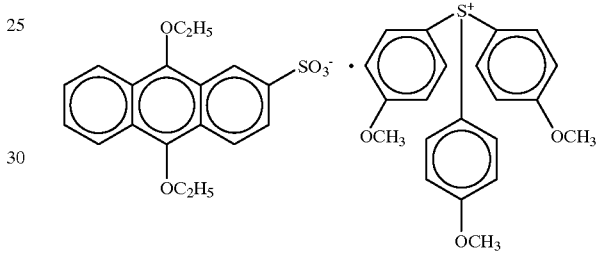

Preferred in particular among them are trinaphthylsulfonium triflate, dinaphthyliodonium triflate, dinaphthylsulfonylmethane, NAT-105 (CAS.No.[137867-61-9], Midori Kagaku Co., Ltd.), NDI-105 (CAS.No. [133710-62-0], Midori Kagaku Co., Ltd.) and NAI-105 (CAS.No.[85342-62-7].

Additionally, if a photo-acid generator having a terpenoid skeleton is employed, light penetration near a wavelength of 193 nm can be preferably improved.

As for the compounds having a terpenoid skeleton, any of the compounds as explained hereinabove may be used. Namely, sulfonyl or sulfonate compounds having myrcene, carene, ocimene, pinene, limonene, camphene, terpinolene, tricyclene, terpinene, fenchene, phellandrene, sylvestrene, sabinene, citronellol, pinocampheol, geraniol, fenchyl alcohol, nerol, borneol, linalol, menthol, terpineol, carveol, thujyl alcohol, citronellal, ionone, irone, cineole, citral, menthone, pinol, cyclocitral, carvomethone, ascaridole, safranal, carvotanacetone, phellandral, pimelintenone, citronellic acid, perillaldehyde, thujone, caron, tagetone, camphor, bisabolene, santalene, zingiberene, caryophyllene, curcumene, cedrene, cadinene, longifolene, sesquibenihene, farnesol, patchouli alcohol, nerolidol, carotol, cadinol, lanceol, eudesmol, cedrol, guajol, kessoglycol, cyperone, hinokiic acid, eremophilone, santalic acid, zerumbone, camphorene, podocarprene, mirene, phyllocladene, totarene, phytol, sclareol, manool, hinokiol, ferruginol, totarol, sugiol, ketomanoyl oxide, manoyl oxide, abietic acid, pimaric acid, neoabietic acid, levopimaric acid, iso-d-pimaric acid, agathenedicarboxylic acid, rubenic acid, triterpene or carotinoide; 4-quinoneazide compound having a hydroxyl compound attached to a terpenoid skeleton such as myrcene, carene, ocimene, pinene, limonene, camphene, terpinolene, tricyclene, terpinene, fenchene, phellandrene, sylvestrene, sabinene, citronellol, pinocampheol, geraniol, fenchyl alcohol, nerol, borneol, linalol, menthol, terpineol, carveol, thujyl alcohol, citronellal, ionone, irone, cineole, citral, menthone, pinol, cyclocitral, carvomethone, ascaridole, safranal, carvotanacetone, phellandral, pimelintenone, citronellic acid, perillaldehyde, thujone, caron, tagetone, camphor, bisabolene, santalene, zingiberene, caryophyllene, curcumene, cedrene, cadinene, longifolene, sesquibenihene, farnesol, patchouli alcohol, nerolidol, carotol, cadinol, lanceol, eudesmol, cedrol, guajol, kessoglycol, cyperone, hinokiic acid, eremophilone, santalic acid, zerumbone, camphorene, podocarprene, mirene, phyllocladene, totarene, phytol, sclareol, manool, hinokiol, ferruginol, totarol, sugiol, ketomanoyl oxide, manoyl oxide, abietic acid, pimaric acid, neoabietic acid, levopimaric acid, iso-d-pimaric acid, agathenedicarboxylic acid, rubenic acid, triterpene or carotinoide; and a salt to be derived from the reaction between a triflate and sulfonium or iodonium having as a side chain a terpenoid skeleton such as myrcene, carene, ocimene, pinene, limonene, camphene, terpinolene, tricyclene, terpinene, fenchene, phellandrene, sylvestrene, sabinene, citronellol, pinocampheol, geraniol, fenchyl alcohol, nerol, borneol, linalol, menthol, terpineol, carveol, thujyl alcohol, citronellal, ionone, irone, cineole, citral, menthone, pinol, cyclocitral, carvomethone, ascaridole, safranal, carvotanacetone, phellandral, pimelintenone, citronellic acid, perillaldehyde, thujone, caron, tagetone, camphor, bisabolene, santalene, zingiberene, caryophyllene, curcumene, cedrene, cadinene, longifolene, sesquibenihene, farnesol, patchouli alcohol, nerolidol, carotol, cadinol, lanceol, eudesmol, cedrol, guajol, kessoglycol, cyperone, hinokiic acid, eremophilone, santalic acid, zerumbone, camphorene, podocarprene, mirene, phyllocladene, totarene, phytol, sclareol, manool, hinokiol, ferruginol, totarol, sugiol, ketomanoyl oxide, manoyl oxide, abietic acid, pimaric acid, neoabietic acid, levopimaric acid, iso-d-pimaric acid, agathenedicarboxylic acid, rubenic acid, triterpene or carotinoide. Preferred in particular among them are trimenthyl sulfonylmethane, trimenthyl sulfonium triflate, dimenthyl-methyl sulfonium triflate, menthyldimethyl sulfonium triflate, dimenthyl iodonium triflate and menthyl iodonium triflate.

The content of the photo-acid generator to be added to the base resin should preferably be in the range of from 0.001 mole % to 50 mole %. Because if the content of this photo-acid generator is less than 0.001 mole %, it would be impossible to generate a sufficient amount of acid, thereby making it difficult to form a desired pattern. On the other hand, if the content of this photo-acid generator is more than 50 mole %, the resolution and sensitivity of the photosensitive material would be undesirably lowered. Therefore, more preferable content of the photo-acid generator agent is 0.01 mole % to 40 mole %.

The photosensitive material according to this invention may be a chemically amplified resist of positive type containing (a) an alkali-soluble resin, (b) a solubility-inhibitor and (c) a photo-acid generator, or containing the solubility-inhibitor as a copolymer component of the resin component. It is also possible to mix the solubility-inhibitor into the resin component.

There is no restriction with respect to the kinds of this solubility-inhibitor as far as it has a substituent group or a functional group that can be decomposed in the presence of an acid, and the decomposed products are capable of generating radicals such as —(C=O)O—, —OS(=O)$_2$—, or —O— under the influence of an alkali solution.

Examples of the solubility-inhibitor are ones which have been derived from phenolic compounds, such as t-butoxycarbonylether, methylether, methoxymethylether, methylthiomethylether, t-butylthiomethylether, t-butoxymethylether, 4-pentenyloxymethylether, t-butyldimethylsiloxymethylether, thexyldimethylsiloxymethylether, 2-methoxyethoxymethylether, 2,2,2-trichloroethoxymethylether, bis-2'-chloroethoxymethylether, 2'-trimethylsilylethoxymethylether, 2'-triethylsilylethoxymethylether, 2'-triisopropylsilylethoxymethylether, 2'-t-butyldimethylsilylethoxymethylether, tetrahydropyranylether, tetrahydrothiopyranylether, 3-bromotetrahydropyranylether, 1-methoxycyclohexylether, 4-methoxytetrahydropyranylether, 4-methoxytetrahydrothiopyranylether, 4-methoxytetrahydrothiopyranylether-S,S-dioxide, 1,4-dioxan-2-ylether, tetrahydrofuranylether, tetrahydrothiofuranylether, 2,3,3a,4,5,6,7,7a-octahydro-7,8,8-trimethyl-4,7-methanobenzofuran-2-ylether, 1-ethoxyethylether, 1-2'-chloroethoxy-ethylether, 1-methyl-1-methoxyethylether, 2,2,2-trichloroethylether, 2-trimethylsilylethylether, t-butylether, allylether, 4,4',4"-tris-4',5'-dichlorophthalimidephenyl-methylether, 4,4',4"-tris-4',5'-dibromophthalimidephenyl-methylether, 4,4',4"-tris-4',5'-iodophthalimidephenyl-methylether, 9-anthlylether, 9-9'-phenyl-10'-oxo-anthlylether (tritiron ether), 1,3-benzodithiolan-2-ylether, benzisothiazolyl-S,S-dioxideether, trimethylsilylether, triethylsilylether, triisopropylsilylether, dimethylisopropylsilylether, diethylisopropylsilylether, dimethylthexylsilylether and t-butyldimethylsilylether.

Preferable in particular among these compounds are ones which can be derived by protecting a phenolic compound with t-butoxycarbonyl group, t-butoxycarbonylmethyl group, trimethylsilyl group, t-butyldimethylsilyl group or tetrahydropyranyl group.

It is also possible to use esters of polycarboxylic acid, such as isopropyl ester, ethyl ester, methyl ester, methoxymethyl ester, methylthiomethyl ester, tetrahydropyranyl ester, tetrahydrofuranyl ester, methoxyethoxymethyl ester, 2-trimethylsilylethoxymethyl ester, 2,2,2-trichloroethyl ester, 2-chloroethyl ester, 2-bromoethyl ester, 2-iodoethyl ester, 2-fluoroethyl ester, ω-chloroalkyl ester, 2-trimethylsilylethyl ester, 2-methylthioethyl ester, 1,3-dithianyl-2-methyl ester, t-butyl ester, cyclopentyl ester, cyclohexyl ester, allyl ester, 3-buten-1-yl ester, 4-trimethylsilyl-2-buten-1-yl ester, 9-anthrylmethyl ester, 2-9',10'-dioxo-anthlylmethyl ester, 1-pyrenylmethyl ester, 2-trifluoromethyl-6-chromylmethyl ester, piperonyl ester, 4-picolyl ester, trimethylsilyl ester, triethylsilyl ester, t-butyldimethylsilyl ester, isopropyldimethylsilyl ester, di-t-butyldimethylsilyl ester, thiol ester, oxazole, 2-alkyl-1,3-oxazoline, 4-alkyl-5-oxo-1,3-oxazoline, 5-alkyl-4-oxo-1,3-dioxsolane, ortho ester, pentaamine-cobalt complex, triethylstannyl ester, tri-n-butylstanyl ester, N,N-dimethylamide, pyrrolidineamide, piperidineamide, 5,6-dihydrophenanthridineamide, N-7-nitroindoryl ester, N-8-nitro-1,2,3,4-tetrahydroquinolylamide, hydrazide, N-phenylhydrazide, N,N'-diisopropylhydrazide and t-butyl ester. It is also possible to employ a compound represented by the following chemical formula;

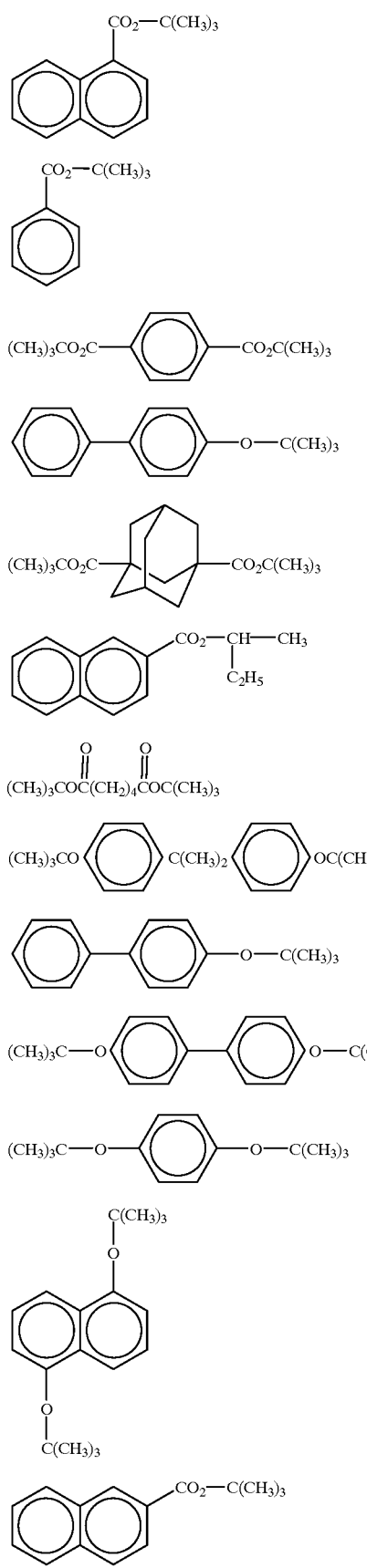
-continued
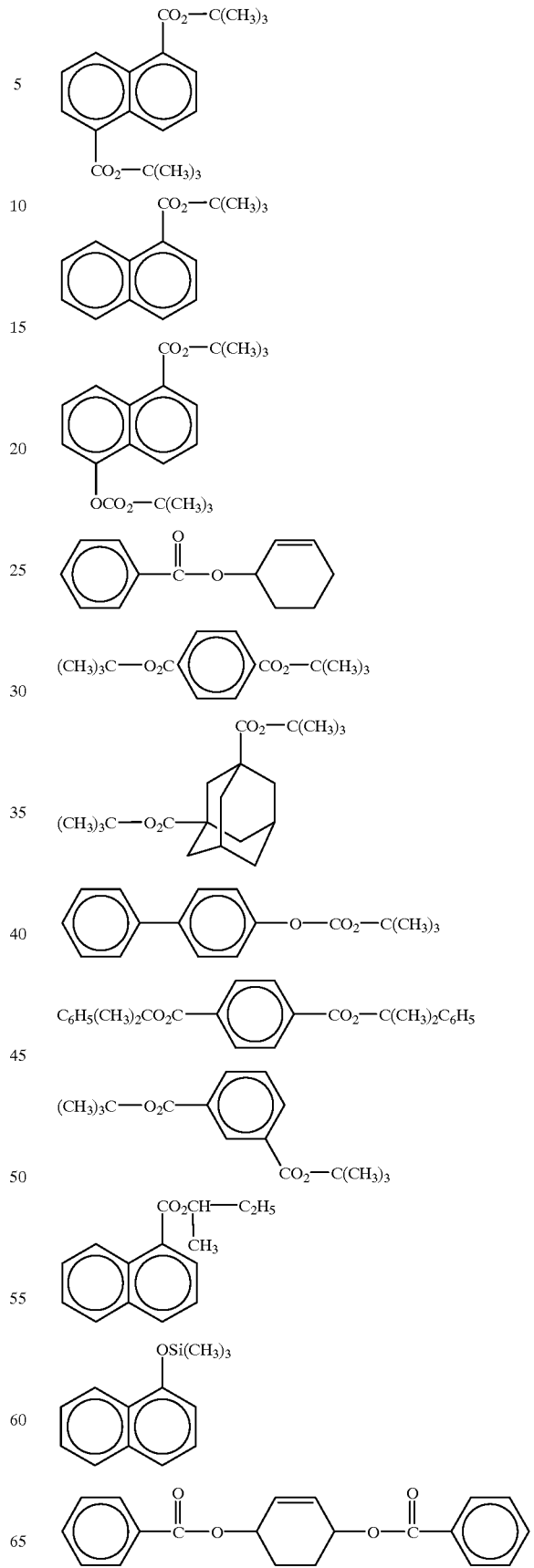

-continued
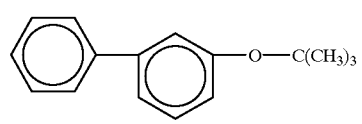
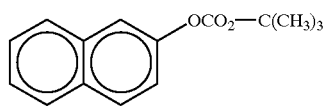
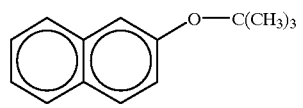
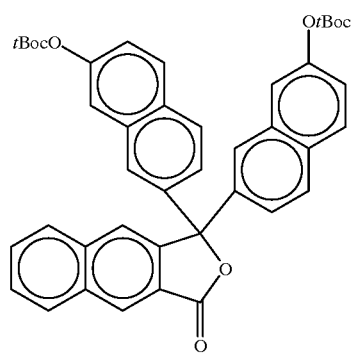
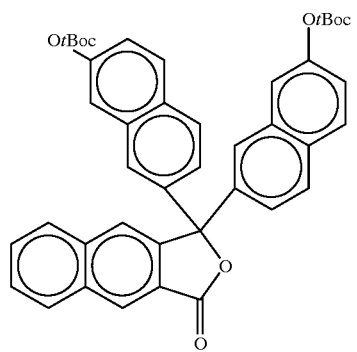
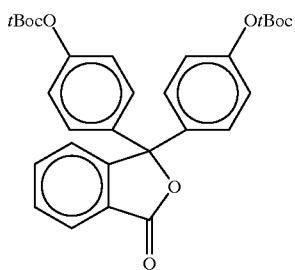
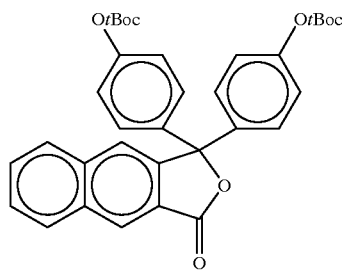
-continued
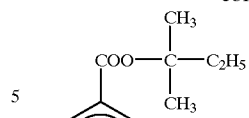
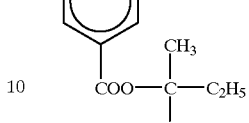
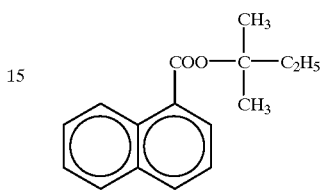
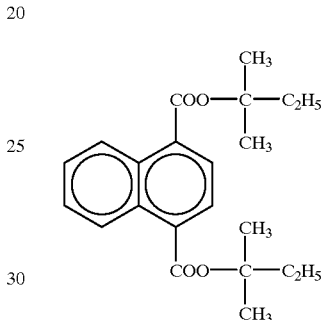
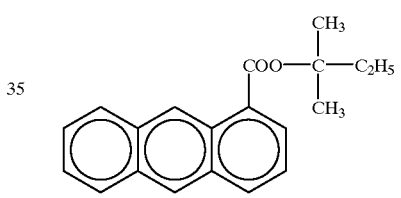
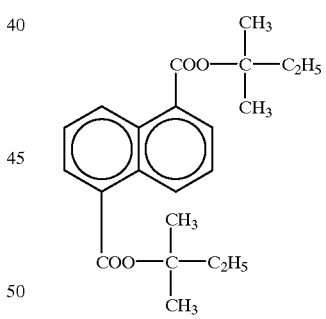
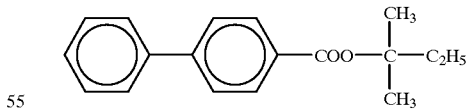
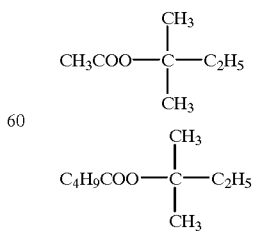

-continued
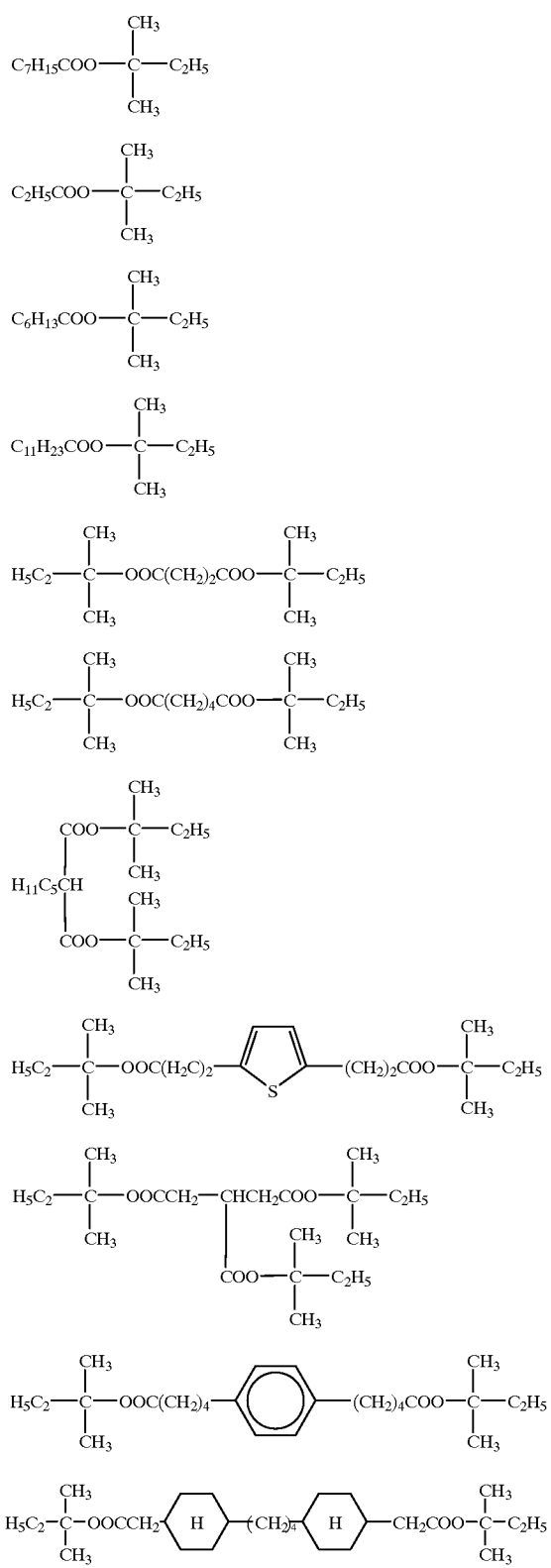
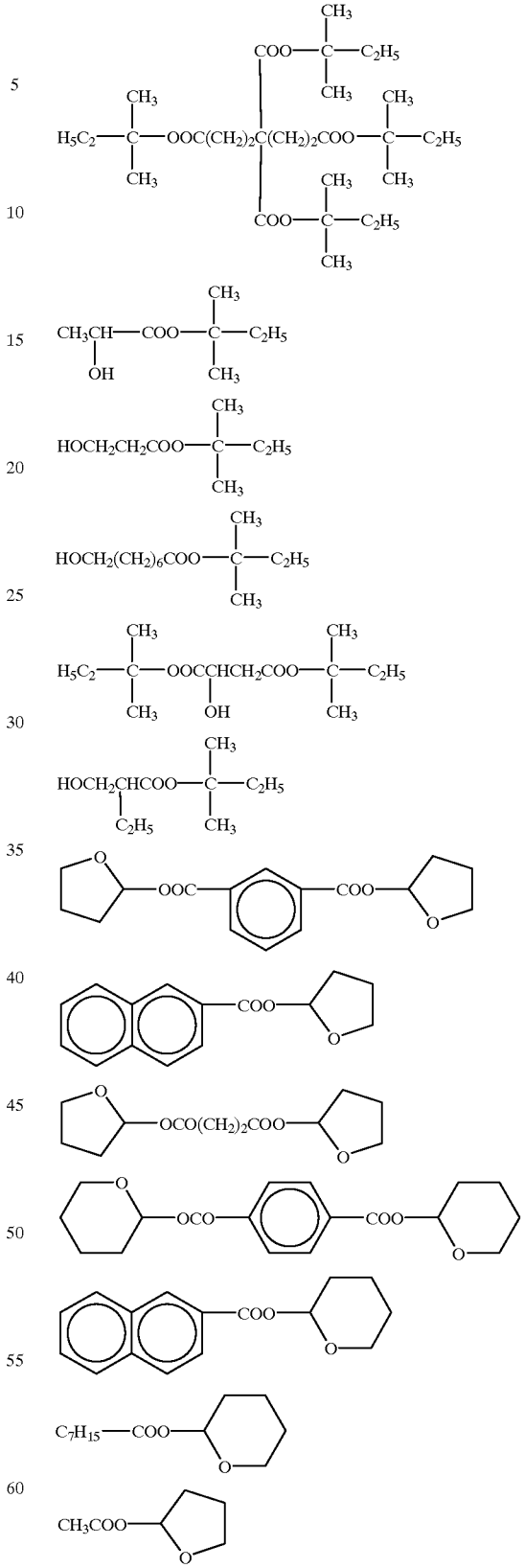

Among these esters, the use of polyhydroxy naphthol having a naphthalene skeleton and protected with t-buthoxycarbonyl group is preferable because of its improved light transmittance to a light of 193 nm in wavelength.

It is also possible to use a compound represented by the general formula (6) shown below.

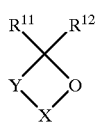

formula (6)

wherein $R^{11}$ and $R^{12}$ are individually hydrogen atom, halogen atom, cyano group, nitro group or monovalent organic group and may be the same or different from each other; $R^{11}$ and $R^{12}$ may be connected together of form a closed ring; X is >C=O or —SO$_2$—, Y is a divalent organic group; and at least one of $R^{11}$, $R^{12}$ and Y is provided with a substituent group or a functional group to be decomposed by an acid.

Examples of the monovalent organic group to be introduced as $R^{11}$ or $R^{12}$ are an alkyl group such as methyl, ethyl, propyl, isopropyl, n-butyl, isobutyl, s-butyl and t-butyl, a substituted or unsubstituted alicyclic group or heterocyclic group such as cyclohexyl, piperidyl or pyranine.

Examples of the divalent substituent group Y are an unsaturated aliphatic group such as ethylene, propylene and butylene; substituted or unsubstituted alicyclic group or heterocyclic group such as cyclohexane, pyradine, pyrane or morphorane.

If it is desired to use a resin component containing a compound having a substituent group or a functional group to be decomposed in the presence of an acid to form decomposed products which are capable of generating radicals such as —(C=O)O—, —OS(=O)$_2$—, or —O— under the influence of an alkali solution, the content of the compound should preferably be in the range of 1 to 60 mole % based on the amount of the base resin. If the content of the compound falls outside this range, the coating of the compound may become difficult. In this case, the group that can be decomposed by an acid may not be included in the base resin component.

If it is desired to utilize the photosensitive material of this invention as a chemically amplified resist of negative type, the resist can be manufactured by suitably adding a photoacid generator and a photo-crosslinking agent to a copolymer to be derived from a reaction between a vinyl compound or acrylic compound represented by the general formula (5) having a menthyl or menthyl derivative group represented by the general formula (1) and an alkali-soluble acrylic compound represented by the general formula (5) such as methacrylic acid or acrylic acid, or a vinyl compound.

In this case, it is possible to employ, as the photo-acid generator, halogenated alkyl-substituted triazine or naphthylidine compounds in addition to the compounds exemplified above as being useful for a positive resist. It is also possible to employ a compound represented by the following table and chemical formula;

TABLE 3

| Midori Kagaku Co. Ltd. | TAZ-101 TAZ-102 | CAS. NO. | (6542-67-2) 24502-22-1 |
|---|---|---|---|

TABLE 3-continued

| | TAZ-103 | 3712-60-5 |
| | TAZ-104 | 3584-23-4 |
| | TAZ-105 | 117482-75-4 |
| | TAZ-106 | 69432-40-2 |
| | TAZ-110 | 42573-57-9 |
| | TAZ-113 | 42880-07-9 |
| | TAZ-114 | 42880-08-0 |
| | TAZ-118 | 151052-45-8 |
| | TAZ-119 | 139545-38-3 |
| | TAZ-120 | 42880-12-6 |
| | TAZ-115 | 42880-09-1 |
| | TAZ-116 | 42880-03-5 |

TAZ-111

TAZ-112

TABLE 3-continued

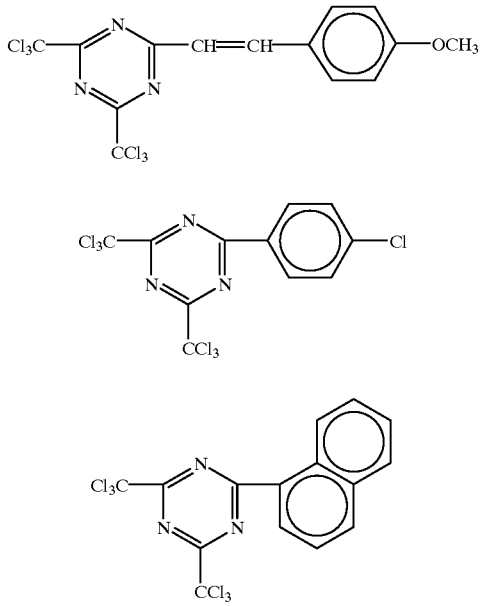

As for the photo-crosslinking agent, it is possible to employ a vinyl compound having on its side chain an epoxy group, an acrylic polymer represented by the general formula (5), or a melamine type compound such as methylol-substituted triazine or naphthylidine compounds.

In the above descriptions, the photosensitive material of this invention is explained on such cases as applied to a chemically amplified resist. In the use of the photosensitive material as a chemically amplified resist however, it is required for the polymer to meet the following conditions. Namely, the polymer is required to have a softening point of 20° C. or more, and an average molecular weight of 500 to 500,000. If the softening point of the polymer constituting the resin component of the photosensitive material is less than 20° C., the acid generated from the photo-acid generator by the irradiation of chemical radiation may excessively diffuse into the layer of the resist in the baking treatment, thereby possibly causing the lowering of resolution of the resist upon being patterned.

On the other hand, if the molecular weight of the polymer is too high, the crosslinking reaction of the polymer may be promoted when the resist composition is irradiated with an electron radiation and baked after the irradiation of electron radiation, thereby giving rise to the deterioration of image quality or sensitivity of the resist if the resist is of positive type.

Next, examples of preparing the photosensitive material of this invention and the method of forming a resist pattern using the photosensitive material will be explained with reference to a chemically amplified resist of positive type.

When it is desired to utilize the photosensitive material of this invention as a chemically amplified resist, the above-mentioned polymer, a compound capable of being decomposed by an acid as required, and a compound capable of generating an acid upon being irradiated with a chemical radiation are dissolved in an organic solvent, and then filtered thereby preparing the resist.

When it is desired to utilize the photosensitive material of this invention in the same manner as in the case of the conventional resist, the above-mentioned polymer, a photo-crosslinking agent or a backbone chain photo-scissioning agent are dissolved in an organic solvent, and then filtered thereby preparing the resist.

The organic solvents useful in this case are a ketone-type solvent such as cyclohexanone, acetone, methylethylketone and methylisobutylketone; a cellosolve-type solvent such as methylcellosolve, 2-ethoxyethyl acetate, 2-methoxyethyl acetate, 2-propyloxyethyl acetate or 2-buthoxyethyl acetate; a glycol-type solvent such as propyleneglycol monomethylether acetate; an ester-type solvent such as ethyl acetate, butyl acetate and isoamyl acetate; a lactone-type solvent such as y-butyrolactone; a nitrogen-containing solvent such as dimethylsulfoxide, hexamethylphosphorictriamide dimethylformamide and N-methylpyrrolidone. These solvents may be employed singly or in combination these solvents may contain a suitable amount of aromatic solvent such as xylene and toluene; aliphatic alcohol such as isopropyl alcohol, ethyl alcohol, methyl alcohol, butyl alcohol, n-butyl alcohol, s-butyl alcohol, t-butyl alcohol and isobutyl alcohol.

In addition to the above three components, a surfactant as a coating film-modefying agent; other kinds of polymer such as epoxy resin, polymethacrylate, propylene oxide-ethylene oxide copolymer and polystyrene; and a dye as a reflection-prohibiting agent may also be incorporated into the resist material.

Followings are a detailed explanation on the process of forming a pattern by using the photoresist material of this invention.

The solution of a photoresist material prepared by dissolving the above mentioned components in an organic solvent is coated on the surface of a substrate by means of a spin-coating method or a dipping method. Then, the coated layer is dried at a temperature of 150° C. or less in general, or preferably at a temperature of 70 to 120° C. thereby forming a photosensitive resin layer (a resist film). The substrate to be employed in this case may be for example a silicon wafer; a silicon wafer having a stepped portion formed of insulating films, electrodes or interconnections; or a blank mask; or Group III–V compounds (such as GaAs, AlGaAs) semiconductor wafer.

Then, the resist film is exposed to a pattern of a radiation, i.e., irradiated through a predetermined mask with chemical radiation. The chemical radiation to be employed in this exposure may be usually an ultraviolet rays of short wavelength, but may be any of electron rays; X-rays; a low pressure mercury lamp light beam; an excimer laser beam such as KrF or ArF excimer laser beam; a synchrotron orbital radiation beam; g-line; and an ion beam.

The resist film thus pattern-exposed is then subjected to a baking step by heating it at a temperature of not more than 150° C. using a hot plate or an oven, or through the irradiation of infrared rays.

Subsequently, the resist film thus baked is subjected to a developing treatment by way of a dipping method or spraying method using an alkaline solution, thereby selectively removing the exposed portion of the resist film to obtain a desired pattern. The alkaline aqueous solution useful as the developing solution may be an organic alkali solution such as an aqueous solution of tetramethylammonium hydroxide, or an inorganic alkali solution such as an aqueous solution of potassium hydroxide and sodium hydroxide. These alkaline solutions are used in general at the concentration of 15% or less. It is also possible to employ as a developing solution other organic solvents such as isopropyl alcohol, ethanol, methanol, 1-butanol, 2-butanol, 1-methyl-1-propanol and 1-methyl-2-propanol. These organic solvents may used singly or in combination.

After the developing treatment, the substrate and resist film are rinsed with water or a solution.

EXAMPLES

This invention will be further explained with reference to the following examples. These examples however should not be construed as being limiting the scope of this invention.

Example I

In each of following examples, a resin component containing a compound having a terpenoid skeleton was employed to prepare a photosensitive material containing this resin component, and the resultant photosensitive material was evaluated. In particular, various kinds of compounds having different kinds of terpenoid were employed to prepare various kinds of resin components.
(Synthesis Example I-1)

24 g of methacrylic acid, 31 g of citronellol and 1.5 g of p-toluenesulfonic acid in 500 mL of toluene were heated to reflux at a oil temperature of 150° C. for 19 h. Subsequently, the reaction mixture was quenched by the addition of salt saturated sodium bicarbonate solution. The mixed solution was extracted with ether. The organic layers were combined and washed with salt saturated sodium bicarbonate solution, an aqueous solution of sodium hydride, and then salt saturated ammonium chloride solution, and then dried over salt saturated brine and sodium sulfate anhydrous. Finally, the resultant oily product was evaporated under reduced pressure to obtain citronellyl methacrylate.
(Evaluation of homopolymer derived from the monomer obtained in Synthesis Example I-1)

2.1 g of citronellyl methacrylate and 0.4 g of azoisobutylonitrile as a polymerization initiator were dissolved in 6 mL of toluene.

The resultant solution was frozen with liquid nitrogen, and warmed to room temperature after repeating a 20 minute degassing of it three times. Then, the solution was heated in a nitrogen stream at oil temperature of 70° C. for 16 h. Then, the reaction was quenched by the addition of 600 mL of methanol. After being reprecipitated with methanol, the product was filtered and evaporated under reduced pressure thereby obtaining polycitronellyl methacrylate.

This polycitronellyl methacrylate was dissolved in cyclohexanone, and the resultant solution was coated on a quartz wafer to a film thickness of 1 μm. The resultant film was examined of its transparency to ArF excimer laser beam (193 nm).

The film was further measured of its etch rate by using carbon tetrafluoride ($CF_4$) gas. The evaluation of dry etch resistance was performed under the following conditions. Namely, the flow rate of $CF_4$ was adjusted to 12.6 sccm, vacuum degree to 10 mTorr and the output of microwave to 150 W.

Novolac resin and polymethacrylate were employed in place of polycitronellyl methacrylate and dissolved respectively into cyclohexanone to prepare Comparative Example (I-1) and Comparative Example (I-2).

These solutions of Comparative Example (I-1) and Comparative Example (I-2) were coated in the same manner as explained above on quartz wafer to examine the transparency of them to ArF excimer laser beam. Further, the etch rate of them using carbon tetrafluoride gas was also measured under the same conditions as mentioned above. The results were summarized in Table 4 shown below.

The etch rate of polymethacrylate was found to be 0.3 when the etch rate of PMMA was assumed to be 1.

TABLE 4

|  | Light transmittance (1 μm) | Etch resistance (relative value) |
| --- | --- | --- |
| This invention | 43% | 0.9 |
| Comparative example (I-1) | $10^{-28}$% | 3.9 |
| Comparative example (I-2) | 70% | 1 |

As clearly seen from Table 4, a polymer having terpenoid skeleton is high in transparency to the ArF excimer laser beam of 193 nm and excellent in dry etch resistance. Whereas, novolac resin is very low in transparency to the ArF excimer laser beam of 193 nm and PMMA is poor in dry etch resistance.

In the following Examples I-1 to I-3, copolymers containing citronellyl methacrylate obtained in the above Synthesis Example I-1 were respectively synthesized to prepare photosensitive materials containing the copolymer which were then examined of their properties.

Example I-1

9 g of citronellyl methacrylate and 1 g of glycidyl methacrylate and 0.5 g of azoisobutylonitrile as a polymerization initiator were dissolved in 30 mL of toluene.

The resultant solution was frozen with liquid nitrogen, and warmed to room temperature after repeating a 20 minute degassing of it three times. Then, the solution was heated in a nitrogen stream at oil temperature of 70° C. for 16 h. Then, the reaction was quenched by the addition of methanol. After being reprecipitated with methanol, the product was filtered and evaporated under vacuum thereby obtaining an aimed copolymer.

1 g of the copolymer thus obtained was dissolved in 9 mL of methyl 3-methoxypropionate and the resultant solution was coated on a silicon wafer to a thickness of 1 μm which was subsequently prebaked at 100° C. Then, the coated film was exposed to an electron beam (exposure dosage: 10 μCcm$^{-2}$, 20 keV), and then, developed in methyl ethyl ketone to form a pattern to which evaluation was made.

As result, it was found possible to form a negative line and space pattern of 0.5 μm in line width.

Example I-2

9 g of citronellyl methacrylate, 1 g of allyl methacrylate and 0.5 g of azoisobutylonitrile as a polymerization initiator were dissolved in 30 mL of toluene.

The resultant solution was frozen with liquid nitrogen, and warmed to room temperature after repeating a 20 minute degassing of it five times. Then, the solution was heated in a nitrogen stream at oil temperature of 70° C. for 16 h. Then, the reaction was quenched by the addition of methanol. After being reprecipitated with methanol, the product was filtered and evaporated under vacuum thereby obtaining an aimed copolymer.

The copolymer thus obtained was made into a solution in the same manner as explained in Example I-1, the resultant solution being coated on a silicon wafer, baked, exposed to an electron beam and then developed under the same conditions as explained in Example I-1 to form a pattern to which evaluation was made.

As result, it was found possible to form a negative line and space pattern of 0.5 μm in line width.

Example I-3

5 g of citronellyl methacrylate, 5 g of α-chlorofluoroethyl acrylate and 0.5 g of azoisobutylonitrile as a polymerization initiator were dissolved in 28 mL of tetrahydrofuran (hereinafter referred to as THF).

The resultant solution was frozen with liquid nitrogen, and warmed to room temperature after repeating a 20 minute degassing of it five times. Then, the solution was heated in a nitrogen stream at oil temperature of 60° C. for 16 hours. Then, the reaction was quenched by the addition of hexane. After being reprecipitated with hexane, the product was filtered and evaporated under vacuum thereby obtaining an aimed copolymer.

The copolymer thus obtained was made into a solution in the same manner as explained in Example I-1, the resultant solution being coated on a silicon wafer, baked, exposed to an electron beam under the same conditions as explained in Example I-1 and then developed using methylisobutylketone to form a pattern to which evaluation was made.

As result, it was found possible to form a positive line and space pattern of 0.5 μm in line width.

(Synthesis Example I-2)

A different kind of copolymer containing the monomer obtained in Synthesis Example I-1 was prepared, and the resultant copolymer was evaluated.

Citronellyl methacrylate, t-butyl methacrylate and methacrylic acid were mixed in the ratio of 50:30:20 to prepare 10 g of a mixture which was dissolved together with azoisobutylonitrile into 40 mL of THF.

The resultant solution was frozen with liquid nitrogen, and warmed to room temperature after repeating a 20 minute degassing of it five times. Then, the solution was heated in a nitrogen stream at oil temperature of 60° C. for 9 h. Then, the reaction was quenched by the addition of hexane. After being reprecipitated with hexane, the product was filtered and evaporated under vacuum thereby obtaining an aimed copolymer.

This copolymer was dissolved in cyclohexanone, and the resultant solution was coated on a quartz wafer to a film thickness of 1 μm. The resultant film was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA, finding that the etch rate of this copolymer was found to be 0.3 when the etch rate of PMMA was assumed to be 1, thus indicating the superiority of the copolymer over that of PMMA.

The evaluation of dry etch resistance was performed under the following conditions. Namely, the flow rate of $CF_4$ was adjusted to 12.6 sccm, vacuum degree to 10 mTorr and the output of microwave to 150 W.

In the following Examples I-4 to I-11, chemically amplified resists containing the copolymer obtained in the above Synthesis Example I-2 were respectively synthesized and were then examined of their properties.

Example I-4

2 g of the copolymer obtained in Example I-2 and 0.04 g of triphenylsulfonium triflate as a photo-acid generator were dissolved in 8 mL of 2-ethoxyethyl acetate.

The solution of copolymer thus obtained was coated on a silicon wafer to a film thickness of 0.8 μm and then prebaked at 100° C. After being exposed to ArF excimer laser beam (40 mJcm$^{-2}$), the film was developed in an aqueous solution of tetramethylammonium hydroxide to form a pattern to which evaluation was made. As result, it was found possible to form a line and space pattern of 0.15 μm in line width.

Further, the transparency and dry etch resistance of the coated film were evaluated in the same manner as in Synthesis Example I-1, finding the light transmittance of 60% and the etch resistance of 0.3, indicating superiority of this resist over PMMA.

Example I-5 to Example I-7

Photo-acid generator shown in Table 5 were respectively coated on a silicon wafer in the same manner as in Example I-4, and the processes of pre-bake, exposure and development were performed under the same conditions as in Example I-4, thereby forming patterns whose properties were subsequently evaluated. In each of these examples, the amount of the photo-acid generator was 0.05 g.

Further, the transparency and dry etch resistance of the coated films were evaluated in the same manner as in Synthesis Example I-1. The results are shown in Table 5 below. The etch rates in these examples were shown based on that of PMMA.

TABLE 5

| Example | Photo-acid generator | Light transmittance (1 μm) % | Etch rate (relative value) |
|---|---|---|---|
| I-5 | Diphenyl iodonium triflate | 59 | 0.3 |
| I-6 | NAT · 105 (Midori Kagaku Co., Ltd.) | 61 | 0.3 |
| I-7 | NAI · 105 (Midori Kagaku Co., Ltd.) | 60 | 0.3 |

As result, it was found possible to form a line and space pattern of 0.15 μm in line width in any of these examples.

Example I-8

2 g of the copolymer obtained in Example I-2, 0.04 g of triphenylsulfonium triflate as a photo-acid generator and 0.1 g of 3,3-bis-4'-t-butoxycarbonyloxynaphthalenyl-1(3H)-isobenzofuranone as a solubility-inhibitor were dissolved in 8 mL of 2-ethoxyethyl acetate.

The solution of copolymer thus obtained was coated on a silicon wafer to a film thickness of 0.8 μm and then prebaked at 100° C. After being exposed to ArF excimer laser beam (40 mJcm$^{-2}$), the film was developed in an aqueous solution of tetramethylammonium hydroxide to form a pattern to which evaluation was made. As result, it was found possible to form a line and space pattern of 0.15 μm in line width.

Further, the transparency and dry etch resistance of the coated film were evaluated in the same manner as in Synthesis Example I-1, finding the light transmittance of 55% and the etch resistance of 0.3, indicating superiority of this resist over PMMA.

Example I-9 to Example I-11

Photo-acid generator shown in Table 6 were respectively coated on a silicon wafer in the same manner as in Example I-8, and the processes of pre-bake, exposure and development were performed under the same conditions as in Example I-8, thereby forming patterns whose properties were subsequently evaluated. In each of these examples, the amount of the photo-acid generator was 0.05 g.

Further, the transparency and dry etch resistance of the coated films were evaluated in the same manner as in Synthesis Example I-1. The results are shown in Table 6 below. The etch rates in these examples were shown based on that of PMMA.

TABLE 6

| Example | Photo-acid generator | Light transmittance (1 μm) % | Etch rate (relative value) |
|---------|---------------------|------------------------------|---------------------------|
| I-9 | Diphenyl iodonium triflate | 59 | 0.3 |
| I-10 | NAT · 105 (Midori Kagaku Co., Ltd.) | 61 | 0.3 |
| I-11 | NAI · 105 (Midori Kagaku Co., Ltd.) | 60 | 0.3 |

As result, it was found possible to form a line and space pattern of 0.15 μm in line width in any of these examples.

In this invention, the monomer represented by the general formula (2), t-butylmethacrylate (a functional group to be decomposed by an acid) and methacrylate (an alkali-soluble group) may be mixed together in any ratio as long as the amount of these components fall within the shaded region in FIGURE.

(Synthesis Example I-3)

The synthesis described in the Synthesis Example I-1 was repeated excepting that citronellol was replaced by the same amount of pinocampheol thereby obtaining pinocamphyl methacrylate.

(Evaluation of homopolymer derived from the monomer obtained in Synthesis Example I-3)

Polypinocamphyl methacrylate was prepared in the same manner as in the Synthesis Example I-1 excepting the employment of pinocamphyl methacrylate as a monomer in this example. This polypinocamphyl methacrylate was dissolved in cyclohexanone, and the resultant solution was coated on a quartz wafer to examine of its transparency to ArF excimer laser beam (193 nm). As a result, the light transmittance of the polypinocamphyl methacrylate was 45% as measured by converting the film thickness to 1 μm.

The film was further measured of its etch rate by using carbon tetrafluoride ($CF_4$) gas under the same conditions as explained above. As a result, the etch rate of polypinocamphyl methacrylate was found to be 0.3 when the etch rate of PMMA was assumed to be 1.

In the following Examples I-12 to I-14, copolymers containing pinocamphyl methacrylate obtained in the above Synthesis Example I-3 were respectively synthesized to prepare photosensitive materials containing the copolymer which were then examined of their properties.

Example I-12

The preparation of copolymer performed in Synthesis Example I-1 was repeated except that citronellyl methacrylate was replaced by pinocamphyl methacrylate obtained in the above Synthesis Example I-3 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-13

The preparation of copolymer performed in Synthesis Example I-2 was repeated except that citronellyl methacrylate was replaced by pinocamphyl methacrylate obtained in the above Synthesis Example I-3 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 μm in line width.

Example I-14

The preparation of copolymer performed in Synthesis Example I-3 was repeated except that citronellyl methacrylate was replaced by pinocamphyl methacrylate obtained in the above Synthesis Example I-3 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-2, thereby forming patterns whose properties were subsequently evaluated.

As result, it was found possible to form a positive line and space pattern of 0.5 μm in line width.

(Synthesis Example I-4)

A different kind of copolymer containing the monomer obtained in Synthesis Example I-3 was prepared, and the resultant copolymer was evaluated.

Namely, the preparation of copolymer performed in Synthesis Example I-2 was repeated except that citronellyl methacrylate was replaced by pinocamphyl methacrylate thereby obtaining a copolymer, which was then dissolved in cyclohexanone. The film formed using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA, finding that the etch rate of this copolymer was found to be 0.3 when the etch rate of PMMA was assumed to be 1, thus indicating the superiority of the copolymer over that of PMMA.

In the following Examples I-15 to I-22, chemically amplified resists containing the copolymer obtained in the above Synthesis Example I-4 were respectively synthesized and were then examined of their properties.

Example I-15 to Example I-18

The preparation of chemically amplified resists as performed in (Example I-4) to (Example I-7) were repeated except that the copolymer of Synthesis Example I-2 was replaced by the copolymer obtained in Synthesis Example I-4. Using the resists, patterns were formed in the same manner as explained above, and the properties of these patterns were evaluated.

Further, as in the case of Synthesis Example I-1, the transparency and dry etch resistance were evaluated. The results obtained were summarized in Table 7 below together with the photo-acid generator employed. The values of etch rate were based on that of PMMA.

TABLE 7

| Example | Photo-acid generator | Light transmittance (1 μm) % | Etch rate (relative value) |
| --- | --- | --- | --- |
| I-15 | Triphenyl sulfonium triflate | 60 | 0.3 |
| I-16 | Diphenyl iodonium triflate | 59 | 0.3 |
| I-17 | NAT · 105 (Midori Kagaku Co., Ltd.) | 61 | 0.3 |
| I-18 | NAI · 105 (Midori Kagaku Co., Ltd.) | 60 | 0.3 |

As a result, it was found possible to form a line and space pattern of 0.15 μm in line width in any of examples.

Example I-19 to Example I-22

The preparation of chemically amplified resists as performed in (Example I-8) to (Example I-11) were repeated except that the copolymer of Synthesis Example I-2 was replaced by the copolymer obtained in Synthesis Example I-4. Using the resists, patterns were formed in the same manner as explained above, and the properties of these patterns were evaluated.

Further, as in the case of Synthesis Example I-1, the transparency and dry etch resistance were evaluated. The results obtained were summarized in Table 8 below together with the photo-acid generator employed. The values of etch rate were based on that of PMMA.

TABLE 8

| Example | Photo-acid generator | Light transmittance (1 μm) % | Etch rate (relative value) |
| --- | --- | --- | --- |
| I-19 | Triphenyl sulfonium triflate | 55 | 0.3 |
| I-20 | Diphenyl iodonium triflate | 59 | 0.3 |
| I-21 | NAT · 105 (Midori Kagaku Co., Ltd.) | 61 | 0.3 |
| I-22 | NAI · 105 (Midori Kagaku Co., Ltd.) | 60 | 0.3 |

As a result, it was found possible to form a line and space pattern of 0.15 μm in line width in any of examples.
(Synthesis Example I-5)

The synthesis described in the Synthesis Example I-1 was repeated excepting that citronellol was replaced by the same amount of geraniol thereby obtaining geranyl methacrylate. (Evaluation of homopolymer derived from the monomer obtained in Synthesis Example I-5)

Polygeranyl methacrylate was prepared in the same manner as in the Synthesis Example I-1 excepting the employment of geranyl methacrylate as a monomer in this example. This polygeranyl methacrylate was dissolved in cyclohexanone, and the resultant solution was coated on a quartz wafer to examine of its transparency to ArF excimer laser beam (193 nm). As a result, the light transmittance of the polygeranyl methacrylate was 45% as measured by converting the film thickness to 1 μm.

The film was further measured of its etch rate by using carbon tetrafluoride ($CF_4$) gas under the same conditions as explained above. As a result, the etch rate of polygeranyl methacrylate was found to be 0.3 when the etch rate of PMMA was assumed to be 1.

In the following Examples I-23 to I-25, copolymers containing geranyl methacrylate obtained in the above Synthesis Example I-5 were respectively synthesized to prepare photosensitive materials containing the copolymers which were then examined of their properties.

Example I-23

The preparation of copolymer performed in Synthesis Example I-1 was repeated except that citronellyl methacrylate was replaced by geranyl methacrylate obtained in the above Synthesis Example I-5 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-24

The preparation of copolymer performed in Synthesis Example I-2 was repeated except that citronellyl methacrylate was replaced by geranyl methacrylate obtained in the above Synthesis Example I-5 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-25

The preparation of copolymer performed in Synthesis Example I-3 was repeated except that citronellyl methacrylate was replaced by geranyl methacrylate obtained in the above Synthesis Example I-5 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-1, thereby forming patterns whose properties were subsequently evaluated.

As result, it was found possible to form a positive line and space pattern of 0.5 μm in line width.
(Synthesis Example I-6)

A different kind of copolymer containing the monomer obtained in Synthesis Example I-5 was prepared, and the resultant copolymer was evaluated.

Namely, the preparation of copolymer performed in Synthesis Example I-2 was repeated except that citronellyl methacrylate was replaced by geranyl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-26 to I-33, chemically amplified resists containing the copolymer obtained in the above Synthesis Example I-6 were respectively synthesized and were examined of their properties.

Example I-26 to Example I-29

The preparation of chemically amplified resists as performed in (Example I-4) to (Example I-7) were repeated except that the copolymer of Synthesis Example I-2 was replaced by the copolymer obtained in Synthesis Example I-6. Using the resists, patterns were formed in the same manner as explained above, and the properties of these patterns were evaluated.

Further, as in the case of Synthesis Example I-1, the transparency and dry etch resistance were evaluated. The results obtained were summarized in Table 9 below together with the photo-acid generator employed. The values of etch rate were based on that of PMMA.

TABLE 9

| Example | Photo-acid generator | Light transmittance (1 μm) % | Etch rate (relative value) |
|---|---|---|---|
| I-26 | Triphenyl sulfonium triflate | 60 | 0.3 |
| I-27 | Diphenyl iodonium triflate | 59 | 0.3 |
| I-28 | NAT · 105 (Midori Kagaku Co., Ltd.) | 61 | 0.3 |
| I-29 | NAI · 105 (Midori Kagaku Co., Ltd.) | 60 | 0.3 |

As a result, it was found possible to form a line and space pattern of 0.15 μm in line width in any of examples.

Example I-30 to Example I-33

The preparation of chemically amplified resists as performed in (Example I-8) to (Example I-11) were repeated except that the copolymer of Synthesis Example I-2 was replaced by the copolymer obtained in Synthesis Example I-6. Using the resists, patterns were formed in the same manner as explained above, and the properties of these patterns were evaluated.

Further, as in the case of Synthesis Example I-1, the transparency and dry etch resistance were evaluated. The results obtained were summarized in Table 10 below together with the photo-acid generator employed. The values of etch rate were based on that of PMMA.

TABLE 10

| Example | Photo-acid generator | Light transmittance (1 μm) % | Etch rate (relative value) |
|---|---|---|---|
| I-30 | Triphenyl sulfonium triflate | 55 | 0.3 |
| I-31 | Diphenyl iodonium triflate | 59 | 0.3 |
| I-32 | NAT · 105 (Midori Kagaku Co., Ltd.) | 61 | 0.3 |
| I-33 | NAI · 105 (Midori Kagaku Co., Ltd.) | 60 | 0.3 |

As a result, it was found possible to form a line and space pattern of 0.15 μm in line width in any of examples.

(Synthesis Example I-7)

The synthesis described in the Synthesis Example I-1 was repeated excepting that citronellol was replaced by the same amount of fenchyl alcohol thereby obtaining fenchyl methacrylate.

(Evaluation of homopolymer derived from the monomer obtained in Synthesis Example I-7)

Polyfenchyl methacrylate was prepared in the same manner as in the Synthesis Example I-1 excepting the employment of fenchyl methacrylate as a monomer in this example. This polyfenchyl methacrylate was dissolved in cyclohexanone, and the resultant solution was coated on a quartz wafer to examine of its transparency to ArF excimer laser beam (193 nm). As a result, the light transmittance of the polyfenchyl methacrylate was 45% as measured by converting the film thickness to 1 μm.

The film was further measured of its etch rate by using carbon tetrafluoride ($CF_4$) gas under the same conditions as explained above. As a result, the etch rate of polyfenchyl methacrylate was found to be 0.3 when the etch rate of PMMA was assumed to be 1.

In the following Examples I-34 to I-36, copolymers containing fenchyl methacrylate obtained in the above Synthesis Example I-7 were respectively synthesized to prepare photosensitive materials containing the copolymer which were then examined of their properties.

Example I-34

The preparation of copolymer performed in Synthesis Example I-1 was repeated except that citronellyl methacrylate was replaced by fenchyl methacrylate obtained in the above Synthesis Example I-7 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-35

The preparation of copolymer performed in Synthesis Example I-2 was repeated except that citronellyl methacrylate was replaced by fenchyl methacrylate obtained in the above Synthesis Example I-7 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 μm in line width.

Example I-36

The preparation of copolymer performed in Synthesis Example I-3 was repeated except that citronellyl methacrylate was replaced by fenchyl methacrylate obtained in the above Synthesis Example I-7 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As result, it was found possible to form a positive line and space pattern of 0.5 μm in line width.

(Synthesis Example I-8)

A different kind of copolymer containing the monomer obtained in Synthesis Example I-7 was prepared, and the resultant copolymer was evaluated.

Namely, the preparation of copolymer performed in Synthesis Example I-2 was repeated except that citronellyl methacrylate was replaced by fenchyl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-37 to I-44, chemically amplified resists containing the copolymer obtained in the above Synthesis Example I-8 were respectively synthesized and were examined of their properties.

Example I-37 to Example I-40

The preparation of chemically amplified resists as performed in (Example I-4) to (Example I-7) were repeated except that the copolymer of Synthesis Example I-2 was replaced by the copolymer obtained in Synthesis Example I-8. Using the resists, patterns were formed in the same manner as explained above, and the properties of these patterns were evaluated.

Further, as in the case of Synthesis Example I-1, the transparency and dry etch resistance were evaluated. The results obtained were summarized in Table 11 below together with the photo-acid generators employed. The values of etch rate were based on that of PMMA.

TABLE 11

| Example | Photo-acid generator | Light transmittance (1 μm) % | Etch rate (relative value) |
|---|---|---|---|
| I-37 | Triphenyl sulfonium triflate | 60 | 0.3 |
| I-38 | Diphenyl iodonium triflate | 59 | 0.3 |
| I-39 | NAT · 105 (Midori Kagaku Co., Ltd.) | 61 | 0.3 |
| I-40 | NAI · 105 (Midori Kagaku Co., Ltd.) | 60 | 0.3 |

As a result, it was found possible to form a line and space pattern of 0.15 μm in line width in any of examples.

Example I-41 to Example I-44

The preparation of chemically amplified resists as performed in (Example I-8) to (Example I-11) were repeated except that the copolymer of Synthesis Example I-2 was replaced by the copolymer obtained in Synthesis Example I-8. Using the resists, patterns were formed in the same manner as explained above, and the properties of these patterns were evaluated.

Further, as in the case of Synthesis Example I-1, the transparency and dry etch resistance were evaluated. The results obtained were summarized in Table 12 below together with the photo-acid generator employed. The values of etch rate were based on that of PMMA.

TABLE 12

| Example | Photo-acid generator | Light transmittance (1 μm) % | Etch rate (relative value) |
|---|---|---|---|
| I-41 | Triphenyl sulfonium triflate | 55 | 0.3 |
| I-42 | Diphenyl iodonium triflate | 59 | 0.3 |
| I-43 | NAT · 105 (Midori Kagaku Co., Ltd.) | 61 | 0.3 |
| I-44 | NAI · 105 (Midori Kagaku Co., Ltd.) | 60 | 0.3 |

As a result, it was found possible to form a line and space pattern of 0.15 μm in line width in any of examples.

(Synthesis Example I-9)

The synthesis described in the Synthesis Example I-1 was repeated excepting that citronellol was replaced by the same amount of nerol thereby obtaining neryl methacrylate.

(Evaluation of homopolymer derived from the monomer obtained in Synthesis Example I-9)

Polyneryl methacrylate was prepared in the same manner as in the Synthesis Example I-1 excepting the employment of neryl methacrylate as a monomer in this example. This polyneryl methacrylate was dissolved in cyclohexanone, and the resultant solution was coated on a quartz wafer to examine of its transparency to ArF excimer laser beam (193 nm). As a result, the light transmittance of the polyneryl methacrylate was 45% as measured by converting the film thickness to 1 μm.

The film was further measured of its etch rate by using carbon tetrafluoride (CF$_4$) gas under the same conditions as explained above. As a result, the etch rate of polyneryl methacrylate was found to be 0.3 when the etch rate of PMMA was assumed to be 1.

In the following Examples I-45 to I-47, copolymers containing neryl methacrylate obtained in the above Synthesis Example I-9 were respectively synthesized to prepare photosensitive materials containing the copolymer which were then examined of their properties.

Example I-45

The preparation of copolymer performed in Synthesis Example I-1 was repeated except that citronellyl methacrylate was replaced by neryl methacrylate obtained in the above Synthesis Example I-9 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-46

The preparation of copolymer performed in Synthesis Example I-2 was repeated except that citronellyl methacrylate was replaced by neryl methacrylate obtained in the above Synthesis Example I-9 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 μm in line width.

Example I-47

The preparation of copolymer performed in Synthesis Example I-3 was repeated except that citronellyl methacrylate was replaced by neryl methacrylate obtained in the above Synthesis Example I-9 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As result, it was found possible to form a positive line and space pattern of 0.5 μm in line width.

(Synthesis Example I-10)

A different kind of copolymer containing the monomer obtained in Synthesis Example I-9 was prepared, and the resultant copolymer was evaluated.

Namely, the preparation of copolymer performed in Synthesis Example I-2 was repeated except that citronellyl methacrylate was replaced by neryl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride (CF$_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-48 to I-55, chemically amplified resists containing the copolymer obtained in the above Synthesis Example I-10 were respectively synthesized and were examined of their properties.

Example I-48 to Example I-51

The preparation of chemically amplified resists as performed in (Example I-4) to (Example I-7) were repeated except that the copolymer of Synthesis Example I-2 was replaced by the copolymer obtained in Synthesis Example I-10. Using the resists, patterns were formed in the same manner as explained above, and the properties of these patterns were evaluated.

Further, as in the case of Synthesis Example I-1, the transparency and dry etch resistance were evaluated. The results obtained were summarized in Table 13 below together with the photo-acid generator employed. The values of etch rate were based on that of PMMA.

TABLE 13

| Example | Photo-acid generator | Light transmittance (1 μm) % | Etch rate (relative value) |
|---------|----------------------|------------------------------|----------------------------|
| I-48 | Triphenyl sulfonium triflate | 60 | 0.3 |
| I-49 | Diphenyl iodonium triflate | 59 | 0.3 |
| I-50 | NAT · 105 (Midori Kagaku Co., Ltd.) | 61 | 0.3 |
| I-51 | NAI · 105 (Midori Kagaku Co., Ltd.) | 60 | 0.3 |

As a result, it was found possible to form a line and space pattern of 0.15 μm in line width in any of examples.

Example I-52 to Example I-55

The preparation of chemically amplified resists as performed in (Example I-8) to (Example I-11) were repeated except that the copolymer of Synthesis Example I-2 was replaced by the copolymer obtained in Synthesis Example I-10. Using the resists, patterns were formed in the same manner as explained above, and the properties of these patterns were evaluated.

Further, as in the case of Synthesis Example I-1, the transparency and dry etch resistance were evaluated. The results obtained were summarized in Table 14 below together with the photo-acid generator employed. The values of etch rate were based on that of PMMA.

TABLE 14

| Example | Photo-acid generator | Light transmittance (1 μm) % | Etch rate (relative value) |
|---|---|---|---|
| I-52 | Triphenyl sulfonium triflate | 55 | 0.3 |
| I-53 | Diphenyl iodonium triflate | 59 | 0.3 |
| I-54 | NAT · 105 (Midori Kagaku Co., Ltd.) | 61 | 0.3 |
| I-55 | NAI · 105 (Midori Kagaku Co., Ltd.) | 60 | 0.3 |

As a result, it was found possible to form a line and space pattern of 0.15 μm in line width in any of examples.
(Synthesis Example I-11)

The synthesis described in the Synthesis Example I-1 was repeated excepting that citronellol was replaced by the same amount of borneol thereby obtaining bornyl methacrylate.
(Evaluation of homopolymer derived from the monomer obtained in Synthesis Example I-11)

Polybornyl methacrylate was prepared in the same manner as in the Synthesis Example I-1 excepting the employment of bornyl methacrylate as a monomer in this example. This polybornyl methacrylate was dissolved in cyclohexanone, and the resultant solution was coated on a quartz wafer to examine of its transparency to ArF excimer laser beam (193 nm). As a result, the light transmittance of the polybornyl methacrylate was 45% as measured by converting the film thickness to 1 μm.

The film was further measured of its etch rate by using carbon tetrafluoride (CF$_4$) gas under the same conditions as explained above. As a result, the etch rate of polybornyl methacrylate was found to be 0.3 when the etch rate of PMMA was assumed to be 1.

In the following Examples I-56 to I-58, copolymers containing bornyl methacrylate obtained in the above Synthesis Example I-11 were respectively synthesized to prepare photosensitive materials containing the copolymer which were then examined of their properties.

Example I-56

The preparation of copolymer performed in Synthesis Example I-1 was repeated except that citronellyl methacrylate was replaced by bornyl methacrylate obtained in the above Synthesis Example I-11 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated As result, it was found possible to form a negative line and space pattern of 0.5 μm in line width.

Example I-57

The preparation of copolymer performed in Synthesis Example I-2 was repeated except that citronellyl methacrylate was replaced by bornyl methacrylate obtained in the above Synthesis Example I-11 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 μm in line width.

Example I-58

The preparation of copolymer perform ed in Synthesis Example I-3 was repeated except that citronellyl methacrylate was replaced by bornyl methacrylate obtained in the above Synthesis Example I-11 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As result, it was found possible to form a positive line and space pattern of 0.5 μm in line width.
(Synthesis Example I-12)

A different kind of copolymer containing the monomer obtained in Synthesis Example I-11 was prepared, and the resultant copolymer was evaluated.

Namely, the preparation of copolymer performed in Synthesis Example I-2 was repeated except that citronellyl methacrylate was replaced by bornyl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride (CF$_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-59 to I-66, chemically amplified resists containing the copolymer obtained in the above Synthesis Example I-12 were respectively synthesized and were examined of their properties.

Example I-59 to Example I-62

The preparation of chemically amplified resists as performed in (Example I-4) to (Example I-7) were repeated except that the copolymer of Synthesis Example I-2 was replaced by the copolymer obtained in Synthesis Example I-12. Using the resists, patterns were formed in the same manner as explained above, and the properties of these patterns were evaluated.

Further, as in the case of Synthesis Example I-1, the transparency and dry etch resistance were evaluated. The results obtained were summarized in Table 15 below together with the photo-acid generator employed. The values of etch rate were based on that of PMMA.

TABLE 15

| Example | Photo-acid generator | Light transmittance (1 μm) % | Etch rate (relative value) |
|---|---|---|---|
| I-59 | Triphenyl sulfonium triflate | 60 | 0.3 |
| I-60 | Diphenyl iodonium triflate | 59 | 0.3 |
| I-61 | NAT · 105 (Midori Kagaku Co., Ltd.) | 61 | 0.3 |
| I-62 | NAI · 105 (Midori Kagaku Co., Ltd.) | 60 | 0.3 |

As a result, it was found possible to form a line and space pattern of 0.15 μm in line width in any of examples.

Example I-63 to Example I-66

The preparation of chemically amplified resists as performed in (Example I-8) to (Example I-11) were repeated except that the copolymer of Synthesis Example I-2 was replaced by the copolymer obtained in Synthesis Example I-12. Using the resists, patterns were formed in the same manner as explained above, and the properties of these patterns were evaluated.

Further, as in the case of Synthesis Example I-1, the transparency and dry etch resistance were evaluated. The results obtained were summarized in Table 16 below together with the photo-acid generator employed. The values of etch rate were based on that of PMMA.

TABLE 16

| Example | Photo-acid generator | Light transmittance (1 μm) % | Etch rate (relative value) |
|---|---|---|---|
| I-63 | Triphenyl sulfonium triflate | 55 | 0.3 |
| I-64 | Diphenyl iodonium triflate | 59 | 0.3 |
| I-65 | NAT · 105 (Midori Kagaku Co., Ltd.) | 61 | 0.3 |
| I-66 | NAI · 105 (Midori Kagaku Co., Ltd.) | 60 | 0.3 |

As a result, it was found possible to form a line and space pattern of 0.15 μm in line width in any of examples.
(Synthesis Example I-13)

The synthesis described in the Synthesis Example I-1 was repeated excepting that citronellol was replaced by the same amount of cinerol thereby obtaining cineryl methacrylate.
(Evaluation of homopolymer derived from the monomer obtained in Synthesis Example I-13)

Polycineryl methacrylate was prepared in the same manner as in the Synthesis Example I-1 excepting the employment of cineryl methacrylate as a monomer in this example. This polycineryl methacrylate was dissolved in cyclohexanone, and the resultant solution was coated on a quartz wafer to examine of its transparency to ArF excimer laser beam (193 nm). As a result, the light transmittance of the polycineryl methacrylate was 45% as measured by converting the film thickness to 1 μm.

The film was further measured of its etch rate by using carbon tetrafluoride ($CF_4$) gas under the same conditions as explained above. As a result, the etch rate of polycineryl methacrylate was found to be 0.3 when the etch rate of PMMA was assumed to be 1.

In the following Examples I-67 to I-69, copolymers containing cineryl methacrylate obtained in the above Synthesis Example I-13 were respectively synthesized to prepare photosensitive materials containing the copolymer which were then examined of their properties.

Example I-67

The preparation of copolymer performed in Synthesis Example I-1 was repeated except that citronellyl methacrylate was replaced by cineryl methacrylate obtained in the above Synthesis Example I-13 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-68

The preparation of copolymer performed in Synthesis Example I-2 was repeated except that citronellyl methacrylate was replaced by cineryl methacrylate obtained in the above Synthesis Example I-13 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 μm in line width.

Example I-69

The preparation of copolymer performed in Synthesis Example I-3 was repeated except that citronellyl methacrylate was replaced by cineryl methacrylate obtained in the above Synthesis Example I-13 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As result, it was found possible to form a positive line and space pattern of 0.5 an in line width.
(Synthesis Example I-14)

A different kind of copolymer containing the monomer obtained in Synthesis Example I-13 was prepared, and the resultant copolymer was evaluated.

Namely, the preparation of copolymer performed in Synthesis Example I-2 was repeated except that citronellyl methacrylate was replaced by cineryl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-70 to I-77, chemically amplified resists containing the copolymer obtained in the above Synthesis Example I-14 were respectively synthesized and were examined of their properties.

Example I-70 to Example I-73

The preparation of chemically amplified resists as performed in (Example I-4) to (Example I-7) were repeated except that the copolymer of Synthesis Example I-2 was replaced by the copolymer obtained in Synthesis Example I-14. Using the resists, patterns were formed in the same manner as explained above, and the properties of these patterns were evaluated.

Further, as in the case of Synthesis Example I-1, the transparency and dry etch resistance were evaluated. The results obtained were summarized in Table 17 below together with the photo-acid generator employed. The values of etch rate were based on that of PMMA.

TABLE 17

| Example | Photo-acid generator | Light transmittance (1 μm) % | Etch rate (relative value) |
| --- | --- | --- | --- |
| I-70 | Triphenyl sulfonium triflate | 60 | 0.3 |
| I-71 | Diphenyl iodonium triflate | 59 | 0.3 |
| I-72 | NAT · 105 (Midori Kagaku Co., Ltd.) | 61 | 0.3 |
| I-73 | NAI · 105 (Midori Kagaku Co., Ltd.) | 60 | 0.3 |

As a result, it was found possible to form a line and space pattern of 0.15 μm in line width in any of examples.

Example I-74 to Example I-77

The preparation of chemically amplified resists as performed in (Example I-8) to (Example I-11) were repeated except that the copolymer of Synthesis Example I-2 was replaced by the copolymer obtained in Synthesis Example I-14. Using the resists, patterns were formed in the same manner as explained above, and the properties of these patterns were evaluated.

Further, as in the case of Synthesis Example I-1, the transparency and dry etch resistance were evaluated. The results obtained were summarized in Table 18 below together with the photo-acid generator employed. The values of etch rate were based on that of PMMA.

TABLE 18

| Example | Photo-acid generator | Light transmittance (1 μm) % | Etch rate (relative value) |
| --- | --- | --- | --- |
| I-74 | Triphenyl triflate sulfonium | 55 | 0.3 |
| I-75 | Diphenyl iodonium triflate | 59 | 0.3 |
| I-76 | NAT · 105 (Midori Kagaku Co., Ltd.) | 61 | 0.3 |
| I-77 | NAI · 105 (Midori Kagaku Co., Ltd.) | 60 | 0.3 |

As a result, it was found possible to form a line and space pattern of 0.15 μm in line width in any of examples.
(Synthesis Example I-15)

The synthesis described in the Synthesis Example I-1 was repeated excepting that citronellol was replaced by the same amount of pinol thereby obtaining pinyl methacrylate.
(Evaluation of homopolymer derived from the monomer obtained in Synthesis Example I-15)

Polypinyl methacrylate was prepared in the same manner as in the Synthesis Example I-1 excepting the employment of pinyl methacrylate as a monomer in this example. This polypinyl methacrylate was dissolved in cyclohexanone, and the resultant solution was coated on a quartz wafer to examine of its transparency to ArF excimer laser beam (193 nm). As a result, the light transmittance of the polypinyl methacrylate was 45% as measured by converting the film thickness to 1 μm.

The film was further measured of its etch rate by using carbon tetrafluoride ($CF_4$) gas under the same conditions as explained above. As a result, the etch rate of polypinyl methacrylate was found to be 0.3 when the etch rate of PMMA was assumed to be 1.

In the following Examples I-78 to I-80, copolymers containing pinyl methacrylate obtained in the above Synthesis Example I-15 were respectively synthesized to prepare photosensitive materials containing the copolymer which were then examined of their properties.

Example I-78

The preparation of copolymer performed in Synthesis Example I-1 was repeated except that citronellyl methacrylate was replaced by pinyl methacrylate obtained in the above Synthesis Example I-15 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-79

The preparation of copolymer performed in Synthesis Example I-2 was repeated except that citronellyl methacrylate was replaced by pinyl methacrylate obtained in the above Synthesis Example I-15 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 μm in line width.

Example I-80

The preparation of copolymer performed in Synthesis Example I-3 was repeated except that citronellyl methacrylate was replaced by pinyl methacrylate obtained in the above Synthesis Example I-15 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As result, it was found possible to form a positive line and space pattern of 0.5 μm in line width.

(Synthesis Example I-16)

A different kind of copolymer containing the monomer obtained in Synthesis Example I-15 was prepared, and the resultant copolymer was evaluated.

Namely, the preparation of copolymer performed in Synthesis Example I-2 was repeated except that citronellyl methacrylate was replaced by pinyl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of The film was further measured of its etch rate by using carbon tetrafluoride ($CF_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-81 to I-88, chemically amplified resists containing the copolymer obtained in the above Synthesis Example I-16 were respectively synthesized and were examined of their properties.

Example I-81 to Example I-84

The preparation of chemically amplified resists as performed in (Example I-4) to (Example I-7) were repeated except that the copolymer of Synthesis Example I-2 was replaced by the copolymer obtained in Synthesis Example I-16. Using the resists, patterns were formed in the same manner as explained above, and the properties of these patterns were evaluated.

Further, as in the case of Synthesis Example I-1, the transparency and dry etch resistance were evaluated. The results obtained were summarized in Table 19 below together with the photo-acid generator employed. The values of etch rate were based on that of PMMA.

TABLE 19

| Example | Photo-acid generator | Light transmittance (1 μm) % | Etch rate (relative value) |
| --- | --- | --- | --- |
| I-81 | Triphenyl sulfonium triflate | 60 | 0.3 |
| I-82 | Diphenyl iodonium triflate | 59 | 0.3 |
| I-83 | NAT · 105 (Midori Kagaku Co., Ltd.) | 61 | 0.3 |
| I-84 | NAI · 105 (Midori Kagaku Co., Ltd.) | 60 | 0.3 |

As a result, it was found possible to form a line and space pattern of 0.15 μm in line width in any of examples.

Example I-85 to Example I-88

The preparation of chemically amplified resists as performed in (Example I-8) to (Example I-11) were repeated except that the copolymer of Synthesis Example I-2 was replaced by the copolymer obtained in Synthesis Example I-16. Using the resists, patterns were formed in the same manner as explained above, and the properties of these patterns were evaluated.

Further, as in the case of Synthesis Example I-1, the transparency and dry etch resistance were evaluated. The results obtained were summarized in Table 20 below together with the photo-acid generator employed. The values of etch rate were based on that of PMMA.

TABLE 20

| Example | Photo-acid generator | Light transmittance (1 μm) % | Etch rate (relative value) |
| --- | --- | --- | --- |
| I-85 | Triphenyl sulfonium triflate | 55 | 0.3 |
| I-86 | Diphenyl iodonium triflate | 59 | 0.3 |
| I-87 | NAT · 105 (Midori Kagaku Co., Ltd.) | 61 | 0.3 |
| I-88 | NAI · 105 (Midori Kagaku Co., Ltd.) | 60 | 0.3 |

As a result, it was found possible to form a line and space pattern of 0.15 μm in line width in any of examples.
(Synthesis Example I-17)

The synthesis described in the Synthesis Example I-1 was repeated excepting that citronellol was replaced by the same amount of ascaridole thereby obtaining ascaridyl methacrylate.

(Evaluation of homopolymer derived from the monomer obtained in Synthesis Example I-17)

Polyascaridyl methacrylate was prepared in the same manner as in the Synthesis Example I-1 excepting the employment of ascaridyl methacrylate as a monomer in this example. This polyascaridyl methacrylate was dissolved in cyclohexanone, and the resultant solution was coated on a quartz wafer to examine of its transparency to ArF excimer laser beam (193 nm). As a result, the light transmittance of the polyascaridyl methacrylate was 45% as measured by converting the film thickness to 1 μm.

The film was further measured of its etch rate by using carbon tetrafluoride ($CF_4$) gas under the same conditions as explained above. As a result, the etch rate of polyascaridyl methacrylate was found to be 0.3 when the etch rate of PMMA was assumed to be 1.

In the following Examples I-89 to I-91, copolymers containing ascaridyl methacrylate obtained in the above Synthesis Example I-17 were respectively synthesized to prepare photosensitive materials containing the copolymer which were then examined of their properties.

Example I-89

The preparation of copolymer performed in Synthesis Example I-1 was repeated except that citronellyl methacrylate was replaced by ascaridyl methacrylate obtained in the above Synthesis Example I-17 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-90

The preparation of copolymer performed in Synthesis Example I-2 was repeated except that citronellyl methacrylate was replaced by ascaridyl methacrylate obtained in the above Synthesis Example I-17 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 μm in line width.

Example I-91

The preparation of copolymer performed in Synthesis Example I-3 was repeated except that citronellyl methacrylate was replaced by ascaridyl methacrylate obtained in the above Synthesis Example I-17 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As result, it was found possible to form a positive line and space pattern of 0.5 μm in line width.
(Synthesis Example I-18)

A different kind of copolymer containing the monomer obtained in Synthesis Example I-17 was prepared, and the resultant copolymer was evaluated.

Namely, the preparation of copolymer performed in Synthesis Example I-2 was repeated except that citronellyl methacrylate was replaced by ascaridyl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-92 to I-99, chemically amplified resists containing the copolymer obtained in the above Synthesis Example I-18 were respectively synthesized and were examined of their properties.

Example I-92 to Example I-95

The preparation of chemically amplified resists as performed in (Example I-4) to (Example I-7) were repeated except that the copolymer of Synthesis Example I-2 was replaced by the copolymer obtained in Synthesis Example I-18. Using the resists, patterns were formed in the same manner as explained above, and the properties of these patterns were evaluated.

Further, as in the case of Synthesis Example I-1, the transparency and dry etch resistance were evaluated. The results obtained were summarized in Table 21 below together with the photo-acid generator employed. The values of etch rate were based on that of PMMA.

TABLE 21

| Example | Photo-acid generator | Light transmittance (1 μm) % | Etch rate (relative value) |
|---------|----------------------|------------------------------|----------------------------|
| I-92 | Triphenyl sulfonium triflate | 60 | 0.3 |
| I-93 | Diphenyl iodonium triflate | 59 | 0.3 |
| I-94 | NAT · 105 (Midori Kagaku Co., Ltd.) | 61 | 0.3 |
| I-95 | NAI · 105 (Midori Kagaku Co., Ltd.) | 60 | 0.3 |

As a result, it was found possible to form a line and space pattern of 0.15 μm in line width in any of examples.

Example I-96 to Example I-99

The preparation of chemically amplified resists as performed in (Example I-8) to (Example I-11) were repeated except that the copolymer of Synthesis Example I-2 was replaced by the copolymer obtained in Synthesis Example I-18. Using the resists, patterns were formed in the same manner as explained above, and the properties of these patterns were evaluated.

Further, as in the case of Synthesis Example I-1, the transparency and dry etch resistance were evaluated. The results obtained were summarized in Table 22 below together with the photo-acid generator employed. The values of etch rate were based on that of PMMA.

TABLE 22

| Example | Photo-acid generator | Light transmittance (1 μm) % | Etch rate (relative value) |
| --- | --- | --- | --- |
| I-96 | Triphenyl sulfonium triflate | 55 | 0.3 |
| I-97 | Diphenyl iodonium triflate | 59 | 0.3 |
| I-98 | NAT · 105 (Midori Kagaku Co., Ltd.) | 61 | 0.3 |
| I-99 | NAI · 105 (Midori Kagaku Co., Ltd.) | 60 | 0.3 |

As a result, it was found possible to form a line and space pattern of 0.15 μm in line width in any of examples.
(Synthesis Example I-19)

The synthesis described in the Synthesis Example I-1 was repeated excepting that citronellol was replaced by the same amount of farnesol thereby obtaining farnesyl methacrylate.
(Evaluation of homopolymer derived from the monomer obtained in Synthesis Example I-19)

Polyfarnesyl methacrylate was prepared in the same manner as in the Synthesis Example I-1 excepting the employment of farnesyl methacrylate as a monomer in this example. This polyfarnesyl methacrylate was dissolved in cyclohexanone, and the resultant solution was coated on a quartz wafer to examine of its transparency to ArF excimer laser beam (193 nm). As a result, the light transmittance of the polyfarnesyl methacrylate was 45% as measured by converting the film thickness to 1 μm.

The film was further measured of its etch rate by using carbon tetrafluoride ($CF_4$) gas under the same conditions as explained above. As a result, the etch rate of polyfarnesyl methacrylate was found to be 0.3 when the etch rate of PMMA was assumed to be 1.

In the following Examples I-100 to I-102, copolymers containing farnesyl methacrylate obtained in the above Synthesis Example I-19 were respectively synthesized to prepare photosensitive materials containing the copolymer which were then examined of their properties.

Example I-100

The preparation of copolymer performed in Synthesis Example I-1 was repeated except that citronellyl methacrylate was replaced by farnesyl methacrylate obtained in the above Synthesis Example I-19 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-101

The preparation of copolymer performed in Synthesis Example I-2 was repeated except that citronellyl methacrylate was replaced by farnesyl methacrylate obtained in the above Synthesis Example I-19 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 μm in line width.

Example I-102

The preparation of copolymer performed in Synthesis Example I-3 was repeated except that citronellyl methacrylate was replaced by farnesyl methacrylate obtained in the above Synthesis Example I-19 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As result, it was found possible to form a positive line and space pattern of 0.5 μm in line width.
(Synthesis Example I-20)

A different kind of copolymer containing the monomer obtained in Synthesis Example I-19 was prepared, and the resultant copolymer was evaluated.

Namely, the preparation of copolymer performed in Synthesis Example I-2 was repeated except that citronellyl methacrylate was replaced by farnesyl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-103 to I-110, chemically amplified resists containing the copolymer obtained in the above Synthesis Example I-20 were respectively synthesized and were examined of their properties.

Example I-103 to Example I-106

The preparation of chemically amplified resists as performed in (Example I-4) to (Example I-7) were repeated except that the copolymer of Synthesis Example I-2 was replaced by the copolymer obtained in Synthesis Example I-20. Using the resists, patterns were formed in the same manner as explained above, and the properties of these patterns were evaluated.

Further, as in the case of Synthesis Example I-1, the transparency and dry etch resistance were evaluated. The results obtained were summarized in Table 23 below together with the photo-acid generator employed. The values of etch rate were based on that of PMMA.

TABLE 23

| Example | Photo-acid generator | Light transmittance (1 μm) % | Etch rate (relative value) |
|---|---|---|---|
| I-103 | Triphenyl sulfonium triflate | 60 | 0.3 |
| I-104 | Diphenyl iodonium triflate | 59 | 0.3 |
| I-105 | NAT · 105 (Midori Kagaku Co., Ltd.) | 61 | 0.3 |
| I-106 | NAI · 105 (Midori Kagaku Co., Ltd.) | 60 | 0.3 |

As a result, it was found possible to form a line and space pattern of 0.15 μm in line width in any of examples.

Example I-107 to Example I-110

The preparation of chemically amplified resists as performed in (Example I-8) to (Example I-11) were repeated except that the copolymer of Synthesis Example I-2 was replaced by the copolymer obtained in Synthesis Example I-20. Using the resists, patterns were formed in the same manner as explained above, and the properties of these patterns were evaluated.

Further, as in the case of Synthesis Example I-1, the transparency and dry etch resistance were evaluated. The results obtained were summarized in Table 24 below together with the photo-acid generator employed. The values of etch rate were based on that of PMMA.

TABLE 24

| Example | Photo-acid generator | Light transmittance (1 μm) % | Etch rate (relative value) |
|---|---|---|---|
| I-107 | Triphenyl sulfonium triflate | 55 | 0.3 |
| I-108 | Diphenyl iodonium triflate | 59 | 0.3 |
| I-109 | NAT · 105 (Midori Kagaku Co., Ltd.) | 61 | 0.3 |
| I-110 | NAI · 105 (Midori Kagaku Co., Ltd.) | 60 | 0.3 |

As a result, it was found possible to form a line and space pattern of 0.15 μm in line width in any of examples.
(Synthesis Example I-21)

The synthesis described in the Synthesis Example I-1 was repeated excepting that citronellol was replaced by the same amount of patchouli alcohol thereby obtaining patchoulyl methacrylate.
(Evaluation of homopolymer derived from the monomer obtained in Synthesis Example I-21)

Polypatchoulyl methacrylate was prepared in the same manner as in the Synthesis Example I-1 excepting the employment of patchoulyl methacrylate as a monomer in this example. This polypatchoulyl methacrylate was dissolved in cyclohexanone, and the resultant solution was coated on a quartz wafer to examine of its transparency to ArF excimer laser beam (193 nm). As a result, the light transmittance of the polypatchoulyl methacrylate was 45% as measured by converting the film thickness to 1 μm.

The film was further measured of its etch rate by using carbon tetrafluoride ($CF_4$) gas under the same conditions as explained above. As a result, the etch rate of polypatchoulyl methacrylate was found to be 0.3 when the etch rate of PMMA was assumed to be 1.

In the following Examples I-111 to I-113, copolymers containing patchoulyl methacrylate obtained in the above Synthesis Example I-21 were respectively synthesized to prepare photosensitive materials containing the copolymer which were then examined of their properties.

Example I-111

The preparation of copolymer performed in Synthesis Example I-1 was repeated except that citronellyl methacrylate was replaced by patchoulyl methacrylate obtained in the above Synthesis Example I-21 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-112

The preparation of copolymer performed in Synthesis Example I-2 was repeated except that citronellyl methacrylate was replaced by patchoulyl methacrylate obtained in the above Synthesis Example I-21 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 μm in line width.

Example I-113

The preparation of copolymer performed in Synthesis Example I-3 was repeated except that citronellyl methacrylate was replaced by patchoulyl methacrylate obtained in the above Synthesis Example I-21 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As result, it was found possible to form a positive line and space pattern of 0.5 μm in line width.
(Synthesis Example I-22)

A different kind of copolymer containing the monomer obtained in Synthesis Example I-21 was prepared, and the resultant copolymer was evaluated.

Namely, the preparation of copolymer performed in Synthesis Example I-2 was repeated except that citronellyl methacrylate was replaced by patchoulyl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride (CF$_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-114 to I-121, chemically amplified resists containing the copolymer obtained in the above Synthesis Example I-22 were respectively synthesized and were examined of their properties.

Example I-114 to Example I-117

The preparation of chemically amplified resists as performed in (Example I-4) to (Example I-7) were repeated except that the copolymer of Synthesis Example I-2 was replaced by the copolymer obtained in Synthesis Example I-22. Using the resists, patterns were formed in the same manner as explained above, and the properties of these patterns were evaluated.

Further, as in the case of Synthesis Example I-1, the transparency and dry etch resistance were evaluated. The results obtained were summarized in Table 25 below together with the photo-acid generator employed. The values of etch rate were based on that of PMMA.

TABLE 25

| Example | Photo-acid generator | Light transmittance (1 µm) % | Etch rate (relative value) |
|---|---|---|---|
| I-114 | Triphenyl sulfonium triflate | 60 | 0.3 |
| I-115 | Diphenyl iodonium triflate | 59 | 0.3 |
| I-116 | NAT · 105 (Midori Kagaku Co., Ltd.) | 61 | 0.3 |
| I-117 | NAI · 105 (Midori Kagaku Co., Ltd.) | 60 | 0.3 |

As a result, it was found possible to form a line and space pattern of 0.15 µm in line width in any of examples.

Example I-118 to Example I-121

The preparation of chemically amplified resists as performed in (Example I-8) to (Example I-11) were repeated except that the copolymer of Synthesis Example I-2 was replaced by the copolymer obtained in Synthesis Example I-22. Using the resists, patterns were formed in the same manner as explained above, and the properties of these patterns were evaluated.

Further, as in the case of Synthesis Example I-1, the transparency and dry etch resistance were evaluated. The results obtained were summarized in Table 26 below together with the photo-acid generator employed. The values of etch rate were based on that of PMMA.

TABLE 26

| Example | Photo-acid generator | Light transmittance (1 µm) % | Etch rate (relative value) |
|---|---|---|---|
| I-118 | Triphenyl sulfonium triflate | 55 | 0.3 |
| I-119 | Diphenyl iodonium triflate | 59 | 0.3 |
| I-120 | NAT · 105 (Midori Kagaku Co., Ltd.) | 61 | 0.3 |
| I-121 | NAI · 105 (Midori Kagaku Co., Ltd.) | 60 | 0.3 |

As a result, it was found possible to form a line and space pattern of 0.15 µm in line width in any of examples.

(Synthesis Example I-23)

The synthesis described in the Synthesis Example I-1 was repeated excepting that citronellol was replaced by the same amount of nerolidol thereby obtaining nerolidyl methacrylate.

(Evaluation of homopolymer derived from the monomer obtained in Synthesis Example I-23)

Polynerolidyl methacrylate was prepared in the same manner as in the Synthesis Example I-1 excepting the employment of nerolidyl methacrylate as a monomer in this example. This polynerolidyl methacrylate was dissolved in cyclohexanone, and the resultant solution was coated on a quartz wafer to examine of its transparency to ArF excimer laser beam (193 nm). As a result, the light transmittance of the polynerolidyl methacrylate was 45% as measured by converting the film thickness to 1 µm.

The film was further measured of its etch rate by using carbon tetrafluoride (CF$_4$) gas under the same conditions as explained above. As a result, the etch rate of polynerolidyl methacrylate was found to be 0.3 when the etch rate of PMMA was assumed to be 1.

In the following Examples I-122 to I-124, copolymers containing nerolidyl methacrylate obtained in the above Synthesis Example I-23 were respectively synthesized to prepare photosensitive materials containing the copolymer which were then examined of their properties.

Example I-122

The preparation of copolymer performed in Synthesis Example I-1 was repeated except that citronellyl methacrylate was replaced by nerolidyl methacrylate obtained in the above Synthesis Example I-23 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 µm in line width.

Example I-123

The preparation of copolymer performed in Synthesis Example I-2 was repeated except that citronellyl methacrylate was replaced by nerolidyl methacrylate obtained in the above Synthesis Example I-23 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 μm in line width.

Example I-124

The preparation of copolymer performed in Synthesis Example I-3 was repeated except that citronellyl methacrylate was replaced by nerolidyl methacrylate obtained in the above Synthesis Example I-23 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As a result, it was found possible to form a positive line and space pattern of 0.5 μm in line width.

(Synthesis Example I-24)

A different kind of copolymer containing the monomer obtained in Synthesis Example I-23 was prepared, and the resultant copolymer was evaluated.

Namely, the preparation of copolymer performed in Synthesis Example I-2 was repeated except that citronellyl methacrylate was replaced by nerolidyl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-125 to I-132, chemically amplified resists containing the copolymer obtained in the above Synthesis Example I-24 were respectively synthesized and were examined of their properties.

Example I-125 to Example I-128

The preparation of chemically amplified resists as performed in (Example I-4) to (Example I-7) were repeated except that the copolymer of Synthesis Example I-2 was replaced by the copolymer obtained in Synthesis Example I-24. Using the resists, patterns were formed in the same manner as explained above, and the properties of these patterns were evaluated.

Further, as in the case of Synthesis Example I-1, the transparency and dry etch resistance were evaluated. The results obtained were summarized in Table 27 below together with the photo-acid generator employed. The values of etch rate were based on that of PMMA.

TABLE 27

| Example | Photo-acid generator | Light transmittance (1 μm) % | Etch rate (relative value) |
|---|---|---|---|
| I-125 | Triphenyl sulfonium triflate | 60 | 0.3 |
| I-126 | Diphenyl iodonium triflate | 59 | 0.3 |
| I-127 | NAT · 105 (Midori Kagaku Co., Ltd.) | 61 | 0.3 |
| I-128 | NAI · 105 (Midori Kagaku Co., Ltd.) | 60 | 0.3 |

As a result, it was found possible to form a line and space pattern of 0.15 μm in line width in any of examples.

Example I-129 to Example I-132

The preparation of chemically amplified resists as performed in (Example I-8) to (Example I-11) were repeated except that the copolymer of Synthesis Example I-2 was replaced by the copolymer obtained in Synthesis Example I-24. Using the resists, patterns were formed in the same manner as explained above, and the properties of these patterns were evaluated.

Further, as in the case of Synthesis Example I-1, the transparency and dry etch resistance were evaluated. The results obtained were summarized in Table 28 below together with the photo-acid generator employed. The values of etch rate were based on that of PMMA.

TABLE 28

| Example | Photo-acid generator | Light transmittance (1 μm) % | Etch rate (relative value) |
|---|---|---|---|
| I-129 | Triphenyl sulfonium triflate | 55 | 0.3 |
| I-130 | Diphenyl iodonium triflate | 59 | 0.3 |
| I-131 | NAT · 105 (Midori Kagaku Co., Ltd.) | 61 | 0.3 |
| I-132 | NAI · 105 (Midori Kagaku Co., Ltd.) | 60 | 0.3 |

As a result, it was found possible to form a line and space pattern of 0.15 μm in line width in any of examples.

(Synthesis Example I-25)

The synthesis described in the Synthesis Example I-1 was repeated excepting that citronellol was replaced by the same amount of carotol thereby obtaining carotyl methacrylate.

(Evaluation of homopolymer derived from the monomer obtained in Synthesis Example I-25)

Polycarotyl methacrylate was prepared in the same manner as in the Synthesis Example I-1 excepting the employment of carotyl methacrylate as a monomer in this example. This polycarotyl methacrylate was dissolved in cyclohexanone, and the resultant solution was coated on a quartz wafer to examine of its transparency to ArF excimer laser beam (193 nm). As a result, the light transmittance of the polycarotyl methacrylate was 45% as measured by converting the film thickness to 1 μm.

The film was further measured of its etch rate by using carbon tetrafluoride ($CF_4$) gas under the same conditions as explained above. As a result, the etch rate of polycarotyl methacrylate was found to be 0.3 when the etch rate of PMMA was assumed to be 1.

In the following Examples I-133 to I-135, copolymers containing carotyl methacrylate obtained in the above Synthesis Example I-25 were respectively synthesized to prepare photosensitive materials containing the copolymer which were then examined of their properties.

Example I-133

The preparation of copolymer performed in Synthesis Example I-1 was repeated except that citronellyl methacrylate was replaced by carotyl methacrylate obtained in the above Synthesis Example I-25 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-134

The preparation of copolymer performed in Synthesis Example I-2 was repeated except that citronellyl methacrylate was replaced by carotyl methacrylate obtained in the above Synthesis Example I-25 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 μm in line width.

Example I-135

The preparation of copolymer performed in Synthesis Example I-3 was repeated except that citronellyl methacrylate was replaced by carotyl methacrylate obtained in the above Synthesis Example I-25 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As result, it was found possible to form a positive line and space pattern of 0.5 μm in line width.

(Synthesis Example I-26)

A different kind of copolymer containing the monomer obtained in Synthesis Example I-25 was prepared, and the resultant copolymer was evaluated.

Namely, the preparation of copolymer performed in Synthesis Example I-2 was repeated except that citronellyl methacrylate was replaced by carotyl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-136 to I-143, chemically amplified resists containing the copolymer obtained in the above Synthesis Example I-26 were respectively synthesized and were examined of their properties.

Example I-136 to Example I-139

The preparation of chemically amplified resists as performed in (Example I-4) to (Example I-7) were repeated except that the copolymer of Synthesis Example I-2 was replaced by the copolymer obtained in Synthesis Example I-26. Using the resists, patterns were formed in the same manner as explained above, and the properties of these patterns were evaluated.

Further, as in the case of Synthesis Example I-1, the transparency and dry etch resistance were evaluated. The results obtained were summarized in Table 29 below together with the photo-acid generator employed. The values of etch rate were based on that of PMMA.

TABLE 29

| Example | Photo-acid generator | Light transmittance (1 μm) % | Etch rate (relative value) |
|---------|---------------------|------------------------------|----------------------------|
| I-136 | Triphenyl sulfonium triflate | 60 | 0.3 |
| I-137 | Diphenyl iodonium triflate | 59 | 0.3 |
| I-138 | NAT · 105 (Midori Kagaku Co., Ltd.) | 61 | 0.3 |
| I-139 | NAI · 105 (Midori Kagaku Co., Ltd.) | 60 | 0.3 |

As a result, it was found possible to form a line and space pattern of 0.15 μm in line width in any of examples.

Example I-140 to Example I-143

The preparation of chemically amplified resists as performed in (Example I-8) to (Example I-11) were repeated except that the copolymer of Synthesis Example I-2 was replaced by the copolymer obtained in Synthesis Example I-26. Using the resists, patterns were formed in the same manner as explained above, and the properties of these patterns were evaluated.

Further, as in the case of Synthesis Example I-1, the transparency and dry etch resistance were evaluated. The results obtained were summarized in Table 30 below together with the photo-acid generator employed. The values of etch rate were based on that of PMMA.

TABLE 30

| Example | Photo-acid generator | Light transmittance (1 μm) % | Etch rate (relative value) |
|---|---|---|---|
| I-140 | Triphenyl sulfonium triflate | 55 | 0.3 |
| I-141 | Diphenyl iodonium triflate | 59 | 0.3 |
| I-142 | NAT · 105 (Midori Kagaku Co., Ltd.) | 61 | 0.3 |
| I-143 | NAI · 105 (Midori Kagaku Co., Ltd.) | 60 | 0.3 |

As a result, it was found possible to form a line and space pattern of 0.15 μm in line width in any of examples.

(Synthesis Example I-27)

The synthesis described in the Synthesis Example I-1 was repeated excepting that citronellol was replaced by the same amount of cadinol thereby obtaining cadinyl methacrylate.

(Evaluation of homopolymer derived from the monomer obtained in Synthesis Example I-27)

Polycadinyl methacrylate was prepared in the same manner as in the Synthesis Example I-1 excepting the employment of cadinyl methacrylate as a monomer in this example. This polycadinyl methacrylate was dissolved in cyclohexanone, and the resultant solution was coated on a quartz wafer to examine of its transparency to ArF excimer laser beam (193 nm). As a result, the light transmittance of the polycadinyl methacrylate was 45% as measured by converting the film thickness to 1 μm.

The film was further measured of its etch rate by using carbon tetrafluoride ($CF_4$) gas under the same conditions as explained above. As a result, the etch rate of polycadinyl methacrylate was found to be 0.3 when the etch rate of PMMA was assumed to be 1.

In the following Examples I-144 to I-146, copolymers containing cadinyl methacrylate obtained in the above Synthesis Example I-27 were respectively synthesized to prepare photosensitive materials containing the copolymer which were then examined of their properties.

Example I-144

The preparation of copolymer performed in Synthesis Example I-1 was repeated except that citronellyl methacrylate was replaced by cadinyl methacrylate obtained in the above Synthesis Example I-27 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-145

The preparation of copolymer performed in Synthesis Example I-2 was repeated except that citronellyl methacrylate was replaced by cadinyl methacrylate obtained in the above Synthesis Example I-27 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 μm in line width.

Example I-146

The preparation of copolymer performed in Synthesis Example I-3 was repeated except that citronellyl methacrylate was replaced by cadinyl methacrylate obtained in the above Synthesis Example I-27 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As result, it was found possible to form a positive line and space pattern of 0.5 μm in line width.

(Synthesis Example I-28)

A different kind of copolymer containing the monomer obtained in Synthesis Example I-27 was prepared, and the resultant copolymer was evaluated.

Namely, the preparation of copolymer performed in Synthesis Example I-2 was repeated except that citronellyl methacrylate was replaced by cadinyl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-147 to I-154, chemically amplified resists containing the copolymer obtained in the above Synthesis Example I-28 were respectively synthesized and were examined of their properties.

Example I-147 to Example I-150

The preparation of chemically amplified resists as performed in (Example I-4) to (Example I-7) were repeated except that the copolymer of Synthesis Example I-2 was replaced by the copolymer obtained in Synthesis Example I-28. Using the resists, patterns were formed in the same manner as explained above, and the properties of these patterns were evaluated.

Further, as in the case of Synthesis Example I-1, the transparency and dry etch resistance were evaluated. The results obtained were summarized in Table 31 below together with the photo-acid generator employed. The values of etch rate were based on that of PMMA.

TABLE 31

| Example | Photo-acid generator | Light transmittance (1 μm) % | Etch rate (relative value) |
|---|---|---|---|
| I-147 | Triphenyl sulfonium triflate | 60 | 0.3 |
| I-148 | Diphenyl iodonium triflate | 59 | 0.3 |
| I-149 | NAT · 105 (Midori Kagaku Co., Ltd.) | 61 | 0.3 |
| I-150 | NAI · 105 (Midori Kagaku Co., Ltd.) | 60 | 0.3 |

As a result, it was found possible to form a line and space pattern of 0.15 μm in line width in any of examples.

Example I-151 to Example I-154

The preparation of chemically amplified resists as performed in (Example I-8) to (Example I-11) were repeated except that the copolymer of Synthesis Example I-2 was replaced by the copolymer obtained in Synthesis Example I-28. Using the resists, patterns were formed in the same manner as explained above, and the properties of these patterns were evaluated.

Further, as in the case of Synthesis Example I-1, the transparency and dry etch resistance were evaluated. The results obtained were summarized in Table 32 below together with the photo-acid generator employed. The values of etch rate were based on that of PMMA.

TABLE 32

| Example | Photo-acid generator | Light transmittance (1 μm) % | Etch rate (relative value) |
|---|---|---|---|
| I-151 | Triphenyl sulfonium triflate | 55 | 0.3 |
| I-152 | Diphenyl iodonium triflate | 59 | 0.3 |
| I-153 | NAT · 105 (Midori Kagaku Co., Ltd.) | 61 | 0.3 |
| I-154 | NAI · 105 (Midori Kagaku Co., Ltd.) | 60 | 0.3 |

As a result, it was found possible to form a line and space pattern of 0.15 μm in line width in any of examples.
(Synthesis Example I-29)

The synthesis described in the Synthesis Example I-1 was repeated excepting that citronellol was replaced by the same amount of lanceol thereby obtaining lancyl methacrylate.
(Evaluation of homopolymer derived from the monomer obtained in Synthesis Example I-29)

Polylancyl methacrylate was prepared in the same manner as in the Synthesis Example I-1 excepting the employment of lancyl methacrylate as a monomer in this example. This polylancyl methacrylate was dissolved in cyclohexanone, and the resultant solution was coated on a quartz wafer to examine of its transparency to ArF excimer laser beam (193 nm). As a result, the light transmittance of the polylancyl methacrylate was 45% as measured by converting the film thickness to 1 μm.

The film was further measured of its etch rate by using carbon tetrafluoride ($CF_4$) gas under the same conditions as explained above. As a result, the etch rate of polylancyl methacrylate was found to be 0.3 when the etch rate of PMMA was assumed to be 1.

In the following Examples I-155 to I-157, copolymers containing lancyl methacrylate obtained in the above Synthesis Example I-29 were respectively synthesized to prepare photosensitive materials containing the copolymer which were then examined of their properties.

Example I-155

The preparation of copolymer performed in Synthesis Example I-1 was repeated except that citronellyl methacrylate was replaced by lancyl methacrylate obtained in the above Synthesis Example I-29 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-156

The preparation of copolymer performed in Synthesis Example I-2 was repeated except that citronellyl methacrylate was replaced by lancyl methacrylate obtained in the above Synthesis Example I-29 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 μm in line width.

Example I-157

The preparation of copolymer performed in Synthesis Example I-3 was repeated except that citronellyl methacrylate was replaced by lancyl methacrylate obtained in the above Synthesis Example I-29 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As result, it was found possible to form a positive line and space pattern of 0.5 μm in line width.
(Synthesis Example I-30)

A different kind of copolymer containing the monomer obtained in Synthesis Example I-29 was prepared, and the resultant copolymer was evaluated.

Namely, the preparation of copolymer performed in Synthesis Example I-2 was repeated except that citronellyl methacrylate was replaced by lancyl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride (CF$_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-158 to I-161, chemically amplified resists containing the copolymer obtained in the above Synthesis Example I-30 were respectively synthesized and were examined of their properties.

Example I-158 to Example I-161

The preparation of chemically amplified resists as performed in (Example I-4) to (Example I-7) were repeated except that the copolymer of Synthesis Example I-2 was replaced by the copolymer obtained in Synthesis Example I-30. Using the resists, patterns were formed in the same manner as explained above, and the properties of these patterns were evaluated.

Further, as in the case of Synthesis Example I-1, the transparency and dry etch resistance were evaluated. The results obtained were summarized in Table 33 below together with the photo-acid generator employed. The values of etch rate were based on that of PMMA.

TABLE 33

| Example | Photo-acid generator | Light transmittance (1 μm) % | Etch rate (relative value) |
|---|---|---|---|
| I-158 | Triphenyl sulfonium triflate | 60 | 0.3 |
| I-159 | Diphenyl iodonium triflate | 59 | 0.3 |
| I-160 | NAT · 105 (Midori Kagaku Co., Ltd.) | 61 | 0.3 |
| I-161 | NAI · 105 (Midori Kagaku Co., Ltd.) | 60 | 0.3 |

As a result, it was found possible to form a line and space pattern of 0.15 μm in line width in any of examples.

Example I-162 to Example I-165

The preparation of chemically amplified resists as performed in (Example I-8) to (Example I-11) were repeated except that the copolymer of Synthesis Example I-2 was replaced by the copolymer obtained in Synthesis Example I-30. Using the resists, patterns were formed in the same manner as explained above, and the properties of these patterns were evaluated.

Further, as in the case of Synthesis Example I-1, the transparency and dry etch resistance were evaluated. The results obtained were summarized in Table 34 below together with the photo-acid generator employed. The values of etch rate were based on that of PMMA.

TABLE 34

| Example | Photo-acid generator | Light transmittance (1 μm) % | Etch rate (relative value) |
|---|---|---|---|
| I-162 | Triphenyl sulfonium triflate | 55 | 0.3 |
| I-163 | Diphenyl iodonium triflate | 59 | 0.3 |
| I-164 | NAT · 105 (Midori Kagaku Co., Ltd.) | 61 | 0.3 |
| I-165 | NAI · 105 (Midori Kagaku Co., Ltd.) | 60 | 0.3 |

As a result, it was found possible to form a line and space pattern of 0.15 μm in line width in any of examples.

(Synthesis Example I-31)

The synthesis described in the Synthesis Example I-1 was repeated excepting that citronellol was replaced by the same amount of eudesmol thereby obtaining eudesmyl methacrylate.

(Evaluation of homopolymer derived from the monomer obtained in Synthesis Example I-31)

Polyeudesmyl methacrylate was prepared in the same manner as in the Synthesis Example I-1 excepting the employment of eudesmyl methacrylate as a monomer in this example. This polyeudesmyl methacrylate was dissolved in cyclohexanone, and the resultant solution was coated on a quartz wafer to examine of its transparency to ArF excimer laser beam (193 nm). As a result, the light transmittance of the polyeudesmyl methacrylate was 45% as measured by converting the film thickness to 1 μm.

The film was further measured of its etch rate by using carbon tetrafluoride (CF$_4$) gas under the same conditions as explained above. As a result, the etch rate of polyeudesmyl methacrylate was found to be 0.3 when the etch rate of PMMA was assumed to be 1.

In the following Examples I-166 to I-168, copolymers containing eudesmyl methacrylate obtained in the above Synthesis Example I-31 were respectively synthesized to prepare photosensitive materials containing the copolymer which were then examined of their properties.

Example I-166

The preparation of copolymer performed in Synthesis Example I-1 was repeated except that citronellyl methacrylate was replaced by eudesmyl methacrylate obtained in the above Synthesis Example I-31 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-167

The preparation of copolymer performed in Synthesis Example I-2 was repeated except that citronellyl methacrylate was replaced by eudesmyl methacrylate obtained in the above Synthesis Example I-31 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 μm in line width.

Example I-168

The preparation of copolymer performed in Synthesis Example I-3 was repeated except that citronellyl methacrylate was replaced by eudesmyl methacrylate obtained in the above Synthesis Example I-31 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As result, it was found possible to form a positive line and space pattern of 0.5 μm in line width.

(Synthesis Example I-32)

A different kind of copolymer containing the monomer obtained in Synthesis Example I-31 was prepared, and the resultant copolymer was evaluated.

Namely, the preparation of copolymer performed in Synthesis Example I-2 was repeated except that citronellyl methacrylate was replaced by eudesmyl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-169 to I-176, chemically amplified resists containing the copolymer obtained in the above Synthesis Example I-32 were respectively synthesized and were examined of their properties.

Example I-169 to Example I-172

The preparation of chemically amplified resists as performed in (Example I-4) to (Example I-7) were repeated except that the copolymer of Synthesis Example I-2 was replaced by the copolymer obtained in Synthesis Example I-32. Using the resists, patterns were formed in the same manner as explained above, and the properties of these patterns were evaluated.

Further, as in the case of Synthesis Example I-1, the transparency and dry etch resistance were evaluated. The results obtained were summarized in Table 35 below together with the photo-acid generator employed. The values of etch rate were based on that of PMMA.

TABLE 35

| Example | Photo-acid generator | Light transmittance (1 μm) % | Etch rate (relative value) |
|---|---|---|---|
| I-169 | Triphenyl sulfonium triflate | 60 | 0.3 |
| I-170 | Diphenyl iodonium triflate | 59 | 0.3 |
| I-171 | NAT.105 (Midori Kagaku Co., Ltd.) | 61 | 0.3 |
| I-172 | NAI-105 (Midori Kagaku Co., Ltd.) | 60 | 0.3 |

As a result, it was found possible to form a line and space pattern of 0.15 μm in line width in any of examples.

Example I-173 to Example I-176

The preparation of chemically amplified resists as performed in (Example I-8) to (Example I-11) were repeated except that the copolymer of Synthesis Example I-2 was replaced by the copolymer obtained in Synthesis Example I-32. Using the resists, patterns were formed in the same manner as explained above, and the properties of these patterns were evaluated.

Further, as in the case of Synthesis Example I-1, the transparency and dry etch resistance were evaluated. The results obtained were summarized in Table 36 below together with the photo-acid generator employed. The values of etch rate were based on that of PMMA.

TABLE 36

| Example | Photo-acid generator | Light transmittance (1 μm) % | Etching rate (relative value) |
|---|---|---|---|
| I-173 | Triphenyl sulfonium triflate | 55 | 0.3 |
| I-174 | Diphenyl iodonium triflate | 59 | 0.3 |
| I-175 | NAT.105 (Midori Kagaku Co., Ltd.) | 61 | 0.3 |
| I-176 | NAI-105 (Midori Kagaku Co., Ltd.) | 60 | 0.3 |

As a result, it was found possible to form a line and space pattern of 0.15 μm in line width in any of examples.

(Synthesis Example I-33)

The synthesis described in the Synthesis Example I-1 was repeated excepting that citronellol was replaced by the same amount of cedrol thereby obtaining cedryl methacrylate.

(Evaluation of homopolymer derived from the monomer obtained in Synthesis Example I-33)

Polycedryl methacrylate was prepared in the same manner as in the Synthesis Example I-1 excepting the employment of cedryl methacrylate as a monomer in this example. This polycedryl methacrylate was dissolved in cyclohexanone, and the resultant solution was coated on a quartz wafer to examine of its transparency to ArF excimer laser beam (193 nm). As a result, the light transmittance of the polycedryl methacrylate was 45% as measured by converting the film thickness to 1 μm.

The film was further measured of its etch rate by using carbon tetrafluoride ($CF_4$) gas under the same conditions as explained above. As a result, the etch rate of polycedryl methacrylate was found to be 0.3 when the etch rate of PMMA was assumed to be 1.

In the following Examples I-177 to I-179, copolymers containing cedryl methacrylate obtained in the above Synthesis Example I-33 were respectively synthesized to prepare photosensitive materials containing the copolymer which were then examined of their properties.

Example I-177

The preparation of copolymer performed in Synthesis Example I-1 was repeated except that citronellyl methacrylate was replaced by cedryl methacrylate obtained in the above Synthesis Example I-33 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 $\mu$m in line width.

Example I-178

The preparation of copolymer performed in Synthesis Example I-2 was repeated except that citronellyl methacrylate was replaced by cedryl methacrylate obtained in the above Synthesis Example I-33 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 $\mu$m in line width.

Example I-179

The preparation of copolymer performed in Synthesis Example I-3 was repeated except that citronellyl methacrylate was replaced by cedryl methacrylate obtained in the above Synthesis Example I-33 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As a result, it was found possible to form a positive line and space pattern of 0.5 $\mu$m in line width.
(Synthesis Example I-34)

A different kind of copolymer containing the monomer obtained in Synthesis Example I-33 was prepared, and the resultant copolymer was evaluated.

Namely, the preparation of copolymer performed in Synthesis Example I-2 was repeated except that citronellyl methacrylate was replaced by cedryl methacrylate thereby obtaining a copolymer, which was then dissolved in cyclohexanone. The film 1 $\mu$m thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-180 to I-187, chemically amplified resists containing the copolymer obtained in the above Synthesis Example I-34 were respectively synthesized and were examined of their properties.

Example I-180 to Example I-183

The preparation of chemically amplified resists as performed in (Example I-4) to (Example I-7) were repeated except that the copolymer of Synthesis Example I-2 was replaced by the copolymer obtained in Synthesis Example I-34. Using the resists, patterns were formed in the same manner as explained above, and the properties of these patterns were evaluated.

Further, as in the case of Synthesis Example I-1, the transparency and dry etch resistance were evaluated. The results obtained were summarized in Table 37 below together with the photo-acid generator employed. The values of etch rate were based on that of PMMA.

TABLE 37

| Example | Photo-acid generator | Light transmittance (1 $\mu$m) % | Etch rate (relative value) |
|---|---|---|---|
| I-180 | Triphenyl sulfonium triflate | 60 | 0.3 |
| I-181 | Diphenyl iodonium triflate | 59 | 0.3 |
| I-182 | NAT-105 (Midori Kagaku Co., Ltd.) | 61 | 0.3 |
| I-183 | NAI-105 (Midori Kagaku Co., Ltd.) | 60 | 0.3 |

As a result, it was found possible to form a line and space pattern of 0.15 $\mu$m in line width in any of examples.

Example I-184 to Example I-187

The preparation of chemically amplified resists as performed in (Example I-8) to (Example I-11) were repeated except that the copolymer of Synthesis Example I-2 was replaced by the copolymer obtained in Synthesis Example I-34. Using the resists, patterns were formed in the same manner as explained above, and the properties of these patterns were evaluated.

Further, as in the case of Synthesis Example I-1, the transparency and dry etch resistance were evaluated. The results obtained were summarized in Table 38 below together with the photo-acid generators employed. The values of etch rate were based on that of PMMA.

TABLE 38

| Example | Photo-acid generator | Light transmittance (1 μm) % | Etch rate (relative value) |
|---|---|---|---|
| I-184 | Triphenyl sulfonium triflate | 55 | 0.3 |
| I-185 | Diphenyl iodonium triflate | 59 | 0.3 |
| I-186 | NAT.105 (Midori Kagaku Co., Ltd.) | 61 | 0.3 |
| I-187 | NAI-105 (Midori Kagaku Co., Ltd.) | 60 | 0.3 |

As a result, it was found possible to form a line and space pattern of 0.15 μm in line width in any of examples.
(Synthesis Example I-35)

The synthesis described in the Synthesis Example I-1 was repeated excepting that citronellol was replaced by the same amount of guajol thereby obtaining guajyl methacrylate.
(Evaluation of homopolymer derived from the monomer obtained in Synthesis Example I-35)

Polyguajyl methacrylate was prepared in the same manner as in the Synthesis Example I-1 excepting the employment of guajyl methacrylate as a monomer in this example. This polyguajyl methacrylate was dissolved in cyclohexanone, and the resultant solution was coated on a quartz wafer to examine of its transparency to ArF excimer laser beam (193 nm). As a result, the light transmittance of the polyguajyl methacrylate was 45% as measured by converting the film thickness to 1 μm.

The film was further measured of its etch rate by using carbon tetrafluoride ($CF_4$) gas under the same conditions as explained above. As a result, the etch rate of polyguajyl methacrylate was found to be 0.3 when the etch rate of PMMA was assumed to be 1.

In the following Examples I-188 to I-190, copolymers containing guajyl methacrylate obtained in the above Synthesis Example I-35 were respectively synthesized to prepare photosensitive materials containing the copolymer which were then examined of their properties.

Example I-188

The preparation of copolymer performed in Synthesis Example I-1 was repeated except that citronellyl methacrylate was replaced by guajyl methacrylate obtained in the above Synthesis Example I-35 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As a result, it was found possible to form a negative line and space pattern of 0.5 μm in line width.

Example I-189

The preparation of copolymer performed in Synthesis Example I-2 was repeated except that citronellyl methacrylate was replaced by guajyl methacrylate obtained in the above Synthesis Example I-35 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 μm in line width.

Example I-190

The preparation of copolymer performed in Synthesis Example I-3 was repeated except that citronellyl methacrylate was replaced by guajyl methacrylate obtained in the above Synthesis Example I-35 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As result, it was found possible to form a positive line and space pattern of 0.5 μm in line width.
(Synthesis Example I-36)

A different kind of copolymer containing the monomer obtained in Synthesis Example I-35 was prepared, and the resultant copolymer was evaluated.

Namely, the preparation of copolymer performed in Synthesis Example I-2 was repeated except that citronellyl methacrylate was replaced by guajyl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-191 to I-198, chemically amplified resists containing the copolymer obtained in the above Synthesis Example I-36 were respectively synthesized and were examined of their properties.

Example I-191 to Example I-194

The preparation of chemically amplified resists as performed in (Example I-4) to (Example I-7) were repeated except that the copolymer of Synthesis Example I-2 was replaced by the copolymer obtained in Synthesis Example I-36. Using the resists, patterns were formed in the same manner as explained above, and the properties of these patterns were evaluated.

Further, as in the case of Synthesis Example I-1, the transparency and dry etch resistance were evaluated. The results obtained were summarized in Table 39 below together with the photo-acid generator employed. The values of etch rate were based on that of PMMA.

TABLE 39

| Example | Photo-acid generator | Light transmittance (1 μm) % | Etch rate (relative value) |
|---|---|---|---|
| I-191 | Triphenyl sulfonium triflate | 60 | 0.3 |
| I-192 | Diphenyl iodonium triflate | 59 | 0.3 |
| I-193 | NAT.105 (Midori Kagaku Co., Ltd.) | 61 | 0.3 |
| I-194 | NAI-105 (Midori Kagaku Co., Ltd.) | 60 | 0.3 |

As a result, it was found possible to form a line and space pattern of 0.15 μm in line width in any of examples.

Example I-195 to Example I-198

The preparation of chemically amplified resists as performed in (Example I-8) to (Example I-11) were repeated except that the copolymer of Synthesis Example I-2 was replaced by the copolymer obtained in Synthesis Example I-36. Using the resists, patterns were formed in the same manner as explained above, and the properties of these patterns were evaluated.

Further, as in the case of Synthesis Example I-1, the transparency and dry etch resistance were evaluated. The results obtained were summarized in Table 40 below together with the photo-acid generator employed. The values of etch rate were based on that of PMMA.

TABLE 40

| Example | Photo-acid generator | Light transmittance (1 μm) % | Etch rate (relative value) |
|---|---|---|---|
| I-195 | Triphenyl sulfonium triflate | 55 | 0.3 |
| I-196 | Diphenyl iodonium triflate | 59 | 0.3 |
| I-197 | NAT.105 (Midori Kagaku Co., Ltd.) | 61 | 0.3 |
| I-198 | NAI-105 (Midori Kagaku Co., Ltd.) | 60 | 0.3 |

As a result, it was found possible to form a line and space pattern of 0.15 μm in line width in any of examples.
(Synthesis Example I-37)

The synthesis described in the Synthesis Example I-1 was repeated excepting that citronellol was replaced by the same amount of kessoglycol thereby obtaining kessoglycoxyl methacrylate.
(Evaluation of homopolymer derived from the monomer obtained in Synthesis Example I-37)

Polykessoglycoxyl methacrylate was prepared in the same manner as in the Synthesis Example I-1 excepting the employment of kessoglycoxyl methacrylate as a monomer in this example. This polykessoglycoxyl methacrylate was dissolved in cyclohexanone, and the resultant solution was coated on a quartz wafer to examine of its transparency to ArF excimer laser beam (193 nm). As a result, the light transmittance of the polykessoglycoxyl methacrylate was 45% as measured by converting the film thickness to 1 μm.

The film was further measured of its etch rate by using carbon tetrafluoride ($CF_4$) gas under the same conditions as explained above. As a result, the etch rate of polykessoglycoxyl methacrylate was found to be 0.3 when the etch rate of PMMA was assumed to be 1.

In the following Examples I-199 to I-201, copolymers containing kessoglycoxyl methacrylate obtained in the above Synthesis Example I-37 were respectively synthesized to prepare photosensitive materials containing the copolymer which were then examined of their properties.

Example I-199

The preparation of copolymer performed in Synthesis Example I-1 was repeated except that citronellyl methacrylate was replaced by kessoglycoxyl methacrylate obtained in the above Synthesis Example I-37 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-200

The preparation of copolymer performed in Synthesis Example I-2 was repeated except that citronellyl methacrylate was replaced by kessoglycoxyl methacrylate obtained in the above Synthesis Example I-37 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 μm in line width.

Example I-201

The preparation of copolymer performed in Synthesis Example I-3 was repeated except that citronellyl methacrylate was replaced by kessoglycoxyl methacrylate obtained in the above Synthesis Example I-37 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As result, it was found possible to form a positive line and space pattern of 0.5 μm in line width.
(Synthesis Example I-38)

A different kind of copolymer containing the monomer obtained in Synthesis Example I-37 was prepared, and the resultant copolymer was evaluated.

Namely, the preparation of copolymer performed in Synthesis Example I-2 was repeated except that citronellyl methacrylate was replaced by kessoglycoxyl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride (CF$_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-202 to I-209, chemically amplified resists containing the copolymer obtained in the above Synthesis Example I-38 were respectively synthesized and were examined of their properties.

Example I-202 to Example I-205

The preparation of chemically amplified resists as performed in (Example I-4) to (Example I-7) were repeated except that the copolymer of Synthesis Example I-2 was replaced by the copolymer obtained in Synthesis Example I-38. Using the resists, patterns were formed in the same manner as explained above, and the properties of these patterns were evaluated.

Further, as in the case of Synthesis Example I-1, the transparency and dry etch resistance were evaluated. The results obtained were summarized in Table 41 below together with the photo-acid generator employed. The values of etch rate were based on that of PMMA.

TABLE 41

| Example | Photo-acid generator | Light transmittance (1 μm) % | Etch rate (relative value) |
| --- | --- | --- | --- |
| I-202 | Triphenyl sulfonium triflate | 60 | 0.3 |
| I-203 | Diphenyl iodonium triflate | 59 | 0.3 |
| I-204 | NAT.105 (Midori Kagaku Co., Ltd.) | 61 | 0.3 |
| I-205 | NAI-105 (Midori Kagaku Co., Ltd.) | 60 | 0.3 |

As a result, it was found possible to form a line and space pattern of 0.15 μm in line width in any of examples.

Example I-206 to Example I-209

The preparation of chemically amplified resists as performed in (Example I-8) to (Example I-11) were repeated except that the copolymer of Synthesis Example I-2 was replaced by the copolymer obtained in Synthesis Example I-38. Using the resists, patterns were formed in the same manner as explained above, and the properties of these patterns were evaluated.

Further, as in the case of Synthesis Example I-1, the transparency and dry etch resistance were evaluated. The results obtained were summarized in Table 42 below together with the photo-acid generator employed. The values of etch rate were based on that of PMMA.

TABLE 42

| Example | Photo-acid generator | Light transmittance (1 μm) % | Etch rate (relative value) |
| --- | --- | --- | --- |
| I-206 | Triphenyl sulfonium triflate | 55 | 0.3 |
| I-207 | Diphenyl iodonium triflate | 59 | 0.3 |
| I-208 | NAT.105 (Midori Kagaku Co., Ltd.) | 61 | 0.3 |
| I-209 | NAI-105 (Midori Kagaku Co., Ltd.) | 60 | 0.3 |

As a result, it was found possible to form a line and space pattern of 0.15 μm in line width in any of examples.
(Synthesis Example I-39)
The synthesis described in the Synthesis Example I-1 was repeated excepting that citronellol was replaced by the same amount of phytol thereby obtaining phytyl methacrylate.
(Evaluation of homopolymer derived from the monomer obtained in Synthesis Example I-39)
Polyphytyl methacrylate was prepared in the same manner as in the Synthesis Example I-1 excepting the employment of phytyl methacrylate as a monomer in this example. This polyphytyl methacrylate was dissolved in cyclohexanone, and the resultant solution was coated on a quartz wafer to examine of its transparency to ArF excimer laser beam (193 nm). As a result, the light transmittance of the polyphytyl methacrylate was 45% as measured by converting the film thickness to 1 μm.

The film was further measured of its etch rate by using carbon tetrafluoride (CF$_4$) gas under the same conditions as explained above. As a result, the etch rate of polyphytyl methacrylate was found to be 0.3 when the etch rate of PMMA was assumed to be 1.

In the following Examples I-210 to I-212, copolymers containing phytyl methacrylate obtained in the above Synthesis Example I-39 were respectively synthesized to prepare photosensitive materials containing the copolymer which were then examined of their properties.

Example I-210

The preparation of copolymer performed in Synthesis Example I-1 was repeated except that citronellyl methacrylate was replaced by phytyl methacrylate obtained in the above Synthesis Example I-39 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-211

The preparation of copolymer performed in Synthesis Example I-2 was repeated except that citronellyl methacrylate was replaced by phytyl methacrylate obtained in the above Synthesis Example I-39 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 μm in line width.

Example I-212

The preparation of copolymer performed in Synthesis Example I-3 was repeated except that citronellyl methacrylate was replaced by phytyl methacrylate obtained in the above Synthesis Example I-39 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As a result, it was found possible to form a positive line and space pattern of 0.5 μm in line width.

(Synthesis Example I-40)

A different kind of copolymer containing the monomer obtained in Synthesis Example I-39 was prepared, and the resultant copolymer was evaluated.

Namely, the preparation of copolymer performed in Synthesis Example I-2 was repeated except that citronellyl methacrylate was replaced by phytyl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-213 to I-220, chemically amplified resists containing the copolymer obtained in the above Synthesis Example I-40 were respectively synthesized and were examined of their properties.

Example I-213 to Example I-216

The preparation of chemically amplified resists as performed in (Example I-4) to (Example I-7) were repeated except that the copolymer of Synthesis Example I-2 was replaced by the copolymer obtained in Synthesis Example I-40. Using the resists, patterns were formed in the same manner as explained above, and the properties of these patterns were evaluated.

Further, as in the case of Synthesis Example I-1, the transparency and dry etch resistance were evaluated. The results obtained were summarized in Table 43 below together with the photo-acid generator employed. The values of etch rate were based on that of PMMA.

TABLE 43

| Example | Photo-acid generator | Light transmittance (1 μm) % | Etch rate (relative value) |
| --- | --- | --- | --- |
| I-213 | Triphenyl sulfonium triflate | 60 | 0.3 |
| I-214 | Diphenyl iodonium triflate | 59 | 0.3 |
| I-215 | NAT.105 (Midori Kagaku Co., Ltd.) | 61 | 0.3 |
| I-216 | NAI-105 (Midori Kagaku Co., Ltd.) | 60 | 0.3 |

As a result, it was found possible to form a line and space pattern of 0.15 μm in line width in any of examples.

Example I-217 to Example I-220

The preparation of chemically amplified resists as performed in (Example I-8) to (Example I-11) were repeated except that the copolymer of Synthesis Example I-2 was replaced by the copolymer obtained in Synthesis Example I-40. Using the resists, patterns were formed in the same manner as explained above, and the properties of these patterns were evaluated.

Further, as in the case of Synthesis Example I-1, the transparency and dry etch resistance were evaluated. The results obtained were summarized in Table 44 below together with the photo-acid generator employed. The values of etch rate were based on that of PMMA.

TABLE 44

| Example | Photo-acid generator | Light transmittance (1 μm) % | Etch rate (relative value) |
| --- | --- | --- | --- |
| I-217 | Triphenyl sulfonium triflate | 55 | 0.3 |
| I-218 | Diphenyl iodonium triflate | 59 | 0.3 |
| I-219 | NAT.105 (Midori Kagaku Co., Ltd.) | 61 | 0.3 |
| I-220 | NAI-105 (Midori Kagaku Co., Ltd.) | 60 | 0.3 |

As a result, it was found possible to form a line and space pattern of 0.15 μm in line width in any of examples.

(Synthesis Example I-41)

The synthesis described in the Synthesis Example I-1 was repeated excepting that citronellol was replaced by the same amount of sclareol thereby obtaining sclaryl methacrylate.

(Evaluation of homopolymer derived from the monomer obtained in Synthesis Example I-41)

Polysclaryl methacrylate was prepared in the same manner as in the Synthesis Example I-1 excepting the employment of sclaryl methacrylate as a monomer in this example. This polysclaryl methacrylate was dissolved in cyclohexanone, and the resultant solution was coated on a quartz wafer to examine of its transparency to ArF excimer laser beam (193 nm). As a result, the light transmittance of the polysclaryl methacrylate was 45% as measured by converting the film thickness to 1 μm.

The film was further measured of its etch rate by using carbon tetrafluoride ($CF_4$) gas under the same conditions as explained above. As a result, the etch rate of polysclaryl methacrylate was found to be 0.3 when the etch rate of PMMA was assumed to be 1.

In the following Examples I-221 to I-223, copolymers containing sclaryl methacrylate obtained in the above Synthesis Example I-41 were respectively synthesized to prepare photosensitive materials containing the copolymer which were then examined of their properties.

Example I-221

The preparation of copolymer performed in Synthesis Example I-1 was repeated except that citronellyl methacrylate was replaced by sclaryl methacrylate obtained in the above Synthesis Example I-41 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-222

The preparation of copolymer performed in Synthesis Example I-2 was repeated except that citronellyl methacrylate was replaced by sclaryl methacrylate obtained in the above Synthesis Example I-41 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As a result, it was found possible to form a negative line and space pattern of 0.5 μm in line width.

Example I-223

The preparation of copolymer performed in Synthesis Example I-3 was repeated except that citronellyl methacrylate was replaced by sclaryl methacrylate obtained in the above Synthesis Example I-41 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As result, it was found possible to form a positive line and space pattern of 0.5 μm in line width.

(Synthesis Example I-42)

A different kind of copolymer containing the monomer obtained in Synthesis Example I-41 was prepared, and the resultant copolymer was evaluated.

Namely, the preparation of copolymer performed in Synthesis Example I-2 was repeated except that citronellyl methacrylate was replaced by sclaryl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-224 to I-231, chemically amplified resists containing the copolymer obtained in the above Synthesis Example I-42 were respectively synthesized and were examined of their properties.

Example I-224 to Example I-227

The preparation of chemically amplified resists as performed in (Example I-4) to (Example I-7) were repeated except that the copolymer of Synthesis Example I-2 was replaced by the copolymer obtained in Synthesis Example I-42. Using the resists, patterns were formed in the same manner as explained above, and the properties of these patterns were evaluated.

Further, as in the case of Synthesis Example I-1, the transparency and dry etch resistance were evaluated. The results obtained were summarized in Table 45 below together with the photo-acid generator employed. The values of etch rate were based on that of PMMA.

TABLE 45

| Example | Photo-acid generator | Light transmittance (1 μm) % | Etch rate (relative value) |
|---|---|---|---|
| I-224 | Triphenyl sulfonium triflate | 60 | 0.3 |
| I-225 | Diphenyl iodonium triflate | 59 | 0.3 |
| I-226 | NAT-105 (Midori Kagaku Co., Ltd.) | 61 | 0.3 |
| I-227 | NAI-105 (Midori Kagaku Co., Ltd.) | 60 | 0.3 |

As a result, it was found possible to form a line and space pattern of 0.15 μm in line width in any of examples.

Example I-228 to Example I-231

The preparation of chemically amplified resists as performed in (Example I-8) to (Example I-11) were repeated except that the copolymer of Synthesis Example I-2 was replaced by the copolymer obtained in Synthesis Example I-42. Using the resists, patterns were formed in the same manner as explained above, and the properties of these patterns were evaluated.

Further, as in the case of Synthesis Example I-1, the transparency and dry etch resistance were evaluated. The results obtained were summarized in Table 46 below together with the photo-acid generators employed. The values of etch rate were based on that of PMMA.

TABLE 46

| Example | Photo-acid generator | Light transmittance (1 μm) % | Etch rate (relative value) |
|---|---|---|---|
| I-228 | Triphenyl sulfonium triflate | 55 | 0.3 |
| I-229 | Diphenyl iodonium triflate | 59 | 0.3 |
| I-230 | NAT.105 (Midori Kagaku Co., Ltd.) | 61 | 0.3 |
| I-231 | NAI-105 (Midori Kagaku Co., Ltd.) | 60 | 0.3 |

As a result, it was found possible to form a line and space pattern of 0.15 μm in line width in any of examples.

(Synthesis Example I-43)

The synthesis described in the Synthesis Example I-1 was repeated excepting that citronellol was replaced by the same amount of manool thereby obtaining manyl methacrylate.

(Evaluation of homopolymer derived from the monomer obtained in Synthesis Example I-43)

Polymanyl methacrylate was prepared in the same manner as in the Synthesis Example I-1 excepting the employment of manyl methacrylate as a monomer in this example. This polymanyl methacrylate was dissolved in cyclohexanone, and the resultant solution was coated on a quartz wafer to examine of its transparency to ArF excimer laser beam (193 nm). As a result, the light transmittance of the polymanyl methacrylate was 45% as measured by converting the film thickness to 1 μm.

The film was further measured of its etch rate by using carbon tetrafluoride ($CF_4$) gas under the same conditions as explained above. As a result, the etch rate of polymanyl methacrylate was found to be 0.3 when the etch rate of PMMA was assumed to be 1.

In the following Examples I-232 to I-234, copolymers containing manyl methacrylate obtained in the above Synthesis Example I-43 were respectively synthesized to prepare photosensitive materials containing the copolymer which were then examined of their properties.

Example I-232

The preparation of copolymer performed in Synthesis Example I-1 was repeated except that citronellyl methacrylate was replaced by manyl methacrylate obtained in the above Synthesis Example I-43 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-233

The preparation of copolymer performed in Synthesis Example I-2 was repeated except that citronellyl methacrylate was replaced by manyl methacrylate obtained in the above Synthesis Example I-43 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 μm in line width.

Example I-234

The preparation of copolymer performed in Synthesis Example I-3 was repeated except that citronellyl methacrylate was replaced by manyl methacrylate obtained in the above Synthesis Example I-43 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As result, it was found possible to form a positive line and space pattern of 0.5 μm in line width.

(Synthesis Example I-44)

A different kind of copolymer containing the monomer obtained in Synthesis Example I-43 was prepared, and the resultant copolymer was evaluated.

Namely, the preparation of copolymer performed in Synthesis Example I-2 was repeated except that citronellyl methacrylate was replaced by manyl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-235 to I-242, chemically amplified resists containing the copolymer obtained in the above Synthesis Example I-44 were respectively synthesized and were examined of their properties.

Example I-235 to Example I-238

The preparation of chemically amplified resists as performed in (Example I-4) to (Example I-7) were repeated except that the copolymer of Synthesis Example I-2 was replaced by the copolymer obtained in Synthesis Example I-44. Using the resists, patterns were formed in the same manner as explained above, and the properties of these patterns were evaluated.

Further, as in the case of Synthesis Example I-1, the transparency and dry etch resistance were evaluated. The results obtained were summarized in Table 47 below together with the photo-acid generator employed. The values of etch rate were based on that of PMMA.

TABLE 47

| Example | Photo-acid generator | Light transmittance (1 μm) % | Etch rate (relative value) |
|---|---|---|---|
| I-235 | Triphenyl sulfonium triflate | 60 | 0.3 |
| I-236 | Diphenyl iodonium triflate | 59 | 0.3 |
| I-237 | NAT.105 (Midori Kagaku Co., Ltd.) | 61 | 0.3 |
| I-238 | NAI-105 (Midori Kagaku Co., Ltd.) | 60 | 0.3 |

As a result, it was found possible to form a line and space pattern of 0.15 μm in line width in any of examples.

Example I-239 to Example I-242

The preparation of chemically amplified resists as performed in (Example I-8) to (Example I-11) were repeated except that the copolymer of Synthesis Example I-2 was replaced by the copolymer obtained in Synthesis Example I-44. Using the resists, patterns were formed in the same manner as explained above, and the properties of these patterns were evaluated.

Further, as in the case of Synthesis Example I-1, the transparency and dry etch resistance were evaluated. The results obtained were summarized in Table 48 below together with the photo-acid generator employed. The values of etch rate were based on that of PMMA.

TABLE 48

| Example | Photo-acid generator | Light transmittance (1 μm) % | Etch rate (relative value) |
|---|---|---|---|
| I-239 | Triphenyl sulfonium triflate | 55 | 0.3 |
| I-240 | Diphenyl iodonium triflate | 59 | 0.3 |
| I-241 | NAT.105 (Midori Kagaku Co., Ltd.) | 61 | 0.3 |
| I-242 | NAI-105 (Midori Kagaku Co., Ltd.) | 60 | 0.3 |

As a result, it was found possible to form a line and space pattern of 0.15 μm in line width in any of examples.

(Synthesis Example I-45)

The synthesis described in the Synthesis Example I-1 was repeated excepting that citronellol was replaced by the same amount of hinokiol thereby obtaining hinokyl methacrylate.

(Evaluation of homopolymer derived from the monomer obtained in Synthesis Example I-45)

Polyhinokyl methacrylate was prepared in the same manner as in the Synthesis Example I-1 excepting the employment of hinokyl methacrylate as a monomer in this example. This polyhinokyl methacrylate was dissolved in cyclohexanone, and the resultant solution was coated on a quartz wafer to examine of its transparency to ArF excimer laser beam (193 nm). As a result, the light transmittance of the polyhinokyl methacrylate was 45% as measured by converting the film thickness to 1 μm.

The film was further measured of its etch rate by using carbon tetrafluoride ($CF_4$) gas under the same conditions as explained above. As a result, the etch rate of polyhinokyl methacrylate was found to be 0.3 when the etch rate of PMMA was assumed to be 1.

In the following Examples I-243 to I-245, copolymers containing hinokyl methacrylate obtained in the above Synthesis Example I-45 were respectively synthesized to prepare photosensitive materials containing the copolymer which were then examined of their properties.

Example I-243

The preparation of copolymer performed in Synthesis Example I-1 was repeated except that citronellyl methacrylate was replaced by hinokyl methacrylate obtained in the above Synthesis Example I-45 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-244

The preparation of copolymer performed in Synthesis Example I-2 was repeated except that citronellyl methacrylate was replaced by hinokyl methacrylate obtained in the above Synthesis Example I-45 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 μm in line width.

Example I-245

The preparation of copolymer performed in Synthesis Example I-3 was repeated except that citronellyl methacrylate was replaced by hinokyl methacrylate obtained in the above Synthesis Example I-45 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As result, it was found possible to form a positive line and space pattern of 0.5 μm in line width.

(Synthesis Example I-46)

A different kind of copolymer containing the monomer obtained in Synthesis Example I-45 was prepared, and the resultant copolymer was evaluated.

Namely, the preparation of copolymer performed in Synthesis Example I-2 was repeated except that citronellyl methacrylate was replaced by hinokyl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-246 to I-253, chemically amplified resists containing the copolymer obtained in the above Synthesis Example I-46 were respectively synthesized and were examined of their properties.

Example I-246 to Example I-249

The preparation of chemically amplified resists as performed in (Example I-4) to (Example I-7) were repeated except that the copolymer of Synthesis Example I-2 was replaced by the copolymer obtained in Synthesis Example I-46. Using the resists, patterns were formed in the same manner as explained above, and the properties of these patterns were evaluated.

Further, as in the case of Synthesis Example I-1, the transparency and dry etch resistance were evaluated. The results obtained were summarized in Table 49 below together with the photo-acid generator employed. The values of etch rate were based on that of PMMA.

TABLE 49

| Example | Photo-acid generator | Light transmittance (1 μm) % | Etch rate (relative value) |
|---|---|---|---|
| I-246 | Triphenyl sulfonium triflate | 60 | 0.3 |
| I-247 | Diphenyl iodonium triflate | 59 | 0.3 |
| I-248 | NAT.105 (Midori Kagaku Co., Ltd.) | 61 | 0.3 |
| I-249 | NAI-105 (Midori Kagaku Co., Ltd.) | 60 | 0.3 |

As a result, it was found possible to form a line and space pattern of 0.15 μm in line width in any of examples.

Example I-250 to Example I-253

The preparation of chemically amplified resists as performed in (Example I-8) to (Example I-11) were repeated except that the copolymer of Synthesis Example I-2 was replaced by the copolymer obtained in Synthesis Example I-46. Using the resists, patterns were formed in the same manner as explained above, and the properties of these patterns were evaluated.

Further, as in the case of Synthesis Example I-1, the transparency and dry etch resistance were evaluated. The results obtained were summarized in Table 50 below together with the photo-acid generator employed. The values of etch rate were based on that of PMMA.

TABLE 50

| Example | Photo-acid generator | Light transmittance (1 μm) % | Etch rate (relative value) |
|---|---|---|---|
| I-250 | Triphenyl sulfonium triflate | 55 | 0.3 |
| I-251 | Diphenyl iodonium triflate | 59 | 0.3 |
| I-252 | NAT.105 (Midori Kagaku Co., Ltd.) | 61 | 0.3 |
| I-253 | NAI-105 (Midori Kagaku Co., Ltd.) | 60 | 0.3 |

As a result, it was found possible to form a line and space pattern of 0.15 μm in line width in any of examples.

(Synthesis Example I-47)

The synthesis described in the Synthesis Example I-1 was repeated excepting that citronellol was replaced by the same amount of ferruginol thereby obtaining ferruginyl methacrylate.

(Evaluation of homopolymer derived from the monomer obtained in Synthesis Example I-47)

Polyferruginyl methacrylate was prepared in the same manner as in the Synthesis Example I-1 excepting the employment of ferruginyl methacrylate as a monomer in this example. This polyferruginyl methacrylate was dissolved in cyclohexanone, and the resultant solution was coated on a quartz wafer to examine of its transparency to ArF excimer laser beam (193 nm). As a result, the light transmittance of the polyferruginyl methacrylate was 45% as measured by converting the film thickness to 1 μm.

The film was further measured of its etch rate by using carbon tetrafluoride ($CF_4$) gas under the same conditions as explained above. As a result, the etch rate of polyferruginyl methacrylate was found to be 0.3 when the etch rate of PMMA was assumed to be 1.

In the following Examples I-254 to I-256, copolymers containing ferruginyl methacrylate obtained in the above Synthesis Example I-47 were respectively synthesized to prepare photosensitive materials containing the copolymer which were then examined of their properties.

Example I-254

The preparation of copolymer performed in Synthesis Example I-1 was repeated except that citronellyl methacrylate was replaced by ferruginyl methacrylate obtained in the above Synthesis Example I-47 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-255

The preparation of copolymer performed in Synthesis Example I-2 was repeated except that citronellyl methacrylate was replaced by ferruginyl methacrylate obtained in the above Synthesis Example I-47 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 µm in line width.

Example I-256

The preparation of copolymer performed in Synthesis Example I-3 was repeated except that citronellyl methacrylate was replaced by ferruginyl methacrylate obtained in the above Synthesis Example I-47 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As result, it was found possible to form a positive line and space pattern of 0.5 µm in line width.

(Synthesis Example I-48)

A different kind of copolymer containing the monomer obtained in Synthesis Example I-47 was prepared, and the resultant copolymer was evaluated.

Namely, the preparation of copolymer performed in Synthesis Example I-2 was repeated except that citronellyl methacrylate was replaced by ferruginyl methacrylate thereby obtaining a copolymer, which was then dissolved in cyclohexanone. The film 1 µm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-257 to I-264, chemically amplified resists containing the copolymer obtained in the above Synthesis Example I-48 were respectively synthesized and were examined of their properties.

Example I-257 to Example I-260

The preparation of chemically amplified resists as performed in (Example I-4) to (Example I-7) were repeated except that the copolymer of Synthesis Example I-2 was replaced by the copolymer obtained in Synthesis Example I-48. Using the resists, patterns were formed in the same manner as explained above, and the properties of these patterns were evaluated.

Further, as in the case of Synthesis Example I-1, the transparency and dry etch resistance were evaluated. The results obtained were summarized in Table 51 below together with the photo-acid generator employed. The values of etch rate were based on that of PMMA.

TABLE 51

| Example | Photo-acid generator | Light transmittance (1 µm) % | Etch rate (relative value) |
|---|---|---|---|
| I-257 | Triphenyl sulfonium triflate | 60 | 0.3 |
| I-258 | Diphenyl iodonium triflate | 59 | 0.3 |
| I-259 | NAT.105 (Midori Kagaku Co., Ltd.) | 61 | 0.3 |
| I-260 | NAI.105 (Midori Kagaku Co., Ltd.) | 60 | 0.3 |

As a result, it was found possible to form a line and space pattern of 0.15 µm in line width in any of examples.

Example I-261 to Example I-264

The preparation of chemically amplified resists as performed in (Example I-8) to (Example I-11) were repeated except that the copolymer of Synthesis Example I-2 was replaced by the copolymer obtained in Synthesis Example I-48. Using the resists, patterns were formed in the same manner as explained above, and the properties of these patterns were evaluated.

Further, as in the case of Synthesis Example I-1, the transparency and dry etch resistance were evaluated. The results obtained were summarized in Table 52 below together with the photo-acid generator employed. The values of etch rate were based on that of PMMA.

TABLE 52

| Example | Photo-acid generator | Light transmittance (1 µm) % | Etch rate (relative value) |
|---|---|---|---|
| I-261 | Triphenyl sulfonium triflate | 55 | 0.3 |
| I-262 | Diphenyl iodonium triflate | 59 | 0.3 |
| I-263 | NAT.105 (Midori Kagaku Co., Ltd.) | 61 | 0.3 |
| I-264 | NAI.105 (Midori Kagaku Co., Ltd.) | 60 | 0.3 |

As a result, it was found possible to form a line and space pattern of 0.15 µm in line width in any of examples.

(Synthesis Example I-49)

The synthesis described in the Synthesis Example I-1 was repeated excepting that citronellol was replaced by the same amount of totarol thereby obtaining totaryl methacrylate.

(Evaluation of homopolymer derived from the monomer obtained in Synthesis Example I-49)

Polytotaryl methacrylate was prepared in the same manner as in the Synthesis Example I-1 excepting the employment of totaryl methacrylate as a monomer in this example. This polytotaryl methacrylate was dissolved in cyclohexanone, and the resultant solution was coated on a quartz wafer to examine of its transparency to ArF excimer laser beam (193 nm). As a result, the light transmittance of the polytotaryl methacrylate was 45% as measured by converting the film thickness to 1 µm.

The film was further measured of its etch rate by using carbon tetrafluoride ($CF_4$) gas under the same conditions as explained above. As a result, the etch rate of polytotaryl methacrylate was found to be 0.3 when the etch rate of PMMA was assumed to be 1.

In the following Examples I-265 to I-267, copolymers containing totaryl methacrylate obtained in the above Synthesis Example I-49 were respectively synthesized to prepare photosensitive materials containing the copolymer which were then examined of their properties.

Example I-265

The preparation of copolymer performed in Synthesis Example I-1 was repeated except that citronellyl methacrylate was replaced by totaryl methacrylate obtained in the above Synthesis Example I-49 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-266

The preparation of copolymer performed in Synthesis Example I-2 was repeated except that citronellyl methacrylate was replaced by totaryl methacrylate obtained in the above Synthesis Example I-49 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 μm in line width.

Example I-267

The preparation of copolymer performed in Synthesis Example I-3 was repeated except that citronellyl methacrylate was replaced by totaryl methacrylate obtained in the above Synthesis Example I-49 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As result, it was found possible to form a positive line and space pattern of 0.5 μm in line width.
(Synthesis Example I-50)

A different kind of copolymer containing the monomer obtained in Synthesis Example I-49 was prepared, and the resultant copolymer was evaluated.

Namely, the preparation of copolymer performed in Synthesis Example I-2 was repeated except that citronellyl methacrylate was replaced by totaryl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-268 to I-275, chemically amplified resists containing the copolymer obtained in the above Synthesis Example I-50 were respectively synthesized and were examined of their properties.

Example I-268 to Example I-271

The preparation of chemically amplified resists as performed in (Example I-4) to (Example I-7) were repeated except that the copolymer of Synthesis Example I-2 was replaced by the copolymer obtained in Synthesis Example I-50. Using the resists, patterns were formed in the same manner as explained above, and the properties of these patterns were evaluated.

Further, as in the case of Synthesis Example I-1, the transparency and dry etch resistance were evaluated. The results obtained were summarized in Table 53 below together with the photo-acid generator employed. The values of etch rate were based on that of PMMA.

TABLE 53

| Example | Photo-acid generator | Light transmittance (1 μm) % | Etch rate (relative value) |
|---|---|---|---|
| I-268 | Triphenyl sulfonium triflate | 60 | 0.3 |
| I-269 | Diphenyl iodonium triflate | 59 | 0.3 |
| I-270 | NAT.105 (Midori Kagaku Co., Ltd.) | 61 | 0.3 |
| I-271 | NAI.105 (Midori Kagaku Co., Ltd.) | 60 | 0.3 |

As a result, it was found possible to form a line and space pattern of 0.15 μm in line width in any of examples.

Example I-272 to Example I-275

The preparation of chemically amplified resists as performed in (Example I-8) to (Example I-11) were repeated except that the copolymer of Synthesis Example I-2 was replaced by the copolymer obtained in Synthesis Example I-50. Using the resists, patterns were formed in the same manner as explained above, and the properties of these patterns were evaluated.

Further, as in the case of Synthesis Example I-1, the transparency and dry etch resistance were evaluated. The results obtained were summarized in Table 54 below together with the photo-acid generators employed. The values of etch rate were based on that of PMMA.

TABLE 54

| Example | Photo-acid generator | Light transmittance (1 μm) % | Etch rate (relative value) |
|---|---|---|---|
| I-272 | Triphenyl sulfonium triflate | 55 | 0.3 |
| I-273 | Diphenyl iodonium triflate | 59 | 0.3 |
| I-274 | NAT.105 (Midori Kagaku Co., Ltd.) | 61 | 0.3 |
| I-275 | NAI.105 (Midori Kagaku Co., Ltd.) | 60 | 0.3 |

As a result, it was found possible to form a line and space pattern of 0.15 μm in line width in any of examples.
(Synthesis Example I-51)

The synthesis described in the Synthesis Example I-1 was repeated excepting that citronellol was replaced by the same amount of sugiol thereby obtaining sugyl methacrylate.
(Evaluation of homopolymer derived from the monomer obtained in Synthesis Example I-51)

Polysugyl methacrylate was prepared in the same manner as in the Synthesis Example I-1 excepting the employment of sugyl methacrylate as a monomer in this example. This polysugyl methacrylate was dissolved in cyclohexanone, and the resultant solution was coated on a quartz wafer to examine of its transparency to ArF excimer laser beam (193 nm). As a result, the light transmittance of the polysugyl methacrylate was 45% as measured by converting the film thickness to 1 μm.

The film was further measured of its etch rate by using carbon tetrafluoride ($CF_4$) gas under the same conditions as explained above. As a result, the etch rate of polysugyl methacrylate was found to be 0.3 when the etch rate of PMMA was assumed to be 1.

In the following Examples I-276 to I-278, copolymers containing sugyl methacrylate obtained in the above Synthesis Example I-51 were respectively synthesized to prepare photosensitive materials containing the copolymer which were then examined of their properties.

Example I-276

The preparation of copolymer performed in Synthesis Example I-1 was repeated except that citronellyl methacrylate was replaced by sugyl methacrylate obtained in the above Synthesis Example I-51 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As a result, it was found possible to form a negative line and space pattern of 0.5 μm in line width.

Example I-277

The preparation of copolymer performed in Synthesis Example I-2 was repeated except that citronellyl methacrylate was replaced by sugyl methacrylate obtained in the above Synthesis Example I-51 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As a result, it was found possible to form a negative line and space pattern of 0.5 μm in line width.

Example I-278

The preparation of copolymer performed in Synthesis Example I-3 was repeated except that citronellyl methacrylate was replaced by sugyl methacrylate obtained in the above Synthesis Example I-51 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As a result, it was found possible to form a positive line and space pattern of 0.5 μm in line width.
(Synthesis Example I-52)

A different kind of copolymer containing the monomer obtained in Synthesis Example I-51 was prepared, and the resultant copolymer was evaluated.

Namely, the preparation of copolymer performed in Synthesis Example I-2 was repeated except that citronellyl methacrylate was replaced by sugyl methacrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-279 to I-286, chemically amplified resists containing the copolymer obtained in the above Synthesis Example I-52 were respectively synthesized and were examined of their properties.

Example I-279 to Example I-282

The preparation of chemically amplified resists as performed in (Example I-4) to (Example I-7) were repeated except that the copolymer of Synthesis Example I-2 was replaced by the copolymer obtained in Synthesis Example I-52. Using the resists, patterns were formed in the same manner as explained above, and the properties of these patterns were evaluated.

Further, as in the case of Synthesis Example I-1, the transparency and dry etch resistance were evaluated. The results obtained were summarized in Table 55 below together with the photo-acid generators employed. The values of etch rate were based on that of PMMA.

TABLE 55

| Example | Photo-acid generator | Light transmittance (1 μm) % | Etch rate (relative value) |
|---|---|---|---|
| I-279 | Triphenyl sulfonium triflate | 60 | 0.3 |
| I-280 | Diphenyl iodonium triflate | 59 | 0.3 |
| I-281 | NAT.105 (Midori Kagaku Co., Ltd.) | 61 | 0.3 |
| I-282 | NAI.105 (Midori Kagaku Co., Ltd.) | 60 | 0.3 |

As a result, it was found possible to form a line and space pattern of 0.15 μm in line width in any of examples.

Example I-283 to Example I-286

The preparation of chemically amplified resists as performed in (Example I-8) to (Example I-11) were repeated except that the copolymer of Synthesis Example I-2 was replaced by the copolymer obtained in Synthesis Example I-52. Using the resists, patterns were formed in the same manner as explained above, and the properties of these patterns were evaluated.

Further, as in the case of Synthesis Example I-1, the transparency and dry etch resistance were evaluated. The results obtained were summarized in Table 56 below together with the photo-acid generators employed. The values of etch rate were based on that of PMMA.

TABLE 56

| Example | Photo-acid generator | Light transmittance (1 μm) % | Etch rate (relative value) |
|---|---|---|---|
| I-283 | Triphenyl sulfonium triflate | 55 | 0.3 |
| I-284 | Diphenyl iodonium triflate | 59 | 0.3 |
| I-285 | NAT.105 (Midori Kagaku Co., Ltd.) | 61 | 0.3 |
| I-286 | NAI.105 (Midori Kagaku Co., Ltd.) | 60 | 0.3 |

As a result, it was found possible to form a line and space pattern of 0.15 μm in line width in any of examples.
(Synthesis Example I-53)

24 g of acrylic acid, 31 g of citronellol and 1.5 g of p-toluenesulfonic acid in 500 mL of toluene were heated to reflux at a oil temperature of 150° C. for 19 h. Subsequently, the reaction mixture was quenched by the addition of salt saturated sodium bicarbonate solution. The mixed solution was extracted with ether. The organic layers were combined and washed with salt saturated sodium bicarbonate solution, an aqueous solution of sodium hydroxide, and then salt saturated ammonium chloride solution, and then dried over salt saturated brine and sodium sulfate anhydrous. Finally, the resultant oily product was evaporated under reduced pressure to obtain citronellyl acrylate.
(Evaluation of homopolymer derived from the monomer obtained in Synthesis Example I-53)

Polycitronellyl acrylate was prepared in the same manner as in the Synthesis Example I-1 excepting the employment of citronellyl acrylate as a monomer in this example. This polycitronellyl acrylate was dissolved in cyclohexanone, and the resultant solution was coated on a quartz wafer to examine of its transparency to ArF excimer laser beam (193 nm). As a result, the light transmittance of the polycitronellyl acrylate was 45% as measured by converting the film thickness to 1 μm.

The film was further measured of its etch rate by using carbon tetrafluoride ($CF_4$) gas under the same conditions as explained above. As a result, the etch rate of polycitronellyl acrylate was found to be 0.3 when the etch rate of PMMA was assumed to be 1.

In the following Examples I-287 to I-289, copolymers containing citronellyl acrylate obtained in the above Synthesis Example I-53 were respectively synthesized to prepare photosensitive materials containing the copolymer which were then examined of their properties.

Example I-287

The preparation of copolymer performed in Synthesis Example I-1 was repeated except that citronellyl methacrylate was replaced by citronellyl acrylate obtained in the above Synthesis Example I-53 thereby obtaining a copolymer.

The copolymer thus obtained was formed into a solution in the same manner as in Example I-1, which was then coated on a silicon wafer, and the processes of pre-bake, exposure and development were performed under the same conditions as in Example I-1, thereby forming patterns whose properties were subsequently evaluated.

As result, it was found possible to form a negative line and space pattern of 0.5 μm in line width.

Example I-288

The preparation of copolymer performed in Synthesis Example I-2 was repeated except that citronellyl methacrylate was replaced by citronellyl acrylate obtained in the above Synthesis Example I-53 thereby obtaining a copolymer.

The copolymer thus obtained was formed into a solution in the same manner as in Example I-2, which was then coated on a silicon wafer, and the processes of pre-bake, exposure and development were performed under the same conditions as in Example I-2, thereby forming patterns whose properties were subsequently evaluated.

As result, it was found possible to form a negative line and space pattern of 0.5 μm in line width.

Example I-289

The preparation of copolymer performed in Synthesis Example I-3 was repeated except that citronellyl methacrylate was replaced by citronellyl acrylate obtained in the above Synthesis Example I-53 thereby obtaining a copolymer.

The copolymer thus obtained was formed into a solution in the same manner as in Example I-3, which was then coated on a silicon wafer, and the processes of pre-bake, exposure and development were performed under the same conditions as in Example I-3, thereby forming patterns whose properties were subsequently evaluated.

As result, it was found possible to form a positive line and space pattern of 0.5 μm in line width.
(Synthesis Example I-54)

A different kind of copolymer containing the monomer obtained in Synthesis Example I-53 was prepared, and the resultant copolymer was evaluated.

Namely, the preparation of copolymer performed in Synthesis Example I-2 was repeated except that citronellyl methacrylate was replaced by citronellyl acrylate thereby obtaining a copolymer, which was then dissolved in cyclohexanone. The film 1 $\mu$m thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-2, finding that the etch rate of this copolymer was found to be 0.3 when the etch rate of PMMA was assumed to be 1, thus indicating the superiority of the copolymer over that of PMMA.

In the following Examples I-290 to I-297, chemically amplified resists containing the copolymer obtained in the above Synthesis Example I-54 were respectively synthesized and were examined of their properties.

Example I-290 to Example I-293

The preparation of chemically amplified resists as performed in (Example I-4) to (Example I-7) were repeated except that the copolymer of Synthesis Example I-2 was replaced by the copolymer obtained in Synthesis Example I-54. Using the resists, patterns were formed in the same manner as explained above, and the properties of these patterns were evaluated.

Further, as in the case of Synthesis Example I-1, the transparency and dry etch resistance were evaluated. The results obtained were summarized in Table 57 below together with the photo-acid generators employed. The values of etch rate were based on that of PMMA.

TABLE 57

| Example | Photo-acid generator | Light transmittance (1 $\mu$m) % | Etch rate (relative value) |
|---|---|---|---|
| I-290 | Triphenyl sulfonium triflate | 60 | 0.3 |
| I-291 | Diphenyl iodonium triflate | 59 | 0.3 |
| I-292 | NAT.105 (Midori Kagaku Co., Ltd.) | 61 | 0.3 |
| I-293 | NAI.105 (Midori Kagaku Co., Ltd.) | 60 | 0.3 |

As a result, it was found possible to form a line and space pattern of 0.15 $\mu$m in line width in any of examples.

Example I-294 to Example I-297

The preparation of chemically amplified resists as performed in (Example I-8) to (Example I-11) were repeated except that the copolymer of Synthesis Example I-2 was replaced by the copolymer obtained in Synthesis Example I-54. Using the resists, patterns were formed in the same manner as explained above, and the properties of these patterns were evaluated.

Further, as in the case of Synthesis Example I-1, the transparency and dry etch resistance were evaluated. The results obtained were summarized in Table 58 below together with the photo-acid generators employed. The values of etch rate were based on that of PMMA.

TABLE 58

| Example | Photo-acid generator | Light transmittance (1 $\mu$m) % | Etch rate (relative value) |
|---|---|---|---|
| I-294 | Triphenyl sulfonium triflate | 55 | 0.3 |
| I-295 | Diphenyl iodonium triflate | 59 | 0.3 |
| I-296 | NAT.105 (Nidori Kagaku Co., Ltd.) | 61 | 0.3 |
| I-297 | NAI.105 (Midori Kagaku Co., Ltd.) | 60 | 0.3 |

As a result, it was found possible to form a line and space pattern of 0.15 $\mu$m in line width in any of examples.
(Synthesis Example I-55)

The synthesis described in the Synthesis Example I-53 was repeated excepting that citronellol was replaced by the same amount of pinocampheol thereby obtaining pinocamphyl acrylate.
(Evaluation of homopolymer derived from the monomer obtained in Synthesis Example I-55)

Polypinocamphyl acrylate was prepared in the same manner as in the Synthesis Example I-53 excepting the employment of pinocamphyl acrylate as a monomer in this example. This polypinocamphyl acrylate was dissolved in cyclohexanone, and the resultant solution was coated on a quartz wafer to examine of its transparency to ArF excimer laser beam (193 nm). As a result, the light transmittance of the polypinocamphyl acrylate was 45% as measured by converting the film thickness to 1 $\mu$m.

The film was further measured of its etch rate by using carbon tetrafluoride ($CF_4$) gas under the same conditions as explained above. As a result, the etch rate of polypinocamphyl acrylate was found to be 0.3 when the etch rate of PMMA was assumed to be 1.

In the following Examples I-298 to I-300, copolymers containing pinocamphyl acrylate obtained in the above Synthesis Example I-55 were respectively synthesized to prepare photosensitive materials containing the copolymer which were then examined of their properties.

Example I-298

The preparation of copolymer performed in Example I-287 was repeated except that citronellyl acrylate was replaced by pinocamphyl acrylate obtained in the above Synthesis Example I-55 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As result, it was found possible to form a negative line and space pattern of 0.5 $\mu$m in line width.

Example I-299

The preparation of copolymer performed in Example I-288 was repeated except that citronellyl acrylate was replaced by pinocamphyl acrylate obtained in the above Synthesis Example I-55 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As result, it was found possible to form a negative line and space pattern of 0.5 μm in line width.

Example I-300

The preparation of copolymer performed in Example I-289 was repeated except that citronellyl acrylate was replaced by pinocamphyl acrylate obtained in the above Synthesis Example I-55 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As a result, it was found possible to form a positive line and space pattern of 0.5 μm in line width.

(Synthesis Example I-56)

A different kind of copolymer containing the monomer obtained in Synthesis Example I-55 was prepared, and the resultant copolymer was evaluated.

Namely, the preparation of copolymer performed in Synthesis Example I-54 was repeated except that citronellyl acrylate was replaced by pinocamphyl acrylate thereby obtaining a copolymer, which was then dissolved in cyclohexanone. The film formed on a quartz wafer to 1 μm in thickness using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in Synthesis Example 54, finding that the etch rate of this copolymer was found to be 0.3 when the etch rate of PMMA was assumed to be 1, thus indicating the superiority of the copolymer over that of PMMA.

In the following Examples I-301 to I-308, chemically amplified resists containing the copolymer obtained in the above Synthesis Example I-56 were respectively synthesized and were then examined of their properties.

Example I-301 to Example I-304

The preparation of chemically amplified resists as performed in (Example I-4) to (Example I-7) were repeated except that the copolymer of Synthesis Example I-2 was replaced by the copolymer obtained in Synthesis Example I-56. Using the resists, patterns were formed in the same manner as explained above, and the properties of these patterns were evaluated.

Further, as in the case of Synthesis Example I-1, the transparency and dry etch resistance were evaluated. The results obtained were summarized in Table 59 below together with the photo-acid generator employed. The values of etch rate were based on that of PMMA.

TABLE 59

| Example | Photo-acid generator | Light transmittance (1 μm) % | Etch rate (relative value) |
|---|---|---|---|
| I-301 | Triphenyl sulfonium triflate | 60 | 0.3 |
| I-302 | Diphenyl iodonium triflate | 59 | 0.3 |
| I-303 | NAT.105 (Midori Kagaku Co., Ltd.) | 61 | 0.3 |
| I-304 | NAI.105 (Midori Kagaku Co., Ltd.) | 60 | 0.3 |

As a result, it was found possible to form a line and space pattern of 0.15 μm in line width in any of examples.

Example I-305 to Example I-308

The preparation of chemically amplified resists as performed in (Example I-8) to (Example I-11) were repeated except that the copolymer of Synthesis Example I-2 was replaced by the copolymer obtained in Synthesis Example I-56. Using the resists, patterns were formed in the same manner as explained above, and the properties of these patterns were evaluated.

Further, as in the case of Synthesis Example I-1, the transparency and dry etch resistance were evaluated. The results obtained were summarized in Table 60 below together with the photo-acid generators employed. The values of etch rate were based on that of PMMA.

TABLE 60

| Example | Photo-acid generator | Light transmittance (1 μm) % | Etch rate (relative value) |
|---|---|---|---|
| I-305 | Triphenyl sulfonium triflate | 55 | 0.3 |
| I-306 | Diphenyl iodonium triflate | 59 | 0.3 |
| I-307 | NAT.105 (Midori Kagaku Co., Ltd.) | 61 | 0.3 |
| I-308 | NAI.105 (Midori Kagaku Co., Ltd.) | 60 | 0.3 |

As a result, it was found possible to form a line and space pattern of 0.15 μm in line width in any of examples.
(Synthesis Example I-57)

The synthesis described in the Synthesis Example I-53 was repeated excepting that citronellol was replaced by the same amount of geraniol thereby obtaining geranyl acrylate.
(Evaluation of homopolymer derived from the monomer obtained in Synthesis Example I-57)

Polygeranyl acrylate was prepared in the same manner as in the Synthesis Example I-53 excepting the employment of geranyl acrylate as a monomer in this example. This polygeranyl acrylate was dissolved in cyclohexanone, and the resultant solution was coated on a quartz wafer to examine of its transparency to ArF excimer laser beam (193 nm). As a result, the light transmittance of the polygeranyl acrylate was 45% as measured by converting the film thickness to 1 μm.

The film was further measured of its etch rate by using carbon tetrafluoride ($CF_4$) gas under the same conditions as explained above. As a result, the etch rate of polygeranyl acrylate was found to be 0.3 when the etch rate of PMMA was assumed to be 1.

In the following Examples I-309 to I-311, copolymers containing geranyl acrylate obtained in the above Synthesis Example I-57 were respectively synthesized to prepare photosensitive materials containing the copolymer which were then examined of their properties.

Example I-309

The preparation of copolymer performed in Example I-287 was repeated except that citronellyl acrylate was replaced by geranyl acrylate obtained in the above Synthesis Example I-57 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As result, it was found possible to form a negative line and space pattern of 0.5 µm in line width.

Example I-310

The preparation of copolymer performed in Example I-288 was repeated except that citronellyl acrylate was replaced by geranyl acrylate obtained in the above Synthesis Example I-57 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As result, it was found possible to form a negative line and space pattern of 0.5 µm in line width.

Example I-311

The preparation of copolymer performed in Example I-289 was repeated except that citronellyl acrylate was replaced by geranyl acrylate obtained in the above Synthesis Example I-57 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As result, it was found possible to form a positive line and space pattern of 0.5 µm in line width.
(Synthesis Example I-58)

A different kind of copolymer containing the monomer obtained in Synthesis Example I-57 was prepared, and the resultant copolymer was evaluated.

Namely, the preparation of copolymer performed in Synthesis Example I-54 was repeated except that citronellyl acrylate was replaced by geranyl acrylate thereby obtaining a copolymer, which was then dissolved in cyclohexanone. The film 1 µm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-312 to I-319, chemically amplified resists containing the copolymer obtained in the above Synthesis Example I-58 were respectively synthesized and were examined of their properties.

Example I-312 to Example I-315

The preparation of chemically amplified resists as performed in (Example I-4) to (Example I-7) were repeated except that the copolymer of Synthesis Example I-2 was replaced by the copolymer obtained in Synthesis Example I-58. Using the resists, patterns were formed in the same manner as explained above, and the properties of these patterns were evaluated.

Further, as in the case of Synthesis Example I-1, the transparency and dry etch resistance were evaluated. The results obtained were summarized in Table 61 below together with the photo-acid generators employed. The values of etch rate were based on that of PMMA.

TABLE 61

| Example | Photo-acid generator | Light transmittance (1 µm) % | Etch rate (relative value) |
|---|---|---|---|
| I-312 | Triphenyl sulfonium triflate | 60 | 0.3 |
| I-313 | Diphenyl iodonium triflate | 59 | 0.3 |
| I-314 | NAT.105 (Midori Kagaku Co., Ltd.) | 61 | 0.3 |
| I-315 | NAI.105 (Midori Kagaku Co., Ltd.) | 60 | 0.3 |

As a result, it was found possible to form a line and space pattern of 0.15 µm in line width in any of examples.

Example I-316 to Example I-319

The preparation of chemically amplified resists as performed in (Example I-8) to (Example I-11) were repeated except that the copolymer of Synthesis Example I-2 was replaced by the copolymer obtained in Synthesis Example I-58. Using the resists, patterns were formed in the same manner as explained above, and the properties of these patterns were evaluated.

Further, as in the case of Synthesis Example I-1, the transparency and dry etch resistance were evaluated. The results obtained were summarized in Table 62 below together with the photo-acid generators employed. The values of etch rate were based on that of PMMA.

TABLE 62

| Example | Photo-acid generator | Light transmittance (1 µm) % | Etch rate (relative value) |
|---|---|---|---|
| I-316 | Triphenyl sulfonium triflate | 55 | 0.3 |
| I-317 | Diphenyl iodonium triflate | 59 | 0.3 |
| I-318 | NAT.105 (Midori Kagaku Co., Ltd.) | 61 | 0.3 |

TABLE 62-continued

| Example | Photo-acid generator | Light transmittance (1 μm) % | Etch rate (relative value) |
|---|---|---|---|
| I-319 | NAI.105 (Midori Kagaku Co., Ltd.) | 60 | 0.3 |

As a result, it was found possible to form a line and space pattern of 0.15 μm in line width in any of examples.

(Synthesis Example I-59)

The synthesis described in the Synthesis Example I-53 was repeated excepting that citronellol was replaced by the same amount of fenchyl alcohol thereby obtaining fenchyl acrylate.

(Evaluation of homopolymer derived from the monomer obtained in Synthesis Example I-59)

Polyfenchyl acrylate was prepared in the same manner as in the Synthesis Example I-53 excepting the employment of fenchyl acrylate as a monomer in this example. This polyfenchyl acrylate was dissolved in cyclohexanone, and the resultant solution was coated on a quartz wafer to examine of its transparency to ArF excimer laser beam (193 nm). As a result, the light transmittance of the polyfenchyl acrylate was 45% as measured by converting the film thickness to 1 μm.

The film was further measured of its etch rate by using carbon tetrafluoride ($CF_4$) gas under the same conditions as explained above. As a result, the etch rate of polyfenchyl acrylate was found to be 0.3 when the etch rate of PMMA was assumed to be 1.

In the following Examples I-320 to I-322, copolymers containing fenchyl acrylate obtained in the above Synthesis Example I-59 were respectively synthesized to prepare photosensitive materials containing the copolymer which were then examined of their properties.

Example I-320

The preparation of copolymer performed in Example I-287 was repeated except that citronellyl acrylate was replaced by fenchyl acrylate obtained in the above Synthesis Example I-59 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As result, it was found possible to form a negative line and space pattern of 0.5 μm in line width.

Example I-321

The preparation of copolymer performed in Example I-288 was repeated except that citronellyl acrylate was replaced by fenchyl acrylate obtained in the above Synthesis Example I-59 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As a result, it was found possible to form a negative line and space pattern of 0.5 μm in line width.

Example I-322

The preparation of copolymer performed in Example I-289 was repeated except that citronellyl acrylate was replaced by fenchyl acrylate obtained in the above Synthesis Example I-59 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As a result, it was found possible to form a positive line and space pattern of 0.5 μm in line width.

(Synthesis Example I-60)

A different kind of copolymer containing the monomer obtained in Synthesis Example I-59 was prepared, and the resultant copolymer was evaluated.

Namely, the preparation of copolymer performed in Synthesis Example I-54 was repeated except that citronellyl acrylate was replaced by fenchyl acrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-323 to I-330, chemically amplified resists containing the copolymer obtained in the above Synthesis Example I-60 were respectively synthesized and were examined of their properties.

Example I-323 to Example I-326

The preparation of chemically amplified resists as performed in (Example I-4) to (Example I-7) were repeated except that the copolymer of Synthesis Example I-2 was replaced by the copolymer obtained in Synthesis Example I-60. Using the resists, patterns were formed in the same manner as explained above, and the properties of these patterns were evaluated.

Further, as in the case of Synthesis Example I-1, the transparency and dry etch resistance were evaluated. The results obtained were summarized in Table 63 below together with the photo-acid generators employed. The values of etch rate were based on that of PMMA.

TABLE 63

| Example | Photo-acid generator | Light transmittance (1 μm) % | Etch rate (relative value) |
|---|---|---|---|
| I-323 | Triphenyl sulfonium triflate | 60 | 0.3 |
| I-324 | Diphenyl iodonium triflate | 59 | 0.3 |
| I-325 | NAT.105 (Midori Kagaku Co., Ltd.) | 61 | 0.3 |

TABLE 63-continued

| Example | Photo-acid generator | Light transmittance (1 μm) % | Etch rate (relative value) |
|---|---|---|---|
| I-326 | NAI.105 (Midori Kagaku Co., Ltd.) | 60 | 0.3 |

As a result, it was found possible to form a line and space pattern of 0.15 μm in line width in any of examples.

Example I-327 to Example I-330

The preparation of chemically amplified resists as performed in (Example I-8) to (Example I-11) were repeated except that the copolymer of Synthesis Example I-2 was replaced by the copolymer obtained in Synthesis Example I-60. Using the resists, patterns were formed in the same manner as explained above, and the properties of these patterns were evaluated.

Further, as in the case of Synthesis Example I-1, the transparency and dry etch resistance were evaluated. The results obtained were summarized in Table 64 below together with the photo-acid generators employed. The values of etch rate were based on that of PMMA.

TABLE 64

| Example | Photo-acid generator | Light transmittance (1 μm) % | Etch rate (relative value) |
|---|---|---|---|
| I-327 | Triphenyl sulfonium triflate | 55 | 0.3 |
| I-328 | Diphenyl iodonium triflate | 59 | 0.3 |
| I-329 | NAT.105 (Midori Kagaku Co., Ltd.) | 61 | 0.3 |
| I-330 | NAI.105 (Midori Kagaku Co., Ltd.) | 60 | 0.3 |

As a result, it was found possible to form a line and space pattern of 0.15 μm in line width in any of examples.

(Synthesis Example I-61)

The synthesis described in the Synthesis Example I-53 was repeated excepting that citronellol was replaced by the same amount of nerol thereby obtaining neryl acrylate.

(Evaluation of homopolymer derived from the monomer obtained in Synthesis Example I-61)

Polyneryl acrylate was prepared in the same manner as in the Synthesis Example I-53 excepting the employment of neryl acrylate as a monomer in this example. This polyneryl acrylate was dissolved in cyclohexanone, and the resultant solution was coated on a quartz wafer to examine of its transparency to ArF excimer laser beam (193 nm). As a result, the light transmittance of the polyneryl acrylate was 45% as measured by converting the film thickness to 1 μm.

The film was further measured of its etch rate by using carbon tetrafluoride ($CF_4$) gas under the same conditions as explained above. As a result, the etch rate of polyneryl acrylate was found to be 0.3 when the etch rate of PMMA was assumed to be 1.

In the following Examples I-331 to I-333, copolymers containing neryl acrylate obtained in the above Synthesis Example I-61 were respectively synthesized to prepare photosensitive materials containing the copolymer which were then examined of their properties.

Example I-331

The preparation of copolymer performed in Example I-287 was repeated except that citronellyl acrylate was replaced by neryl acrylate obtained in the above Synthesis Example I-61 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As a result, it was found possible to form a negative line and space pattern of 0.5 μm in line width.

Example I-332

The preparation of copolymer performed in Example I-288 was repeated except that citronellyl acrylate was replaced by neryl acrylate obtained in the above Synthesis Example I-61 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As a result, it was found possible to form a negative line and space pattern of 0.5 μm in line width.

Example I-333

The preparation of copolymer performed in Example I-289 was repeated except that citronellyl acrylate was replaced by neryl acrylate obtained in the above Synthesis Example I-61 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As result, it was found possible to form a positive line and space pattern of 0.5 μm in line width.

(Synthesis Example I-62)

A different kind of copolymer containing the monomer obtained in Synthesis Example I-61 was prepared, and the resultant copolymer was evaluated.

Namely, the preparation of copolymer performed in Synthesis Example I-54 was repeated except that citronellyl acrylate was replaced by neryl acrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-334 to I-341, chemically amplified resists containing the copolymer obtained in the above Synthesis Example I-62 were respectively synthesized and were examined of their properties.

Example I-334 to Example I-337

The preparation of chemically amplified resists as performed in (Example I-4) to (Example I-7) were repeated except that the copolymer of Synthesis Example I-2 was replaced by the copolymer obtained in Synthesis Example I-62. Using the resists, patterns were formed in the same manner as explained above, and the properties of these patterns were evaluated.

Further, as in the case of Synthesis Example I-1, the transparency and dry etch resistance were evaluated. The results obtained were summarized in Table 65 below together with the photo-acid generators employed. The values of etch rate were based on that of PMMA.

TABLE 65

| Example | Photo-acid generator | Light transmittance (1 µm) % | Etch rate (relative value) |
|---|---|---|---|
| I-334 | Triphenyl sulfonium triflate | 60 | 0.3 |
| I-335 | Diphenyl iodonium triflate | 59 | 0.3 |
| I-336 | NAT.105 (Midori Kagaku Co., Ltd.) | 61 | 0.3 |
| I-337 | NAI.105 (Midori Kagaku Co., Ltd.) | 60 | 0.3 |

As a result, it was found possible to form a line and space pattern of 0.15 µm in line width in any of examples.

Example I-338 to Example I-341

The preparation of chemically amplified resists as performed in (Example I-8) to (Example I-11) were repeated except that the copolymer of Synthesis Example I-2 was replaced by the copolymer obtained in Synthesis Example I-62. Using the resists, patterns were formed in the same manner as explained above, and the properties of these patterns were evaluated.

Further, as in the case of Synthesis Example I-1, the transparency and dry etch resistance were evaluated. The results obtained were summarized in Table 66 below together with the photo-acid generators employed. The values of etch rate were based on that of PMMA.

TABLE 66

| Example | Photo-acid generator | Light transmittance (1 µm) % | Etch rate (relative value) |
|---|---|---|---|
| I-338 | Triphenyl sulfonium triflate | 55 | 0.3 |
| I-339 | Diphenyl iodonium triflate | 59 | 0.3 |
| I-340 | NAT.105 (Midori Kagaku Co., Ltd.) | 61 | 0.3 |
| I-341 | NAI.105 (Midori Kagaku Co., Ltd.) | 60 | 0.3 |

As a result, it was found possible to form a line and space pattern of 0.15 µm in line width in any of examples.
(Synthesis Example I-63)

The synthesis described in the Synthesis Example I-53 was repeated excepting that citronellol was replaced by the same amount of borneol thereby obtaining bornyl acrylate.
(Evaluation of homopolymer derived from the monomer obtained in Synthesis Example I-63)

Polybornyl acrylate was prepared in the same manner as in the Synthesis Example I-53 excepting the employment of bornyl acrylate as a monomer in this example. This polybornyl acrylate was dissolved in cyclohexanone, and the resultant solution was coated on a quartz wafer to examine of its transparency to ArF excimer laser beam (193 nm). As a result, the light transmittance of the polybornyl acrylate was 45% as measured by converting the film thickness to 1 µm.

The film was further measured of its etch rate by using carbon tetrafluoride ($CF_4$) gas under the same conditions as explained above. As a result, the etch rate of polybornyl acrylate was found to be 0.3 when the etch rate of PMMA was assumed to be 1.

In the following Examples I-342 to I-344, copolymers containing bornyl acrylate obtained in the above Synthesis Example I-63 were respectively synthesized to prepare photosensitive materials containing the copolymer which were then examined of their properties.

Example I-342

The preparation of copolymer performed in Example I-287 was repeated except that citronellyl acrylate was replaced by bornyl acrylate obtained in the above Synthesis Example I-63 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As a result, it was found possible to form a negative line and space pattern of 0.5 µm in line width.

Example I-343

The preparation of copolymer performed in Example I-288 was repeated except that citronellyl acrylate was replaced by bornyl acrylate obtained in the above Synthesis Example I-63 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As result, it was found possible to form a negative line and space pattern of 0.5 μm in line width.

Example I-344

The preparation of copolymer performed in Example I-289 was repeated except that citronellyl acrylate was replaced by bornyl acrylate obtained in the above Synthesis Example I-63 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As result, it was found possible to form a positive line and space pattern of 0.5 μm in line width.
(Synthesis Example I-64)

A different kind of copolymer containing the monomer obtained in Synthesis Example I-63 was prepared, and the resultant copolymer was evaluated.

Namely, the preparation of copolymer performed in Synthesis Example I-54 was repeated except that citronellyl acrylate was replaced by bornyl acrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-345 to I-352, chemically amplified resists containing the copolymer obtained in the above Synthesis Example I-64 were respectively synthesized and were examined of their properties.

Example I-345 to Example I-348

The preparation of chemically amplified resists as performed in (Example I-4) to (Example I-7) were repeated except that the copolymer of Synthesis Example I-2 was replaced by the copolymer obtained in Synthesis Example I-64. Using the resists, patterns were formed in the same manner as explained above, and the properties of these patterns were evaluated.

Further, as in the case of Synthesis Example I-1, the transparency and dry etch resistance were evaluated. The results obtained were summarized in Table 67 below together with the photo-acid generator employed. The values of etch rate were based on that of PMMA.

TABLE 67

| Example | Photo-acid generator | Light transmittance (1 μm) % | Etch rate (relative value) |
|---|---|---|---|
| I-345 | Triphenyl sulfonium triflate | 60 | 0.3 |

TABLE 67-continued

| Example | Photo-acid generator | Light transmittance (1 μm) % | Etch rate (relative value) |
|---|---|---|---|
| I-346 | Diphenyl iodonium triflate | 59 | 0.3 |
| I-347 | NAT.105 (Midori Kagaku Co., Ltd.) | 61 | 0.3 |
| I-348 | NAI.105 (Midori Kagaku Co., Ltd.) | 60 | 0.3 |

As a result, it was found possible to form a line and space pattern of 0.15 μm in line width in any of examples.

Example I-349 to Example I-352

The preparation of chemically amplified resists as performed in (Example I-8) to (Example I-11) were repeated except that the copolymer of Synthesis Example I-2 was replaced by the copolymer obtained in Synthesis Example I-64. Using the resists, patterns were formed in the same manner as explained above, and the properties of these patterns were evaluated.

Further, as in the case of Synthesis Example I-1, the transparency and dry etch resistance were evaluated. The results obtained were summarized in Table 68 below together with the photo-acid generator employed. The values of etch rate were based on that of PMMA.

TABLE 68

| Example | Photo-acid generator | Light transmittance (1 μm)% | Etch rate (relative value) |
|---|---|---|---|
| I-349 | Triphenyl sulfonium triflate | 55 | 0.3 |
| I-350 | Diphenyl iodonium triflate | 59 | 0.3 |
| I-351 | NAT.105 (Midori Kagaku Co., Ltd.) | 61 | 0.3 |
| I-352 | NAI.105 (Midori Kagaku Co., Ltd.) | 60 | 0.3 |

As a result, it was found possible to form a line and space pattern of 0.15 μm in line width in any of examples.
(Synthesis Example I-65)

The synthesis described in the Synthesis Example I-53 was repeated excepting that citronellol was replaced by the same amount of cinerole thereby obtaining cineryl acrylate.
(Evaluation of homopolymer derived from the monomer obtained in Synthesis Example I-65)

Polycineryl acrylate was prepared in the same manner as in the Synthesis Example I-53 excepting the employment of cineryl acrylate as a monomer in this example. This polycineryl acrylate was dissolved in cyclohexanone, and the resultant solution was coated on a quartz wafer to examine of its transparency to ArF excimer laser beam (193 nm). As a result, the light transmittance of the polycineryl acrylate was 45% as measured by converting the film thickness to 1 μm.

The film was further measured of its etch rate by using carbon tetrafluoride ($CF_4$) gas under the same conditions as explained above. As a result, the etch rate of polycineryl acrylate was found to be 0.3 when the etch rate of PMMA was assumed to be 1.

In the following Examples I-353 to I-355, copolymers containing cineryl acrylate obtained in the above Synthesis Example I-65 were respectively synthesized to prepare photosensitive materials containing the copolymer which were then examined of their properties.

Example I-353

The preparation of copolymer performed in Example I-287 was repeated except that citronellyl acrylate was replaced by cineryl acrylate obtained in the above Synthesis Example I-65 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As a result, it was found possible to form a negative line and space pattern of 0.5 μm in line width.

Example I-354

The preparation of copolymer performed in Example I-288 was repeated except that citronellyl acrylate was replaced by cineryl acrylate obtained in the above Synthesis Example I-65 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As a result, it was found possible to form a negative line and space pattern of 0.5 μm in line width.

Example I-355

The preparation of copolymer performed in Example I-289 was repeated except that citronellyl acrylate was replaced by cineryl acrylate obtained in the above Synthesis Example I-65 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As result, it was found possible to form a positive line and space pattern of 0.5 μm in line width.
(Synthesis Example I-66)

A different kind of copolymer containing the monomer obtained in Synthesis Example I-65 was prepared, and the resultant copolymer was evaluated.

Namely, the preparation of copolymer performed in Synthesis Example I-54 was repeated except that citronellyl acrylate was replaced by cineryl acrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-356 to I-363, chemically amplified resists containing the copolymer obtained in the above Synthesis Example I-66 were respectively synthesized and were examined of their properties.

Example I-356 to Example I-359

The preparation of chemically amplified resists as performed in (Example I-4) to (Example I-7) were repeated except that the copolymer of Synthesis Example I-2 was replaced by the copolymer obtained in Synthesis Example I-66. Using the resists, patterns were formed in the same manner as explained above, and the properties of these patterns were evaluated.

Further, as in the case of Synthesis Example I-1, the transparency and dry etch resistance were evaluated. The results obtained were summarized in Table 69 below together with the photo-acid generator employed. The values of etch rate were based on that of PMMA.

TABLE 69

| Example | Photo-acid generator | Light transmittance (1 μm)% | Etch rate (relative value) |
|---|---|---|---|
| I-356 | Triphenyl sulfonium triflate | 60 | 0.3 |
| I-357 | Diphenyl iodonium triflate | 59 | 0.3 |
| I-358 | NAT.105 (Midori Kagaku Co., Ltd.) | 61 | 0.3 |
| I-359 | NAI.105 (Midori Kagaku Co., Ltd.) | 60 | 0.3 |

As a result, it was found possible to form a line and space pattern of 0.15 μm in line width in any of examples.

Example I-360 to Example I-363

The preparation of chemically amplified resists as performed in (Example I-8) to (Example I-11) were repeated except that the copolymer of Synthesis Example I-2 was replaced by the copolymer obtained in Synthesis Example I-66. Using the resists, patterns were formed in the same manner as explained above, and the properties of these patterns were evaluated.

Further, as in the case of Synthesis Example I-1, the transparency and dry etch resistance were evaluated. The results obtained were summarized in Table 70 below together with the photo-acid generator employed. The values of etch rate were based on that of PMMA.

TABLE 70

| Example | Photo-acid generator | Light transmittance (1 μm)% | Etch rate (relative value) |
|---|---|---|---|
| I-360 | Triphenyl sulfonium triflate | 55 | 0.3 |
| I-361 | Diphenyl iodonium triflate | 59 | 0.3 |

TABLE 70-continued

| Example | Photo-acid generator | Light transmittance (1 μm)% | Etch rate (relative value) |
|---|---|---|---|
| I-362 | NAT.105 (Midori Kagaku Co., Ltd.) | 61 | 0.3 |
| I-363 | NAI.105 (Midori Kagaku Co., Ltd.) | 60 | 0.3 |

As a result, it was found possible to form a line and space pattern of 0.15 μm in line width in any of examples.

(Synthesis Example I-67)

The synthesis described in the Synthesis Example I-53 was repeated excepting that citronellol was replaced by the same amount of pinol thereby obtaining pinyl acrylate.

(Evaluation of homopolymer derived from the monomer obtained in Synthesis Example I-67)

Polypinyl acrylate was prepared in the same manner as in the Synthesis Example I-53 excepting the employment of pinyl acrylate as a monomer in this example. This polypinyl acrylate was dissolved in cyclohexanone, and the resultant solution was coated on a quartz wafer to examine of its transparency to ArF excimer laser beam (193 nm). As a result, the light transmittance of the polypinyl acrylate was 45% as measured by converting the film thickness to 1 μm.

The film was further measured of its etch rate by using carbon tetrafluoride ($CF_4$) gas under the same conditions as explained above. As a result, the etch rate of polypinyl acrylate was found to be 0.3 when the etch rate of PMMA was assumed to be 1.

In the following Examples I-364 to I-366, copolymers containing pinyl acrylate obtained in the above Synthesis Example I-67 were respectively synthesized to prepare photosensitive materials containing the copolymer which were then examined of their properties.

Example I-364

The preparation of copolymer performed in Example I-287 was repeated except that citronellyl acrylate was replaced by pinyl acrylate obtained in the above Synthesis Example I-67 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As a result, it was found possible to form a negative line and space pattern of 0.5 μm in line width.

Example I-365

The preparation of copolymer performed in Example I-288 was repeated except that citronellyl acrylate was replaced by pinyl acrylate obtained in the above Synthesis Example I-67 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As a result, it was found possible to form a negative line and space pattern of 0.5 μm in line width.

Example I-366

The preparation of copolymer performed in Example I-289 was repeated except that citronellyl acrylate was replaced by pinyl acrylate obtained in the above Synthesis Example I-67 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As a result, it was found possible to form a positive line and space pattern of 0.5 μm in line width.

(Synthesis Example I-68)

A different kind of copolymer containing the monomer obtained in Synthesis Example I-67 was prepared, and the resultant copolymer was evaluated.

Namely, the preparation of copolymer performed in Synthesis Example I-54 was repeated except that citronellyl acrylate was replaced by pinyl acrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-367 to I-374, chemically amplified resists containing the copolymer obtained in the above Synthesis Example I-68 were respectively synthesized and were examined of their properties.

Example I-367 to Example I-370

The preparation of chemically amplified resists as performed in (Example I-4) to (Example I-7) were repeated except that the copolymer of Synthesis Example I-2 was replaced by the copolymer obtained in Synthesis Example I-68. Using the resists, patterns were formed in the same manner as explained above, and the properties of these patterns were evaluated.

Further, as in the case of Synthesis Example I-1, the transparency and dry etch resistance were evaluated. The results obtained were summarized in Table 71 below together with the photo-acid generator employed. The values of etch rate were based on that of PMMA.

TABLE 71

| Example | Photo-acid generator | Light transmittance (1 μm)% | Etch rate (relative value) |
|---|---|---|---|
| I-367 | Triphenyl sulfonium triflate | 60 | 0.3 |
| I-368 | Diphenyl iodonium triflate | 59 | 0.3 |
| I-369 | NAT.105 (Midori Kagaku Co., Ltd.) | 61 | 0.3 |

TABLE 71-continued

| Example | Photo-acid generator | Light transmittance (1 μm)% | Etch rate (relative value) |
|---|---|---|---|
| I-370 | NAI.105 (Midori Kagaku Co., Ltd.) | 60 | 0.3 |

As a result, it was found possible to form a line and space pattern of 0.15 μm in line width in any of examples.

Example I-371 to Example I-374

The preparation of chemically amplified resists as performed in (Example I-8) to (Example I-11) were repeated except that the copolymer of Synthesis Example I-2 was replaced by the copolymer obtained in Synthesis Example I-68. Using the resists, patterns were formed in the same manner as explained above, and the properties of these patterns were evaluated.

Further, as in the case of Synthesis Example I-1, the transparency and dry etch resistance were evaluated. The results obtained were summarized in Table 72 below together with the photo-acid generator employed. The values of etch rate were based on that of PMMA.

TABLE 72

| Example | Photo-acid generator | Light transmittance (1 μm)% | Etch rate (relative value) |
|---|---|---|---|
| I-371 | Triphenyl sulfonium triflate | 55 | 0.3 |
| I-372 | Diphenyl iodonium triflate | 59 | 0.3 |
| I-373 | NAT.105 (Midori Kagaku Co., Ltd.) | 61 | 0.3 |
| I-374 | NAI.105 (Midori Kagaku Co., Ltd.) | 60 | 0.3 |

As a result, it was found possible to form a line and space pattern of 0.15 μm in line width in any of examples.

(Synthesis Example I-69)

The synthesis described in the Synthesis Example I-53 was repeated excepting that citronellol was replaced by the same amount of ascaridole thereby obtaining ascaridyl acrylate.

(Evaluation of homopolymer derived from the monomer obtained in Synthesis Example I-69)

Polyascaridyl acrylate was prepared in the same manner as in the Synthesis Example I-53 excepting the employment of ascaridyl acrylate as a monomer in this example. This polyascaridyl acrylate was dissolved in cyclohexanone, and the resultant solution was coated on a quartz wafer to examine of its transparency to ArF excimer laser beam (193 nm). As a result, the light transmittance of the polyascaridyl acrylate was 45% as measured by converting the film thickness to 1 μm.

The film was further measured of its etch rate by using carbon tetrafluoride ($CF_4$) gas under the same conditions as explained above. As a result, the etch rate of polyascaridyl acrylate was found to be 0.3 when the etch rate of PMMA was assumed to be 1.

In the following Examples I-375 to I-377, copolymers containing ascaridyl acrylate obtained in the above Synthesis Example I-69 were respectively synthesized to prepare photosensitive materials containing the copolymer which were then examined of their properties.

Example I-375

The preparation of copolymer performed in Example I-287 was repeated except that citronellyl acrylate was replaced by ascaridyl acrylate obtained in the above Synthesis Example I-69 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As result, it was found possible to form a negative line and space pattern of 0.5 μm in line width.

Example I-376

The preparation of copolymer performed in Example I-288 was repeated except that citronellyl acrylate was replaced by ascaridyl acrylate obtained in the above Synthesis Example I-69 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As a result, it was found possible to form a negative line and space pattern of 0.5 μm in line width.

Example I-377

The preparation of copolymer performed in Example I-289 was repeated except that citronellyl acrylate was replaced by ascaridyl acrylate obtained in the above Synthesis Example I-69 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As a result, it was found possible to form a positive line and space pattern of 0.5 μm in line width.

(Synthesis Example I-70)

A different kind of copolymer containing the monomer obtained in Synthesis Example I-69 was prepared, and the resultant copolymer was evaluated.

Namely, the preparation of copolymer performed in Synthesis Example I-54 was repeated except that citronellyl acrylate was replaced by ascaridyl acrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-378 to I-385, chemically amplified resists containing the copolymer obtained in the above Synthesis Example I-70 were respectively synthesized and were examined of their properties.

Example I-378 to Example I-381

The preparation of chemically amplified resists as performed in (Example I-4) to (Example I-7) were repeated except that the copolymer of Synthesis Example I-2 was replaced by the copolymer obtained in Synthesis Example I-70. Using the resists, patterns were formed in the same manner as explained above, and the properties of these patterns were evaluated.

Further, as in the case of Synthesis Example I-1, the transparency and dry etch resistance were evaluated. The results obtained were summarized in Table 73 below together with the photo-acid generator employed. The values of etch rate were based on that of PMMA.

TABLE 73

| Example | Photo-acid generator | Light transmittance (1 $\mu$m)% | Etch rate (relative value) |
|---|---|---|---|
| I-378 | Triphenyl sulfonium triflate | 60 | 0.3 |
| I-379 | Diphenyl iodonium triflate | 59 | 0.3 |
| I-380 | NAT.105 (Midori Kagaku Co., Ltd.) | 61 | 0.3 |
| I-381 | NAI.105 (Midori Kagaku Co., Ltd.) | 60 | 0.3 |

As a result, it was found possible to form a line and space pattern of 0.15 $\mu$m in line width in any of examples.

Example I-382 to Example I-385

The preparation of chemically amplified resists as performed in (Example I-8) to (Example I-11) were repeated except that the copolymer of Synthesis Example I-2 was replaced by the copolymer obtained in Synthesis Example I-70. Using the resists, patterns were formed in the same manner as explained above, and the properties of these patterns were evaluated.

Further, as in the case of Synthesis Example I-1, the transparency and dry etch resistance were evaluated. The results obtained were summarized in Table 74 below together with the photo-acid generator employed. The values of etch rate were based on that of PMMA.

TABLE 74

| Example | Photo-acid generator | Light transmittance (1 $\mu$m)% | Etch rate (relative value) |
|---|---|---|---|
| I-382 | Triphenyl sulfonium triflate | 55 | 0.3 |
| I-383 | Diphenyl iodonium triflate | 59 | 0.3 |
| I-384 | NAT.105 (Midori Kagaku Co., Ltd.) | 61 | 0.3 |
| I-385 | NAI.105 (Midori Kagaku Co., Ltd.) | 60 | 0.3 |

As a result, it was found possible to form a line and space pattern of 0.15 $\mu$m in line width in any of examples.

(Synthesis Example I-71)

The synthesis described in the Synthesis Example I-53 was repeated excepting that citronellol was replaced by the same amount of farnesol thereby obtaining farnesyl acrylate.

(Evaluation of homopolymer derived from the monomer obtained in Synthesis Example I-71)

Polyfarnesyl acrylate was prepared in the same manner as in the Synthesis Example I-53 excepting the employment of farnesyl acrylate as a monomer in this example. This polyfarnesyl acrylate was dissolved in cyclohexanone, and the resultant solution was coated on a quartz wafer to examine of its transparency to ArF excimer laser beam (193 nm). As a result, the light transmittance of the polyfarnesyl acrylate was 45% as measured by converting the film thickness to 1 $\mu$m.

The film was further measured of its etch rate by using carbon tetrafluoride ($CF_4$) gas under the same conditions as explained above. As a result, the etch rate of polyfarnesyl acrylate was found to be 0.3 when the etch rate of PMMA was assumed to be 1.

In the following Examples I-386 to I-388, copolymers containing farnesyl acrylate obtained in the above Synthesis Example I-71 were respectively synthesized to prepare photosensitive materials containing the copolymer which were then examined of their properties.

Example I-386

The preparation of copolymer performed in Example I-287 was repeated except that citronellyl acrylate was replaced by farnesyl acrylate obtained in the above Synthesis Example I-71 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As result, it was found possible to form a negative line and space pattern of 0.5 $\mu$m in line width.

Example I-387

The preparation of copolymer performed in Example I-288 was repeated except that citronellyl acrylate was replaced by farnesyl acrylate obtained in the above Synthesis Example I-71 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As a result, it was found possible to form a negative line and space pattern of 0.5 $\mu$m in line width.

Example I-388

The preparation of copolymer performed in Example I-289 was repeated except that citronellyl acrylate was replaced by farnesyl acrylate obtained in the above Synthesis Example I-71 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As result, it was found possible to form a positive line and space pattern of 0.5 μin line width.

(Synthesis Example I-72)

A different kind of copolymer containing the monomer obtained in Synthesis Example I-71 was prepared, and the resultant copolymer was evaluated.

Namely, the preparation of copolymer performed in Synthesis Example I-54 was repeated except that citronellyl acrylate was replaced by farnesyl acrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-389 to I-396, chemically amplified resists containing the copolymer obtained in the above Synthesis Example I-72 were respectively synthesized and were examined of their properties.

Example I-389 to Example I-392

The preparation of chemically amplified resists as performed in (Example I-4) to (Example I-7) were repeated except that the copolymer of Synthesis Example I-2 was replaced by the copolymer obtained in Synthesis Example I-72. Using the resists, patterns were formed in the same manner as explained above, and the properties of these patterns were evaluated.

Further, as in the case of Synthesis Example I-1, the transparency and dry etch resistance were evaluated. The results obtained were summarized in Table 75 below together with the photo-acid generator employed. The values of etch rate were based on that of PMMA.

TABLE 75

| Example | Photo-acid generator | Light transmittance (1 μm)% | Etch rate (relative value) |
|---|---|---|---|
| I-389 | Triphenyl sulfonium triflate | 60 | 0.3 |
| I-390 | Diphenyl iodonium triflate | 59 | 0.3 |
| I-391 | NAT.105 (Midori Kagaku Co., Ltd.) | 61 | 0.3 |
| I-392 | NAI.105 (Midori Kagaku Co., Ltd.) | 60 | 0.3 |

As a result, it was found possible to form a line and space pattern of 0.15 μm in line width in any of examples.

Example I-393 to Example I-396

The preparation of chemically amplified resists as performed in (Example I-8) to (Example I-11) were repeated except that the copolymer of Synthesis Example I-2 was replaced by the copolymer obtained in Synthesis Example I-72. Using the resists, patterns were formed in the same manner as explained above, and the properties of these patterns were evaluated.

Further, as in the case of Synthesis Example I-1, the transparency and dry etch resistance were evaluated. The results obtained were summarized in Table 76 below together with the photo-acid generator employed. The values of etch rate were based on that of PMMA.

TABLE 76

| Example | Photo-acid generator | Light transmittance (1 μm)% | Etch rate (relative value) |
|---|---|---|---|
| I-393 | Triphenyl sulfonium triflate | 55 | 0.3 |
| I-394 | Diphenyl iodonium triflate | 59 | 0.3 |
| I-395 | NAT.105 (Midori Kagaku Co., Ltd.) | 61 | 0.3 |
| I-396 | NAI.105 (Midori Kagaku Co., Ltd.) | 60 | 0.3 |

As a result, it was found possible to form a line and space pattern of 0.15 μm in line width in any of examples.

(Synthesis Example I-73)

The synthesis described in the Synthesis Example I-53 was repeated excepting that citronellol was replaced by the same amount of patchouli alcohol thereby obtaining patchoulyl acrylate.

(Evaluation of homopolymer derived from the monomer obtained in Synthesis Example I-73)

Polypatchoulyl acrylate was prepared in the same manner as in the Synthesis Example I-53 excepting the employment of patchoulyl acrylate as a monomer in this example. This polypatchoulyl acrylate was dissolved in cyclohexanone, and the resultant solution was coated on a quartz wafer to examine of its transparency to ArF excimer laser beam (193 nm). As a result, the light transmittance of the polypatchoulyl acrylate was 45% as measured by converting the film thickness to 1 μm.

The film was further measured of its etch rate by using carbon tetrafluoride ($CF_4$) gas under the same conditions as explained above. As a result, the etch rate of polypatchoulyl acrylate was found to be 0.3 when the etch rate of PMMA was assumed to be 1.

In the following Examples I-397 to I-399, copolymers containing patchoulyl acrylate obtained in the above Synthesis Example I-73 were respectively synthesized to prepare photosensitive materials containing the copolymer which were then examined of their properties.

Example I-397

The preparation of copolymer performed in Example I-287 was repeated except that citronellyl acrylate was replaced by patchoulyl acrylate obtained in the above Synthesis Example I-73 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As a result, it was found possible to form a negative line and space pattern of 0.5 µm in line width.

Example I-398

The preparation of copolymer performed in Example I-288 was repeated except that citronellyl acrylate was replaced by patchoulyl acrylate obtained in the above Synthesis Example I-73 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As a result, it was found possible to form a negative line and space pattern of 0.5 µm in line width.

Example I-399

The preparation of copolymer performed in Example I-289 was repeated except that citronellyl acrylate was replaced by patchoulyl acrylate obtained in the above Synthesis Example I-73 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As result, it was found possible to form a positive line and space pattern of 0.5 µm in line width.
(Synthesis Example I-74)

A different kind of copolymer containing the monomer obtained in Synthesis Example I-73 was prepared, and the resultant copolymer was evaluated.

Namely, the preparation of copolymer performed in Synthesis Example I-54 was repeated except that citronellyl acrylate was replaced by patchoulyl acrylate thereby obtaining a copolymer, which was then dissolved in cyclohexanone. The film 1 µm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-400 to I-407, chemically amplified resists containing the copolymer obtained in the above Synthesis Example I-74 were respectively synthesized and were examined of their properties.

Example I-400 to Example I-403

The preparation of chemically amplified resists as performed in (Example I-4) to (Example I-7) were repeated except that the copolymer of Synthesis Example I-2 was replaced by the copolymer obtained in Synthesis Example I-74. Using the resists, patterns were formed in the same manner as explained above, and the properties of these patterns were evaluated.

Further, as in the case of Synthesis Example I-1, the transparency and dry etch resistance were evaluated. The results obtained were summarized in Table 77 below together with the photo-acid generator employed. The values of etch rate were based on that of PMMA.

TABLE 77

| Example | Photo-acid generator | Light transmittance (1 µm)% | Etch rate (relative value) |
| --- | --- | --- | --- |
| I-400 | Triphenyl sulfonium triflate | 60 | 0.3 |
| I-401 | Diphenyl iodonium triflate | 59 | 0.3 |
| I-402 | NAT.105 (Midori Kagaku Co., Ltd.) | 61 | 0.3 |
| I-403 | NAI.105 (Midori Kagaku Co., Ltd.) | 60 | 0.3 |

As a result, it was found possible to form a line and space pattern of 0.15 µm in line width in any of examples.

Example I-404 to Example I-407

The preparation of chemically amplified resists as performed in (Example I-8) to (Example I-11) were repeated except that the copolymer of Synthesis Example I-2 was replaced by the copolymer obtained in Synthesis Example I-74. Using the resists, patterns were formed in the same manner as explained above, and the properties of these patterns were evaluated.

Further, as in the case of Synthesis Example I-1, the transparency and dry etch resistance were evaluated. The results obtained were summarized in Table 78 below together with the photo-acid generator employed. The values of etch rate were based on that of PMMA.

TABLE 78

| Example | Photo-acid generator | Light transmittance (1 µm)% | Etch rate (relative value) |
| --- | --- | --- | --- |
| I-404 | Triphenyl sulfonium triflate | 55 | 0.3 |
| I-405 | Diphenyl iodonium triflate | 59 | 0.3 |
| I-406 | NAT.105 (Midori Kagaku Co., Ltd.) | 61 | 0.3 |
| I-407 | NAI.105 (Midori Kagaku Co., Ltd.) | 60 | 0.3 |

As a result, it was found possible to form a line and space pattern of 0.15 µm in line width in any of examples.
(Synthesis Example I-75)

The synthesis described in the Synthesis Example I-53 was repeated excepting that citronellol was replaced by the same amount of nerolidol thereby obtaining nerolidyl acrylate.
(Evaluation of homopolymer derived from the monomer obtained in Synthesis Example I-75)

Polynerolidyl acrylate was prepared in the same manner as in the Synthesis Example I-53 excepting the employment of nerolidyl acrylate as a monomer in this example. This polynerolidyl acrylate was dissolved in cyclohexanone, and the resultant solution was coated on a quartz wafer to examine of its transparency to ArF excimer laser beam (193 nm). As a result, the light transmittance of the polynerolidyl acrylate was 45% as measured by converting the film thickness to 1 µm.

The film was further measured of its etch rate by using carbon tetrafluoride ($CF_4$) gas under the same conditions as explained above. As a result, the etch rate of polynerolidyl acrylate was found to be 0.3 when the etch rate of PMMA was assumed to be 1.

In the following Examples I-408 to I-410, copolymers containing nerolidyl acrylate obtained in the above Synthesis Example I-75 were respectively synthesized to prepare photosensitive materials containing the copolymer which were then examined of their properties.

Example I-408

The preparation of copolymer performed in Example I-287 was repeated except that citronellyl acrylate was replaced by nerolidyl acrylate obtained in the above Synthesis Example I-75 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As a result, it was found possible to form a negative line and space pattern of 0.5 µm in line width.

Example I-409

The preparation of copolymer performed in Example I-288 was repeated except that citronellyl acrylate was replaced by nerolidyl acrylate obtained in the above Synthesis Example I-75 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As result, it was found possible to form a negative line and space pattern of 0.5 µm in line width.

Example I-410

The preparation of copolymer performed in Example I-289 was repeated except that citronellyl acrylate was replaced by nerolidyl acrylate obtained in the above Synthesis Example I-75 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As a result, it was found possible to form a positive line and space pattern of 0.5 µm in line width.
(Synthesis Example I-76)

A different kind of copolymer containing the monomer obtained in Synthesis Example I-75 was prepared, and the resultant copolymer was evaluated.

Namely, the preparation of copolymer performed in Synthesis Example I-54 was repeated except that citronellyl acrylate was replaced by nerolidyl acrylate thereby obtaining a copolymer, which was then dissolved in cyclohexanone. The film 1 µm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-411 to I-418, chemically amplified resists containing the copolymer obtained in the above Synthesis Example I-76 were respectively synthesized and were examined of their properties.

Example I-411 to Example I-414

The preparation of chemically amplified resists as performed in (Example I-4) to (Example I-7) were repeated except that the copolymer of Synthesis Example I-2 was replaced by the copolymer obtained in Synthesis Example I-76. Using the resists, patterns were formed in the same manner as explained above, and the properties of these patterns were evaluated.

Further, as in the case of Synthesis Example I-1, the transparency and dry etch resistance were evaluated. The results obtained were summarized in Table 79 below together with the photo-acid generator employed. The values of etch rate were based on that of PMMA.

TABLE 79

| Example | Photo-acid generator | Light transmittance (1 µm)% | Etch rate (relative value) |
|---|---|---|---|
| I-411 | Triphenyl sulfonium triflate | 60 | 0.3 |
| I-412 | Diphenyl iodonium triflate | 59 | 0.3 |
| I-413 | NAT.105 (Midori Kagaku Co., Ltd.) | 61 | 0.3 |
| I-414 | NAI.105 (Midori Kagaku Co., Ltd.) | 60 | 0.3 |

As a result, it was found possible to form a line and space pattern of 0.15 µm in line width in any of examples.

Example I-415 to Example I-418

The preparation of chemically amplified resists as performed in (Example I-8) to (Example I-11) were repeated except that the copolymer of Synthesis Example I-2 was replaced by the copolymer obtained in Synthesis Example I-76. Using the resists, patterns were formed in the same manner as explained above, and the properties of these patterns were evaluated.

Further, as in the case of Synthesis Example I-1, the transparency and dry etch resistance were evaluated. The results obtained were summarized in Table 80 below together with the photo-acid generator employed. The values of etch rate were based on that of PMMA.

TABLE 80

| Example | Photo-acid generator | Light transmittance (1 μm)% | Etch rate (relative value) |
|---|---|---|---|
| I-415 | Triphenyl sulfonium triflate | 55 | 0.3 |
| I-416 | Diphenyl iodonium triflate | 59 | 0.3 |
| I-417 | NAT.105 (Midori Kagaku Co., Ltd.) | 61 | 0.3 |
| I-418 | NAI.105 (Midori Kagaku Co., Ltd.) | 60 | 0.3 |

As a result, it was found possible to form a line and space pattern of 0.15 μm in line width in any of examples.
(Synthesis Example I-77)

The synthesis described in the Synthesis Example I-53 was repeated excepting that citronellol was replaced by the same amount of carotol thereby obtaining carotyl acrylate.
(Evaluation of homopolymer derived from the monomer obtained in Synthesis Example I-77)

Polycarotyl acrylate was prepared in the same manner as in the Synthesis Example I-53 excepting the employment of carotyl acrylate as a monomer in this example. This polycarotyl acrylate was dissolved in cyclohexanone, and the resultant solution was coated on a quartz wafer to examine of its transparency to ArF excimer laser beam (193 nm). As a result, the light transmittance of the polycarotyl acrylate was 45% as measured by converting the film thickness to 1 μm.

The film was further measured of its etch rate by using carbon tetrafluoride (CF$_4$) gas under the same conditions as explained above. As a result, the etch rate of polycarotyl acrylate was found to be 0.3 when the etch rate of PMMA was assumed to be 1.

In the following Examples I-419 to I-421, copolymers containing carotyl acrylate obtained in the above Synthesis Example I-77 were respectively synthesized to prepare photosensitive materials containing the copolymer which were then examined of their properties.

Example I-419

The preparation of copolymer performed in Example I-287 was repeated except that citronellyl acrylate was replaced by carotyl acrylate obtained in the above Synthesis Example I-77 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As a result, it was found possible to form a negative line and space pattern of 0.5 μm in line width.

Example I-420

The preparation of copolymer performed in Example I-288 was repeated except that citronellyl acrylate was replaced by carotyl acrylate obtained in the above Synthesis Example I-77 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As a result, it was found possible to form a negative line and space pattern of 0.5 μm in line width.

Example I-421

The preparation of copolymer performed in Example I-289 was repeated except that citronellyl acrylate was replaced by carotyl acrylate obtained in the above Synthesis Example I-77 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As result, it was found possible to form a positive line and space pattern of 0.5 μm in line width.
(Synthesis Example I-78)

A different kind of copolymer containing the monomer obtained in Synthesis Example I-77 was prepared, and the resultant copolymer was evaluated.

Namely, the preparation of copolymer performed in Synthesis Example I-54 was repeated except that citronellyl acrylate was replaced by carotyl acrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride (CF$_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-422 to I-429, chemically amplified resists containing the copolymer obtained in the above Synthesis Example I-78 were respectively synthesized and were examined of their properties.

Example I-422 to Example I-425

The preparation of chemically amplified resists as performed in (Example I-4) to (Example I-7) were repeated except that the copolymer of Synthesis Example I-2 was replaced by the copolymer obtained in Synthesis Example I-78. Using the resists, patterns were formed in the same manner as explained above, and the properties of these patterns were evaluated.

Further, as in the case of Synthesis Example I-1, the transparency and dry etch resistance were evaluated. The results obtained were summarized in Table 81 below together with the photo-acid generator employed. The values of etch rate were based on that of PMMA.

TABLE 81

| Example | Photo-acid generator | Light transmittance (1 μm)% | Etch rate (relative value) |
|---|---|---|---|
| I-422 | Triphenyl sulfonium triflate | 60 | 0.3 |
| I-423 | Diphenyl iodonium triflate | 59 | 0.3 |
| I-424 | NAT.105 (Midori Kagaku Co.1 Ltd.) | 61 | 0.3 |
| I-425 | NAI.105 (Midori Kagaku Co., Ltd.) | 60 | 0.3 |

As a result, it was found possible to form a line and space pattern of 0.15 μm in line width in any of examples.

Example I-426 to Example I-429

The preparation of chemically amplified resists as performed in (Example I-8) to (Example I-11) were repeated except that the copolymer of Synthesis Example I-2 was replaced by the copolymer obtained in Synthesis Example I-78. Using the resists, patterns were formed in the same manner as explained above, and the properties of these patterns were evaluated.

Further, as in the case of Synthesis Example I-1, the transparency and dry etch resistance were evaluated. The results obtained were summarized in Table 82 below together with the photo-acid generator employed. The values of etch rate were based on that of PMMA.

TABLE 82

| Example | Photo-acid generator | Light transmittance (1 μm)% | Etch rate (relative value) |
|---|---|---|---|
| I-426 | Triphenyl sulfonium triflate | 55 | 0.3 |
| I-427 | Diphenyl iodonium triflate | 59 | 0.3 |
| I-428 | NAT.105 (Midori Kagaku Co., Ltd.) | 61 | 0.3 |
| I-429 | NAI.105 (Midori Kagaku Co., Ltd.) | 60 | 0.3 |

As a result, it was found possible to form a line and space pattern of 0.15 μm in line width in any of examples.
(Synthesis Example I-79)

The synthesis described in the Synthesis Example I-53 was repeated excepting that citronellol was replaced by the same amount of cadinol thereby obtaining cadinyl acrylate.
(Evaluation of homopolymer derived from the monomer obtained in Synthesis Example I-79)

Polycadinyl acrylate was prepared in the same manner as in the Synthesis Example I-53 excepting the employment of cadinyl acrylate as a monomer in this example. This polycadinyl acrylate was dissolved in cyclohexanone, and the resultant solution was coated on a quartz wafer to examine of its transparency to ArF excimer laser beam (193 nm). As a result, the light transmittance of the polycadinyl acrylate was 45% as measured by converting the film thickness to 1 μm.

The film was further measured of its etch rate by using carbon tetrafluoride ($CF_4$) gas under the same conditions as explained above. As a result, the etch rate of polycadinyl acrylate was found to be 0.3 when the etch rate of PMMA was assumed to be 1.

In the following Examples I-430 to I-432, copolymers containing cadinyl acrylate obtained in the above Synthesis Example I-79 were respectively synthesized to prepare photosensitive materials containing the copolymer which were then examined of their properties.

Example I-430

The preparation of copolymer performed in Example I-287 was repeated except that citronellyl acrylate was replaced by cadinyl acrylate obtained in the above Synthesis Example I-79 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As a result, it was found possible to form a negative line and space pattern of 0.5 μm in line width.

Example I-431

The preparation of copolymer performed in Example I-288 was repeated except that citronellyl acrylate was replaced by cadinyl acrylate obtained in the above Synthesis Example I-79 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As a result, it was found possible to form a negative line and space pattern of 0.5 μm in line width.

Example I-432

The preparation of copolymer performed in Example I-289 was repeated except that citronellyl acrylate was replaced by cadinyl acrylate obtained in the above Synthesis Example I-79 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As a result, it was found possible to form a positive line and space pattern of 0.5 μm in line width.
(Synthesis Example I-80)

A different kind of copolymer containing the monomer obtained in Synthesis Example I-79 was prepared, and the resultant copolymer was evaluated.

Namely, the preparation of copolymer performed in Synthesis Example I-54 was repeated except that citronellyl acrylate was replaced by cadinyl acrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride (CF$_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-433 to I-440, chemically amplified resists containing the copolymer obtained in the above Synthesis Example I-80 were respectively synthesized and were examined of their properties.

Example I-433 to Example I-436

The preparation of chemically amplified resists as performed in (Example I-4) to (Example I-7) were repeated except that the copolymer of Synthesis Example I-2 was replaced by the copolymer obtained in Synthesis Example I-80. Using the resists, patterns were formed in the same manner as explained above, and the properties of these patterns were evaluated.

Further, as in the case of Synthesis Example I-1, the transparency and dry etch resistance were evaluated. The results obtained were summarized in Table 83 below together with the photo-acid generator employed. The values of etch rate were based on that of PMMA.

TABLE 83

| Example | Photo-acid generator | Light transmittance (1 μm)% | Etch rate (relative value) |
|---|---|---|---|
| I-433 | Triphenyl sulfonium triflate | 60 | 0.3 |
| I-434 | Diphenyl iodonium triflate | 59 | 0.3 |
| I-435 | NAT.105 (Midori Kagaku Co., Ltd.) | 61 | 0.3 |
| I-436 | NAI.105 (Midori Kagaku Co., Ltd.) | 60 | 0.3 |

As a result, it was found possible to form a line and space pattern of 0.15 μm in line width in any of examples.

Example I-437 to Example I-440

The preparation of chemically amplified resists as performed in (Example I-8) to (Example I-11) were repeated except that the copolymer of Synthesis Example I-2 was replaced by the copolymer obtained in Synthesis Example I-80. Using the resists, patterns were formed in the same manner as explained above, and the properties of these patterns were evaluated.

Further, as in the case of Synthesis Example I-1, the transparency and dry etch resistance were evaluated. The results obtained were summarized in Table 84 below together with the photo-acid generator employed. The values of etch rate were based on that of PMMA.

TABLE 84

| Example | Photo-acid generator | Light transmittance (1 μm) % | Etch rate (relative value) |
|---|---|---|---|
| I-437 | Triphenyl sulfonium triflate | 55 | 0.3 |
| I-438 | Diphenyl iodonium triflate | 59 | 0.3 |
| I-439 | NAT · 105 (Midori Kagaku Co., Ltd.) | 61 | 0.3 |
| I-440 | NAI 105 (Midori Kagaku Co., Ltd.) | 60 | 0.3 |

As a result, it was found possible to form a line and space pattern of 0.15 μm in line width in any of examples.
(Synthesis Example I-81)

The synthesis described in the Synthesis Example I-53 was repeated excepting that citronellol was replaced by the same amount of lanceol thereby obtaining lancyl acrylate.
(Evaluation of homopolymer derived from the monomer obtained in Synthesis Example I-81)

Polylancyl acrylate was prepared in the same manner as in the Synthesis Example I-53 excepting the employment of lancyl acrylate as a monomer in this example. This polylancyl acrylate was dissolved in cyclohexanone, and the resultant solution was coated on a quartz wafer to examine of its transparency to ArF excimer laser beam (193 nm). As a result, the light transmittance of the polylancyl acrylate was 45% as measured by converting the film thickness to 1.

The film was further measured of its etch rate by using carbon tetrafluoride (CF$_4$) gas under the same conditions as explained above. As a result, the etch rate of polylancyl acrylate was found to be 0.3 when the etch rate of PMMA was assumed to be 1.

In the following Examples I-441 to I-443, copolymers containing lancyl acrylate obtained in the above Synthesis Example I-81 were respectively synthesized to prepare photosensitive materials containing the copolymer which were then examined of their properties.

Example I-441

The preparation of copolymer performed in Example I-287 was repeated except that citronellyl acrylate was replaced by lancyl acrylate obtained in the above Synthesis Example I-81 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As a result, it was found possible to form a negative line and space pattern of 0.5 μm in line width.

Example I-442

The preparation of copolymer performed in Example I-288 was repeated except that citronellyl acrylate was replaced by lancyl acrylate obtained in the above Synthesis Example I-81 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As a result, it was found possible to form a negative line and space pattern of 0.5 μm in line width.

Example I-443

The preparation of copolymer performed in Example I-289 was repeated except that citronellyl acrylate was replaced by lancyl acrylate obtained in the above Synthesis Example I-81 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As a result, it was found possible to form a positive line and space pattern of 0.5 μm in line width.
(Synthesis Example I-82)

A different kind of copolymer containing the monomer obtained in Synthesis Example I-81 was prepared, and the resultant copolymer was evaluated.

Namely, the preparation of copolymer performed in Synthesis Example I-54 was repeated except that citronellyl acrylate was replaced by lancyl acrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-444 to I-451, chemically amplified resists containing the copolymer obtained in the above Synthesis Example I-82 were respectively synthesized and were examined of their properties.

Example I-444 to Example I-447

The preparation of chemically amplified resists as performed in (Example I-4) to (Example I-7) were repeated except that the copolymer of Synthesis Example I-2 was replaced by the copolymer obtained in Synthesis Example I-82. Using the resists, patterns were formed in the same manner as explained above, and the properties of these patterns were evaluated.

Further, as in the case of Synthesis Example I-1, the transparency and dry etch resistance were evaluated. The results obtained were summarized in Table 85 below together with the photo-acid generator employed. The values of etch rate were based on that of PMMA.

TABLE 85

| Example | Photo-acid generator | Light transmittance (1 μm) % | Etch rate (relative value) |
|---|---|---|---|
| I-444 | Triphenyl sulfonium triflate | 60 | 0.3 |

TABLE 85-continued

| Example | Photo-acid generator | Light transmittance (1 μm) % | Etch rate (relative value) |
|---|---|---|---|
| I-445 | Diphenyl iodonium triflate | 59 | 0.3 |
| I-446 | NAT · 105 (Midori Kagaku Co., Ltd.) | 61 | 0.3 |
| I-447 | NAI · 105 (Midori Kagaku Co., Ltd.) | 60 | 0.3 |

As a result, it was found possible to form a line and space pattern of 0.15 μm in line width in any of examples.

Example I-448 to Example I-451

The preparation of chemically amplified resists as performed in (Example I-8) to (Example I-11) were repeated except that the copolymer of Synthesis Example I-2 was replaced by the copolymer obtained in Synthesis Example I-82. Using the resists, patterns were formed in the same manner as explained above, and the properties of these patterns were evaluated.

Further, as in the case of Synthesis Example I-1, the transparency and dry etch resistance were evaluated. The results obtained were summarized in Table 86 below together with the photo-acid generator employed. The values of etch rate were based on that of PMMA.

TABLE 86

| Example | Photo-acid generator | Light transmittance (1 μm) % | Etch rate (relative value) |
|---|---|---|---|
| I-448 | Triphenyl sulfonium triflate | 55 | 0.3 |
| I-449 | Diphenyl iodonium triflate | 59 | 0.3 |
| I-450 | NAT · 105 (Midori Kagaku Co., Ltd.) | 61 | 0.3 |
| I-451 | NAI · 105 (Midori Kagaku Co., Ltd.) | 60 | 0.3 |

As a result, it was found possible to form a line and space pattern of 0.15 μm in line width in any of examples.
(Synthesis Example I-83)

The synthesis described in the Synthesis Example I-53 was repeated excepting that citronellol was replaced by the same amount of eudesmol thereby obtaining eudesmyl acrylate.
(Evaluation of homopolymer derived from the monomer obtained in Synthesis Example I-83)

Polyeudesmyl acrylate was prepared in the same manner as in the Synthesis Example I-53 excepting the employment of eudesmyl acrylate as a monomer in this example. This polyeudesmyl acrylate was dissolved in cyclohexanone, and the resultant solution was coated on a quartz wafer to examine of its transparency to ArF excimer laser beam (193 nm). As a result, the light transmittance of the polyeudesmyl acrylate was 45% as measured by converting the film thickness to 1 μm.

The film was further measured of its etch rate by using carbon tetrafluoride (CF$_4$) gas under the same conditions as explained above. As a result, the etch rate of polyeudesmyl acrylate was found to be 0.3 when the etch rate of PMMA was assumed to be 1.

In the following Examples I-452 to I-454, copolymers containing eudesmyl acrylate obtained in the above Synthesis Example I-83 were respectively synthesized to prepare photosensitive materials containing the copolymer which were then examined of their properties.

Example I-452

The preparation of copolymer performed in Example I-287 was repeated except that citronellyl acrylate was replaced by eudesmyl acrylate obtained in the above Synthesis Example I-83 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As a result, it was found possible to form a negative line and space pattern of 0.5 μm in line width.

Example I-453

The preparation of copolymer performed in Example I-288 was repeated except that citronellyl acrylate was replaced by eudesmyl acrylate obtained in the above Synthesis Example I-83 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As a result, it was found possible to form a negative line and space pattern of 0.5 μm in line width.

Example I-454

The preparation of copolymer performed in Example I-289 was repeated except that citronellyl acrylate was replaced by eudesmyl acrylate obtained in the above Synthesis Example I-83 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As a result, it was found possible to form a positive line and space pattern of 0.5 μm in line width.

(Synthesis Example I-84)

A different kind of copolymer containing the monomer obtained in Synthesis Example I-83 was prepared, and the resultant copolymer was evaluated.

Namely, the preparation of copolymer performed in Synthesis Example I-54 was repeated except that citronellyl acrylate was replaced by eudesmyl acrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride (CF$_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-455 to I-462, chemically amplified resists containing the copolymer obtained in the above Synthesis Example I-84 were respectively synthesized and were examined of their properties.

Example I-455 to Example I-458

The preparation of chemically amplified resists as performed in (Example I-4) to (Example I-7) were repeated except that the copolymer of Synthesis Example I-2 was replaced by the copolymer obtained in Synthesis Example I-84. Using the resists, patterns were formed in the same manner as explained above, and the properties of these patterns were evaluated.

Further, as in the case of Synthesis Example I-1, the transparency and dry etch resistance were evaluated. The results obtained were summarized in Table 87 below together with the photo-acid generator employed. The values of etch rate were based on that of PMMA.

TABLE 87

| Example | Photo-acid generator | Light transmittance (1 μm) % | Etch rate (relative value) |
|---|---|---|---|
| I-455 | Triphenyl sulfonium triflate | 60 | 0.3 |
| I-456 | Diphenyl iodonium triflate | 59 | 0.3 |
| I-457 | NAT · 105 (Midori Kagaku Co., Ltd.) | 61 | 0.3 |
| I-458 | NAI · 105 (Midori Kagaku Co., Ltd.) | 60 | 0.3 |

As a result, it was found possible to form a line and space pattern of 0.15 μm in line width in any of examples.

Example I-459 to Example I-462

The preparation of chemically amplified resists as performed in (Example I-8) to (Example I-11) were repeated except that the copolymer of Synthesis Example I-2 was replaced by the copolymer obtained in Synthesis Example I-84. Using the resists, patterns were formed in the same manner as explained above, and the properties of these patterns were evaluated.

Further, as in the case of Synthesis Example I-1, the transparency and dry etch resistance were evaluated. The results obtained were summarized in Table 88 below together with the photo-acid generator employed. The values of etch rate were based on that of PMMA.

TABLE 88

| Example | Photo-acid generator | Light transmittance (1 μm) % | Etch rate (relative value) |
|---|---|---|---|
| I-459 | Triphenyl sulfonium triflate | 55 | 0.3 |
| I-460 | Diphenyl iodonium triflate | 59 | 0.3 |
| I-461 | NAT · 105 (Midori Kagaku Co., Ltd.) | 61 | 0.3 |
| I-462 | NAI · 105 (Midori Kagaku Co., Ltd.) | 60 | 0.3 |

As a result, it was found possible to form a line and space pattern of 0.15 μm in line width in any of examples.
(Synthesis Example I-85)

The synthesis described in the Synthesis Example I-53 was repeated excepting that citronellol was replaced by the same amount of cedrol thereby obtaining cedryl acrylate.
(Evaluation of homopolymer derived from the monomer obtained in Synthesis Example I-85)

Polycedryl acrylate was prepared in the same manner as in the Synthesis Example I-53 excepting the employment of cedryl acrylate as a monomer in this example. This polycedryl acrylate was dissolved in cyclohexanone, and the resultant solution was coated on a quartz wafer to examine of its transparency to ArF excimer laser beam (193 nm). As a result, the light transmittance of the polycedryl acrylate was 45% as measured by converting the film thickness to 1 μm.

The film was further measured of its etch rate by using carbon tetrafluoride (CF$_4$) gas under the same conditions as explained above. As a result, the etch rate of polycedryl acrylate was found to be 0.3 when the etch rate of PMMA was assumed to be 1.

In the following Examples I-463 to I-465, copolymers containing cedryl acrylate obtained in the above Synthesis Example I-85 were respectively synthesized to prepare photosensitive materials containing the copolymer which were then examined of their properties.

Example I-463

The preparation of copolymer performed in Example I-287 was repeated except that citronellyl acrylate was replaced by cedryl acrylate obtained in the above Synthesis Example I-85 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As a result, it was found possible to form a negative line and space pattern of 0.5 μm in line width.

Example I-464

The preparation of copolymer performed in Example I-288 was repeated except that citronellyl acrylate was replaced by cedryl acrylate obtained in the above Synthesis Example I-85 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As a result, it was found possible to form a negative line and space pattern of 0.5 μm in line width.

Example I-465

The preparation of copolymer performed in Example I-289 was repeated except that citronellyl acrylate was replaced by cedryl acrylate obtained in the above Synthesis Example I-85 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As a result, it was found possible to form a positive line and space pattern of 0.5 μm in line width.
(Synthesis Example I-86)

A different kind of copolymer containing the monomer obtained in Synthesis Example I-85 was prepared, and the resultant copolymer was evaluated.

Namely, the preparation of copolymer performed in Synthesis Example I-54 was repeated except that citronellyl acrylate was replaced by cedryl acrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride (CF$_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-466 to I-473, chemically amplified resists containing the copolymer obtained in the above Synthesis Example I-86 were respectively synthesized and were examined of their properties.

Example I-466 to Example I-469

The preparation of chemically amplified resists as performed in (Example I-4) to (Example I-7) were repeated except that the copolymer of Synthesis Example I-2 was replaced by the copolymer obtained in Synthesis Example I-86. Using the resists, patterns were formed in the same manner as explained above, and the properties of these patterns were evaluated.

Further, as in the case of Synthesis Example I-1, the transparency and dry etch resistance were evaluated. The results obtained were summarized in Table 89 below together with the photo-acid generator employed. The values of etch rate were based on that of PMMA.

TABLE 89

| Example | Photo-acid generator | Light transmittance (1 μm) % | Etch rate (relative value) |
|---|---|---|---|
| I-466 | Triphenyl sulfonium triflate | 60 | 0.3 |

TABLE 89-continued

| Example | Photo-acid generator | Light transmittance (1 μm) % | Etch rate (relative value) |
|---|---|---|---|
| I-467 | Diphenyl iodonium triflate | 59 | 0.3 |
| I-468 | NAT · 105 (Midori Kagaku Co., Ltd.) | 61 | 0.3 |
| I-469 | NAI · 105 (Midori Kagaku Co., Ltd.) | 60 | 0.3 |

As a result, it was found possible to form a line and space pattern of 0.15 μm in line width in any of examples.

Example I-470 to Example I-473

The preparation of chemically amplified resists as performed in (Example I-8) to (Example I-11) were repeated except that the copolymer of Synthesis Example I-2 was replaced by the copolymer obtained in Synthesis Example I-86. Using the resists, patterns were formed in the same manner as explained above, and the properties of these patterns were evaluated.

Further, as in the case of Synthesis Example I-1, the transparency and dry etch resistance were evaluated. The results obtained were summarized in Table 90 below together with the photo-acid generator employed. The values of etch rate were based on that of PMMA.

TABLE 90

| Example | Photo-acid generator | Light transmittance (1 μm) % | Etch rate (relative value) |
|---|---|---|---|
| I-470 | Triphenyl sulfonium triflate | 55 | 0.3 |
| I-471 | Diphenyl iodonium triflate | 59 | 0.3 |
| I-472 | NAT · 105 (Midori Kagaku Co., Ltd.) | 61 | 0.3 |
| I-473 | NAI · 105 (Midori Kagaku Co., Ltd.) | 60 | 0.3 |

As a result, it was found possible to form a line and space pattern of 0.15 μm in line width in any of examples.
(Synthesis Example I-87)

The synthesis described in the Synthesis Example I-53 was repeated excepting that citronellol was replaced by the same amount of guajol thereby obtaining guajyl acrylate.
(Evaluation of homopolymer derived from the monomer obtained in Synthesis Example I-87)

Polyguajyl acrylate was prepared in the same manner as in the Synthesis Example I-53 excepting the employment of guajyl acrylate as a monomer in this example. This polyguajyl acrylate was dissolved in cyclohexanone, and the resultant solution was coated on a quartz wafer to examine of its transparency to ArF excimer laser beam (193 nm). As a result, the light transmittance of the polyguajyl acrylate was 45% as measured by converting the film thickness to 1 μm.

The film was further measured of its etch rate by using carbon tetrafluoride ($CF_4$) gas under the same conditions as explained above. As a result, the etch rate of polyguajyl acrylate was found to be 0.3 when the etch rate of PMMA was assumed to be 1.

In the following Examples I-474 to I-476, copolymers containing guajyl acrylate obtained in the above Synthesis Example I-87 were respectively synthesized to prepare photosensitive materials containing the copolymer which were then examined of their properties.

Example I-474

The preparation of copolymer performed in Example I-287 was repeated except that citronellyl acrylate was replaced by guajyl acrylate obtained in the above Synthesis Example I-87 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As a result, it was found possible to form a negative line and space pattern of 0.5 μm in line width.

Example I-475

The preparation of copolymer performed in Example I-288 was repeated except that citronellyl acrylate was replaced by guajyl acrylate obtained in the above Synthesis Example I-87 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As a result, it was found possible to form a negative line and space pattern of 0.5 μm in line width.

Example I-476

The preparation of copolymer performed in Example I-289 was repeated except that citronellyl acrylate was replaced by guajyl acrylate obtained in the above Synthesis Example I-87 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As a result, it was found possible to form a positive line and space pattern of 0.5 μm in line width.
(Synthesis Example I-88)

A different kind of copolymer containing the monomer obtained in Synthesis Example I-87 was prepared, and the resultant copolymer was evaluated.

Namely, the preparation of copolymer performed in Synthesis Example I-54 was repeated except that citronellyl acrylate was replaced by guajyl acrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-477 to I-484, chemically amplified resists containing the copolymer obtained in the above Synthesis Example I-88 were respectively synthesized and were examined of their properties.

Example I-477 to Example I-480

The preparation of chemically amplified resists as performed in (Example I-4) to (Example I-7) were repeated except that the copolymer of Synthesis Example I-2 was replaced by the copolymer obtained in Synthesis Example I-88. Using the resists, patterns were formed in the same manner as explained above, and the properties of these patterns were evaluated.

Further, as in the case of Synthesis Example I-1, the transparency and dry etch resistance were evaluated. The results obtained were summarized in Table 91 below together with the photo-acid generator employed. The values of etch rate were based on that of PMMA.

TABLE 91

| Example | Photo-acid generator | Light transmittance (1 μm) % | Etch rate (relative value) |
| --- | --- | --- | --- |
| I-477 | Triphenyl sulfonium triflate | 60 | 0.3 |
| I-478 | Diphenyl iodonium triflate | 59 | 0.3 |
| I-479 | NAT · 105 (Midori Kagaku Co., Ltd.) | 61 | 0.3 |
| I-480 | NAI · 105 (Midori Kagaku Co., Ltd.) | 60 | 0.3 |

As a result, it was found possible to form a line and space pattern of 0.15 μm in line width in any of examples.

Example I-481 to Example I-484

The preparation of chemically amplified resists as performed in (Example I-8) to (Example I-11) were repeated except that the copolymer of Synthesis Example I-2 was replaced by the copolymer obtained in Synthesis Example I-88. Using the resists, patterns were formed in the same manner as explained above, and the properties of these patterns were evaluated.

Further, as in the case of Synthesis Example I-1, the transparency and dry etch resistance were evaluated. The results obtained were summarized in Table 92 below together with the photo-acid generator employed. The values of etch rate were based on that of PMMA.

TABLE 92

| Example | Photo-acid generator | Light transmittance (1 μm) % | Etch rate (relative value) |
| --- | --- | --- | --- |
| I-481 | Triphenyl sulfonium triflate | 55 | 0.3 |
| I-482 | Diphenyl iodonium triflate | 59 | 0.3 |
| I-483 | NAT · 105 (Midori Kagaku Co., Ltd.) | 61 | 0.3 |
| I-484 | NAI · 105 (Midori Kagaku Co., Ltd.) | 60 | 0.3 |

As a result, it was found possible to form a line and space pattern of 0.15 μm in line width in any of examples.
(Synthesis Example I-89)

The synthesis described in the Synthesis Example I-53 was repeated excepting that citronellol was replaced by the same amount of kessoglycol thereby obtaining kessoglycoxyl acrylate.

(Evaluation of homopolymer derived from the monomer obtained in Synthesis Example I-89)

Polykessoglycoxyl acrylate was prepared in the same manner as in the Synthesis Example I-53 excepting the employment of kessoglycoxyl acrylate as a monomer in this example. This polykessoglycoxyl acrylate was dissolved in cyclohexanone, and the resultant solution was coated on a quartz wafer to examine of its transparency to ArF excimer laser beam (193 nm). As a result, the light transmittance of the polykessoglycoxyl acrylate was 45% as measured by converting the film thickness to 1 μm.

The film was further measured of its etch rate by using carbon tetrafluoride ($CF_4$) gas under the same conditions as explained above. As a result, the etch rate of polykessoglycoxyl acrylate was found to be 0.3 when the etch rate of PMMA was assumed to be 1.

In the following Examples I-485 to I-487, copolymers containing kessoglycoxyl acrylate obtained in the above Synthesis Example I-89 were respectively synthesized to prepare photosensitive materials containing the copolymer which were then examined of their properties.

Example I-485

The preparation of copolymer performed in Example I-287 was repeated except that citronellyl acrylate was replaced by kessoglycoxyl acrylate obtained in the above Synthesis Example I-89 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As a result, it was found possible to form a negative line and space pattern of 0.5 μm in line width.

Example I-486

The preparation of copolymer performed in Example I-288 was repeated except that citronellyl acrylate was replaced by kessoglycoxyl acrylate obtained in the above Synthesis Example I-89 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As a result, it was found possible to form a negative line and space pattern of 0.5 μm in line width.

Example I-487

The preparation of copolymer performed in Example I-289 was repeated except that citronellyl acrylate was replaced by kessoglycoxyl acrylate obtained in the above Synthesis Example I-89 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As a result, it was found possible to form a positive line and space pattern of 0.5 μm in line width.

(Synthesis Example I-90)

A different kind of copolymer containing the monomer obtained in Synthesis Example I-89 was prepared, and the resultant copolymer was evaluated.

Namely, the preparation of copolymer performed in Synthesis Example I-54 was repeated except that citronellyl acrylate was replaced by kessoglycoxyl acrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-488 to I-495, chemically amplified resists containing the copolymer obtained in the above Synthesis Example I-90 were respectively synthesized and were examined of their properties.

Example I-488 to Example I-491

The preparation of chemically amplified resists as performed in (Example I-4) to (Example I-7) were repeated except that the copolymer of Synthesis Example I-2 was replaced by the copolymer obtained in Synthesis Example I-90. Using the resists, patterns were formed in the same manner as explained above, and the properties of these patterns were evaluated.

Further, as in the case of Synthesis Example I-1, the transparency and dry etch resistance were evaluated. The results obtained were summarized in Table 93 below together with the photo-acid generator employed. The values of etch rate were based on that of PMMA.

TABLE 93

| Example | Photo-acid generator | Light transmittance (1 μm) % | Etch rate (relative value) |
|---------|---------------------|------------------------------|----------------------------|
| I-488   | Triphenyl sulfonium triflate | 60 | 0.3 |

TABLE 93-continued

| Example | Photo-acid generator | Light transmittance (1 μm) % | Etch rate (relative value) |
|---------|---------------------|------------------------------|----------------------------|
| I-489   | Diphenyl iodonium triflate | 59 | 0.3 |
| I-490   | NAT · 105 (Midori Kagaku Co., Ltd.) | 61 | 0.3 |
| I-491   | NAI · 105 (Midori Kagaku Co., Ltd.) | 60 | 0.3 |

As a result, it was found possible to form a line and space pattern of 0.15 μm in line width in any of examples.

Example I-492 to Example I-495

The preparation of chemically amplified resists as performed in (Example I-8) to (Example I-11) were repeated except that the copolymer of Synthesis Example I-2 was replaced by the copolymer obtained in Synthesis Example I-90. Using the resists, patterns were formed in the same manner as explained above, and the properties of these patterns were evaluated.

Further, as in the case of Synthesis Example I-1, the transparency and dry etch resistance were evaluated. The results obtained were summarized in Table 94 below together with the photo-acid generator employed. The values of etch rate were based on that of PMMA.

TABLE 94

| Example | Photo-acid generator | Light transmittance (1 μm) % | Etch rate (relative value) |
|---------|---------------------|------------------------------|----------------------------|
| I-492   | Triphenyl sulfonium triflate | 55 | 0.3 |
| I-493   | Diphenyl iodonium triflate | 59 | 0.3 |
| I-494   | NAT · 105 (Midori Kagaku Co., Ltd.) | 61 | 0.3 |
| I-495   | NAI · 105 (Midori Kagaku Co., Ltd.) | 60 | 0.3 |

As a result, it was found possible to form a line and space pattern of 0.15 μm in line width in any of examples.

(Synthesis Example I-91)

The synthesis described in the Synthesis Example I-53 was repeated excepting that citronellol was replaced by the same amount of phytol thereby obtaining phytyl acrylate.

(Evaluation of homopolymer derived from the monomer obtained in Synthesis Example I-91)

Polyphytyl acrylate was prepared in the same manner as in the Synthesis Example I-53 excepting the employment of phytyl acrylate as a monomer in this example. This polyphytyl acrylate was dissolved in cyclohexanone, and the resultant solution was coated on a quartz wafer to examine of its transparency to ArF excimer laser beam (193 nm). As a result, the light transmittance of the polyphytyl acrylate was 45% as measured by converting the film thickness to 1 μm.

The film was further measured of its etch rate by using carbon tetrafluoride ($CF_4$) gas under the same conditions as explained above. As a result, the etch rate of polyphytyl acrylate was found to be 0.3 when the etch rate of PMMA was assumed to be 1.

In the following Examples I-496 to I-498, copolymers containing phytyl acrylate obtained in the above Synthesis Example I-91 were respectively synthesized to prepare photosensitive materials containing the copolymer which were then examined of their properties.

Example I-496

The preparation of copolymer performed in Example I-287 was repeated except that citronellyl acrylate was replaced by phytyl acrylate obtained in the above Synthesis Example I-91 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As a result, it was found possible to form a negative line and space pattern of 0.5 µm in line width.

Example I-497

The preparation of copolymer performed in Example I-288 was repeated except that citronellyl acrylate was replaced by phytyl acrylate obtained in the above Synthesis Example I-91 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As a result, it was found possible to form a negative line and space pattern of 0.5 µm in line width.

Example I-498

The preparation of copolymer performed in Example I-289 was repeated except that citronellyl acrylate was replaced by phytyl acrylate obtained in the above Synthesis Example I-91 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As a result, it was found possible to form a positive line and space pattern of 0.5 µm in line width.
(Synthesis Example I-92)

A different kind of copolymer containing the monomer obtained in Synthesis Example I-91 was prepared, and the resultant copolymer was evaluated.

Namely, the preparation of copolymer performed in Synthesis Example I-54 was repeated except that citronellyl acrylate was replaced by phytyl acrylate thereby obtaining a copolymer, which was then dissolved in cyclohexanone. The film 1 µm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-499 to I-506, chemically amplified resists containing the copolymer obtained in the above Synthesis Example I-92 were respectively synthesized and were examined of their properties.

Example I-499 to Example I-502

The preparation of chemically amplified resists as performed in (Example I-4) to (Example I-7) were repeated except that the copolymer of Synthesis Example I-2 was replaced by the copolymer obtained in Synthesis Example I-92. Using the resists, patterns were formed in the same manner as explained above, and the properties of these patterns were evaluated.

Further, as in the case of Synthesis Example I-1, the transparency and dry etch resistance were evaluated. The results obtained were summarized in Table 95 below together with the photo-acid generator employed. The values of etch rate were based on that of PMMA.

TABLE 95

| Example | Photo-acid generator | Light transmittance (1 µm) % | Etch rate (relative value) |
| --- | --- | --- | --- |
| I-499 | Triphenyl sulfonium triflate | 60 | 0.3 |
| I-500 | Diphenyl iodonium triflate | 59 | 0.3 |
| I-501 | NAT · 105 (Midori Kagaku Co., Ltd.) | 61 | 0.3 |
| I-502 | NAI · 105 (Midori Kagaku Co., Ltd.) | 60 | 0.3 |

As a result, it was found possible to form a line and space pattern of 0.15 µm in line width in any of examples.

Example I-503 to Example I-506

The preparation of chemically amplified resists as performed in (Example I-8) to (Example I-11) were repeated except that the copolymer of Synthesis Example I-2 was replaced by the copolymer obtained in Synthesis Example I-92. Using the resists, patterns were formed in the same manner as explained above, and the properties of these patterns were evaluated.

Further, as in the case of Synthesis Example I-1, the transparency and dry etch resistance were evaluated. The results obtained were summarized in Table 96 below together with the photo-acid generator employed. The values of etch rate were based on that of PMMA.

TABLE 96

| Example | Photo-acid generator | Light transmittance (1 µm) % | Etch rate (relative value) |
| --- | --- | --- | --- |
| I-503 | Triphenyl sulfonium triflate | 55 | 0.3 |

TABLE 96-continued

| Example | Photo-acid generator | Light transmittance (1 μm) % | Etch rate (relative value) |
|---|---|---|---|
| I-504 | Diphenyl iodonium triflate | 59 | 0.3 |
| I-505 | NAT · 105 (Midori Kagaku Co., Ltd.) | 61 | 0.3 |
| I-506 | NAI · 105 (Midori Kagaku Co., Ltd.) | 60 | 0.3 |

As a result, it was found possible to form a line and space pattern of 0.15 μm in line width in any of examples.
(Synthesis Example I-93)

The synthesis described in the Synthesis Example I-53 was repeated excepting that citronellol was replaced by the same amount of sclareol thereby obtaining sclaryl acrylate.
(Evaluation of homopolymer derived from the monomer obtained in Synthesis Example I-93)

Polysclaryl acrylate was prepared in the same manner as in the Synthesis Example I-53 excepting the employment of sclaryl acrylate as a monomer in this example. This polysclaryl acrylate was dissolved in cyclohexanone, and the resultant solution was coated on a quartz wafer to examine of its transparency to ArF excimer laser beam (193 nm). As a result, the light transmittance of the polysclaryl acrylate was 45% as measured by converting the film thickness to 1 μm.

The film was further measured of its etch rate by using carbon tetrafluoride ($CF_4$) gas under the same conditions as explained above. As a result, the etch rate of polysclaryl acrylate was found to be 0.3 when the etch rate of PMMA was assumed to be 1.

In the following Examples I-507 to I-509, copolymers containing sclaryl acrylate obtained in the above Synthesis Example I-93 were respectively synthesized to prepare photosensitive materials containing the copolymer which were then examined of their properties.

Example I-507

The preparation of copolymer performed in Example I-287 was repeated except that citronellyl acrylate was replaced by sclaryl acrylate obtained in the above Synthesis Example I-93 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As a result, it was found possible to form a negative line and space pattern of 0.5 μm in line width.

Example I-508

The preparation of copolymer performed in Example I-288 was repeated except that citronellyl acrylate was replaced by sclaryl acrylate obtained in the above Synthesis Example I-93 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As a result, it was found possible to form a negative line and space pattern of 0.5 μm in line width.

Example I-509

The preparation of copolymer performed in Example I-289 was repeated except that citronellyl acrylate was replaced by sclaryl acrylate obtained in the above Synthesis Example I-93 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As a result, it was found possible to form a positive line and space pattern of 0.5 μm in line width.
(Synthesis Example I-94)

A different kind of copolymer containing the monomer obtained in Synthesis Example I-93 was prepared, and the resultant copolymer was evaluated.

Namely, the preparation of copolymer performed in Synthesis Example I-54 was repeated except that citronellyl acrylate was replaced by sclaryl acrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-510 to I-517, chemically amplified resists containing the copolymer obtained in the above Synthesis Example I-94 were respectively synthesized and were examined of their properties.

Example I-510 to Example I-513

The preparation of chemically amplified resists as performed in (Example I-4) to (Example I-7) were repeated except that the copolymer of Synthesis Example I-2 was replaced by the copolymer obtained in Synthesis Example I-94. Using the resists, patterns were formed in the same manner as explained above, and the properties of these patterns were evaluated.

Further, as in the case of Synthesis Example I-1, the transparency and dry etch resistance were evaluated. The results obtained were summarized in Table 97 below together with the photo-acid generator employed. The values of etch rate were based on that of PMMA.

TABLE 97

| Example | Photo-acid generator | Light transmittance (1 μm) % | Etch rate (relative value) |
|---|---|---|---|
| I-510 | Triphenyl sulfonium triflate | 60 | 0.3 |

TABLE 97-continued

| Example | Photo-acid generator | Light transmittance (1 μm) % | Etch rate (relative value) |
|---|---|---|---|
| I-511 | Diphenyl iodonium triflate | 59 | 0.3 |
| I-512 | NAT · 105 (Midori Kagaku Co., Ltd.) | 61 | 0.3 |
| I-513 | NAI · 105 (Midori Kagaku Co., Ltd.) | 60 | 0.3 |

As a result, it was found possible to form a line and space pattern of 0.15 μm in line width in any of examples.

Example I-514 to Example I-517

The preparation of chemically amplified resists as performed in (Example I-8) to (Example I-11) were repeated except that the copolymer of Synthesis Example I-2 was replaced by the copolymer obtained in Synthesis Example I-94. Using the resists, patterns were formed in the same manner as explained above, and the properties of these patterns were evaluated.

Further, as in the case of Synthesis Example I-1, the transparency and dry etch resistance were evaluated. The results obtained were summarized in Table 98 below together with the photo-acid generator employed. The values of etch rate were based on that of PMMA.

TABLE 98

| Example | Photo-acid generator | Light transmittance (1 μm) % | Etch rate (relative value) |
|---|---|---|---|
| I-514 | Triphenyl sulfonium triflate | 55 | 0.3 |
| I-515 | Diphenyl iodonium triflate | 59 | 0.3 |
| I-516 | NAT · 105 (Midori Kagaku Co., Ltd.) | 61 | 0.3 |
| I-517 | NAI · 105 (Midori Kagaku Co., Ltd.) | 60 | 0.3 |

As a result, it was found possible to form a line and space pattern of 0.15 μm in line width in any of examples.
(Synthesis Example I-95)

The synthesis described in the Synthesis Example I-53 was repeated excepting that citronellol was replaced by the same amount of manool thereby obtaining manyl acrylate.
(Evaluation of homopolymer derived from the monomer obtained in Synthesis Example I-95)

Polymanyl acrylate was prepared in the same manner as in the Synthesis Example I-53 excepting the employment of manyl acrylate as a monomer in this example. This polymanyl acrylate was dissolved in cyclohexanone, and the resultant solution was coated on a quartz wafer to examine of its transparency to ArF excimer laser beam (193 nm). As a result, the light transmittance of the polymanyl acrylate was 45% as measured by converting the film thickness to 1 μm.

The film was further measured of its etch rate by using carbon tetrafluoride ($CF_4$) gas under the same conditions as explained above. As a result, the etch rate of polymanyl acrylate was found to be 0.3 when the etch rate of PMMA was assumed to be 1.

In the following Examples I-518 to I-520, copolymers containing manyl acrylate obtained in the above Synthesis Example I-95 were respectively synthesized to prepare photosensitive materials containing the copolymer which were then examined of their properties.

Example I-518

The preparation of copolymer performed in Example I-287 was repeated except that citronellyl acrylate was replaced by manyl acrylate obtained in the above Synthesis Example I-95 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As a result, it was found possible to form a negative line and space pattern of 0.5 μm in line width.

Example I-519

The preparation of copolymer performed in Example I-288 was repeated except that citronellyl acrylate was replaced by manyl acrylate obtained in the above Synthesis Example I-95 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As a result, it was found possible to form a negative line and space pattern of 0.5 μm in line width.

Example I-520

The preparation of copolymer performed in Example I-289 was repeated except that citronellyl acrylate was replaced by manyl acrylate obtained in the above Synthesis Example I-95 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As a result, it was found possible to form a positive line and space pattern of 0.5 μm in line width.
(Synthesis Example I-96)

A different kind of copolymer containing the monomer obtained in Synthesis Example I-95 was prepared, and the resultant copolymer was evaluated.

Namely, the preparation of copolymer performed in Synthesis Example I-54 was repeated except that citronellyl acrylate was replaced by manyl acrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-521 to I-528, chemically amplified resists containing the copolymer obtained in the above Synthesis Example I-96 were respectively synthesized and were examined of their properties.

Example I-521 to Example I-524

The preparation of chemically amplified resists as performed in (Example I-4) to (Example I-7) were repeated except that the copolymer of Synthesis Example I-2 was replaced by the copolymer obtained in Synthesis Example I-96. Using the resists, patterns were formed in the same manner as explained above, and the properties of these patterns were evaluated.

Further, as in the case of Synthesis Example I-1, the transparency and dry etch resistance were evaluated. The results obtained were summarized in Table 99 below together with the photo-acid generator employed. The values of etch rate were based on that of PMMA.

TABLE 99

| Example | Photo-acid generator | Light transmittance (1 μm) % | Etch rate (relative value) |
| --- | --- | --- | --- |
| I-521 | Triphenyl sulfonium triflate | 60 | 0.3 |
| I-522 | Diphenyl iodonium triflate | 59 | 0.3 |
| I-523 | NAT · 105 (Midori Kagaku Co., Ltd.) | 61 | 0.3 |
| I-524 | NAI · 105 (Midori Kagaku Co., Ltd.) | 60 | 0.3 |

As a result, it was found possible to form a line and space pattern of 0.15 μm in line width in any of examples.

Example I-525 to Example I-528

The preparation of chemically amplified resists as performed in (Example I-8) to (Example I-11) were repeated except that the copolymer of Synthesis Example I-2 was replaced by the copolymer obtained in Synthesis Example I-96. Using the resists, patterns were formed in the same manner as explained above, and the properties of these patterns were evaluated.

Further, as in the case of Synthesis Example I-1, the transparency and dry etch resistance were evaluated. The results obtained were summarized in Table 100 below together with the photo-acid generator employed. The values of etch rate were based on that of PMMA.

TABLE 100

| Example | Photo-acid generator | Light transmittance (1 μm) % | Etch rate (relative value) |
| --- | --- | --- | --- |
| I-525 | Triphenyl sulfonium triflate | 55 | 0.3 |
| I-526 | Diphenyl iodonium triflate | 59 | 0.3 |
| I-527 | NAT · 105 (Midori Kagaku Co., Ltd.) | 61 | 0.3 |
| I-528 | NAI · 105 (Midori Kagaku Co., Ltd.) | 60 | 0.3 |

As a result, it was found possible to form a line and space pattern of 0.15 μm in line width in any of examples.

(Synthesis Example I-97)

The synthesis described in the Synthesis Example I-53 was repeated excepting that citronellol was replaced by the same amount of hinokiol thereby obtaining hinokyl acrylate.

(Evaluation of homopolymer derived from the monomer obtained in Synthesis Example I-97)

Polyhinokyl acrylate was prepared in the same manner as in the Synthesis Example I-53 excepting the employment of hinokyl acrylate as a monomer in this example. This polyhinokyl acrylate was dissolved in cyclohexanone, and the resultant solution was coated on a quartz wafer to examine of its transparency to ArF excimer laser beam (193 nm). As a result, the light transmittance of the polyhinokyl acrylate was 45% as measured by converting the film thickness to 1 μm.

The film was further measured of its etch rate by using carbon tetrafluoride ($CF_4$) gas under the same conditions as explained above. As a result, the etch rate of polyhinokyl acrylate was found to be 0.3 when the etch rate of PMMA was assumed to be 1.

In the following Examples I-529 to I-531, copolymers containing hinokyl acrylate obtained in the above Synthesis Example I-97 were respectively synthesized to prepare photosensitive materials containing the copolymer which were then examined of their properties.

Example I-529

The preparation of copolymer performed in Example I-287 was repeated except that citronellyl acrylate was replaced by hinokyl acrylate obtained in the above Synthesis Example I-97 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As a result, it was found possible to form a negative line and space pattern of 0.5 μm in line width.

Example I-530

The preparation of copolymer performed in Example I-288 was repeated except that citronellyl acrylate was replaced by hinokyl acrylate obtained in the above Synthesis Example I-97 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As a result, it was found possible to form a negative line and space pattern of 0.5 μm in line width.

Example I-531

The preparation of copolymer performed in Example I-289 was repeated except that citronellyl acrylate was replaced by hinokyl acrylate obtained in the above Synthesis Example I-97 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As a result, it was found possible to form a positive line and space pattern of 0.5 μm in line width.
(Synthesis Example I-98)

A different kind of copolymer containing the monomer obtained in Synthesis Example I-97 was prepared, and the resultant copolymer was evaluated.

Namely, the preparation of copolymer performed in Synthesis Example I-54 was repeated except that citronellyl acrylate was replaced by hinokyl acrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-532 to I-539, chemically amplified resists containing the copolymer obtained in the above Synthesis Example I-98 were respectively synthesized and were examined of their properties.

Example I-532 to Example I-535

The preparation of chemically amplified resists as performed in (Example I-4) to (Example I-7) were repeated except that the copolymer of Synthesis Example I-2 was replaced by the copolymer obtained in Synthesis Example I-98. Using the resists, patterns were formed in the same manner as explained above, and the properties of these patterns were evaluated.

Further, as in the case of Synthesis Example I-1, the transparency and dry etch resistance were evaluated. The results obtained were summarized in Table 101 below together with the photo-acid generator employed. The values of etch rate were based on that of PMMA.

TABLE 101

| Example | Photo-acid generator | Light transmittance (1 μm) % | Etch rate (relative value) |
|---|---|---|---|
| I-532 | Triphenyl sulfonium triflate | 60 | 0.3 |
| I-533 | Diphenyl iodonium triflate | 59 | 0.3 |

TABLE 101-continued

| Example | Photo-acid generator | Light transmittance (1 μm) % | Etch rate (relative value) |
|---|---|---|---|
| I-534 | NAT · 105 (Midori Kagaku Co., Ltd.) | 61 | 0.3 |
| I-535 | NAI · 105 (Midori Kagaku Co., Ltd.) | 60 | 0.3 |

As a result, it was found possible to form a line and space pattern of 0.15 μm in line width in any of examples.

Example I-536 to Example I-539

The preparation of chemically amplified resists as performed in (Example I-8) to (Example I-11) were repeated except that the copolymer of Synthesis Example I-2 was replaced by the copolymer obtained in Synthesis Example I-98. Using the resists, patterns were formed in the same manner as explained above, and the properties of these patterns were evaluated.

Further, as in the case of Synthesis Example I-1, the transparency and dry etch resistance were evaluated. The results obtained were summarized in Table 102 below together with the photo-acid generator employed. The values of etch rate were based on that of PMMA.

TABLE 102

| Example | Photo-acid generator | Light transmittance (1 μm) % | Etch rate (relative value) |
|---|---|---|---|
| I-536 | Triphenyl sulfonium triflate | 55 | 0.3 |
| I-537 | Diphenyl iodonium triflate | 59 | 0.3 |
| I-538 | NAT · 105 (Midori Kagaku Co., Ltd.) | 61 | 0.3 |
| I-539 | NAI · 105 (Midori Kagaku Co., Ltd.) | 60 | 0.3 |

As a result, it was found possible to form a line and space pattern of 0.15 μm in line width in any of examples.
(Synthesis Example I-99)

The synthesis described in the Synthesis Example I-53 was repeated excepting that citronellol was replaced by the same amount of ferruginol thereby obtaining ferruginyl acrylate.
(Evaluation of homopolymer derived from the monomer obtained in Synthesis Example I-99)

Polyferruginyl acrylate was prepared in the same manner as in the Synthesis Example I-53 excepting the employment of ferruginyl acrylate as a monomer in this example. This polyferruginyl acrylate was dissolved in cyclohexanone, and the resultant solution was coated on a quartz wafer to examine of its transparency to ArF excimer laser beam (193 nm). As a result, the light transmittance of the polyferruginyl acrylate was 45% as measured by converting the film thickness to 1 μm.

The film was further measured of its etch rate by using carbon tetrafluoride ($CF_4$) gas under the same conditions as explained above. As a result, the etch rate of polyferruginyl acrylate was found to be 0.3 when the etch rate of PMMA was assumed to be 1.

In the following Examples I-540 to I-542, copolymers containing ferruginyl acrylate obtained in the above Synthesis Example I-99 were respectively synthesized to prepare photosensitive materials containing the copolymer which were then examined of their properties.

Example I-540

The preparation of copolymer performed in Example I-287 was repeated except that citronellyl acrylate was replaced by ferruginyl acrylate obtained in the above Synthesis Example I-99 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As a result, it was found possible to form a negative line and space pattern of 0.5 μm in line width.

Example I-541

The preparation of copolymer performed in Example I-288 was repeated except that citronellyl acrylate was replaced by ferruginyl acrylate obtained in the above Synthesis Example I-99 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As a result, it was found possible to form a negative line and space pattern of 0.5 μm in line width.

Example I-542

The preparation of copolymer performed in Example I-289 was repeated except that citronellyl acrylate was replaced by ferruginyl acrylate obtained in the above Synthesis Example I-99 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As a result, it was found possible to form a positive line and space pattern of 0.5 μm in line width.

(Synthesis Example I-100)

A different kind of copolymer containing the monomer obtained in Synthesis Example I-99 was prepared, and the resultant copolymer was evaluated.

Namely, the preparation of copolymer performed in Synthesis Example I-54 was repeated except that citronellyl acrylate was replaced by ferruginyl acrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-543 to I-550, chemically amplified resists containing the copolymer obtained in the above Synthesis Example I-100 were respectively synthesized and were examined of their properties.

Example I-543 to Example I-546

The preparation of chemically amplified resists as performed in (Example I-4) to (Example I-7) were repeated except that the copolymer of Synthesis Example I-2 was replaced by the copolymer obtained in Synthesis Example I-100. Using the resists, patterns were formed in the same manner as explained above, and the properties of these patterns were evaluated.

Further, as in the case of Synthesis Example I-1, the transparency and dry etch resistance were evaluated. The results obtained were summarized in Table 103 below together with the photo-acid generator employed. The values of etch rate were based on that of PMMA.

TABLE 103

| Example | Photo-acid generator | Light transmittance (1 μm) % | Etch rate (relative value) |
|---|---|---|---|
| I-543 | Triphenyl sulfonium triflate | 60 | 0.3 |
| I-544 | Diphenyl iodonium triflate | 59 | 0.3 |
| I-545 | NAT · 105 (Midori Kagaku Co., Ltd.) | 61 | 0.3 |
| I-546 | NAI · 105 (Midori Kagaku Co., Ltd.) | 60 | 0.3 |

As a result, it was found possible to form a line and space pattern of 0.15 μm in line width in any of examples.

Example I-547 to Example I-550

The preparation of chemically amplified resists as performed in (Example I-8) to (Example I-11) were repeated except that the copolymer of Synthesis Example I-2 was replaced by the copolymer obtained in Synthesis Example I-100. Using the resists, patterns were formed in the same manner as explained above, and the properties of these patterns were evaluated.

Further, as in the case of Synthesis Example I-1, the transparency and dry etch resistance were evaluated. The results obtained were summarized in Table 104 below together with the photo-acid generator employed. The values of etch rate were based on that of PMMA.

TABLE 104

| Example | Photo-acid generator | Light transmittance (1 μm) % | Etch rate (relative value) |
|---|---|---|---|
| I-547 | Triphenyl sulfonium triflate | 55 | 0.3 |

TABLE 104-continued

| Example | Photo-acid generator | Light transmittance (1 μm) % | Etch rate (relative value) |
|---|---|---|---|
| I-548 | Diphenyl iodonium triflate | 59 | 0.3 |
| I-549 | NAT · 105 (Midori Kagaku Co., Ltd.) | 61 | 0.3 |
| I-550 | NAI · 105 (Midori Kagaku Co., Ltd.) | 60 | 0.3 |

As a result, it was found possible to form a line and space pattern of 0.15 μm in line width in any of examples.

(Synthesis Example I-101)

The synthesis described in the Synthesis Example I-53 was repeated excepting that citronellol was replaced by the same amount of totarol thereby obtaining totaryl acrylate.

(Evaluation of homopolymer derived from the monomer obtained in Synthesis Example I-101)

Polytotaryl acrylate was prepared in the same manner as in the Synthesis Example I-53 excepting the employment of totaryl acrylate as a monomer in this example. This polytotaryl acrylate was dissolved in cyclohexanone, and the resultant solution was coated on a quartz wafer to examine of its transparency to ArF excimer laser beam (193 nm). As a result, the light transmittance of the polytotaryl acrylate was 45% as measured by converting the film thickness to 1 μm.

The film was further measured of its etch rate by using carbon tetrafluoride ($CF_4$) gas under the same conditions as explained above. As a result, the etch rate of polytotaryl acrylate was found to be 0.3 when the etch rate of PMMA was assumed to be 1.

In the following Examples I-551 to I-553, copolymers containing totaryl acrylate obtained in the above Synthesis Example I-101 were respectively synthesized to prepare photosensitive materials containing the copolymer which were then examined of their properties.

Example I-551

The preparation of copolymer performed in Example I-287 was repeated except that citronellyl acrylate was replaced by totaryl acrylate obtained in the above Synthesis Example I-101 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As a result, it was found possible to form a negative line and space pattern of 0.5 μm in line width.

Example I-552

The preparation of copolymer performed in Example I-288 was repeated except that citronellyl acrylate was replaced by totaryl acrylate obtained in the above Synthesis Example I-101 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As a result, it was found possible to form a negative line and space pattern of 0.5 μm in line width.

Example I-553

The preparation of copolymer performed in Example I-289 was repeated except that citronellyl acrylate was replaced by totaryl acrylate obtained in the above Synthesis Example I-101 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As a result, it was found possible to form a positive line and space pattern of 0.5 μm in line width.

(Synthesis Example I-102)

A different kind of copolymer containing the monomer obtained in Synthesis Example I-101 was prepared, and the resultant copolymer was evaluated.

Namely, the preparation of copolymer performed in Synthesis Example I-54 was repeated except that citronellyl acrylate was replaced by totaryl acrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-554 to I-561, chemically amplified resists containing the copolymer obtained in the above Synthesis Example I-102 were respectively synthesized and were examined of their properties.

Example I-554 to Example I-557

The preparation of chemically amplified resists as performed in (Example I-4) to (Example I-7) were repeated except that the copolymer of Synthesis Example I-2 was replaced by the copolymer obtained in Synthesis Example I-102. Using the resists, patterns were formed in the same manner as explained above, and the properties of these patterns were evaluated.

Further, as in the case of Synthesis Example I-1, the transparency and dry etch resistance were evaluated. The results obtained were summarized in Table 105 below together with the photo-acid generator employed. The values of etch rate were based on that of PMMA.

TABLE 105

| Example | Photo-acid generator | Light transmittance (1 μm) % | Etch rate (relative value) |
|---|---|---|---|
| I-554 | Triphenyl sulfonium triflate | 60 | 0.3 |

TABLE 105-continued

| Example | Photo-acid generator | Light transmittance (1 μm) % | Etch rate (relative value) |
|---|---|---|---|
| I-555 | Diphenyl iodonium triflate | 59 | 0.3 |
| I-556 | NAT · 105 (Midori Kagaku Co., Ltd.) | 61 | 0.3 |
| I-557 | NAI · 105 (Midori Kagaku Co., Ltd.) | 60 | 0.3 |

As a result, it was found possible to form a line and space pattern of 0.15 μm in line width in any of examples.

Example I-558 to Example I-561

The preparation of chemically amplified resists as performed in (Example I-8) to (Example I-11) were repeated except that the copolymer of Synthesis Example I-2 was replaced by the copolymer obtained in Synthesis Example I-102. Using the resists, patterns were formed in the same manner as explained above, and the properties of these patterns were evaluated.

Further, as in the case of Synthesis Example I-1, the transparency and dry etch resistance were evaluated. The results obtained were summarized in Table 106 below together with the photo-acid generator employed. The values of etch rate were based on that of PMMA.

TABLE 106

| Example | Photo-acid generator | Light transmittance (1 μm) % | Etch rate (relative value) |
|---|---|---|---|
| I-558 | Triphenyl sulfonium triflate | 55 | 0.3 |
| I-559 | Diphenyl iodonium triflate | 59 | 0.3 |
| I-560 | NAT · 105 (Midori Kagaku Co., Ltd.) | 61 | 0.3 |
| I-561 | NAI · 105 (Midori Kagaku Co., Ltd.) | 60 | 0.3 |

As a result, it was found possible to form a line and space pattern of 0.15 μm in line width in any of examples.
(Synthesis Example I-103)

The synthesis described in the Synthesis Example I-53 was repeated excepting that citronellol was replaced by the same amount of sugiol thereby obtaining sugyl acrylate.
(Evaluation of homopolymer derived from the monomer obtained in Synthesis Example I-103)

Polysugyl acrylate was prepared in the same manner as in the Synthesis Example I-53 excepting the employment of sugyl acrylate as a monomer in this example. This polysugyl acrylate was dissolved in cyclohexanone, and the resultant solution was coated on a quartz wafer to examine of its transparency to ArF excimer laser beam (193 nm). As a result, the light transmittance of the polysugyl acrylate was 45% as measured by converting the film thickness to 1 μm.

The film was further measured of its etch rate by using carbon tetrafluoride ($CF_4$) gas under the same conditions as explained above. As a result, the etch rate of polysugyl acrylate was found to be 0.3 when the etch rate of PMMA was assumed to be 1.

In the following Examples I-562 to I-564, copolymers containing sugyl acrylate obtained in the above Synthesis Example I-103 were respectively synthesized to prepare photosensitive materials containing the copolymer which were then examined of their properties.

Example I-562

The preparation of copolymer performed in Example I-287 was repeated except that citronellyl acrylate was replaced by sugyl acrylate obtained in the above Synthesis Example I-103 thereby obtaining a copolymer.

The copolymer thus obtained was formed into a solution in the same manner as in Example I-287, which was then coated on a silicon wafer, and the processes of pre-bake, exposure and development were performed under the same conditions as in Example I-287, thereby forming patterns whose properties were subsequently evaluated.

As a result, it was found possible to form a negative line and space pattern of 0.5 μm in line width.

Example I-563

The preparation of copolymer performed in Example I-288 was repeated except that citronellyl acrylate was replaced by sugyl acrylate obtained in the above Synthesis Example I-103 thereby obtaining a copolymer.

The copolymer thus obtained was formed into a solution in the same manner as in Example I-288, which was then coated on a silicon wafer, and the processes of pre-bake, exposure and development were performed under the same conditions as in Example I-288, thereby forming patterns whose properties were subsequently evaluated.

As a result, it was found possible to form a negative line and space pattern of 0.5 μm in line width.

Example I-564

The preparation of copolymer performed in Example I-289 was repeated except that citronellyl acrylate was replaced by sugyl acrylate obtained in the above Synthesis Example I-103 thereby obtaining a copolymer.

The copolymer thus obtained was formed into a solution in the same manner as in Example I-289, which was then coated on a silicon wafer, and the processes of pre-bake, exposure and development were performed under the same conditions as in Example I-289, thereby forming patterns whose properties were subsequently evaluated.

As a result, it was found possible to form a positive line and space pattern of 0.5 μm in line width.
(Synthesis Example I-104)

A different kind of copolymer containing the monomer obtained in Synthesis Example I-103 was prepared, and the resultant copolymer was evaluated.

Namely, the preparation of copolymer performed in Synthesis Example I-54 was repeated except that citronellyl acrylate was replaced by sugyl acrylate thereby obtaining a copolymer, which was then dissolved in cyclohexanone. The film 1 μm thick formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example I-54, finding that the etch rate of this copolymer was found to be 0.3 when the etch rate of PMMA was assumed to be 1, thus indicating the superiority of the copolymer over that of PMMA.

In the following Examples I-565 to I-572, chemically amplified resists containing the copolymer obtained in the above Synthesis Example I-104 were respectively synthesized and were examined of their properties.

Example I-565 to Example I-568

The preparation of chemically amplified resists as performed in (Example I-4) to (Example I-7) were repeated except that the copolymer of Synthesis Example I-2 was replaced by the copolymer obtained in Synthesis Example I-104. Using the resists, patterns were formed in the same manner as explained above, and the properties of these patterns were evaluated.

Further, as in the case of Synthesis Example I-1, the transparency and dry etch resistance were evaluated. The results obtained were summarized in Table 107 below together with the photo-acid generator employed. The values of etch rate were based on that of PMMA.

TABLE 107

| Example | Photo-acid generator | Light transmittance (1 µm) % | Etch rate (relative value) |
|---|---|---|---|
| I-565 | Triphenyl sulfonium triflate | 60 | 0.3 |
| I-566 | Diphenyl iodonium triflate | 59 | 0.3 |
| I-567 | NAT · 105 (Midori Kagaku Co., Ltd.) | 61 | 0.3 |
| I-568 | NAI · 105 (Midori Kagaku Co., Ltd.) | 60 | 0.3 |

As a result, it was found possible to form a line and space pattern of 0.15 µm in line width in any of examples.

Example I-569 to Example I-572

The preparation of chemically amplified resists as performed in (Example I-8) to (Example I-11) were repeated except that the copolymer of Synthesis Example I-2 was replaced by the copolymer obtained in Synthesis Example I-104. Using the resists, patterns were formed in the same manner as explained above, and the properties of these patterns were evaluated.

Further, as in the case of Synthesis Example I-1, the transparency and dry etch resistance were evaluated. The results obtained were summarized in Table 108 below together with the photo-acid generator employed. The values of etch rate were based on that of PMMA.

TABLE 108

| Example | Photo-acid generator | Light transmittance (1 µm) % | Etch rate (relative value) |
|---|---|---|---|
| I-569 | Triphenyl sulfonium triflate | 55 | 0.3 |
| I-570 | Diphenyl iodonium triflate | 59 | 0.3 |
| I-571 | NAT · 105 (Midori Kagaku Co., Ltd.) | 61 | 0.3 |
| I-572 | NAI · 105 (Midori Kagaku Co., Ltd.) | 60 | 0.3 |

As a result, it was found possible to form a line and space pattern of 0.15 µm in line width in any of examples.

(Synthesis Example I-105)

3,3-bis-4'-t-butoxycarbonyl naphthalenyl-1(3H)-isobenzofuranone employed a solubility-inhibitor in the above examples was synthesized as follows. Namely, 5.4 g of 3,3-bis-4'-hydroxynaphthalenyl-1(3H)-isobenzofuranone was dissolved in 300 mL of acetonirile, and 0.3 mg of 4'-dimethylamino pyridine was added to this solution. To this solution, 68 g of di-t-butyl pyrocarbonate dissolved in 20 mL of acetonitrile was added dropwise, and heated for one hour at room temperature. Subsequently, the solution was extracted with ethyl acetate and washed with an aqueous solution of citric acid, salt saturated sodium bicarbonate solution and salt saturated brine. Finally, after being dried over sodium sulfate anhydous, the product was recrystallized.

Example II

In each of these examples, a base resin component containing a compound having a menthyl or menthyl derivative group as a skeleton was synthesized to prepare a photosensitive material, and the resultant photosensitive material was evaluated. In particular, the kind of the compound and the ratio of copolymer components were varied so as to prepare various kinds of base resin.

(Synthesis Example II-1)

24 g of methacrylic acid, 31 g of menthol and 15 g of p-toluenesulfonic acid dissolved in 500 mL of toluene were heated under reflux at an oil temperature of 150° C. for 19 h. Subsequently, the reaction of the mixed solution was quenched by the addition of salt saturated sodium hydrocarbonate solution. The mixture was extracted with ether, the organic layers were combined and washed with salt saturated sodium bicarbonate solution and then with an aqueous solution of sodium hydroxide, salt saturated ammonium chloride solution, and then dried over salt saturated brine and sodium sulfate anhydous. Finally, the resultant oily product was evaporated under reduced pressure to obtain menthyl methacrylate.

(Evaluation of homopolymer derived from the monomer obtained in Synthesis Example II-1)

2.1 g of menthyl methacrylate and 0.4 g of azoisobutylonitrile as a polymerization initiator were dissolved in 6 mL of toluene.

The resultant solution was frozen with liquid nitrogen, and warmed to room temperature after repeating a 20 minute degassing of it three times. Then, the solution was heated in a nitrogen stream at oil temperature of 70° C. for 16 hours. Then, the reaction was quenched by the addition of 600 mL of methanol. After being reprecipitated with methanol, the product was filtered and evaporated under vacuum thereby obtaining polymenthyl methacrylate.

This polymenthyl methacrylate was dissolved in cyclohexanone, and the resultant solution was coated on a quartz wafer to a film thickness of 1 µm. The resultant film was examined of its transparency to ArF excimer laser beam (193 nm).

The film was further measured of its etch rate by using carbon tetrafluoride ($CF_4$) gas. The evaluation of dry etch resistance was performed under the following conditions. Namely, the flow rate of $CF_4$ was adjusted to 12.6 sccm, vacuum degree to 10 mTorr and the output of microwave to 150 W.

Novolac resin and polymethacrylate were employed in place of polymenthyl methacrylate and dissolved respectively into cyclohexanone to prepare Comparative Example (II-1) and Comparative Example (II-2).

These solutions of Comparative Example (II-1) and Comparative Example (II-2) were coated in the same manner as explained above on quartz wafer to examine the transparency of them to ArF excimer laser beam. Further, the etch rate of them using carbon tetrafluoride gas was also measured under the same conditions as mentioned above. The results were summarized in Table 109 shown below.

The etch rate of polymethacrylate was found to be 0.3 when the etch rate of PMMA was assumed to be 1.

TABLE 109

|  | Light transmittance (1 μm) | Etch resistance (relative value) |
| --- | --- | --- |
| This invention | 43% | 0.9 |
| Comparative example (II-1) | $10^{-28}$% | 3.9 |
| Comparative example (II-2) | 70% | 1 |

As clearly seen from Table 109, a polymer possessing terpenoid skeleton has high in transparency to the ArF excimer laser beam of 193 nm and excellent dry etch resistance. Whereas, novolac resin is very low in transparency to the ArF excimer laser beam of 193 nm and PMMA is poor in dry etch resistance.

In the following Examples II-1 to II-3, copolymers containing polymenthyl methacrylate obtained in the above Synthesis Example II-1 were respectively synthesized to prepare photosensitive materials containing the copolymer which were then examined of their properties.

Example II-1

9 g of menthyl methacrylate and 1 g of glycidyl methacrylate and 0.5 g of azoisobutylonitrile as a polymerization initiator were dissolved in 30 mL of toluene.

The resultant solution was frozen with liquid nitrogen, and warmed to room temperature after repeating a 20 minute degassing of it three times. Then, the solution was heated in a nitrogen stream at oil temperature of 70° C. for 16 h. Then, the reaction was quenched by the addition of methanol. After being reprecipitated with methanol, the product was filtered and evaporated under vacuum thereby obtaining an aimed copolymer.

1 g of the copolymer thus obtained was dissolved in 9 mL of methyl 3-methoxypropionate and the resultant solution was coated on a silicon wafer to a thickness of 1 μm which was subsequently pre-baked at 100° C. Then, the coated film was exposed to an electron beam (exposure dosage: 10 $\mu Ccm^{-2}$, 20 keV), and then, developed in methyl ethyl ketone to form a pattern to which evaluation was made.

As a result, it was found possible to form a negative line and space pattern of 0.5 μm in line width.

Example II-2

9 g of menthyl methacrylate, 1 g of allyl methacrylate and 0.5 g of azoisobutylonitrile as a polymerization initiator were dissolved in 30 mL of toluene.

The resultant solution was frozen with liquid nitrogen, and warmed to room temperature after repeating a 20 minute degassing of it five times. Then, the solution was heated in a nitrogen stream at oil temperature of 70° C. for 16 hours. Then, the reaction was quenched by the addition of methanol. After being reprecipitated with methanol, the product was filtered and evaporated under vacuum thereby obtaining an aimed copolymer.

The copolymer thus obtained was made into a solution in the same manner as explained in Example II-1, the resultant solution being coated on a silicon wafer, baked, exposed to an electron beam and then developed under the same conditions as explained in Example II-1 to form a pattern to which evaluation was made.

As result, it was found possible to form a negative line and space pattern of 0.5 μm in line width.

Example II-3

5 g of menthyl methacrylate, 5 g of α-chlorofluoroethyl acrylate and 0.5 g of azoisobutylonitrile as a polymerization initiator were dissolved in 28 mL of tetrahdrofuran (hereinafter referred to as THF).

The resultant solution was frozen with liquid nitrogen, and warmed to room temperature after repeating a 20 minute degassing of it five times. Then, the solution was heated in a nitrogen stream at oil temperature of 60° C. for 16 hours. Then, the reaction was quenched by the addition of hexane. After being reprecipitated with hexane, the product was filtered and evaporated under vacuum thereby obtaining an aimed copolymer.

The copolymer thus obtained was made into a solution in the same manner as explained in Example II-1, the resultant solution being coated on a silicon wafer, baked, exposed to an electron beam under the same conditions as explained in Example II-1 and then developed using methylisobutylketone to form a pattern to which evaluation was made.

As result, it was found possible to form a positive line and space pattern of 0.5 μm in line width.

(Synthesis Example II-2)

A different kind of copolymer containing the monomer obtained in Synthesis Example II-1 was prepared, and the resultant copolymer was evaluated.

Menthyl methacrylate, t-butyl methacrylate and methacrylic acid were mixed in the ratio of 50:30:20 to prepare 10 g of a mixture which was dissolved together with azoisobutylonitrile in 40 mL of THF.

The resultant solution was frozen with liquid nitrogen, and warmed to room temperature after repeating a 20 minute degassing of it five times. Then, the solution was heated in a nitrogen stream at oil temperature of 60° C. for 9 hours. Then, the reaction was quenched by the addition of hexane. After being reprecipitated with hexane, the product was filtered and evaporated under vacuum thereby obtaining an aimed copolymer.

This copolymer was dissolved in cyclohexanone, and the resultant solution was coated on a quartz wafer to a film thickness of 1 μm. The resultant film was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA, finding that the etch rate of this copolymer was found to be 0.3 when the etch rate of PMMA was assumed to be 1, thus indicating the superiority of the copolymer over that of PMMA.

The evaluation of dry etch resistance was performed under the following conditions. Namely, the flow rate of $CF_4$ was adjusted to 12.6 sccm, vacuum degree to 10 mTorr and the output of microwave to 150 W.

In the following Examples II-4 to II-11, chemically amplified resists containing the copolymer obtained in the above Synthesis Example II-2 were respectively synthesized and were then examined of their properties.

Example II-4

2 g of the copolymer obtained in Example II-2 and 0.04 g of triphenylsulfonium triflate as a photo-acid generator were dissolved in 8 mL of 2-ethoxyethyl acetate.

The solution of copolymer thus obtained was coated on a silicon wafer to a film thickness of 0.8 μm and then prebaked at 100° C. After being exposed to ArF excimer laser beam (40 mJcm$^{-2}$), the film was developed in an aqueous solution of tetramethylammonium hydroxide to form a pattern to which evaluation was made. As result, it was found possible to form a line and space pattern of 0.15 μm in line width.

Further, the transparency and dry etch resistance of the coated film were evaluated in the same manner as in Synthesis Example II-1, finding the light transmittance of 60% and the etch rate of 0.3, indicating superiority of this resist over PMMA.

Example II-5 to Example II-7

Using photo-acid generator shown in Table 110, chemically amplified resists were prepared as described in Example II-4. These solutions were respectively coated on a silicon wafer in the same manner as in Example II-4, and the processes of pre-bake, exposure and development were performed under the same conditions as in Example II-4, thereby forming patterns whose properties were subsequently evaluated. In each of these examples, the amount of the photo-acid generator was 0.05 g.

Further, the transparency and dry etch resistance of the coated films were evaluated in the same manner as in Synthesis Example II-1. The results are shown in Table 110 below. The etch rates in these examples were shown based on that of PMMA.

TABLE 110

| Example | Photo-acid generator | Light transmittance (1 μm) % | Etch rate (relative value) |
|---|---|---|---|
| II-5 | Diphenyl iodonium triflate | 59 | 0.3 |
| II-6 | NAT · 105 (Midori Kagaku Co., Ltd.) | 61 | 0.3 |
| II-7 | NAI · 105 (Midori Kagaku Co., Ltd.) | 60 | 0.3 |

As result, it was found possible to form a line and space pattern of 0.5 μm in line width in any of these examples.

Example II-8

2 g of the copolymer obtained in Example II-2, 0.04 g of triphenylsulfonium triflate as a photo-acid generator and 0.1 g of 3,3-bis-4'-t-butoxycarbonyloxy naphthalenyl-1(3H)-isobenzofuranone were dissolved in 8 mL of 2-ethoxyethyl acetate.

The copolymer solution thus obtained was coated on a silicon wafer to a film thickness of 0.8 μm and then pre-baked at 100° C. After being exposed to ArF excimer laser beam (40 mJcm$^{-2}$), the film was developed in an aqueous solution of tetramethylammonium hydroxide to form a pattern to which evaluation was made. As result, it was found possible to form a line and space pattern of 0.15 μm in line width.

Further, the transparency and dry etch resistance of the coated film were evaluated in the same manner as in Synthesis Example II-1, finding the light transmittance of 55% and the etch rate of 0.3, indicating superiority of this resist over PMMA.

Example II-9 to Example II-11

Using photo-acid generator shown in Table 111, chemically amplified resists were prepared as described in Example II-8. These solutions were respectively coated on a silicon wafer in the same manner as in Example II-8, and the processes of pre-bake, exposure and development were performed under the same conditions as in Example II-8, thereby forming patterns whose properties were subsequently evaluated. In each of these examples, the amount of the photo-acid generator was 0.05 g.

Further, the transparency and dry etch resistance of the coated films were evaluated in the same manner as in Synthesis Example II-1. The results are shown in Table 111 below. The etch rates in these examples were shown based on that of PMMA.

TABLE 111

| Example | Photo-acid generator | Light transmittance (1 μm) % | Etch rate (relative value) |
|---|---|---|---|
| II-9 | Diphenyl iodonium triflate | 59 | 0.3 |
| II-10 | NAT · 105 (Midori Kagaku Co., Ltd.) | 61 | 0.3 |
| II-11 | NAI · 105 (Midori Kagaku Co., Ltd.) | 60 | 0.3 |

As result, it was found possible to form a line and space pattern of 0.15 μm in line width in any of these examples.

In these examples, menthyl methacrylate (the monomer represented by the general formula (2)), t-butyl methacrylate (a functional group to be decomposed by an acid) and methacrylate (an alkali-soluble group) may be mixed together in any ratio as long as the amount of these components fall within the shaded region in FIGURE.

(Synthesis Example II-3)

The preparation of copolymer performed in Synthesis Example II-2 was repeated except that the ratio of menthyl methacrylate, t-butyl methacrylate and methacrylic acid was changed to 50:25:25 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-12 to II-19, chemically amplified resists containing the copolymer obtained in the above Synthesis Example II-3 were respectively synthesized and were examined of their properties.

Example II-12 to Example II-15

The preparation of chemically amplified resists as performed in (Example II-4) to (Example II-7) were repeated except that the copolymer of Synthesis Example II-2 was replaced by the copolymer obtained in Synthesis Example II-3. Using the resists, patterns were formed in the same manner as explained above, and the properties of these patterns were evaluated.

Further, as in the case of Synthesis Example II-1, the transparency and dry etch resistance were evaluated. The results obtained were summarized in Table 112 below together with the photo-acid generator employed. The values of etch rate were based on that of PMMA.

TABLE 112

| Example | Photo-acid generator | Light transmittance (1 μm) % | Etch rate (relative value) |
|---|---|---|---|
| II-12 | Triphenyl sulfonium triflate | 60 | 0.3 |
| II-13 | Diphenyl iodonium triflate | 59 | 0.3 |
| II-14 | NAT · 105 (Midori Kagaku Co., Ltd.) | 61 | 0.3 |
| II-15 | NAI · 105 (Midori Kagaku Co., Ltd.) | 60 | 0.3 |

As a result, it was found possible to form a line and space pattern of 0.15 μm in line width in any of examples.

Example II-16 to Example II-19

The preparation of chemically amplified resists as performed in (Example II-8) to (Example II-11) were repeated except that the copolymer of Synthesis Example II-2 was replaced by the copolymer obtained in Synthesis Example II-3 and that 3,3-bis-4'-t-butoxycarbonyloxy naphtalenyl-1-(3H)-isobenzofuranone was replaced by 3,3-bis-3'-t-butoxycarbonyloxy-naphtalenyl-1-(3H)-isobenzofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 113 below together with the photo-acid generator employed. The values of etch rate were based on that of PMMA.

TABLE 113

| Example | Photo-acid generator | Light transmittance (1 μm) % | Etch rate (relative value) |
|---|---|---|---|
| II-16 | Triphenyl sulfonium triflate | 55 | 0.3 |
| II-17 | Diphenyl iodonium triflate | 59 | 0.3 |
| II-18 | NAT · 105 (Midori Kagaku Co., Ltd.) | 61 | 0.3 |
| II-19 | NAI · 105 (Midori Kagaku Co., Ltd.) | 60 | 0.3 |

As a result, it was found possible to form a line and space pattern of 0.15 μm in line width in any of examples.

(Synthesis Example II-4)

The preparation of copolymer performed in Synthesis Example II-2 was repeated except that the ratio of menthyl methacrylate, t-butyl methacrylate and methacrylic acid was changed to 50:20:30 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-20 to II-27, chemically amplified resists containing the copolymer obtained in the above Synthesis Example II-4 were respectively synthesized and were examined of their properties.

Example II-20 to Example II-23

The preparation of chemically amplified resists as performed in (Example II-4) to (Example II-7) were repeated except that the copolymer of Synthesis Example II-2 was replaced by the copolymer obtained in Synthesis Example II-4. Using the resists, patterns were formed in the same manner as explained above, and the properties of these patterns were evaluated.

Further, as in the case of Synthesis Example II-1, the transparency and dry etch resistance were evaluated. The results obtained were summarized in Table 114 below together with the photo-acid generator employed. The values of etch rate were based on that of PMMA.

TABLE 114

| Example | Photo-acid generator | Light transmittance (1 μm) % | Etch rate (relative value) |
|---|---|---|---|
| II-20 | Triphenyl sulfonium triflate | 60 | 0.3 |
| II-21 | Diphenyl iodonium triflate | 59 | 0.3 |
| II-22 | NAT · 105 (Midori Kagaku Co., Ltd.) | 61 | 0.3 |
| II-23 | NAI · 105 (Midori Kagaku Co., Ltd.) | 60 | 0.3 |

As a result, it was found possible to form a line and space pattern of 0.15 μm in line width in any of examples.

Example II-24 to Example II-27

The preparation of chemically amplified resists as performed in (Example II-8) to (Example II-11) were repeated except that the copolymer of Synthesis Example II-2 was replaced by the copolymer obtained in Synthesis Example II-4 and that 3,3-bis-4'-t-butoxycarbonyloxy naphtalenyl-1-(3H)-isobenzofuranone was replaced by 3,3-bis-2'-t-butoxycarbonyloxy-naphtalenyl-1-(3H)-isobenzofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 115 below together with the photo-acid generator employed. The values of etch rate were based on that of PMMA.

TABLE 115

| Example | Photo-acid generator | Light transmittance (1 μm) % | Etch rate (relative value) |
|---|---|---|---|
| II-24 | Triphenyl sulfonium triflate | 55 | 0.3 |
| II-25 | Diphenyl iodonium triflate | 59 | 0.3 |
| II-26 | NAT · 105 (Midori Kagaku Co., Ltd.) | 61 | 0.3 |
| II-27 | NAI · 105 (Midori Kagaku Co., Ltd.) | 60 | 0.3 |

As a result, it was found possible to form a line and space pattern of 0.15 μm in line width in any of examples.

(Synthesis Example II-5)

The preparation of copolymer performed in Synthesis Example II-2 was repeated except that the ratio of menthyl methacrylate, t-butyl methacrylate and methacrylic acid was changed to 45:35:20 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-28 to II-35, chemically amplified resists containing the copolymer obtained in the above Synthesis Example II-5 were respectively synthesized and were examined of their properties.

Example II-28 to Example II-31

The preparation of chemically amplified resists as performed in (Example II-4) to (Example II-7) were repeated except that the copolymer of Synthesis Example II-2 was replaced by the copolymer obtained in Synthesis Example II-5. Using the resists, patterns were formed in the same manner as explained above, and the properties of these patterns were evaluated.

Further, as in the case of Synthesis Example II-1, the transparency and dry etch resistance were evaluated. The results obtained were summarized in Table 116 below together with the photo-acid generator employed. The values of etch rate were based on that of PMMA.

TABLE 116

| Example | Photo-acid generator | Light transmittance (1 μm) % | Etch rate (relative value) |
|---|---|---|---|
| II-28 | Triphenyl sulfonium triflate | 60 | 0.3 |
| II-29 | Diphenyl iodonium triflate | 59 | 0.3 |
| II-30 | NAT · 105 (Midori Kagaku Co., Ltd.) | 61 | 0.3 |
| II-31 | NAI · 105 (Midori Kagaku Co., Ltd.) | 60 | 0.3 |

As a result, it was found possible to form a line and space pattern of 0.15 μm in line width in any of examples.

Example II-32 to Example II-35

The preparation of chemically amplified resists as performed in (Example II-8) to (Example II-11) were repeated except that the copolymer of Synthesis Example II-2 was replaced by the copolymer obtained in Synthesis Example II-5 and that 3,3-bis-4'-t-butoxycarbonyloxy naphtalenyl-1-(3H)-isobenzofuranone was replaced by 3,3-bis-5'-t-butoxycarbonyloxy-naphtalenyl-1-(3H)-isobenzofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 117 below together with the photo-acid generator employed. The values of etch rate were based on that of PMMA.

TABLE 117

| Example | Photo-acid generator | Light transmittance (1 μm) % | Etch rate (relative value) |
|---|---|---|---|
| II-32 | Triphenyl sulfonium triflate | 55 | 0.3 |
| II-33 | Diphenyl iodonium triflate | 59 | 0.3 |
| II-34 | NAT · 105 (Midori Kagaku Co., Ltd.) | 61 | 0.3 |
| II-35 | NAI · 105 (Midori Kagaku Co., Ltd.) | 60 | 0.3 |

As a result, it was found possible to form a line and space pattern of 0.15 μm in line width in any of examples.

(Synthesis Example II-6)

The preparation of copolymer performed in Synthesis Example II-2 was repeated except that the ratio of menthyl methacrylate, t-butyl methacrylate and methacrylic acid was changed to 45:30:25 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-36 to II-43, chemically amplified resists containing the copolymer obtained in the above Synthesis Example II-6 were respectively synthesized and were examined of their properties.

Example II-36 to Example II-39

The preparation of chemically amplified resists as performed in (Example II-4) to (Example II-7) were repeated except that the copolymer of Synthesis Example II-2 was replaced by the copolymer obtained in Synthesis Example II-6. Using the resists, patterns were formed in the same manner as explained above, and the properties of these patterns were evaluated.

Further, as in the case of Synthesis Example II-1, the transparency and dry etch resistance were evaluated. The results obtained were summarized in Table 118 below together with the photo-acid generator employed. The values of etch rate were based on that of PMMA.

TABLE 118

| Example | Photo-acid generator | Light transmittance (1 μm) % | Etch rate (relative value) |
|---|---|---|---|
| II-36 | Triphenyl sulfonium triflate | 60 | 0.3 |
| II-37 | Diphenyl iodonium triflate | 59 | 0.3 |
| II-38 | NAT · 105 (Midori Kagaku Co., Ltd.) | 61 | 0.3 |
| II-39 | NAI · 105 (Midori Kagaku Co., Ltd.) | 60 | 0.3 |

As a result, it was found possible to form a line and space pattern of 0.15 μm in line width in any of examples.

Example II-40 to Example II-43

The preparation of chemically amplified resists as performed in (Example II-8) to (Example II-11) were repeated except that the copolymer of Synthesis Example II-2 was replaced by the copolymer obtained in Synthesis Example II-6 and that 3,3-bis-4'-t-butoxycarbonyloxy naphtalenyl-1-(3H)-isobenzofuranone was replaced by 3,3-bis-6'-t-butoxycarbonyloxy-naphtalenyl-1-(3H)-isobenzofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 119 below together with the photo-acid generator employed. The values of etch rate were based on that of PMMA.

TABLE 119

| Example | Photo-acid generator | Light transmittance (1 μm) % | Etch rate (relative value) |
|---|---|---|---|
| II-40 | Triphenyl sulfonium triflate | 55 | 0.3 |
| II-41 | Diphenyl iodonium triflate | 59 | 0.3 |
| II-42 | NAT · 105 (Midori Kagaku Co., Ltd.) | 61 | 0.3 |
| II-43 | NAI · 105 (Midori Kagaku Co., Ltd.) | 60 | 0.3 |

As a result, it was found possible to form a line and space pattern of 0.15 μm in line width in any of examples.

(Synthesis Example II-7)

The preparation of copolymer performed in Synthesis Example II-2 was repeated except that the ratio of menthyl methacrylate, t-butyl methacrylate and methacrylic acid was changed to 45:25:30 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-44 to II-51, chemically amplified resists containing the copolymer obtained in the above Synthesis Example II-7 were respectively synthesized and were examined of their properties.

Example II-44 to Example II-47

The preparation of chemically amplified resists as performed in (Example II-4) to (Example II-7) were repeated except that the copolymer of Synthesis Example II-2 was replaced by the copolymer obtained in Synthesis Example II-7. Using the resists, patterns were formed in the same manner as explained above, and the properties of these patterns were evaluated.

Further, as in the case of Synthesis Example II-1, the transparency and dry etch resistance were evaluated. The results obtained were summarized in Table 120 below together with the photo-acid generator employed. The values of etch rate were based on that of PMMA.

TABLE 120

| Example | Photo-acid generator | Light transmittance (1 μm) % | Etch rate (relative value) |
|---|---|---|---|
| II-44 | Triphenyl sulfonium triflate | 60 | 0.3 |
| II-45 | Diphenyl iodonium triflate | 59 | 0.3 |

TABLE 120-continued

| Example | Photo-acid generator | Light transmittance (1 μm) % | Etch rate (relative value) |
|---|---|---|---|
| II-46 | NAT · 105 (Midori Kagaku Co., Ltd.) | 61 | 0.3 |
| II-47 | NAI · 105 (Midori Kagaku Co., Ltd.) | 60 | 0.3 |

As a result, it was found possible to form a line and space pattern of 0.15 μm in line width in any of examples.

Example II-48 to Example II-51

The preparation of chemically amplified resists as performed in (Example II-8) to (Example II-11) were repeated except that the copolymer of Synthesis Example II-2 was replaced by the copolymer obtained in Synthesis Example II-7 and that 3,3-bis-4'-t-butoxycarbonyloxy naphtalenyl-1-(3H)-isobenzofuranone was replaced by 3,3-bis-7'-t-butoxycarbonyloxy-naphtalenyl-1-(3H)-isobenzofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 121 below together with the photo-acid generator employed. The values of etch rate were based on that of PMMA.

TABLE 121

| Example | Photo-acid generator | Light transmittance (1 μm) % | Etch rate (relative value) |
|---|---|---|---|
| II-48 | Triphenyl sulfonium triflate | 55 | 0.3 |
| II-49 | Diphenyl iodonium triflate | 59 | 0.3 |
| II-50 | NAT · 105 (Midori Kagaku Co., Ltd.) | 61 | 0.3 |
| II-51 | NAI · 105 (Midori Kagaku Co., Ltd.) | 60 | 0.3 |

As a result, it was found possible to form a line and space pattern of 0.15 μm in line width in any of examples.

(Synthesis Example II-8)

The preparation of copolymer performed in Synthesis Example II-2 was repeated except that the ratio of menthyl methacrylate, t-butyl methacrylate and methacrylic acid was changed to 45:20:35 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-52 to II-59, chemically amplified resists containing the copolymer obtained in the above Synthesis Example II-8 were respectively synthesized and were examined of their properties.

Example II-52 to Example II-55

The preparation of chemically amplified resists as performed in (Example II-4) to (Example II-7) were repeated except that the copolymer of Synthesis Example II-2 was replaced by the copolymer obtained in Synthesis Example II-8. Using the resists, patterns were formed in the same manner as explained above, and the properties of these patterns were evaluated.

Further, as in the case of Synthesis Example II-1, the transparency and dry etch resistance were evaluated. The results obtained were summarized in Table 122 below together with the photo-acid generator employed. The values of etch rate were based on that of PMMA.

TABLE 122

| Example | Photo-acid generator | Light transmittance (1 μm) % | Etch rate (relative value) |
|---|---|---|---|
| II-52 | Triphenyl sulfonium triflate | 60 | 0.3 |
| II-53 | Diphenyl iodonium triflate | 59 | 0.3 |
| II-54 | NAT · 105 (Midori Kagaku Co., Ltd.) | 61 | 0.3 |
| II-55 | NAI · 105 (Midori Kagaku Co., Ltd.) | 60 | 0.3 |

As a result, it was found possible to form a line and space pattern of 0.15 μm in line width in any of examples.

Example II-56 to Example II-59

The preparation of chemically amplified resists as performed in (Example II-8) to (Example II-11) were repeated except that the copolymer of Synthesis Example II-2 was replaced by the copolymer obtained in Synthesis Example II-8 and that 3,3-bis-4'-t-butoxycarbonyloxy naphtalenyl-1-(3H)-isobenzofuranone was replaced by 3,3-bis-8'-t-butoxycarbonyloxy-naphtalenyl-1-(3H)-isobenzofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 123 below together with the photo-acid generator employed. The values of etch rate were based on that of PMMA.

TABLE 123

| Example | Photo-acid generator | Light transmittance (1 μm) % | Etch rate (relative value) |
|---|---|---|---|
| II-56 | Triphenyl sulfonium triflate | 55 | 0.3 |
| II-57 | Diphenyl iodonium triflate | 59 | 0.3 |

TABLE 123-continued

| Example | Photo-acid generator | Light transmittance (1 μm) % | Etch rate (relative value) |
|---|---|---|---|
| II-58 | NAT · 105 (Midori Kagaku Co., Ltd.) | 61 | 0.3 |
| II-59 | NAI · 105 (Midori Kagaku Co., Ltd.) | 60 | 0.3 |

As a result, it was found possible to form a line and space pattern of 0.15 μm in line width in any of examples.

(Synthesis Example II-9)

The preparation of copolymer performed in Synthesis Example II-2 was repeated except that the ratio of menthyl methacrylate, t-butyl methacrylate and methacrylic acid was changed to 40:40:20 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-60 to II-67, chemically amplified resists containing the copolymer obtained in the above Synthesis Example II-9 were respectively synthesized and were examined of their properties.

Example II-60 to Example II-63

The preparation of chemically amplified resists as performed in (Example II-4) to (Example II-7) were repeated except that the copolymer of Synthesis Example II-2 was replaced by the copolymer obtained in Synthesis Example II-9. Using the resists, patterns were formed in the same manner as explained above, and the properties of these patterns were evaluated.

Further, as in the case of Synthesis Example II-1, the transparency and dry etch resistance were evaluated. The results obtained were summarized in Table 124 below together with the photo-acid generator employed. The values of etch rate were based on that of PMMA.

TABLE 124

| Example | Photo-acid generator | Light transmittance (1 μm) % | Etch rate (relative value) |
|---|---|---|---|
| II-60 | Triphenyl sulfonium triflate | 60 | 0.3 |
| II-61 | Diphenyl iodonium triflate | 59 | 0.3 |
| II-62 | NAT · 105 (Midori Kagaku Co., Ltd.) | 61 | 0.3 |
| II-63 | NAI · 105 (Midori Kagaku Co., Ltd.) | 60 | 0.3 |

As a result, it was found possible to form a line and space pattern of 0.15 μm in line width in any of examples.

Example II-64 to Example II-67

The preparation of chemically amplified resists as performed in (Example II-8) to (Example II-11) were repeated except that the copolymer of Synthesis Example II-2 was replaced by the copolymer obtained in Synthesis Example II-9 and that 3,3-bis-4'-t-butoxycarbonyloxy naphtalenyl-1-(3H)-isobenzofuranone was replaced by 3,3-bis-1'-t-butoxycarbonyloxy-naphtalenyl-1-(3H)-isonaphtalenofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 125 below together with the photo-acid generator employed. The values of etch rate were based on that of PMMA.

TABLE 125

| Example | Photo-acid generator | Light transmittance (1 μm) % | Etch rate (relative value) |
|---|---|---|---|
| II-64 | Triphenyl sulfonium triflate | 65 | 0.3 |
| II-65 | Diphenyl iodonium triflate | 69 | 0.3 |
| II-66 | NAT · 105 (Midori Kagaku Co., Ltd.) | 71 | 0.3 |
| II-67 | NAI · 105 (Midori Kagaku Co., Ltd.) | 70 | 0.3 |

As a result, it was found possible to form a line and space pattern of 0.15 μm in line width in any of examples.

(Synthesis Example II-10)

The preparation of copolymer performed in Synthesis Example II-2 was repeated except that the ratio of menthyl methacrylate, t-butyl methacrylate and methacrylic acid was changed to 40:35:25 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-68 to II-75, chemically amplified resists containing the copolymer obtained in the above Synthesis Example II-10 were respectively synthesized and were examined of their properties.

Example II-68 to Example II-71

The preparation of chemically amplified resists as performed in (Example II-4) to (Example II-7) were repeated except that the copolymer of Synthesis Example II-2 was replaced by the copolymer obtained in Synthesis Example II-10. Using the resists, patterns were formed in the same manner as explained above, and the properties of these patterns were evaluated.

Further, as in the case of Synthesis Example II-1, the transparency and dry etch resistance were evaluated. The results obtained were summarized in Table 126 below together with the photo-acid generator employed. The values of etch rate were based on that of PMMA.

TABLE 126

| Example | Photo-acid generator | Light transmittance (1 μm) % | Etch rate (relative value) |
|---|---|---|---|
| II-68 | Triphenyl sulfonium triflate | 60 | 0.3 |
| II-69 | Diphenyl iodonium triflate | 59 | 0.3 |
| II-70 | NAT · 105 (Midori Kagaku Co., Ltd.) | 61 | 0.3 |
| II-71 | NAI · 105 (Midori Kagaku Co., Ltd.) | 60 | 0.3 |

As a result, it was found possible to form a line and space pattern of 0.15 μm in line width in any of examples.

Example II-72 to Example II-75

The preparation of chemically amplified resists as performed in (Example II-8) to (Example II-11) were repeated except that the copolymer of Synthesis Example II-2 was replaced by the copolymer obtained in Synthesis Example II-10 and that 3,3-bis-4'-t-butoxycarbonyloxy naphtalenyl-1-(3H)-isobenzofuranone was replaced by 3,3-bis-2'-t-butoxycarbonyloxy-naphtalenyl-1-(3H)-isonaphtalenofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 127 below together with the photo-acid generator employed. The values of etch rate were based on that of PMMA.

TABLE 127

| Example | Photo-acid generator | Light transmittance (1 μm) % | Etch rate (relative value) |
|---|---|---|---|
| II-72 | Triphenyl sulfonium triflate | 65 | 0.3 |
| II-73 | Diphenyl iodonium triflate | 69 | 0.3 |
| II-74 | NAT · 105 (Midori Kagaku Co., Ltd.) | 71 | 0.3 |
| II-75 | NAI · 105 (Midori Kagaku Co., Ltd.) | 70 | 0.3 |

As a result, it was found possible to form a line and space pattern of 0.15 μm in line width in any of examples.

(Synthesis Example II-11)

The preparation of copolymer performed in Synthesis Example II-2 was repeated except that the ratio of menthyl methacrylate, t-butyl methacrylate and methacrylic acid was changed to 40:30:30 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-76 to II-83, chemically amplified resists containing the copolymer obtained in the above Synthesis Example II-11 were respectively synthesized and were examined of their properties.

Example II-76 to Example II-79

The preparation of chemically amplified resists as performed in (Example II-4) to (Example II-7) were repeated except that the copolymer of Synthesis Example II-2 was replaced by the copolymer obtained in Synthesis Example II-11. Using the resists, patterns were formed in the same manner as explained above, and the properties of these patterns were evaluated.

Further, as in the case of Synthesis Example II-1, the transparency and dry etch resistance were evaluated. The results obtained were summarized in Table 128 below together with the photo-acid generator employed. The values of etch rate were based on that of PMMA.

TABLE 128

| Example | Photo-acid generator | Light transmittance (1 μm) % | Etch rate (relative value) |
|---|---|---|---|
| II-76 | Triphenyl sulfonium triflate | 60 | 0.3 |
| II-77 | Diphenyl iodonium triflate | 59 | 0.3 |
| II-78 | NAT · 105 (Midori Kagaku Co., Ltd.) | 61 | 0.3 |
| II-79 | NAI · 105 (Midori Kagaku Co., Ltd.) | 60 | 0.3 |

As a result, it was found possible to form a line and space pattern of 0.15 μm in line width in any of examples.

Example II-80 to Example II-83

The preparation of chemically amplified resists as performed in (Example II-8) to (Example II-11) were repeated except that the copolymer of Synthesis Example II-2 was replaced by the copolymer obtained in Synthesis Example II-11 and that 3,3-bis-4'-t-butoxycarbonyloxy naphtalenyl-1-(3H)-isobenzofuranone was replaced by 3,3-bis-3'-t-butoxycarbonyloxy-naphtalenyl-1-(3H)-isonaphtalenofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 129 below together with the photo-acid generator employed. The values of etch rate were based on that of PMMA.

TABLE 129

| Example | Photo-acid generator | Light transmittance (1 μm) % | Etch rate (relative value) |
|---------|---------------------|------------------------------|----------------------------|
| II-80 | Triphenyl sulfonium triflate | 65 | 0.3 |
| II-81 | Diphenyl iodonium triflate | 69 | 0.3 |
| II-82 | NAT · 105 (Midori Kagaku Co., Ltd.) | 71 | 0.3 |
| II-83 | NAI · 105 (Midori Kagaku Co., Ltd.) | 70 | 0.3 |

As a result, it was found possible to form a line and space pattern of 0.15 μm in line width in any of examples.
(Synthesis Example II-12)

The preparation of copolymer performed in Synthesis Example II-2 was repeated except that the ratio of menthyl methacrylate, t-butyl methacrylate and methacrylic acid was changed to 40:25:35 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride (CF$_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-84 to II-91, chemically amplified resists containing the copolymer obtained in the above Synthesis Example II-12 were respectively synthesized and were examined of their properties.

Example II-84 to Example II-87

The preparation of chemically amplified resists as performed in (Example II-4) to (Example II-7) were repeated except that the copolymer of Synthesis Example II-2 was replaced by the copolymer obtained in Synthesis Example II-12. Using the resists, patterns were formed in the same manner as explained above, and the properties of these patterns were evaluated.

Further, as in the case of Synthesis Example II-1, the transparency and dry etch resistance were evaluated. The results obtained were summarized in Table 130 below together with the photo-acid generator employed. The values of etch rate were based on that of PMMA.

TABLE 130

| Example | Photo-acid generator | Light transmittance (1 μm) % | Etch rate (relative value) |
|---------|---------------------|------------------------------|----------------------------|
| II-84 | Triphenyl sulfonium triflate | 60 | 0.3 |
| II-85 | Diphenyl iodonium triflate | 59 | 0.3 |
| II-86 | NAT · 105 (Midori Kagaku Co., Ltd.) | 61 | 0.3 |
| II-87 | NAI · 105 (Midori Kagaku Co., Ltd.) | 60 | 0.3 |

As a result, it was found possible to form a line and space pattern of 0.15 μm in line width in any of examples.

Example II-88 to Example II-91

The preparation of chemically amplified resists as performed in (Example II-8) to (Example II-11) were repeated except that the copolymer of Synthesis Example II-2 was replaced by the copolymer obtained in Synthesis Example II-12 and that 3,3-bis-4'-t-butoxycarbonyloxy naphtalenyl-1-(3H)-isobenzofuranone was replaced by 3,3-bis-4'-t-butoxycarbonyloxy-naphtalenyl-1-(3H)-isonaphtalenofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 131 below together with the photo-acid generator employed. The values of etch rate were based on that of PMMA.

TABLE 131

| Example | Photo-acid generator | Light transmittance (1 μm) % | Etch rate (relative value) |
|---------|---------------------|------------------------------|----------------------------|
| II-88 | Triphenyl sulfonium triflate | 65 | 0.3 |
| II-89 | Diphenyl iodonium triflate | 69 | 0.3 |
| II-90 | NAT · 105 (Midori Kagaku Co., Ltd.) | 71 | 0.3 |
| II-91 | NAI · 105 (Midori Kagaku Co., Ltd.) | 70 | 0.3 |

As a result, it was found possible to form a line and space pattern of 0.15 μm in line width in any of examples.
(Synthesis Example II-13)

The preparation of copolymer performed in Synthesis Example II-2 was repeated except that the ratio of menthyl methacrylate, t-butyl methacrylate and methacrylic acid was changed to 40:20:40 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-92 to II-99, chemically amplified resists containing the copolymer obtained in the above Synthesis Example II-13 were respectively synthesized and were examined of their properties.

Example II-92 to Example II-95

The preparation of chemically amplified resists as performed in (Example II-4) to (Example II-7) were repeated except that the copolymer of Synthesis Example II-2 was replaced by the copolymer obtained in Synthesis Example II-13. Using the resists, patterns were formed in the same manner as explained above, and the properties of these patterns were evaluated.

Further, as in the case of Synthesis Example II-1, the transparency and dry etch resistance were evaluated. The results obtained were summarized in Table 132 below together with the photo-acid generator employed. The values of etch rate were based on that of PMMA.

TABLE 132

| Example | Photo-acid generator | Light transmittance (1 µm) % | Etch rate (relative value) |
| --- | --- | --- | --- |
| II-92 | Triphenyl sulfonium triflate | 60 | 0.3 |
| II-93 | Diphenyl iodonium triflate | 59 | 0.3 |
| II-94 | NAT · 105 (Midori Kagaku Co., Ltd.) | 61 | 0.3 |
| II-95 | NAI · 105 (Midori Kagaku Co., Ltd.) | 60 | 0.3 |

As a result, it was found possible to form a line and space pattern of 0.15 µm in line width in any of examples.

Example II-96 to Example II-99

The preparation of chemically amplified resists as performed in (Example II-8) to (Example II-11) were repeated except that the copolymer of Synthesis Example II-2 was replaced by the copolymer obtained in Synthesis Example II-13 and that 3,3-bis-4'-t-butoxycarbonyloxy naphtalenyl-1-(3H)-isobenzofuranone was replaced by 3,3-bis-5'-t-butoxycarbonyloxy-naphtalenyl-1-(3H)-isonaphtalenofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 133 below together with the photo-acid generator employed. The values of etch rate were based on that of PMMA.

TABLE 133

| Example | Photo-acid generator | Light transmittance (1 µm) % | Etch rate (relative value) |
| --- | --- | --- | --- |
| II-96 | Triphenyl sulfonium triflate | 65 | 0.3 |
| II-97 | Diphenyl iodonium triflate | 69 | 0.3 |
| II-98 | NAT · 105 (Midori Kagaku Co., Ltd.) | 71 | 0.3 |
| II-99 | NAI · 105 (Midori Kagaku Co., Ltd.) | 70 | 0.3 |

As a result, it was found possible to form a line and space pattern of 0.15 µm in line width in any of examples.

(Synthesis Example II-14)

The preparation of copolymer performed in Synthesis Example II-2 was repeated except that the ratio of menthyl methacrylate, t-butyl methacrylate and methacrylic acid was changed to 35:45:20 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-100 to II-107, chemically amplified resists containing the copolymer obtained in the above Synthesis Example II-14 were respectively synthesized and were examined of their properties.

Example II-100 to Example II-103

The preparation of chemically amplified resists as performed in (Example II-4) to (Example II-7) were repeated except that the copolymer of Synthesis Example II-2 was replaced by the copolymer obtained in Synthesis Example II-14. Using the resists, patterns were formed in the same manner as explained above, and the properties of these patterns were evaluated.

Further, as in the case of Synthesis Example II-1, the transparency and dry etch resistance were evaluated. The results obtained were summarized in Table 134 below together with the photo-acid generator employed. The values of etch rate were based on that of PMMA.

TABLE 134

| Example | Photo-acid generator | Light transmittance (1 µm) % | Etch rate (relative value) |
| --- | --- | --- | --- |
| II-100 | Triphenyl sulfonium triflate | 60 | 0.3 |
| II-101 | Diphenyl iodonium triflate | 59 | 0.3 |
| II-102 | NAT · 105 (Midori Kagaku Co., Ltd.) | 61 | 0.3 |

TABLE 134-continued

| Example | Photo-acid generator | Light transmittance (1 μm) % | Etch rate (relative value) |
|---|---|---|---|
| II-103 | NAI · 105 (Midori Kagaku Co., Ltd.) | 60 | 0.3 |

As a result, it was found possible to form a line and space pattern of 0.15 μm in line width in any of examples.

Example II-104 to Example II-107

The preparation of chemically amplified resists as performed in (Example II-8) to (Example II-11) were repeated except that the copolymer of Synthesis Example II-2 was replaced by the copolymer obtained in Synthesis Example II-14 and that 3,3-bis-4'-t-butoxycarbonyloxy naphtalenyl-1-(3H)-isobenzofuranone was replaced by 3,3-bis-6'-t-butoxycarbonyloxy-naphtalenyl-1-(3H)-isonaphtalenofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 135 below together with the photo-acid generator employed. The values of etch rate were based on that of PMMA.

TABLE 135

| Example | Photo-acid generator | Light transmittance (1 μm) % | Etch rate (relative value) |
|---|---|---|---|
| II-104 | Triphenyl sulfonium triflate | 65 | 0.3 |
| II-105 | Diphenyl iodonium triflate | 69 | 0.3 |
| II-106 | NAT · 105 (Midori Kagaku Co., Ltd.) | 71 | 0.3 |
| II-107 | NAI · 105 (Midori Kagaku Co., Ltd.) | 70 | 0.3 |

As a result, it was found possible to form a line and space pattern of 0.15 μm in line width in any of examples.
(Synthesis Example II-15)

The preparation of copolymer performed in Synthesis Example II-2 was repeated except that the ratio of menthyl methacrylate, t-butyl methacrylate and methacrylic acid was changed to 35:40:25 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-108 to II-115, chemically amplified resists containing the copolymer obtained in the above Synthesis Example II-15 were respectively synthesized and were examined of their properties.

Example II-108 to Example II-111

The preparation of chemically amplified resists as performed in (Example II-4) to (Example II-7) were repeated except that the copolymer of Synthesis Example II-2 was replaced by the copolymer obtained in Synthesis Example II-15. Using the resists, patterns were formed in the same manner as explained above, and the properties of these patterns were evaluated.

Further, as in the case of Synthesis Example II-1, the transparency and dry etch resistance were evaluated. The results obtained were summarized in Table 136 below together with the photo-acid generator employed. The values of etch rate were based on that of PMMA.

TABLE 136

| Example | Photo-acid generator | Light transmittance (1 μm) % | Etch rate (relative value) |
|---|---|---|---|
| II-108 | Triphenyl sulfonium triflate | 60 | 0.3 |
| II-109 | Diphenyl iodonium triflate | 59 | 0.3 |
| II-110 | NAT · 105 (Midori Kagaku Co., Ltd.) | 61 | 0.3 |
| II-111 | NAI · 105 (Midori Kagaku Co., Ltd.) | 60 | 0.3 |

As a result, it was found possible to form a line and space pattern of 0.15 μm in line width in any of examples.

Example II-112 to Example II-115

The preparation of chemically amplified resists as performed in (Example II-8) to (Example II-11) were repeated except that the copolymer of Synthesis Example II-2 was replaced by the copolymer obtained in Synthesis Example II-15 and that 3,3-bis-4'-t-butoxycarbonyloxy naphtalenyl-1-(3H)-isobenzofuranone was replaced by 3,3-bis-7'-t-butoxycarbonyloxy-naphtalenyl-1-(3H)-isonaphtalenofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 137 below together with the photo-acid generator employed. The values of etch rate were based on that of PMMA.

TABLE 137

| Example | Photo-acid generator | Light transmittance (1 μm) % | Etch rate (relative value) |
|---|---|---|---|
| II-112 | Triphenyl sulfonium triflate | 65 | 0.3 |
| II-113 | Diphenyl iodonium triflate | 69 | 0.3 |

TABLE 137-continued

| Example | Photo-acid generator | Light transmittance (1 μm) % | Etch rate (relative value) |
|---|---|---|---|
| II-114 | NAT · 105 (Midori Kagaku Co., Ltd.) | 71 | 0.3 |
| II-115 | NAI · 105 (Midori Kagaku Co., Ltd.) | 70 | 0.3 |

As a result, it was found possible to form a line and space pattern of 0.15 μm in line width in any of examples.

(Synthesis Example II-16)

The preparation of copolymer performed in Synthesis Example II-2 was repeated except that the ratio of menthyl methacrylate, t-butyl methacrylate and methacrylic acid was changed to 35:35:30 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-116 to II-123, chemically amplified resists containing the copolymer obtained in the above Synthesis Example II-16 were respectively synthesized and were examined of their properties.

Example II-116 to Example II-119

The preparation of chemically amplified resists as performed in (Example II-4) to (Example II-7) were repeated except that the copolymer of Synthesis Example II-2 was replaced by the copolymer obtained in Synthesis Example II-16. Using the resists, patterns were formed in the same manner as explained above, and the properties of these patterns were evaluated.

Further, as in the case of Synthesis Example II-1, the transparency and dry etch resistance were evaluated. The results obtained were summarized in Table 138 below together with the photo-acid generator employed. The values of etch rate were based on that of PMMA.

TABLE 138

| Example | Photo-acid generator | Light transmittance (1 μm) % | Etch rate (relative value) |
|---|---|---|---|
| II-116 | Triphenyl sulfonium triflate | 60 | 0.3 |
| II-117 | Diphenyl iodonium triflate | 59 | 0.3 |
| II-118 | NAT · 105 (Midori Kagaku Co., Ltd.) | 61 | 0.3 |
| II-119 | NAI · 105 (Midori Kagaku Co., Ltd.) | 60 | 0.3 |

As a result, it was found possible to form a line and space pattern of 0.15 μm in line width in any of examples.

Example II-120 to Example II-123

The preparation of chemically amplified resists as performed in (Example II-8) to (Example II-11) were repeated except that the copolymer of Synthesis Example II-2 was replaced by the copolymer obtained in Synthesis Example II-16 and that 3,3-bis-4'-t-butoxycarbonyloxy naphtalenyl-1-(3H)-isobenzofuranone was replaced by 3,3-bis-8'-t-butoxycarbonyloxy-naphtalenyl-1-(3H)-isonaphtalenofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 139 below together with the photo-acid generator employed. The values of etch rate were based on that of PMMA.

TABLE 139

| Example | Photo-acid generator | Light transmittance (1 μm) % | Etch rate (relative value) |
|---|---|---|---|
| II-120 | Triphenyl sulfonium triflate | 65 | 0.3 |
| II-121 | Diphenyl iodonium triflate | 69 | 0.3 |
| II-122 | NAT · 105 (Midori Kagaku Co., Ltd.) | 71 | 0.3 |
| II-123 | NAI · 105 (Midori Kagaku Co., Ltd.) | 70 | 0.3 |

As a result, it was found possible to form a line and space pattern of 0.15 μm in line width in any of examples.

(Synthesis Example II-17)

The preparation of copolymer performed in Synthesis Example II-2 was repeated except that t-butyl methacrylate was replaced by ethoxyethyl methacrylate and that the ratio of menthyl methacrylate, ethoxyethyl methacrylate and methacrylic acid was changed to 35:30:35 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-124 to II-131, chemically amplified resists containing the copolymer obtained in the above Synthesis Example II-17 were respectively synthesized and were examined of their properties.

Example II-124 to Example II-127

The preparation of chemically amplified resists as performed in (Example II-4) to (Example II-7) were repeated except that the copolymer of Synthesis Example II-2 was replaced by the copolymer obtained in Synthesis Example II-17. Using the resists, patterns were formed in the same manner as explained above, and the properties of these patterns were evaluated.

Further, as in the case of Synthesis Example II-1, the transparency and dry etch resistance were evaluated. The results obtained were summarized in Table 140 below together with the photo-acid generator employed. The values of etch rate were based on that of PMMA.

TABLE 140

| Example | Photo-acid generator | Light transmittance (1 μm) % | Etch rate (relative value) |
|---|---|---|---|
| II-124 | Triphenyl sulfonium triflate | 60 | 0.3 |
| II-125 | Diphenyl iodonium triflate | 59 | 0.3 |
| II-126 | NAT · 105 (Midori Kagaku Co., Ltd.) | 61 | 0.3 |
| II-127 | NAI · 105 (Midori Kagaku Co., Ltd.) | 60 | 0.3 |

As a result, it was found possible to form a line and space pattern of 0.15 μm in line width in any of examples.

Example II-128 to Example II-131

The preparation of chemically amplified resists as performed in (Example II-8) to (Example II-11) were repeated except that the copolymer of Synthesis Example II-2 was replaced by the copolymer obtained in Synthesis Example II-17. Using the resists, patterns were formed in the same manner as explained above, and the properties of these patterns were evaluated.

Further, as in the case of Synthesis Example II-1, the transparency and dry etch resistance were evaluated. The results obtained were summarized in Table 141 below together with the photo-acid generator employed. The values of etch rate were based on that of PMMA.

TABLE 141

| Example | Photo-acid generator | Light transmittance (1 μm) % | Etch rate (relative value) |
|---|---|---|---|
| II-128 | Triphenyl sulfonium triflate | 55 | 0.3 |
| II-129 | Diphenyl iodonium triflate | 59 | 0.3 |
| II-130 | NAT · 105 (Midori Kagaku Co., Ltd.) | 61 | 0.3 |
| II-131 | NAI · 105 (Midori Kagaku Co., Ltd.) | 60 | 0.3 |

As a result, it was found possible to form a line and space pattern of 0.15 μm in line width in any of examples.
(Synthesis Example II-18)

The preparation of copolymer performed in Synthesis Example II-2 was repeated except that t-butyl methacrylate was replaced by 3-oxycyclohexyl methacrylate and that the ratio of menthyl methacrylate, 3-oxocyclohexyl methacrylate and methacrylic acid was changed to 35:25:40 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-132 to II-139, chemically amplified resists containing the copolymer obtained in the above Synthesis Example II-18 were respectively synthesized and were examined of their properties.

Example II-132 to Example II-135

The preparation of chemically amplified resists as performed in (Example II-4) to (Example II-7) were repeated except that the copolymer of Synthesis Example II-2 was replaced by the copolymer obtained in Synthesis Example II-18. Using the resists, patterns were formed in the same manner as explained above, and the properties of these patterns were evaluated.

Further, as in the case of Synthesis Example II-1, the transparency and dry etch resistance were evaluated. The results obtained were summarized in Table 142 below together with the photo-acid generator employed. The values of etch rate were based on that of PMMA.

TABLE 142

| Example | Photo-acid generator | Light transmittance (1 μm) % | Etch rate (relative value) |
|---|---|---|---|
| II-132 | Triphenyl sulfonium triflate | 60 | 0.3 |
| II-133 | Diphenyl iodonium triflate | 59 | 0.3 |
| II-134 | NAT · 105 (Midori Kagaku Co., Ltd.) | 61 | 0.3 |
| II-135 | NAI · 105 (Midori Kagaku Co., Ltd.) | 60 | 0.3 |

As a result, it was found possible to form a line and space pattern of 0.15 μm in line width in any of examples.

Example II-136 to Example II-139

The preparation of chemically amplified resists as performed in (Example II-8) to (Example II-11) were repeated except that the copolymer of Synthesis Example II-2 was replaced by the copolymer obtained in Synthesis Example II-18. Using the resists, patterns were formed in the same manner as explained above, and the properties of these patterns were evaluated.

Further, as in the case of Synthesis Example II-1, the transparency and dry etch resistance were evaluated. The results obtained were summarized in Table 143 below together with the photo-acid generator employed. The values of etch rate were based on that of PMMA.

TABLE 143

| Example | Photo-acid generator | Light transmittance (1 μm) % | Etch rate (relative value) |
|---|---|---|---|
| II-136 | Triphenyl sulfonium triflate | 55 | 0.3 |
| II-137 | Diphenyl iodonium triflate | 59 | 0.3 |
| II-138 | NAT · 105 (Midori Kagaku Co., Ltd.) | 61 | 0.3 |
| II-139 | NAI · 105 (Midori Kagaku Co., Ltd.) | 60 | 0.3 |

As a result, it was found possible to form a line and space pattern of 0.15 μm in line width in any of examples.

(Synthesis Example II-19)

The preparation of copolymer performed in Synthesis Example II-2 was repeated except that t-butyl methacrylate was replaced by t-butyl-3-naphtyl-2-propenoate and that the ratio of menthyl methacrylate, t-butyl-3-naphtyl-2-propenoate and methacrylic acid was changed to 35:20:45 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride (CF$_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-140 to II-147, chemically amplified resists containing the copolymer obtained in the above Synthesis Example II-19 were respectively synthesized and were examined of their properties.

Example II-140 to Example II-143

The preparation of chemically amplified resists as performed in (Example II-4) to (Example II-7) were repeated except that the copolymer of Synthesis Example II-2 was replaced by the copolymer obtained in Synthesis Example II-19. Using the resists, patterns were formed in the same manner as explained above, and the properties of these patterns were evaluated.

Further, as in the case of Synthesis Example II-1, the transparency and dry etch resistance were evaluated. The results obtained were summarized in Table 144 below together with the photo-acid generator employed. The values of etch rate were based on that of PMMA.

TABLE 144

| Example | Photo-acid generator | Light transmittance (1 μm) % | Etch rate (relative value) |
|---|---|---|---|
| II-140 | Triphenyl sulfonium triflate | 60 | 0.3 |

TABLE 144-continued

| Example | Photo-acid generator | Light transmittance (1 μm) % | Etch rate (relative value) |
|---|---|---|---|
| II-141 | Diphenyl iodonium triflate | 59 | 0.3 |
| II-142 | NAT · 105 (Midori Kagaku Co., Ltd.) | 61 | 0.3 |
| II-143 | NAI · 105 (Midori Kagaku Co., Ltd.) | 60 | 0.3 |

As a result, it was found possible to form a line and space pattern of 0.15 μm in line width in any of examples.

Example II-144 to Example II-147

The preparation of chemically amplified resists as performed in (Example II-8) to (Example II-11) were repeated except that the copolymer of Synthesis Example II-2 was replaced by the copolymer obtained in Synthesis Example II-19. Using the resists, patterns were formed in the same manner as explained above, and the properties of these patterns were evaluated.

Further, as in the case of Synthesis Example II-1, the transparency and dry etch resistance were evaluated. The results obtained were summarized in Table 145 below together with the photo-acid generator employed. The values of etch rate were based on that of PMMA.

TABLE 145

| Example | Photo-acid generator | Light transmittance (1 μm) % | Etch rate (relative value) |
|---|---|---|---|
| II-144 | Triphenyl sulfonium triflate | 55 | 0.3 |
| II-145 | Diphenyl iodonium triflate | 59 | 0.3 |
| II-146 | NAT · 105 (Midori Kagaku Co., Ltd.) | 61 | 0.3 |
| II-147 | NAI · 105 (Midori Kagaku Co., Ltd.) | 60 | 0.3 |

As a result, it was found possible to form a line and space pattern of 0.15 μm in line width in any of examples.

(Synthesis Example II-20)

The preparation of copolymer performed in Synthesis Example II-2 was repeated except that t-butyl methacrylate was replaced by isobornyl methacrylate and that the ratio of menthyl methacrylate, isobornyl methacrylate and methacrylic acid was changed to 30:50:20 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride (CF$_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-148 to II-155, chemically amplified resists containing the copolymer obtained in the above Synthesis Example II-20 were respectively synthesized and were examined of their properties.

Example II-148 to Example II-151

The preparation of chemically amplified resists as performed in (Example II-4) to (Example II-7) were repeated except that the copolymer of Synthesis Example II-2 was replaced by the copolymer obtained in Synthesis Example II-20. Using the resists, patterns were formed in the same manner as explained above, and the properties of these patterns were evaluated.

Further, as in the case of Synthesis Example II-1, the transparency and dry etch resistance were evaluated. The results obtained were summarized in Table 146 below together with the photo-acid generator employed. The values of etch rate were based on that of PMMA.

TABLE 146

| Example | Photo-acid generator | Light transmittance (1 μm) % | Etch rate (relative value) |
|---|---|---|---|
| II-148 | Triphenyl sulfonium triflate | 60 | 0.3 |
| II-149 | Diphenyl iodonium triflate | 59 | 0.3 |
| II-150 | NAT · 105 (Midori Kagaku Co., Ltd.) | 61 | 0.3 |
| II-151 | NAI · 105 (Midori Kagaku Co., Ltd.) | 60 | 0.3 |

As a result, it was found possible to form a line and space pattern of 0.15 μm in line width in any of examples.

Example II-152 to Example II-155

The preparation of chemically amplified resists as performed in (Example II-8) to (Example II-11) were repeated except that the copolymer of Synthesis Example II-2 was replaced by the copolymer obtained in Synthesis Example II-20. Using the resists, patterns were formed in the same manner as explained above, and the properties of these patterns were evaluated.

Further, as in the case of Synthesis Example II-1, the transparency and dry etch resistance were evaluated. The results obtained were summarized in Table 147 below together with the photo-acid generator employed. The values of etch rate were based on that of PMMA.

TABLE 147

| Example | Photo-acid generator | Light transmittance (1 μm) % | Etch rate (relative value) |
|---|---|---|---|
| II-152 | Triphenyl sulfonium triflate | 55 | 0.3 |
| II-153 | Diphenyl iodonium triflate | 59 | 0.3 |
| II-154 | NAT · 105 (Midori Kagaku Co., Ltd.) | 61 | 0.3 |

TABLE 147-continued

| Example | Photo-acid generator | Light transmittance (1 μm) % | Etch rate (relative value) |
|---|---|---|---|
| II-155 | NAI · 105 (Midori Kagaku Co., Ltd.) | 60 | 0.3 |

As a result, it was found possible to form a line and space pattern of 0.15 μm in line width in any of examples.

(Synthesis Example II-21)

The preparation of copolymer performed in Synthesis Example II-2 was repeated except that t-butyl methacrylate was replaced by tetrahydropyranyl methacrylate and that the ratio of menthyl methacrylate, tetrahydropyranyl methacrylate and methacrylic acid was changed to 30:45:25 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-156 to II-163, chemically amplified resists containing the copolymer obtained in the above Synthesis Example II-21 were respectively synthesized and were examined of their properties.

Example II-156 to Example II-159

The preparation of chemically amplified resists as performed in (Example II-4) to (Example II-7) were repeated except that the copolymer of Synthesis Example II-2 was replaced by the copolymer obtained in Synthesis Example II-21. Using the resists, patterns were formed in the same manner as explained above, and the properties of these patterns were evaluated.

Further, as in the case of Synthesis Example II-1, the transparency and dry etch resistance were evaluated. The results obtained were summarized in Table 148 below together with the photo-acid generator employed. The values of etch rate were based on that of PMMA.

TABLE 148

| Example | Photo-acid generator | Light transmittance (1 μm) % | Etch rate (relative value) |
|---|---|---|---|
| II-156 | Triphenyl sulfonium triflate | 60 | 0.3 |
| II-157 | Diphenyl iodonium triflate | 59 | 0.3 |
| II-158 | NAT · 105 (Midori Kagaku Co., Ltd.) | 61 | 0.3 |
| II-159 | NAI · 105 (Midori Kagaku Co., Ltd.) | 60 | 0.3 |

As a result, it was found possible to form a line and space pattern of 0.15 μm in line width in any of examples.

Example II-160 to Example II-163

The preparation of chemically amplified resists as performed in (Example II-8) to (Example II-11) were repeated except that the copolymer of Synthesis Example II-2 was replaced by the copolymer obtained in Synthesis Example II-21. Using the resists, patterns were formed in the same manner as explained above, and the properties of these patterns were evaluated.

Further, as in the case of Synthesis Example II-1, the transparency and dry etch resistance were evaluated. The results obtained were summarized in Table 149 below together with the photo-acid generator employed. The values of etch rate were based on that of PMMA.

TABLE 149

| Example | Photo-acid generator | Light transmittance (1 μm) % | Etch rate (relative value) |
|---|---|---|---|
| II-160 | Triphenyl sulfonium triflate | 55 | 0.3 |
| II-161 | Diphenyl iodonium triflate | 59 | 0.3 |
| II-162 | NAT · 105 (Midori Kagaku Co., Ltd.) | 61 | 0.3 |
| II-163 | NAI · 105 (Midori Kagaku Co., Ltd.) | 60 | 0.3 |

As a result, it was found possible to form a line and space pattern of 0.15 μm in line width in any of examples.

(Synthesis Example II-22)

The preparation of copolymer performed in Synthesis Example II-2 was repeated except that t-butyl methacrylate was replaced by ethoxyethyl acrylate and that the ratio of menthyl methacrylate, ethoxyethyl acrylate and methacrylic acid was changed to 30:40:30 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-164 to II-171, chemically amplified resists containing the copolymer obtained in the above Synthesis Example II-22 were respectively synthesized and were examined of their properties.

Example II-164 to Example II-167

The preparation of chemically amplified resists as performed in (Example II-4) to (Example II-7) were repeated except that the copolymer of Synthesis Example II-2 was replaced by the copolymer obtained in Synthesis Example II-22. Using the resists, patterns were formed in the same manner as explained above, and the properties of these patterns were evaluated.

Further, as in the case of Synthesis Example II-1, the transparency and dry etch resistance were evaluated. The results obtained were summarized in Table 150 below together with the photo-acid generator employed. The values of etch rate were based on that of PMMA.

TABLE 150

| Example | Photo-acid generator | Light transmittance (1 μm) % | Etch rate (relative value) |
|---|---|---|---|
| II-164 | Triphenyl sulfonium triflate | 60 | 0.3 |
| II-165 | Diphenyl iodonium triflate | 59 | 0.3 |
| II-166 | NAT · 105 (Midori Kagaku Co., Ltd.) | 61 | 0.3 |
| II-167 | NAI · 105 (Midori Kagaku Co., Ltd.) | 60 | 0.3 |

As a result, it was found possible to form a line and space pattern of 0.15 μm in line width in any of examples.

Example II-168 to Example II-171

The preparation of chemically amplified resists as performed in (Example II-8) to (Example II-11) were repeated except that the copolymer of Synthesis Example II-2 was replaced by the copolymer obtained in Synthesis Example II-22. Using the resists, patterns were formed in the same manner as explained above, and the properties of these patterns were evaluated.

Further, as in the case of Synthesis Example II-1, the transparency and dry etch resistance were evaluated. The results obtained were summarized in Table 151 below together with the photo-acid generator employed. The values of etch rate were based on that of PMMA.

TABLE 151

| Example | Photo-acid generator | Light transmittance (1 μm) % | Etch rate (relative value) |
|---|---|---|---|
| II-168 | Triphenyl sulfonium triflate | 55 | 0.3 |
| II-169 | Diphenyl iodonium triflate | 59 | 0.3 |
| II-170 | NAT · 105 (Midori Kagaku Co., Ltd.) | 61 | 0.3 |
| II-171 | NAI · 105 (Midori Kagaku Co., Ltd.) | 60 | 0.3 |

As a result, it was found possible to form a line and space pattern of 0.15 μm in line width in any of examples.

(Synthesis Example II-23)

The preparation of copolymer performed in Synthesis Example II-2 was repeated except that t-butyl methacrylate was replaced by 3-oxocyclohexyl acrylate and that the ratio of menthyl methacrylate, 3-oxocyclohexyl acrylate and methacrylic acid was changed to 30:35:35 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-172 to II-179, chemically amplified resists containing the copolymer obtained in the above Synthesis Example II-23 were respectively synthesized and were examined of their properties.

Example II-172 to Example II-175

The preparation of chemically amplified resists as performed in (Example II-4) to (Example II-7) were repeated except that the copolymer of Synthesis Example II-2 was replaced by the copolymer obtained in Synthesis Example II-23. Using the resists, patterns were formed in the same manner as explained above, and the properties of these patterns were evaluated.

Further, as in the case of Synthesis Example II-1, the transparency and dry etch resistance were evaluated. The results obtained were summarized in Table 152 below together with the photo-acid generator employed. The values of etch rate were based on that of PMMA.

TABLE 152

| Example | Photo-acid generator | Light transmittance (1 μm) % | Etch rate (relative value) |
| --- | --- | --- | --- |
| II-172 | Triphenyl sulfonium triflate | 60 | 0.3 |
| II-173 | Diphenyl iodonium triflate | 59 | 0.3 |
| II-174 | NAT · 105 (Midori Kagaku Co., Ltd.) | 61 | 0.3 |
| II-175 | NAI · 105 (Midori Kagaku Co., Ltd.) | 60 | 0.3 |

As a result, it was found possible to form a line and space pattern of 0.15 μm in line width in any of examples.

Example II-176 to Example II-179

The preparation of chemically amplified resists as performed in (Example II-8) to (Example II-11) were repeated except that the copolymer of Synthesis Example II-2 was replaced by the copolymer obtained in Synthesis Example II-23. Using the resists, patterns were formed in the same manner as explained above, and the properties of these patterns were evaluated.

Further, as in the case of Synthesis Example II-1, the transparency and dry etch resistance were evaluated. The results obtained were summarized in Table 153 below together with the photo-acid generator employed. The values of etch rate were based on that of PMMA.

TABLE 153

| Example | Photo-acid generator | Light transmittance (1 μm) % | Etch rate (relative value) |
| --- | --- | --- | --- |
| II-176 | Triphenyl sulfonium triflate | 55 | 0.3 |

TABLE 153-continued

| Example | Photo-acid generator | Light transmittance (1 μm) % | Etch rate (relative value) |
| --- | --- | --- | --- |
| II-177 | Diphenyl iodonium triflate | 59 | 0.3 |
| II-178 | NAT · 105 (Midori Kagaku Co., Ltd.) | 61 | 0.3 |
| II-179 | NAI · 105 (Midori Kagaku Co., Ltd.) | 60 | 0.3 |

As a result, it was found possible to form a line and space pattern of 0.15 μm in line width in any of examples.

(Synthesis Example II-24)

The preparation of copolymer performed in Synthesis Example II-2 was repeated except that t-butyl methacrylate was replaced by tetrahydropyranyl acrylate and that the ratio of menthyl methacrylate, tetrahydropyranyl acrylate and methacrylic acid was changed to 30:30:40 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-180 to II-187, chemically amplified resists containing the copolymer obtained in the above Synthesis Example II-24 were respectively synthesized and were examined of their properties.

Example II-180 to Example II-183

The preparation of chemically amplified resists as performed in (Example II-4) to (Example II-7) were repeated except that the copolymer of Synthesis Example II-2 was replaced by the copolymer obtained in Synthesis Example II-24. Using the resists, patterns were formed in the same manner as explained above, and the properties of these patterns were evaluated.

Further, as in the case of Synthesis Example II-1, the transparency and dry etch resistance were evaluated. The results obtained were summarized in Table 154 below together with the photo-acid generator employed. The values of etch rate were based on that of PMMA.

TABLE 154

| Example | Photo-acid generator | Light transmittance (1 μm) % | Etch rate (relative value) |
| --- | --- | --- | --- |
| II-180 | Triphenyl sulfonium triflate | 60 | 0.3 |
| II-181 | Diphenyl iodonium triflate | 59 | 0.3 |
| II-182 | NAT · 105 (Midori Kagaku Co., Ltd.) | 61 | 0.3 |

TABLE 154-continued

| Example | Photo-acid generator | Light transmittance (1 μm) % | Etch rate (relative value) |
|---|---|---|---|
| II-183 | NAI · 105 (Midori Kagaku Co., Ltd.) | 60 | 0.3 |

As a result, it was found possible to form a line and space pattern of 0.15 μm in line width in any of examples.

Example II-184 to Example II-187

The preparation of chemically amplified resists as performed in (Example II-8) to (Example II-11) were repeated except that the copolymer of Synthesis Example II-2 was replaced by the copolymer obtained in Synthesis Example II-24. Using the resists, patterns were formed in the same manner as explained above, and the properties of these patterns were evaluated.

Further, as in the case of Synthesis Example II-1, the transparency and dry etch resistance were evaluated. The results obtained were summarized in Table 155 below together with the photo-acid generator employed. The values of etch rate were based on that of PMMA.

TABLE 155

| Example | Photo-acid generator | Light transmittance (1 μm) % | Etch rate (relative value) |
|---|---|---|---|
| II-184 | Triphenyl sulfonium triflate | 55 | 0.3 |
| II-185 | Diphenyl iodonium triflate | 59 | 0.3 |
| II-186 | NAT · 105 (Midori Kagaku Co., Ltd.) | 61 | 0.3 |
| II-187 | NAI · 105 (Midori Kagaku Co., Ltd.) | 60 | 0.3 |

As a result, it was found possible to form a line and space pattern of 0.15 μm in line width in any of examples.
(Synthesis Example II-25)

The preparation of copolymer performed in Synthesis Example II-2 was repeated except that t-butyl methacrylate was replaced by isobornyl acrylate and that the ratio of menthyl methacrylate, isobornyl acrylate and methacrylic acid was changed to 30:25:45 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-188 to II-195, chemically amplified resists containing the copolymer obtained in the above Synthesis Example II-25 were respectively synthesized and were examined of their properties.

Example II-188 to Example II-191

The preparation of chemically amplified resists as performed in (Example II-4) to (Example II-7) were repeated except that the copolymer of Synthesis Example II-2 was replaced by the copolymer obtained in Synthesis Example II-25. Using the resists, patterns were formed in the same manner as explained above, and the properties of these patterns were evaluated.

Further, as in the case of Synthesis Example II-1, the transparency and dry etch resistance were evaluated. The results obtained were summarized in Table 156 below together with the photo-acid generator employed. The values of etch rate were based on that of PMMA.

TABLE 156

| Example | Photo-acid generator | Light transmittance (1 μm) % | Etch rate (relative value) |
|---|---|---|---|
| II-188 | Triphenyl sulfonium triflate | 60 | 0.3 |
| II-189 | Diphenyl iodonium triflate | 59 | 0.3 |
| II-190 | NAT · 105 (Midori Kagaku Co., Ltd.) | 61 | 0.3 |
| II-191 | NAI · 105 (Midori Kagaku Co., Ltd.) | 60 | 0.3 |

As a result, it was found possible to form a line and space pattern of 0.15 μm in line width in any of examples.

Example II-192 to Example II-195

The preparation of chemically amplified resists as performed in (Example II-8) to (Example II-11) were repeated except that the copolymer of Synthesis Example II-2 was replaced by the copolymer obtained in Synthesis Example II-25. Using the resists, patterns were formed in the same manner as explained above, and the properties of these patterns were evaluated.

Further, as in the case of Synthesis Example II-1, the transparency and dry etch resistance were evaluated. The results obtained were summarized in Table 157 below together with the photo-acid generator employed. The values of etch rate were based on that of PMMA.

TABLE 157

| Example | Photo-acid generator | Light transmittance (1 μm) % | Etch rate (relative value) |
|---|---|---|---|
| II-192 | Triphenyl sulfonium triflate | 55 | 0.3 |
| II-193 | Diphenyl iodonium triflate | 59 | 0.3 |
| II-194 | NAT · 105 (Midori Kagaku Co., Ltd.) | 61 | 0.3 |
| II-195 | NAI · 105 (Midori Kagaku Co., Ltd.) | 60 | 0.3 |

As a result, it was found possible to form a line and space pattern of 0.15 μm in line width in any of examples.
(Synthesis Example II-26)

The preparation of copolymer performed in Synthesis Example II-2 was repeated except that the ratio of menthyl methacrylate, t-butyl methacrylate and methacrylic acid was changed to 30:20:50 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-196 to II-203, chemically amplified resists containing the copolymer obtained in the above Synthesis Example II-26 were respectively synthesized and were examined of their properties.

Example II-196 to Example II-199

Using photo-acid generator shown in following Table 158, the preparation of chemically amplified resists as performed in (Example II-4) to (Example II-7) were repeated except that the copolymer of Synthesis Example II-2 was replaced by the copolymer obtained in Synthesis Example II-26. Using the resists, patterns were formed in the same manner as explained above, and the properties of these patterns were evaluated.

Further, as in the case of Synthesis Example II-1, the transparency and dry etch resistance were evaluated. The results obtained were summarized in Table 158 below together with the photo-acid generator employed. The values of etch rate were based on that of PMMA.

TABLE 158

| Example | Photo-acid generator | Light transmittance (1 μm) % | Etch rate (relative value) |
|---|---|---|---|
| II-196 | Triphenyl sulfonium triflate | 65 | 0.3 |
| II-197 | Diphenyl iodonium triflate | 74 | 0.3 |
| II-198 | NAT · 105 (Midori Kagaku Co., Ltd.) | 61 | 0.3 |
| II-199 | NAI · 105 (Midori Kagaku Co., Ltd.) | 60 | 0.3 |

As a result, it was found possible to form a line and space pattern of 0.15 μm in line width in any of examples.

Example II-200 to Example II-203

Using photo-acid generator shown in following Table 159, the preparation of chemically amplified resists as performed in (Example II-8) to (Example II-11) were repeated except that the copolymer of Synthesis Example II-2 was replaced by the copolymer obtained in Synthesis Example II-26. Using the resists, patterns were formed in the same manner as explained above, and the properties of these patterns were evaluated.

Further, as in the case of Synthesis Example II-1, the transparency and dry etch resistance were evaluated. The results obtained were summarized in Table 159 below together with the photo-acid generator employed. The values of etch rate were based on that of PMMA.

TABLE 159

| Example | Photo-acid generator | Light transmittance (1 μm) % | Etch rate (relative value) |
|---|---|---|---|
| II-200 | Triphenyl sulfonium triflate | 60 | 0.3 |
| II-201 | Diphenyl iodonium triflate | 74 | 0.3 |
| II-202 | NAT · 105 (Midori Kagaku Co., Ltd.) | 61 | 0.3 |
| II-203 | NAI · 105 (Midori Kagaku Co., Ltd.) | 60 | 0.3 |

As a result, it was found possible to form a line and space pattern of 0.15 μm in line width in any of examples.

(Synthesis Example II-27)

The preparation of copolymer performed in Synthesis Example II-2 was repeated except that the ratio of menthyl methacrylate, t-butyl methacrylate and methacrylic acid was changed to 25:55:20 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-204 to II-211, chemically amplified resists containing the copolymer obtained in the above Synthesis Example II-27 were respectively synthesized and were examined of their properties.

Example II-204 to Example II-207

Using photo-acid generator shown in following Table 160, the preparation of chemically amplified resists as performed in (Example II-4) to (Example II-7) were repeated except that the copolymer of Synthesis Example II-2 was replaced by the copolymer obtained in Synthesis Example II-27. Using the resists, patterns were formed in the same manner as explained above, and the properties of these patterns were evaluated.

Further, as in the case of Synthesis Example II-1, the transparency and dry etch resistance were evaluated. The results obtained were summarized in Table 160 below together with the photo-acid generator employed. The values of etch rate were based on that of PMMA.

TABLE 160

| Example | Photo-acid generator | Light transmittance (1 μm) % | Etch rate (relative value) |
|---|---|---|---|
| II-204 | Triphenyl sulfonium triflate | 58 | 0.3 |

TABLE 160-continued

| Example | Photo-acid generator | Light transmittance (1 μm) % | Etch rate (relative value) |
|---|---|---|---|
| II-205 | Diphenyl iodonium triflate | 55 | 0.3 |
| II-206 | NAT · 105 (Midori Kagaku Co., Ltd.) | 54 | 0.3 |
| II-207 | NAI · 105 (Midori Kagaku Co., Ltd.) | 53 | 0.3 |

As a result, it was found possible to form a line and space pattern of 0.15 μm in line width in any of examples.

Example II-208 to Example II-211

Using photo-acid generator shown in following Table 161, the preparation of chemically amplified resists as performed in (Example II-8) to (Example II-11) were repeated except that the copolymer of Synthesis Example II-2 was replaced by the copolymer obtained in Synthesis Example II-27. Using the resists, patterns were formed in the same manner as explained above, and the properties of these patterns were evaluated.

Further, as in the case of Synthesis Example II-1, the transparency and dry etch resistance were evaluated. The results obtained were summarized in Table 161 below together with the photo-acid generator employed. The values of etch rate were based on that of PMMA.

TABLE 161

| Example | Photo-acid generator | Light transmittance (1 μm) % | Etch rate (relative value) |
|---|---|---|---|
| II-208 | Triphenyl sulfonium triflate | 53 | 0.3 |
| II-209 | Diphenyl iodonium triflate | 51 | 0.3 |
| II-210 | NAT · 105 (Midori Kagaku Co., Ltd.) | 54 | 0.3 |
| II-211 | NAI · 105 (Midori Kagaku Co., Ltd.) | 51 | 0.3 |

As a result, it was found possible to form a line and space pattern of 0.15 μm in line width in any of examples.

(Synthesis Example II-28)

The preparation of copolymer performed in Synthesis Example II-2 was repeated except that the ratio of menthyl methacrylate, t-butyl methacrylate and methacrylic acid was changed to 25:50:25 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-212 to II-219, chemically amplified resists containing the copolymer obtained in the above Synthesis Example II-28 were respectively synthesized and were examined of their properties.

Example II-212 to Example II-215

Using photo-acid generator shown in following Table 162, the preparation of chemically amplified resists as performed in (Example II-4) to (Example II-7) were repeated except that the copolymer of Synthesis Example II-2 was replaced by the copolymer obtained in Synthesis Example II-28. Using the resists, patterns were formed in the same manner as explained above, and the properties of these patterns were evaluated.

Further, as in the case of Synthesis Example II-1, the transparency and dry etch resistance were evaluated. The results obtained were summarized in Table 162 below together with the photo-acid generator employed. The values of etch rate were based on that of PMMA.

TABLE 162

| Example | Photo-acid generator | Light transmittance (1 μm) % | Etch rate (relative value) |
|---|---|---|---|
| II-212 | Triphenyl sulfonium triflate | 70 | 0.3 |
| II-213 | Diphenyl iodonium triflate | 69 | 0.3 |
| II-214 | NAT · 105 (Midori Kagaku Co., Ltd.) | 65 | 0.3 |
| II-215 | NAI · 105 (Midori Kagaku Co., Ltd.) | 65 | 0.3 |

As a result, it was found possible to form a line and space pattern of 0.15 μm in line width in any of examples.

Example II-216 to Example II-219

Using photo-acid generator shown in following Table 163, the preparation of chemically amplified resists as performed in (Example II-8) to (Example II-11) were repeated except that the copolymer of Synthesis Example II-2 was replaced by the copolymer obtained in Synthesis Example II-28. Using the resists, patterns were formed in the same manner as explained above, and the properties of these patterns were evaluated.

Further, as in the case of Synthesis Example II-1, the transparency and dry etch resistance were evaluated. The results obtained were summarized in Table 163 below together with the photo-acid generator employed. The values of etch rate were based on that of PMMA.

TABLE 163

| Example | Photo-acid generator | Light transmittance (1 μm) % | Etch rate (relative value) |
|---|---|---|---|
| II-216 | Triphenyl sulfonium triflate | 70 | 0.3 |

TABLE 163-continued

| Example | Photo-acid generator | Light transmittance (1 μm) % | Etch rate (relative value) |
|---|---|---|---|
| II-209 | Diphenyl iodonium triflate | 65 | 0.3 |
| II-210 | NAT · 105 (Midori Kagaku Co., Ltd.) | 63 | 0.3 |
| II-211 | NAI · 105 (Midori Kagaku Co., Ltd.) | 62 | 0.3 |

As a result, it was found possible to form a line and space pattern of 0.15 μm in line width in any of examples.

(Synthesis Example II-29)

The preparation of copolymer performed in Synthesis Example II-2 was repeated except that the ratio of menthyl methacrylate, t-butyl methacrylate and methacrylic acid was changed to 25:45:30 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-220 to II-227, chemically amplified resists containing the copolymer obtained in the above Synthesis Example II-29 were respectively synthesized and were examined of their properties.

Example II-220 to Example II-223

Using photo-acid generator shown in following Table 164, the preparation of chemically amplified resists as performed in (Example II-4) to (Example II-7) were repeated except that the copolymer of Synthesis Example II-2 was replaced by the copolymer obtained in Synthesis Example II-29. Using the resists, patterns were formed in the same manner as explained above, and the properties of these patterns were evaluated.

Further, as in the case of Synthesis Example II-1, the transparency and dry etch resistance were evaluated. The results obtained were summarized in Table 164 below together with the photo-acid generator employed. The values of etch rate were based on that of PMMA.

TABLE 164

| Example | Photo-acid generator | Light transmittance (1 μm) % | Etch rate (relative value) |
|---|---|---|---|
| II-220 | Triphenyl sulfonium triflate | 68 | 0.3 |
| II-221 | Diphenyl iodonium triflate | 70 | 0.3 |
| II-222 | NAT · 105 (Midori Kagaku Co., Ltd.) | 70 | 0.3 |
| II-223 | NAI · 105 (Midori Kagaku Co., Ltd.) | 65 | 0.3 |

As a result, it was found possible to form a line and space pattern of 0.15 μm in line width in any of examples.

Example II-224 to Example II-227

Using photo-acid generator shown in following Table 165, the preparation of chemically amplified resists as performed in (Example II-8) to (Example II-11) were repeated except that the copolymer of Synthesis Example II-2 was replaced by the copolymer obtained in Synthesis Example II-29. Using the resists, patterns were formed in the same manner as explained above, and the properties of these patterns were evaluated.

Further, as in the case of Synthesis Example II-1, the transparency and dry etch resistance were evaluated. The results obtained were summarized in Table 165 below together with the photo-acid generator employed. The values of etch rate were based on that of PMMA.

TABLE 165

| Example | Photo-acid generator | Light transmittance (1 μm) % | Etch rate (relative value) |
|---|---|---|---|
| II-224 | Triphenyl sulfonium triflate | 65 | 0.3 |
| II-225 | Diphenyl iodonium triflate | 68 | 0.3 |
| II-226 | NAT · 105 (Midori Kagaku Co., Ltd.) | 68 | 0.3 |
| II-227 | NAI · 105 (Midori Kagaku Co., Ltd.) | 63 | 0.3 |

As a result, it was found possible to form a line and space pattern of 0.15 μm in line width in any of examples.

(Synthesis Example II-30)

The preparation of copolymer performed in Synthesis Example II-2 was repeated except that the ratio of menthyl methacrylate, t-butyl methacrylate and methacrylic acid was changed to 25:40:35 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-228 to II-235, chemically amplified resists containing the copolymer obtained in the above Synthesis Example II-30 were respectively synthesized and were examined of their properties.

Example II-228 to Example II-231

The preparation of chemically amplified resists as performed in (Example II-4) to (Example II-7) were repeated except that the copolymer of Synthesis Example II-2 was replaced by the copolymer obtained in Synthesis Example II-30. Using the resists, patterns were formed in the same manner as explained above, and the properties of these patterns were evaluated.

Further, as in the case of Synthesis Example II-1, the transparency and dry etch resistance were evaluated. The results obtained were summarized in Table 166 below together with the photo-acid generator employed. The values of etch rate were based on that of PMMA.

TABLE 166

| Example | Photo-acid generator | Light transmittance (1 μm) % | Etch rate (relative value) |
|---------|---------------------|------------------------------|----------------------------|
| II-228 | Triphenyl sulfonium triflate | 60 | 0.3 |
| II-229 | Diphenyl iodonium triflate | 59 | 0.3 |
| II-230 | NAT · 105 (Midori Kagaku Co., Ltd.) | 61 | 0.3 |
| II-231 | NAI · 105 (Midori Kagaku Co., Ltd.) | 60 | 0.3 |

As a result, it was found possible to form a line and space pattern of 0.15 μm in line width in any of examples.

Example II-232 to Example II-235

The preparation of chemically amplified resists as performed in (Example II-8) to (Example II-11) were repeated except that the copolymer of Synthesis Example II-2 was replaced by the copolymer obtained in Synthesis Example II-30. Using the resists, patterns were formed in the same manner as explained above, and the properties of these patterns were evaluated.

Further, as in the case of Synthesis Example II-1, the transparency and dry etch resistance were evaluated. The results obtained were summarized in Table 167 below together with the photo-acid generator employed. The values of etch rate were based on that of PMMA.

TABLE 167

| Example | Photo-acid generator | Light transmittance (1 μm) % | Etch rate (relative value) |
|---------|---------------------|------------------------------|----------------------------|
| II-232 | Triphenyl sulfonium triflate | 55 | 0.3 |
| II-233 | Diphenyl iodonium triflate | 59 | 0.3 |
| II-234 | NAT · 105 (Midori Kagaku Co., Ltd.) | 61 | 0.3 |
| II-235 | NAI · 105 (Midori Kagaku Co., Ltd.) | 60 | 0.3 |

As a result, it was found possible to form a line and space pattern of 0.15 μm in line width in any of examples.
(Synthesis Example II-31)

The preparation of copolymer performed in Synthesis Example II-2 was repeated except that the ratio of menthyl methacrylate, t-butyl methacrylate and methacrylic acid was changed to 25:35:40 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-236 to II-243, chemically amplified resists containing the copolymer obtained in the above Synthesis Example II-31 were respectively synthesized and were examined of their properties.

Example II-236 to Example II-239

The preparation of chemically amplified resists as performed in (Example II-4) to (Example II-7) were repeated except that the copolymer of Synthesis Example II-2 was replaced by the copolymer obtained in Synthesis Example II-31. Using the resists, patterns were formed in the same manner as explained above, and the properties of these patterns were evaluated.

Further, as in the case of Synthesis Example II-1, the transparency and dry etch resistance were evaluated. The results obtained were summarized in Table 168 below together with the photo-acid generator employed. The values of etch rate were based on that of PMMA.

TABLE 168

| Example | Photo-acid generator | Light transmittance (1 μm) % | Etch rate (relative value) |
|---------|---------------------|------------------------------|----------------------------|
| II-236 | Triphenyl sulfonium triflate | 60 | 0.3 |
| II-237 | Diphenyl iodonium triflate | 59 | 0.3 |
| II-238 | NAT · 105 (Midori Kagaku Co., Ltd.) | 61 | 0.3 |
| II-239 | NAI · 105 (Midori Kagaku Co., Ltd.) | 60 | 0.3 |

As a result, it was found possible to form a line and space pattern of 0.15 μm in line width in any of examples.

Example II-240 to Example II-243

The preparation of chemically amplified resists as performed in (Example II-8) to (Example II-11) were repeated except that the copolymer of Synthesis Example II-2 was replaced by the copolymer obtained in Synthesis Example II-31. Using the resists, patterns were formed in the same manner as explained above, and the properties of these patterns were evaluated.

Further, as in the case of Synthesis Example II-1, the transparency and dry etch resistance were evaluated. The results obtained were summarized in Table 169 below together with the photo-acid generator employed. The values of etch rate were based on that of PMMA.

TABLE 169

| Example | Photo-acid generator | Light transmittance (1 μm) % | Etch rate (relative value) |
|---|---|---|---|
| II-240 | Triphenyl sulfonium triflate | 55 | 0.3 |
| II-241 | Diphenyl iodonium triflate | 59 | 0.3 |
| II-242 | NAT · 105 (Midori Kagaku Co., Ltd.) | 61 | 0.3 |
| II-243 | NAI · 105 (Midori Kagaku Co., Ltd.) | 60 | 0.3 |

As a result, it was found possible to form a line and space pattern of 0.15 μm in line width in any of examples.
(Synthesis Example II-32)

The preparation of copolymer performed in Synthesis Example II-2 was repeated except that the ratio of menthyl methacrylate, t-butyl methacrylate and methacrylic acid was changed to 25:30:45 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-244 to II-251, chemically amplified resists containing the copolymer obtained in the above Synthesis Example II-32 were respectively synthesized and were examined of their properties.

Example II-244 to Example II-247

The preparation of chemically amplified resists as performed in (Example II-4) to (Example II-7) were repeated except that the copolymer of Synthesis Example II-2 was replaced by the copolymer obtained in Synthesis Example II-32. Using the resists, patterns were formed in the same manner as explained above, and the properties of these patterns were evaluated.

Further, as in the case of Synthesis Example II-1, the transparency and dry etch resistance were evaluated. The results obtained were summarized in Table 170 below together with the photo-acid generator employed. The values of etch rate were based on that of PMMA.

TABLE 170

| Example | Photo-acid generator | Light transmittance (1 μm) % | Etch rate (relative value) |
|---|---|---|---|
| II-244 | Triphenyl sulfonium triflate | 60 | 0.3 |
| II-245 | Diphenyl iodonium triflate | 59 | 0.3 |
| II-246 | NAT · 105 (Midori Kagaku Co., Ltd.) | 61 | 0.3 |
| II-247 | NAI · 105 (Midori Kagaku Co., Ltd.) | 60 | 0.3 |

As a result, it was found possible to form a line and space pattern of 0.15 μm in line width in any of examples.

Example II-248 to Example II-251

The preparation of chemically amplified resists as performed in (Example II-8) to (Example II-11) were repeated except that the copolymer of Synthesis Example II-2 was replaced by the copolymer obtained in Synthesis Example II-32. Using the resists, patterns were formed in the same manner as explained above, and the properties of these patterns were evaluated.

Further, as in the case of Synthesis Example II-1, the transparency and dry etch resistance were evaluated. The results obtained were summarized in Table 171 below together with the photo-acid generator employed. The values of etch rate were based on that of PMMA.

TABLE 171

| Example | Photo-acid generator | Light transmittance (1 μm) % | Etch rate (relative value) |
|---|---|---|---|
| II-248 | Triphenyl sulfonium triflate | 55 | 0.3 |
| II-249 | Diphenyl iodonium triflate | 59 | 0.3 |
| II-250 | NAT · 105 (Midori Kagaku Co., Ltd.) | 61 | 0.3 |
| II-251 | NAI · 105 (Midori Kagaku Co., Ltd.) | 60 | 0.3 |

As a result, it was found possible to form a line and space pattern of 0.15 μm in line width in any of examples.
(Synthesis Example II-33)

The preparation of copolymer performed in Synthesis Example II-2 was repeated except that the ratio of menthyl methacrylate, t-butyl methacrylate and methacrylic acid was changed to 25:25:50 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-252 to II-259, chemically amplified resists containing the copolymer obtained in the above Synthesis Example II-33 were respectively synthesized and were examined of their properties.

Example II-252 to Example II-255

The preparation of chemically amplified resists as performed in (Example II-4) to (Example II-7) were repeated except that the copolymer of Synthesis Example II-2 was replaced by the copolymer obtained in Synthesis Example II-33. Using the resists, patterns were formed in the same manner as explained above, and the properties of these patterns were evaluated.

Further, as in the case of Synthesis Example II-1, the transparency and dry etch resistance were evaluated. The results obtained were summarized in Table 172 below together with the photo-acid generator employed. The values of etch rate were based on that of PMMA.

TABLE 172

| Example | Photo-acid generator | Light transmittance (1 $\mu$m) % | Etch rate (relative value) |
|---|---|---|---|
| II-252 | Triphenyl sulfonium triflate | 60 | 0.3 |
| II-253 | Diphenyl iodonium triflate | 59 | 0.3 |
| II-254 | NAT · 105 (Midori Kagaku Co., Ltd.) | 61 | 0.3 |
| II-255 | NAI · 105 (Midori Kagaku Co., Ltd.) | 60 | 0.3 |

As a result, it was found possible to form a line and space pattern of 0.15 $\mu$m in line width in any of examples.

Example II-256 to Example II-259

The preparation of chemically amplified resists as performed in (Example II-8) to (Example II-11) were repeated except that the copolymer of Synthesis Example II-2 was replaced by the copolymer obtained in Synthesis Example II-33. Using the resists, patterns were formed in the same manner as explained above, and the properties of these patterns were evaluated.

Further, as in the case of Synthesis Example II-1, the transparency and dry etch resistance were evaluated. The results obtained were summarized in Table 173 below together with the photo-acid generator employed. The values of etch rate were based on that of PMMA.

TABLE 173

| Example | Photo-acid generator | Light transmittance (1 $\mu$m) % | Etch rate (relative value) |
|---|---|---|---|
| II-256 | Triphenyl sulfonium triflate | 55 | 0.3 |
| II-257 | Diphenyl iodonium triflate | 59 | 0.3 |
| II-258 | NAT · 105 (Midori Kagaku Co., Ltd.) | 61 | 0.3 |
| II-259 | NAI · 105 (Midori Kagaku Co., Ltd.) | 60 | 0.3 |

As a result, it was found possible to form a line and space pattern of 0.15 $\mu$m in line width in any of examples.

(Synthesis Example II-34)

The preparation of copolymer performed in Synthesis Example II-2 was repeated except that the ratio of menthyl methacrylate, t-butyl methacrylate and methacrylic acid was changed to 25:20:55 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-260 to II-267, chemically amplified resists containing the copolymer obtained in the above Synthesis Example II-34 were respectively synthesized and were examined of their properties.

Example II-260 to Example II-263

The preparation of chemically amplified resists as performed in (Example II-4) to (Example II-7) were repeated except that the copolymer of Synthesis Example II-2 was replaced by the copolymer obtained in Synthesis Example II-34. Using the resists, patterns were formed in the same manner as explained above, and the properties of these patterns were evaluated.

Further, as in the case of Synthesis Example II-1, the transparency and dry etch resistance were evaluated. The results obtained were summarized in Table 174 below together with the photo-acid generator employed. The values of etch rate were based on that of PMMA.

TABLE 174

| Example | Photo-acid generator | Light transmittance (1 $\mu$m) % | Etch rate (relative value) |
|---|---|---|---|
| II-260 | Triphenyl sulfonium triflate | 60 | 0.3 |
| II-261 | Diphenyl iodonium triflate | 59 | 0.3 |
| II-262 | NAT · 105 (Midori Kagaku Co., Ltd.) | 61 | 0.3 |
| II-263 | NAI · 105 (Midori Kagaku Co., Ltd.) | 60 | 0.3 |

As a result, it was found possible to form a line and space pattern of 0.15 $\mu$m in line width in any of examples.

Example II-264 to Example II-267

The preparation of chemically amplified resists as performed in (Example II-8) to (Example II-11) were repeated except that the copolymer of Synthesis Example II-2 was replaced by the copolymer obtained in Synthesis Example II-34. Using the resists, patterns were formed in the same manner as explained above, and the properties of these patterns were evaluated.

Further, as in the case of Synthesis Example II-1, the transparency and dry etch resistance were evaluated. The results obtained were summarized in Table 175 below together with the photo-acid generator employed. The values of etch rate were based on that of PMMA.

TABLE 175

| Example | Photo-acid generator | Light transmittance (1 μm) % | Etch rate (relative value) |
|---------|---------------------|------------------------------|----------------------------|
| II-264  | Triphenyl sulfonium triflate | 55 | 0.3 |
| II-265  | Diphenyl iodonium triflate | 59 | 0.3 |
| II-266  | NAT · 105 (Midori Kagaku Co., Ltd.) | 61 | 0.3 |
| II-267  | NAI · 105 (Midori Kagaku Co., Ltd.) | 60 | 0.3 |

As a result, it was found possible to form a line and space pattern of 0.15 μm in line width in any of examples.

(Synthesis Example II-35)

16 g of maleic acid, 20 g of menthol and 10 g of p-toluenesulfonic acid in 30 mL of toluene were heated to reflux at a oil temperature of 150° C. for 10 h. Subsequently, the reaction mixture was quenched by the addition of salt saturated sodium bicarbonate solution. The mixture was extracted with ether, the organic layers were combined and washed with salt saturated sodium bicarbonate solution, salt saturated ammonium chloride solution, and then dried over salt saturated brine and sodium sulfate anhydrous. Finally, the resultant oily product was subjected to fractional distillation to obtain maleic acid monomenthyl ester and dimenthyl maleate.

2.5 g of maleic acid monomenthyl ester, 1 g of 2-methyl-2-propanol and 0.7 g of p-toluenesulfonic acid in 30 mL of toluene were heated to reflux at a oil temperature of 150° C. for 19 h. Subsequently, the reaction mixture was quenched by the addition of salt saturated sodium bicarbonate solution. The mixture was extracted with ether, the organic layers were combined and washed with salt saturated sodium bicarbonate solution and then with an aqueous solution of sodium hydroxide, salt saturated ammonium chloride solution, and then dried over salt saturated brine and sodium sulfate anhydrous. Finally, the resultant oily product was subjected to distillation under reduced pressure to obtain menthyl 3-t-butoxycarbonyl-2Z-propenoate.

(Evaluation of homopolymer derived from the monomer obtained in Synthesis Example II-35)

10 g of menthyl 3-t-butoxycarbonyl-2Z-propenoate was dissolved in 40 mL of THF together with 0.5 g of azoisobutylonitrile as a polymerization initiator.

The resultant solution was frozen with liquid nitrogen, and warmed to room temperature after repeating a 20 minute degassing of it five times. Then, the solution was heated in a nitrogen stream at oil temperature of 60° C. for 10 h. Then, the reaction was quenched by the addition of 600 mL of hexane. After being reprecipitated with hexane, the product was filtered and evaporated under vacuum thereby obtaining polymenthyl 3-t-butoxycarbonyl-2Z-propenoate.

The polymerization reaction as described above was repeated under the same conditions except that 10 g of dimenthyl maleate was employed as a monomer thereby obtaining polydimenthyl maleate.

The polymerization reaction described above was repeated under the same conditions except that 10 g of maleic acid monomenthyl ester was employed as monomer thereby obtaining polymoleic acid monomenthyl ester.

Each of the polymers thus obtained was dissolved in cyclohexanone and the resultant solution was coated on a quartz wafer to examine of its transparency to ArF excimer laser beam (193 nm) in the same manner as in Synthesis Example II-1. As a result, the light transmittance of polymenthyl 3-t-butoxycarbonyl-2Z-propenoate was found to be 50%, while polydimenthyl maleate indicated 43%, which are almost equivalent to that of PMMA.

The etch rates of these polymers were also measured by using carbon tetrafluoride ($CF_4$) gas in comparison with that of PMMA under the same conditions as in the case of monomer in Synthesis Example II-2, finding that the etch rates of these copolymers was found to be 0.3 when the etch rate of PMMA was assumed to be 1, thus indicating the superiority of these polymers over that of PMMA.

In the following examples, copolymers containing dimenthyl maleate, menthyl 3-butoxycarbonyl-2Z-propenoate, or maleic acid monomenthyl ester obtained in the above synthesis Example II-35 were respectively synthesized to prepare photosensitive material and were examined of their properties.

Example II-268

5 g of dimenthyl maleate, 0.5 g of glycidyl methacrylate and 0.25 g of azoisobutylonitrile as a photo-acid generator were dissolved in 15 mL of toluene.

The resultant solution was subjected to reaction in the same manner as in Example II-1 to obtain an aimed copolymer, which was dissolved methyl 3-methoxypropionate and the resultant solution was coated on a silicon wafer in the same manner as in Example II-1 to form a pattern to which evaluation was made.

As result, it was found possible to form a negative line and space pattern of 0.5 μm in line width.

Example II-269

1 g of dimenthyl maleate, 0.1 g of allyl methacrylate and 0.05 g of azoisobutylonitrile as a photo-acid generator were dissolved in 15 mL of toluene.

The resultant solution was subjected to reaction in the same manner as in Example II-2 to obtain an aimed copolymer, which was dissolved methyl 3-methoxypropionate and the resultant solution was coated on a silicon wafer in the same manner as in Example II-2 to form a pattern to which evaluation was made.

As result, it was found possible to form a negative line and space pattern of 0.5 μm in line width.

Example II-270

1 g of dimenthyl maleate, 1 g of α-chlorofluoroacrylate and 0.1 g of azoisobutylonitrile as a photo-acid generator were dissolved in 3 mL of THF.

The resultant solution was subjected to reaction in the same manner as in Example II-3 to obtain an aimed copolymer, which was dissolved methyl 3-methoxypropionate and the resultant solution was coated on a silicon wafer in the same manner as in Example II-3 to form a pattern to which evaluation was made.

Example II-271

The procedures of Example II-268 were repeated except that dimenthyl maleate was substituted by 0.8 g of menthyl 3-t-butoxycarbonyl-2Z-propenoate thereby obtaining a copolymer, which was then formed into a solution as in the case of Example II-268 to be used to form a pattern.

As result, it was found possible to form a negative line and space pattern of 0.5 μm in line width.

Example II-272

The procedures of Example II-269 were repeated except that dimenthyl maleate was substituted by 0.8 g of menthyl 3-t-butoxycarbonyl-2Z-propenoate thereby obtaining a copolymer, which was then formed into a solution as in the case of Example II-269 to be used to form a pattern.

As result, it was found possible to form a negative line and space pattern of 0.5 μm in line width.

Example II-273

The procedures of Example II-270 were repeated except that dimenthyl maleate was substituted by 0.8 g of menthyl 3-t-butoxycarbonyl-2Z-propenoate thereby obtaining a copolymer, which was then formed into a solution as in the case of Example II-270 to be used to form a pattern.

As result, it was found possible to form a positive line and space pattern of 0.5 μm in line width.

In the following Examples II-274 to II-281, chemically amplified resists containing the copolymer obtained in the above Synthesis Example II-35 were respectively synthesized and were examined of their properties.

Example II-274 to Example II-277

The preparation of chemically amplified resists as performed in (Example II-4) to (Example II-7) were repeated except that the homopolymer (polymethyl 3-t-butoxycarbonyl-2Z-propenoate) of Synthesis Example II-2 was replaced by the copolymer obtained in Synthesis Example II-35. Using the resists, patterns were formed in the same manner as explained above, and the properties of these patterns were evaluated.

Further, as in the case of Synthesis Example II-1, the transparency and dry etch resistance were evaluated. The results obtained were summarized in Table 176 below together with the photo-acid generator employed. The values of etch rate were based on that of PMMA.

TABLE 176

| Example | Photo-acid generator | Light transmittance (1 μm) % | Etch rate (relative value) |
|---|---|---|---|
| II-274 | Triphenyl sulfonium triflate | 60 | 0.3 |
| II-275 | Diphenyl iodonium triflate | 59 | 0.3 |
| II-276 | NAT · 105 (Midori Kagaku Co., Ltd.) | 61 | 0.3 |

TABLE 176-continued

| Example | Photo-acid generator | Light transmittance (1 μm) % | Etch rate (relative value) |
|---|---|---|---|
| II-277 | NAI · 105 (Midori Kagaku Co., Ltd.) | 60 | 0.3 |

As a result, it was found possible to form a line and space pattern of 0.15 μm in line width in any of examples.

Example II-278 to Example II-281

The preparation of chemically amplified resists as performed in (Example II-8) to (Example II-11) were repeated except that the homopolymer (polymaleic acid monomenthyl ester) of Synthesis Example II-2 was replaced by the copolymer obtained in Synthesis Example II-35. Using the resists, patterns were formed in the same manner as explained above, and the properties of these patterns were evaluated.

Further, as in the case of Synthesis Example II-1, the transparency and dry etch resistance were evaluated. The results obtained were summarized in Table 177 below together with the photo-acid generator employed. The values of etch rate were based on that of PMMA.

TABLE 177

| Example | Photo-acid generator | Light transmittance (1 μm) % | Etch rate (relative value) |
|---|---|---|---|
| II-278 | Triphenyl sulfonium triflate | 55 | 0.3 |
| II-279 | Diphenyl iodonium triflate | 59 | 0.3 |
| II-280 | NAT · 105 (Midori Kagaku Co., Ltd.) | 61 | 0.3 |
| II-281 | NAI · 105 (Midori Kagaku Co., Ltd.) | 60 | 0.3 |

As a result, it was found possible to form a line and space pattern of 0.15 μm in line width in any of examples.

(Synthesis Example II-36)

The preparation of copolymer performed in Synthesis Example II-35 was repeated except that the ratio of menthyl 3-t-butoxycarbonyl-2Z-propenoate and methacrylic acid was set to 70:30 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-282 to II-289, chemically amplified resists containing the copolymer obtained in the above Synthesis Example II-36 were respectively synthesized and were examined of their properties.

Example II-282 to Example II-285

The preparation of chemically amplified resists as performed in (Example II-4) to (Example II-7) were repeated except that the copolymer of Synthesis Example II-2 was replaced by the copolymer obtained in Synthesis Example II-36. Using the resists, patterns were formed in the same manner as explained above, and the properties of these patterns were evaluated.

Further, as in the case of Synthesis Example II-1, the transparency and dry etch resistance were evaluated. The results obtained were summarized in Table 178 below together with the photo-acid generator employed. The values of etch rate were based on that of PMMA.

TABLE 178

| Example | Photo-acid generator | Light transmittance (1 μm) % | Etch rate (relative value) |
|---|---|---|---|
| II-282 | Triphenyl sulfonium triflate | 60 | 0.3 |
| II-283 | Diphenyl iodonium triflate | 59 | 0.3 |
| II-284 | NAT · 105 (Midori Kagaku Co., Ltd.) | 61 | 0.3 |
| II-285 | NAI · 105 (Midori Kagaku Co., Ltd.) | 60 | 0.3 |

As a result, it was found possible to form a line and space pattern of 0.15 μm in line width in any of examples.

Example II-286 to Example II-289

The preparation of chemically amplified resists as performed in (Example II-8) to (Example II-11) were repeated except that the copolymer of Synthesis Example II-2 was replaced by the copolymer obtained in Synthesis Example II-36. Using the resists, patterns were formed in the same manner as explained above, and the properties of these patterns were evaluated.

Further, as in the case of Synthesis Example II-1, the transparency and dry etch resistance were evaluated. The results obtained were summarized in Table 179 below together with the photo-acid generator employed. The values of etch rate were based on that of PMMA.

TABLE 179

| Example | Photo-acid generator | Light transmittance (1 μm) % | Etch rate (relative value) |
|---|---|---|---|
| II-286 | Triphenyl sulfonium triflate | 55 | 0.3 |
| II-287 | Diphenyl iodonium triflate | 59 | 0.3 |
| II-288 | NAT · 105 (Midori Kagaku Co., Ltd.) | 61 | 0.3 |
| II-289 | NAI · 105 (Midori Kagaku Co., Ltd.) | 60 | 0.3 |

As a result, it was found possible to form a line and space pattern of 0.15 μm in line width in any of examples.
(Synthesis Example II-37)

The preparation of copolymer performed in Synthesis Example II-35 was repeated except that the ratio of menthyl 3-t-butoxycarbonyl-2Z-propenoate and methacrylic acid was set to 75:25 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-290 to II-297, chemically amplified resists containing the copolymer obtained in the above Synthesis Example II-37 were respectively synthesized and were examined of their properties.

Example II-290 to Example II-293

The preparation of chemically amplified resists as performed in (Example II-4) to (Example II-7) were repeated except that the copolymer of Synthesis Example II-2 was replaced by the copolymer obtained in Synthesis Example II-37. Using the resists, patterns were formed in the same manner as explained above, and the properties of these patterns were evaluated.

Further, as in the case of Synthesis Example II-1, the transparency and dry etch resistance were evaluated. The results obtained were summarized in Table 180 below together with the photo-acid generator employed. The values of etch rate were based on that of PMMA.

TABLE 180

| Example | Photo-acid generator | Light transmittance (1 μm) % | Etch rate (relative value) |
|---|---|---|---|
| II-290 | Triphenyl sulfonium triflate | 60 | 0.3 |
| II-291 | Diphenyl iodonium triflate | 59 | 0.3 |
| II-292 | NAT · 105 (Midori Kagaku Co., Ltd.) | 61 | 0.3 |
| II-293 | NAI · 105 (Midori Kagaku Co., Ltd.) | 60 | 0.3 |

As a result, it was found possible to form a line and space pattern of 0.15 μm in line width in any of examples.

Example II-294 to Example II-297

The preparation of chemically amplified resists as performed in (Example II-8) to (Example II-11) were repeated except that the copolymer of Synthesis Example II-2 was replaced by the copolymer obtained in Synthesis Example II-37. Using the resists, patterns were formed in the same manner as explained above, and the properties of these patterns were evaluated.

Further, as in the case of Synthesis Example II-1, the transparency and dry etch resistance were evaluated. The results obtained were summarized in Table 181 below together with the photo-acid generator employed. The values of etch rate were based on that of PMMA.

TABLE 181

| Example | Photo-acid generator | Light transmittance (1 μm) % | Etch rate (relative value) |
|---|---|---|---|
| II-294 | Triphenyl sulfonium triflate | 55 | 0.3 |
| II-295 | Diphenyl iodonium triflate | 59 | 0.3 |
| II-296 | NAT · 105 (Midori Kagaku Co., Ltd.) | 61 | 0.3 |
| II-297 | NAI · 105 (Midori Kagaku Co., Ltd.) | 60 | 0.3 |

As a result, it was found possible to form a line and space pattern of 0.15 μm in line width in any of examples.
(Synthesis Example II-38)

The preparation of copolymer performed in Synthesis Example II-35 was repeated except that the ratio of menthyl 3-t-butoxycarbonyl-2Z-propenoate and methacrylic acid was set to 80:20 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-298 to II-305, chemically amplified resists containing the copolymer obtained in the above Synthesis Example II-38 were respectively synthesized and were examined of their properties.

Example II-298 to Example II-301

The preparation of chemically amplified resists as performed in (Example II-4) to (Example II-7) were repeated except that the copolymer of Synthesis Example II-2 was replaced by the copolymer obtained in Synthesis Example II-38. Using the resists, patterns were formed in the same manner as explained above, and the properties of these patterns were evaluated.

Further, as in the case of Synthesis Example II-1, the transparency and dry etch resistance were evaluated. The results obtained were summarized in Table 182 below together with the photo-acid generator employed. The values of etch rate were based on that of PMMA.

TABLE 182

| Example | Photo-acid generator | Light transmittance (1 μm) % | Etch rate (relative value) |
|---|---|---|---|
| II-298 | Triphenyl sulfonium triflate | 60 | 0.3 |
| II-299 | Diphenyl iodonium triflate | 59 | 0.3 |
| II-300 | NAT · 105 (Midori Kagaku Co., Ltd.) | 61 | 0.3 |
| II-301 | NAI · 105 (Midori Kagaku Co., Ltd.) | 60 | 0.3 |

As a result, it was found possible to form a line and space pattern of 0.15 μm in line width in any of examples.

Example II-302 to Example II-305

The preparation of chemically amplified resists as performed in (Example II-8) to (Example II-11) were repeated except that the copolymer of Synthesis Example II-2 was replaced by the copolymer obtained in Synthesis Example II-38. Using the resists, patterns were formed in the same manner as explained above, and the properties of these patterns were evaluated.

Further, as in the case of Synthesis Example II-1, the transparency and dry etch resistance were evaluated. The results obtained were summarized in Table 183 below together with the photo-acid generator employed. The values of etch rate were based on that of PMMA.

TABLE 183

| Example | Photo-acid generator | Light transmittance (1 μm) % | Etch rate (relative value) |
|---|---|---|---|
| II-302 | Triphenyl sulfonium triflate | 55 | 0.3 |
| II-303 | Diphenyl iodonium triflate | 59 | 0.3 |
| II-304 | NAT · 105 (Midori Kagaku Co., Ltd.) | 61 | 0.3 |
| II-305 | NAI · 105 (Midori Kagaku Co., Ltd.) | 60 | 0.3 |

As a result, it was found possible to form a line and space pattern of 0.15 μm in line width in any of examples.
(Synthesis Example II-39)

The preparation of copolymer performed in Synthesis Example II-35 was repeated except that the ratio of menthyl 3-t-butoxycarbonyl-2Z-propenoate and methacrylic acid was set to 65:35 thereby obtaining a polymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-306 to II-313, chemically amplified resists containing the copolymer obtained in the above Synthesis Example II-39 were respectively synthesized and were examined of their properties.

Example II-306 to Example II-309

The preparation of chemically amplified resists as performed in (Example II-4) to (Example II-7) were repeated except that the copolymer of Synthesis Example II-2 was replaced by the copolymer obtained in Synthesis Example II-39. Using the resists, patterns were formed in the same manner as explained above, and the properties of these patterns were evaluated.

Further, as in the case of Synthesis Example II-1, the transparency and dry etch resistance were evaluated. The results obtained were summarized in Table 184 below together with the photo-acid generator employed. The values of etch rate were based on that of PMMA.

TABLE 184

| Example | Photo-acid generator | Light transmittance (1 μm) % | Etch rate (relative value) |
|---|---|---|---|
| II-306 | Triphenyl sulfonium triflate | 60 | 0.3 |
| II-307 | Diphenyl iodonium triflate | 59 | 0.3 |
| II-308 | NAT · 105 (Midori Kagaku Co., Ltd.) | 61 | 0.3 |
| II-309 | NAI · 105 (Midori Kagaku Co., Ltd.) | 60 | 0.3 |

As a result, it was found possible to form a line and space pattern of 0.15 μm in line width in any of examples.

Example II-310 to Example II-313

The preparation of chemically amplified resists as performed in (Example II-8) to (Example II-11) were repeated except that the copolymer of Synthesis Example II-2 was replaced by the copolymer obtained in Synthesis Example II-39. Using the resists, patterns were formed in the same manner as explained above, and the properties of these patterns were evaluated.

Further, as in the case of Synthesis Example II-1, the transparency and dry etch resistance were evaluated. The results obtained were summarized in Table 185 below together with the photo-acid generator employed. The values of etch rate were based on that of PMMA.

TABLE 185

| Example | Photo-acid generator | Light transmittance (1 μm) % | Etch rate (relative value) |
|---|---|---|---|
| II-310 | Triphenyl sulfonium triflate | 55 | 0.3 |
| II-311 | Diphenyl iodonium triflate | 59 | 0.3 |
| II-312 | NAT · 105 (Midori Kagaku Co., Ltd.) | 61 | 0.3 |

TABLE 185-continued

| Example | Photo-acid generator | Light transmittance (1 μm) % | Etch rate (relative value) |
|---|---|---|---|
| II-313 | NAI · 105 (Midori Kagaku Co., Ltd.) | 60 | 0.3 |

As a result, it was found possible to form a line and space pattern of 0.15 μm in line width in any of examples.
(Synthesis Example II-40)

The preparation of copolymer performed in Synthesis Example II-35 was repeated except that the ratio of menthyl 3-t-butoxycarbonyl-2Z-propenoate and methacrylic acid was set to 60:40 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-314 to II-321, chemically amplified resists containing the copolymer obtained in the above Synthesis Example II-40 were respectively synthesized and were examined of their properties.

Example II-314 to Example II-317

The preparation of chemically amplified resists as performed in (Example II-4) to (Example II-7) were repeated except that the copolymer of Synthesis Example II-2 was replaced by the copolymer obtained in Synthesis Example II-40. Using the resists, patterns were formed in the same manner as explained above, and the properties of these patterns were evaluated.

Further, as in the case of Synthesis Example II-1, the transparency and dry etch resistance were evaluated. The results obtained were summarized in Table 186 below together with the photo-acid generator employed. The values of etch rate were based on that of PMMA.

TABLE 186

| Example | Photo-acid generator | Light transmittance (1 μm) % | Etch rate (relative value) |
|---|---|---|---|
| II-314 | Triphenyl sulfonium triflate | 60 | 0.3 |
| II-315 | Diphenyl iodonium triflate | 59 | 0.3 |
| II-316 | NAT · 105 (Midori Kagaku Co., Ltd.) | 61 | 0.3 |
| II-317 | NAI · 105 (Midori Kagaku Co., Ltd.) | 60 | 0.3 |

As a result, it was found possible to form a line and space pattern of 0.15 μm in line width in any of examples.

Example II-318 to Example II-321

The preparation of chemically amplified resists as performed in (Example II-8) to (Example II-11) were repeated except that the copolymer of Synthesis Example II-2 was replaced by the copolymer obtained in Synthesis Example II-40. Using the resists, patterns were formed in the same manner as explained above, and the properties of these patterns were evaluated.

Further, as in the case of Synthesis Example II-1, the transparency and dry etch resistance were evaluated. The results obtained were summarized in Table 187 below together with the photo-acid generator employed. The values of etch rate were based on that of PMMA.

TABLE 187

| Example | Photo-acid generator | Light transmittance (1 μm) % | Etch rate (relative value) |
|---|---|---|---|
| II-318 | Triphenyl sulfonium triflate | 55 | 0.3 |
| II-319 | Diphenyl iodonium triflate | 59 | 0.3 |
| II-320 | NAT · 105 (Midori Kagaku Co., Ltd.) | 61 | 0.3 |
| II-321 | NAI · 105 (Midori Kagaku Co., Ltd.) | 60 | 0.3 |

As a result, it was found possible to form a line and space pattern of 0.15 μm in line width in any of examples.

(Synthesis Example II-41)

The preparation of copolymer performed in Synthesis Example II-35 was repeated except that the ratio of menthyl 3-t-butoxycarbonyl-2Z-propenoate and methacrylic acid was set to 55:45 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-322 to II-329, chemically amplified resists containing the copolymer obtained in the above Synthesis Example II-41 were respectively synthesized and were examined of their properties.

Example II-322 to Example II-325

The preparation of chemically amplified resists as performed in (Example II-4) to (Example II-7) were repeated except that the copolymer of Synthesis Example II-2 was replaced by the copolymer obtained in Synthesis Example II-41. Using the resists, patterns were formed in the same manner as explained above, and the properties of these patterns were evaluated.

Further, as in the case of Synthesis Example II-1, the transparency and dry etch resistance were evaluated. The results obtained were summarized in Table 188 below together with the photo-acid generator employed. The values of etch rate were based on that of PMMA.

TABLE 188

| Example | Photo-acid generator | Light transmittance (1 μm) % | Etch rate (relative value) |
|---|---|---|---|
| II-322 | Triphenyl sulfonium triflate | 60 | 0.3 |
| II-323 | Diphenyl iodonium triflate | 59 | 0.3 |
| II-324 | NAT · 105 (Midori Kagaku Co., Ltd.) | 61 | 0.3 |
| II-325 | NAI · 105 (Midori Kagaku Co., Ltd.) | 60 | 0.3 |

As a result, it was found possible to form a line and space pattern of 0.15 μm in line width in any of examples.

Example II-326 to Example II-329

The preparation of chemically amplified resists as performed in (Example II-8) to (Example II-11) were repeated except that the copolymer of Synthesis Example II-2 was replaced by the copolymer obtained in Synthesis Example II-41. Using the resists, patterns were formed in the same manner as explained above, and the properties of these patterns were evaluated.

Further, as in the case of Synthesis Example II-1, the transparency and dry etch resistance were evaluated. The results obtained were summarized in Table 189 below together with the photo-acid generator employed. The values of etch rate were based on that of PMMA.

TABLE 189

| Example | Photo-acid generator | Light transmittance (1 μm) % | Etch rate (relative value) |
|---|---|---|---|
| II-326 | Triphenyl sulfonium triflate | 55 | 0.3 |
| II-327 | Diphenyl iodonium triflate | 59 | 0.3 |
| II-328 | NAT · 105 (Midori Kagaku Co., Ltd.) | 61 | 0.3 |
| II-329 | NAI · 105 (Midori Kagaku Co., Ltd.) | 60 | 0.3 |

As a result, it was found possible to form a line and space pattern of 0.15 μm in line width in any of examples.

(Synthesis Example II-42)

The preparation of copolymer performed in Synthesis Example II-35 was repeated except that the ratio of menthyl 3-t-butoxycarbonyl-2Z-propenoate and methacrylic acid was set to 50:50 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-330 to II-337, chemically amplified resists containing the copolymer obtained in the above Synthesis Example II-41 were respectively synthesized and were examined of their properties.

Example II-330 to Example II-333

The preparation of chemically amplified resists as performed in (Example II-4) to Example II-7) were repeated except that the copolymer of Synthesis Example II-2 was replaced by the copolymer obtained in Synthesis Example II-42. Using the resists, patterns were formed in the same manner as explained above, and the properties of these patterns were evaluated.

Further, as in the case of Synthesis Example II-1, the transparency and dry etch resistance were evaluated. The results obtained were summarized in Table 190 below together with the photo-acid generator employed. The values of etch rate were based on that of PMMA.

TABLE 190

| Example | Photo-acid generator | Light transmittance (1 μm) % | Etch rate (relative value) |
|---|---|---|---|
| II-330 | Triphenyl sulfonium triflate | 60 | 0.3 |
| II-331 | Diphenyl iodonium triflate | 59 | 0.3 |
| II-332 | NAT · 105 (Midori Kagaku Co., Ltd.) | 61 | 0.3 |
| II-333 | NAI · 105 (Midori Kagaku Co., Ltd.) | 60 | 0.3 |

As a result, it was found possible to form a line and space pattern of 0.15 μm in line width in any of examples.

Example II-334 to Example II-337

The preparation of chemically amplified resists as performed in (Example II-8) to (Example II-11) were repeated except that the copolymer of Synthesis Example II-2 was replaced by the copolymer obtained in Synthesis Example II-42. Using the resists, patterns were formed in the same manner as explained above, and the properties of these patterns were evaluated.

Further, as in the case of Synthesis Example II-1, the transparency and dry etch resistance were evaluated. The results obtained were summarized in Table 191 below together with the photo-acid generator employed. The values of etch rate were based on that of PMMA.

TABLE 191

| Example | Photo-acid generator | Light transmittance (1 μm) % | Etch rate (relative value) |
|---|---|---|---|
| II-334 | Triphenyl sulfonium triflate | 55 | 0.3 |
| II-335 | Diphenyl iodonium triflate | 59 | 0.3 |
| II-336 | NAT · 105 (Midori Kagaku Co., Ltd.) | 61 | 0.3 |
| II-337 | NAI · 105 (Midori Kagaku Co., Ltd.) | 60 | 0.3 |

As a result, it was found possible to form a line and space pattern of 0.15 μm in line width in any of examples.

(Synthesis Example II-43)

In this Synthesis Example, another copolymer containing a monomer obtained in the above Synthesis Example II-35 was synthesized and then examined of its properties.

Namely, dimenthyl maleate, t-butyl methacrylate and methacrylic acid were mixed in the ratio of 35:40:25 to prepare 10 g of the mixture, which was then dissolved in 40 mL of THF together with azoisobutylonitrile as a polymerization initiator.

The resultant solution was frozen with liquid nitrogen, and warmed to room temperature after repeating a 20 minute degassing of it five times. Then, the solution was heated in a nitrogen stream at oil temperature of 60° C. for 9 h. Then, the reaction was quenched by the addition of hexane. After being reprecipitated with hexane, the product was filtered and evaporated under vacuum thereby obtaining an aimed copolymer.

This copolymer was dissolved in cyclohexanone in the same manner as in Synthesis Example II-1, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-338 to II-345, chemically amplified resists containing the copolymer obtained in Synthesis Example II-43 were synthesized and were examined of their properties.

Example II-338 to Example II-341

The preparation of chemically amplified resists as performed in (Example II-4) to (Example II-7) were repeated except that the copolymer of Synthesis Example II-2 was replaced by the copolymer obtained in Synthesis Example II-43. Using the resists, patterns were formed in the same manner as explained above, and the properties of these patterns were evaluated.

Further, as in the case of Synthesis Example II-1, the transparency and dry etch resistance were evaluated. The results obtained were summarized in Table 192 below together with the photo-acid generator employed. The values of etch rate were based on that of PMMA.

TABLE 192

| Example | Photo-acid generator | Light transmittance (1 μm) % | Etch rate (relative value) |
| --- | --- | --- | --- |
| II-338 | Triphenyl sulfonium triflate | 60 | 0.3 |
| II-339 | Diphenyl iodonium triflate | 59 | 0.3 |
| II-340 | NAT · 105 (Midori Kagaku Co., Ltd.) | 61 | 0.3 |
| II-341 | NAI · 105 (Midori Kagaku Co., Ltd.) | 60 | 0.3 |

As a result, it was found possible to form a line and space pattern of 0.15 μm in line width in any of examples.

Example II-342 to Example II-345

The preparation of chemically amplified resists as performed in (Example II-8) to (Example II-11) were repeated except that the copolymer of Synthesis Example II-2 was replaced by the copolymer obtained in Synthesis Example II-43. Using the resists, patterns were formed in the same manner as explained above, and the properties of these patterns were evaluated.

Further, as in the case of Synthesis Example II-1, the transparency and dry etch resistance were evaluated. The results obtained were summarized in Table 193 below together with the photo-acid generator employed. The values of etch rate were based on that of PMMA.

TABLE 193

| Example | Photo-acid generator | Light transmittance (1 μm) % | Etch rate (relative value) |
| --- | --- | --- | --- |
| II-342 | Triphenyl sulfonium triflate | 55 | 0.3 |
| II-343 | Diphenyl iodonium triflate | 59 | 0.3 |
| II-344 | NAT · 105 (Midori Kagaku Co., Ltd.) | 61 | 0.3 |
| II-345 | NAI · 105 (Midori Kagaku Co., Ltd.) | 60 | 0.3 |

As a result, it was found possible to form a line and space pattern of 0.15 μm in line width in any of examples.
(Synthesis Example II-44)

The preparation of copolymer performed in Synthesis Example II-43 was repeated except that the ratio of dimenthyl methacrylate, t-butyl methacrylate and methacrylic acid was changed to 35:32.5:32.5 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-346 to II-353, chemically amplified resists containing the copolymer obtained in the above Synthesis Example II-44 were respectively synthesized and were examined of their properties.

Example II-346 to Example II-349

The preparation of chemically amplified resists as performed in (Example II-4) to (Example II-7) were repeated except that the copolymer of Synthesis Example II-2 was replaced by the copolymer obtained in Synthesis Example II-44. Using the resists, patterns were formed in the same manner as explained above, and the properties of these patterns were evaluated.

Further, as in the case of Synthesis Example II-1, the transparency and dry etch resistance were evaluated. The results obtained were summarized in Table 194 below together with the photo-acid generator employed. The values of etch rate were based on that of PMMA.

TABLE 194

| Example | Photo-acid generator | Light transmittance (1 μm) % | Etch rate (relative value) |
| --- | --- | --- | --- |
| II-346 | Triphenyl sulfonium triflate | 60 | 0.3 |
| II-347 | Diphenyl iodonium triflate | 59 | 0.3 |
| II-348 | NAT · 105 (Midori Kagaku Co., Ltd.) | 61 | 0.3 |
| II-349 | NAI · 105 (Midori Kagaku Co., Ltd.) | 60 | 0.3 |

As a result, it was found possible to form a line and space pattern of 0.15 μm in line width in any of examples.

Example II-350 to Example II-353

The preparation of chemically amplified resists as performed in (Example II-8) to (Example II-11) were repeated except that the copolymer of Synthesis Example II-2 was replaced by the copolymer obtained in Synthesis Example II-44. Using the resists, patterns were formed in the same manner as explained above, and the properties of these patterns were evaluated.

Further, as in the case of Synthesis Example II-1, the transparency and dry etch resistance were evaluated. The results obtained were summarized in Table 195 below together with the photo-acid generator employed. The values of etch rate were based on that of PMMA.

TABLE 195

| Example | Photo-acid generator | Light transmittance (1 μm) % | Etch rate (relative value) |
| --- | --- | --- | --- |
| II-350 | Triphenyl sulfonium triflate | 55 | 0.3 |
| II-351 | Diphenyl iodonium triflate | 59 | 0.3 |
| II-352 | NAT · 105 (Midori Kagaku Co., Ltd.) | 61 | 0.3 |

TABLE 195-continued

| Example | Photo-acid generator | Light transmittance (1 μm) % | Etch rate (relative value) |
|---|---|---|---|
| II-353 | NAI · 105 (Midori Kagaku Co., Ltd.) | 60 | 0.3 |

As a result, it was found possible to form a line and space pattern of 0.15 μm in line width in any of examples.

(Synthesis Example II-45)

The preparation of copolymer performed in Synthesis Example II-43 was repeated except that the ratio of dimenthyl methacrylate, t-butyl methacrylate and methacrylic acid was changed to 35:25:40 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-354 to II-361, chemically amplified resists containing the copolymer obtained in the above Synthesis Example II-45 were respectively synthesized and were examined of their properties.

Example II-354 to Example II-357

The preparation of chemically amplified resists as performed in (Example II-4) to (Example II-7) were repeated except that the copolymer of Synthesis Example II-2 was replaced by the copolymer obtained in Synthesis Example II-45. Using the resists, patterns were formed in the same manner as explained above, and the properties of these patterns were evaluated.

Further, as in the case of Synthesis Example II-1, the transparency and dry etch resistance were evaluated. The results obtained were summarized in Table 196 below together with the photo-acid generator employed. The values of etch rate were based on that of PMMA.

TABLE 196

| Example | Photo-acid generator | Light transmittance (1 μm) % | Etch rate (relative value) |
|---|---|---|---|
| II-354 | Triphenyl sulfonium triflate | 60 | 0.3 |
| II-355 | Diphenyl iodonium triflate | 59 | 0.3 |
| II-356 | NAT · 105 (Midori Kagaku Co., Ltd.) | 61 | 0.3 |
| II-357 | NAI · 105 (Midori Kagaku Co., Ltd.) | 60 | 0.3 |

As a result, it was found possible to form a line and space pattern of 0.15 μm in line width in any of examples.

Example II-358 to Example II-361

The preparation of chemically amplified resists as performed in (Example II-8) to (Example II-11) were repeated except that the copolymer of Synthesis Example II-2 was replaced by the copolymer obtained in Synthesis Example II-45. Using the resists, patterns were formed in the same manner as explained above, and the properties of these patterns were evaluated.

Further, as in the case of Synthesis Example II-1, the transparency and dry etch resistance were evaluated. The results obtained were summarized in Table 197 below together with the photo-acid generator employed. The values of etch rate were based on that of PMMA.

TABLE 197

| Example | Photo-acid generator | Light transmittance (1 μm) % | Etch rate (relative value) |
|---|---|---|---|
| II-358 | Triphenyl sulfonium triflate | 55 | 0.3 |
| II-359 | Diphenyl iodonium triflate | 59 | 0.3 |
| II-360 | NAT · 105 (Midori Kagaku Co., Ltd.) | 61 | 0.3 |
| II-361 | NAI · 105 (Midori Kagaku Co., Ltd.) | 60 | 0.3 |

As a result, it was found possible to form a line and space pattern of 0.15 μm in line width in any of examples.

(Synthesis Example II-46)

The preparation of copolymer performed in Synthesis Example II-43 was repeated except that the ratio of dimenthyl methacrylate, t-butyl methacrylate and methacrylic acid was changed to 30:45:25 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-362 to II-369, chemically amplified resists containing the copolymer obtained in the above Synthesis Example II-46 were respectively synthesized and were examined of their properties.

Example II-362 to Example II-365

The preparation of chemically amplified resists as performed in (Example II-4) to (Example II-7) were repeated except that the copolymer of Synthesis Example II-2 was replaced by the copolymer obtained in Synthesis Example II-46. Using the resists, patterns were formed in the same manner as explained above, and the properties of these patterns were evaluated.

Further, as in the case of Synthesis Example II-1, the transparency and dry etch resistance were evaluated. The results obtained were summarized in Table 198 below together with the photo-acid generator employed. The values of etch rate were based on that of PMMA.

TABLE 198

| Example | Photo-acid generator | Light transmittance (1 μm) % | Etch rate (relative value) |
|---|---|---|---|
| II-362 | Triphenyl sulfonium triflate | 60 | 0.3 |
| II-363 | Diphenyl iodonium triflate | 59 | 0.3 |
| II-364 | NAT · 105 (Midori Kagaku Co., Ltd.) | 61 | 0.3 |
| II-365 | NAI · 105 (Midori Kagaku Co., Ltd.) | 60 | 0.3 |

As a result, it was found possible to form a line and space pattern of 0.15 μm in line width in any of examples.

Example II-366 to Example II-369

The preparation of chemically amplified resists as performed in (Example II-8) to (Example II-11) were repeated except that the copolymer of Synthesis Example II-2 was replaced by the copolymer obtained in Synthesis Example II-46. Using the resists, patterns were formed in the same manner as explained above, and the properties of these patterns were evaluated.

Further, as in the case of Synthesis Example II-1, the transparency and dry etch resistance were evaluated. The results obtained were summarized in Table 199 below together with the photo-acid generator employed. The values of etch rate were based on that of PMMA.

TABLE 199

| Example | Photo-acid generator | Light transmittance (1 μm) % | Etch rate (relative value) |
|---|---|---|---|
| II-366 | Triphenyl sulfonium triflate | 55 | 0.3 |
| II-367 | Diphenyl iodonium triflate | 59 | 0.3 |
| II-368 | NAT · 105 (Midori Kagaku Co., Ltd.) | 61 | 0.3 |
| II-369 | NAI · 105 (Midori Kagaku Co., Ltd.) | 60 | 0.3 |

As a result, it was found possible to form a line and space pattern of 0.15 μm in line width in any of examples.

(Synthesis Example II-47)

The preparation of copolymer performed in Synthesis Example II-43 was repeated except that the ratio of dimenthyl methacrylate, t-butyl methacrylate and methacrylic acid was changed to 30:40:30 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-370 to II-377, chemically amplified resists containing the copolymer obtained in the above Synthesis Example II-47 were respectively synthesized and were examined of their properties.

Example II-370 to Example II-373

The preparation of chemically amplified resists as performed in (Example II-4) to (Example II-7) were repeated except that the copolymer of Synthesis Example II-2 was replaced by the copolymer obtained in Synthesis Example II-47. Using the resists, patterns were formed in the same manner as explained above, and the properties of these patterns were evaluated.

Further, as in the case of Synthesis Example II-1, the transparency and dry etch resistance were evaluated. The results obtained were summarized in Table 200 below together with the photo-acid generator employed. The values of etch rate were based on that of PMMA.

TABLE 200

| Example | Photo-acid generator | Light transmittance (1 μm) % | Etch rate (relative value) |
|---|---|---|---|
| II-370 | Triphenyl sulfonium triflate | 60 | 0.3 |
| II-371 | Diphenyl iodonium triflate | 59 | 0.3 |
| II-372 | NAT · 105 (Midori Kagaku Co., Ltd.) | 61 | 0.3 |
| II-373 | NAI · 105 (Midori Kagaku Co., Ltd.) | 60 | 0.3 |

As a result, it was found possible to form a line and space pattern of 0.15 μm in line width in any of examples.

Example II-374 to Example II-377

The preparation of chemically amplified resists as performed in (Example II-8) to (Example II-11) were repeated except that the copolymer of Synthesis Example II-2 was replaced by the copolymer obtained in Synthesis Example II-47. Using the resists, patterns were formed in the same manner as explained above, and the properties of these patterns were evaluated.

Further, as in the case of Synthesis Example II-1, the transparency and dry etch resistance were evaluated. The results obtained were summarized in Table 201 below together with the photo-acid generator employed. The values of etch rate were based on that of PMMA.

TABLE 201

| Example | Photo-acid generator | Light transmittance (1 μm) % | Etch rate (relative value) |
|---|---|---|---|
| II-374 | Triphenyl sulfonium triflate | 55 | 0.3 |
| II-375 | Diphenyl iodonium triflate | 59 | 0.3 |

TABLE 201-continued

| Example | Photo-acid generator | Light transmittance (1 μm) % | Etch rate (relative value) |
|---|---|---|---|
| II-376 | NAT · 105 (Midori Kagaku Co., Ltd.) | 61 | 0.3 |
| II-377 | NAI · 105 (Midori Kagaku Co., Ltd.) | 60 | 0.3 |

As a result, it was found possible to form a line and space pattern of 0.15 μm in line width in any of examples.

(Synthesis Example II-48)

The preparation of copolymer performed in Synthesis Example II-43 was repeated except that the ratio of dimenthyl methacrylate, t-butyl methacrylate and methacrylic acid was changed to 30:30:40 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-378 to II-385, chemically amplified resists containing the copolymer obtained in the above Synthesis Example II-48 were respectively synthesized and were examined of their properties.

Example II-378 to Example II-381

The preparation of chemically amplified resists as performed in (Example II-4) to (Example II-7) were repeated except that the copolymer of Synthesis Example II-2 was replaced by the copolymer obtained in Synthesis Example II-48. Using the resists, patterns were formed in the same manner as explained above, and the properties of these patterns were evaluated.

Further, as in the case of Synthesis Example II-1, the transparency and dry etch resistance were evaluated. The results obtained were summarized in Table 202 below together with the photo-acid generator employed. The values of etch rate were based on that of PMMA.

TABLE 202

| Example | Photo-acid generator | Light transmittance (1 μm) % | Etch rate (relative value) |
|---|---|---|---|
| II-378 | Triphenyl sulfonium triflate | 60 | 0.3 |
| II-379 | Diphenyl iodonium triflate | 59 | 0.3 |
| II-380 | NAT · 105 (Midori Kagaku Co., Ltd.) | 61 | 0.3 |

TABLE 202-continued

| Example | Photo-acid generator | Light transmittance (1 μm) % | Etch rate (relative value) |
|---|---|---|---|
| II-381 | NAI · 105 (Midori Kagaku Co., Ltd.) | 60 | 0.3 |

As a result, it was found possible to form a line and space pattern of 0.15 μm in line width in any of examples.

Example II-382 to Example II-385

The preparation of chemically amplified resists as performed in (Example II-8) to (Example II-11) were repeated except that the copolymer of Synthesis Example II-2 was replaced by the copolymer obtained in Synthesis Example II-48. Using the resists, patterns were formed in the same manner as explained above, and the properties of these patterns were evaluated.

Further, as in the case of Synthesis Example II-1, the transparency and dry etch resistance were evaluated. The results obtained were summarized in Table 203 below together with the photo-acid generator employed. The values of etch rate were based on that of PMMA.

TABLE 203

| Example | Photo-acid generator | Light transmittance (1 μm) % | Etch rate (relative value) |
|---|---|---|---|
| II-382 | Triphenyl sulfonium triflate | 55 | 0.3 |
| II-383 | Diphenyl iodonium triflate | 59 | 0.3 |
| II-384 | NAT · 105 (Midori Kagaku Co., Ltd.) | 61 | 0.3 |
| II-385 | NAI · 105 (Midori Kagaku Co., Ltd.) | 60 | 0.3 |

As a result, it was found possible to form a line and space pattern of 0.15 μm in line width in any of examples.

(Synthesis Example II-49)

The preparation of copolymer performed in Synthesis Example II-43 was repeated except that the ratio of dimenthyl methacrylate, t-butyl methacrylate and methacrylic acid was changed to 30:25:45 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-386 to II-393, chemically amplified resists containing the copolymer obtained in the above Synthesis Example II-49 were respectively synthesized and were examined of their properties.

Example II-386 to Example II-389

The preparation of chemically amplified resists as performed in (Example II-4) to (Example II-7) were repeated except that the copolymer of Synthesis Example II-2 was replaced by the copolymer obtained in Synthesis Example II-49. Using the resists, patterns were formed in the same manner as explained above, and the properties of these patterns were evaluated.

Further, as in the case of Synthesis Example II-1, the transparency and dry etch resistance were evaluated. The results obtained were summarized in Table 204 below together with the photo-acid generator employed. The values of etch rate were based on that of PMMA.

TABLE 204

| Example | Photo-acid generator | Light transmittance (1 μm) % | Etch rate (relative value) |
|---|---|---|---|
| II-386 | Triphenyl sulfonium triflate | 60 | 0.3 |
| II-387 | Diphenyl iodonium triflate | 59 | 0.3 |
| II-388 | NAT · 105 (Midori Kagaku Co., Ltd.) | 61 | 0.3 |
| II-389 | NAI · 105 (Midori Kagaku Co., Ltd.) | 60 | 0.3 |

As a result, it was found possible to form a line and space pattern of 0.15 μm in line width in any of examples.

Example II-390 to Example II-393

The preparation of chemically amplified resists as performed in (Example II-8) to (Example II-11) were repeated except that the copolymer of Synthesis Example II-2 was replaced by the copolymer obtained in Synthesis Example II-49. Using the resists, patterns were formed in the same manner as explained above, and the properties of these patterns were evaluated.

Further, as in the case of Synthesis Example II-1, the transparency and dry etch resistance were evaluated. The results obtained were summarized in Table 205 below together with the photo-acid generator employed. The values of etch rate were based on that of PMMA.

TABLE 205

| Example | Photo-acid generator | Light transmittance (1 μm) % | Etch rate (relative value) |
|---|---|---|---|
| II-390 | Triphenyl sulfonium triflate | 55 | 0.3 |
| II-391 | Diphenyl iodonium triflate | 59 | 0.3 |
| II-392 | NAT · 105 (Midori Kagaku Co., Ltd.) | 61 | 0.3 |
| II-393 | NAI · 105 (Midori Kagaku Co., Ltd.) | 60 | 0.3 |

As a result, it was found possible to form a line and space pattern of 0.15 μm in line width in any of examples.
(Synthesis Example II-50)

The preparation of copolymer performed in Synthesis Example II-43 was repeated except that the ratio of dimenthyl methacrylate, t-butyl methacrylate and methacrylic acid was changed to 25:50:25 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-394 to II-401, chemically amplified resists containing the copolymer obtained in the above Synthesis Example II-50 were respectively synthesized and were examined of their properties.

Example II-394 to Example II-397

The preparation of chemically amplified resists as performed in (Example II-4) to (Example II-7) were repeated except that the copolymer of Synthesis Example II-2 was replaced by the copolymer obtained in Synthesis Example II-50. Using the resists, patterns were formed in the same manner as explained above, and the properties of these patterns were evaluated.

Further, as in the case of Synthesis Example II-1, the transparency and dry etch resistance were evaluated. The results obtained were summarized in Table 206 below together with the photo-acid generator employed. The values of etch rate were based on that of PMMA.

TABLE 206

| Example | Photo-acid generator | Light transmittance (1 μm) % | Etch rate (relative value) |
|---|---|---|---|
| II-394 | Triphenyl sulfonium triflate | 60 | 0.3 |
| II-395 | Diphenyl iodonium triflate | 59 | 0.3 |
| II-396 | NAT · 105 (Midori Kagaku Co., Ltd.) | 61 | 0.3 |
| II-397 | NAI · 105 (Midori Kagaku Co., Ltd.) | 60 | 0.3 |

As a result, it was found possible to form a line and space pattern of 0.15 μm in line width in any of examples.

Example II-398 to Example II-401

The preparation of chemically amplified resists as performed in (Example II-8) to (Example II-11) were repeated except that the copolymer of Synthesis Example II-2 was replaced by the copolymer obtained in Synthesis Example II-50. Using the resists, patterns were formed in the same manner as explained above, and the properties of these patterns were evaluated.

Further, as in the case of Synthesis Example II-1, the transparency and dry etch resistance were evaluated. The results obtained were summarized in Table 207 below together with the photo-acid generator employed. The values of etch rate were based on that of PMMA.

TABLE 207

| Example | Photo-acid generator | Light transmittance (1 μm) % | Etch rate (relative value) |
|---|---|---|---|
| II-398 | Triphenyl sulfonium triflate | 55 | 0.3 |
| II-399 | Diphenyl iodonium triflate | 59 | 0.3 |
| II-400 | NAT · 105 (Midori Kagaku Co., Ltd.) | 61 | 0.3 |
| II-401 | NAI · 105 (Midori Kagaku Co., Ltd.) | 60 | 0.3 |

As a result, it was found possible to form a line and space pattern of 0.15 μm in line width in any of examples.
(Synthesis Example II-51)

The preparation of copolymer performed in Synthesis Example II-43 was repeated except that the ratio of dimenthyl methacrylate, t-butyl methacrylate and methacrylic acid was changed to 25:45:30 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-402 to II-409, chemically amplified resists containing the copolymer obtained in the above Synthesis Example II-51 were respectively synthesized and were examined of their properties.

Example II-402 to Example II-405

The preparation of chemically amplified resists as performed in (Example II-4) to (Example II-7) were repeated except that the copolymer of Synthesis Example II-2 was replaced by the copolymer obtained in Synthesis Example II-51. Using the resists, patterns were formed in the same manner as explained above, and the properties of these patterns were evaluated.

Further, as in the case of Synthesis Example II-1, the transparency and dry etch resistance were evaluated. The results obtained were summarized in Table 208 below together with the photo-acid generator employed. The values of etch rate were based on that of PMMA.

TABLE 208

| Example | Photo-acid generator | Light transmittance (1 μm) % | Etch rate (relative value) |
|---|---|---|---|
| II-402 | Triphenyl sulfonium triflate | 60 | 0.3 |
| II-403 | Diphenyl iodonium triflate | 59 | 0.3 |
| II-404 | NAT · 105 (Midori Kagaku Co., Ltd.) | 61 | 0.3 |
| II-405 | NAI · 105 (Midori Kagaku Co., Ltd.) | 60 | 0.3 |

As a result, it was found possible to form a line and space pattern of 0.15 μm in line width in any of examples.

Example II-406 to Example II-409

The preparation of chemically amplified resists as performed in (Example II-8) to (Example II-11) were repeated except that the copolymer of Synthesis Example II-2 was replaced by the copolymer obtained in Synthesis Example II-51. Using the resists, patterns were formed in the same manner as explained above, and the properties of these patterns were evaluated.

Further, as in the case of Synthesis Example II-1, the transparency and dry etch resistance were evaluated. The results obtained were summarized in Table 209 below together with the photo-acid generator employed. The values of etch rate were based on that of PMMA.

TABLE 209

| Example | Photo-acid generator | Light transmittance (1 μm) % | Etch rate (relative value) |
|---|---|---|---|
| II-406 | Triphenyl sulfonium triflate | 55 | 0.3 |
| II-407 | Diphenyl iodonium triflate | 59 | 0.3 |
| II-408 | NAT · 105 (Midori Kagaku Co., Ltd.) | 61 | 0.3 |
| II-409 | NAI · 105 (Midori Kagaku Co., Ltd.) | 60 | 0.3 |

As a result, it was found possible to form a line and space pattern of 0.15 μm in line width in any of examples.
(Synthesis Example II-52)

The preparation of copolymer performed in Synthesis Example II-43 was repeated except that the ratio of dimenthyl methacrylate, t-butyl methacrylate and methacrylic acid was changed to 25:40:35 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-410 to II-417, chemically amplified resists containing the copolymer obtained in the above Synthesis Example II-52 were respectively synthesized and were examined of their properties.

Example II-410 to Example II-413

The preparation of chemically amplified resists as performed in (Example II-4) to (Example II-7) were repeated except that the copolymer of Synthesis Example II-2 was replaced by the copolymer obtained in Synthesis Example II-52. Using the resists, patterns were formed in the same manner as explained above, and the properties of these patterns were evaluated.

Further, as in the case of Synthesis Example II-1, the transparency and dry etch resistance were evaluated. The results obtained were summarized in Table 210 below together with the photo-acid generator employed. The values of etch rate were based on that of PMMA.

TABLE 210

| Example | Photo-acid generator | Light transmittance (1 μm) % | Etch rate (relative value) |
|---|---|---|---|
| II-410 | Triphenyl sulfonium triflate | 60 | 0.3 |
| II-411 | Diphenyl iodonium triflate | 59 | 0.3 |
| II-412 | NAT · 105 (Midori Kagaku Co., Ltd.) | 61 | 0.3 |
| II-413 | NAI · 105 (Midori Kagaku Co., Ltd.) | 60 | 0.3 |

As a result, it was found possible to form a line and space pattern of 0.15 μm in line width in any of examples.

Example II-414 to Example II-417

The preparation of chemically amplified resists as performed in (Example II-8) to (Example II-11) were repeated except that the copolymer of Synthesis Example II-2 was replaced by the copolymer obtained in Synthesis Example II-52. Using the resists, patterns were formed in the same manner as explained above, and the properties of these patterns were evaluated.

Further, as in the case of Synthesis Example II-1, the transparency and dry etch resistance were evaluated. The results obtained were summarized in Table 211 below together with the photo-acid generator employed. The values of etch rate were based on that of PMMA.

TABLE 211

| Example | Photo-acid generator | Light transmittance (1 μm) % | Etch rate (relative value) |
|---|---|---|---|
| II-414 | Triphenyl sulfonium triflate | 55 | 0.3 |
| II-415 | Diphenyl iodonium triflate | 59 | 0.3 |
| II-416 | NAT · 105 (Midori Kagaku Co., Ltd.) | 61 | 0.3 |

TABLE 211-continued

| Example | Photo-acid generator | Light transmittance (1 μm) % | Etch rate (relative value) |
|---|---|---|---|
| II-417 | NAI · 105 (Midori Kagaku Co., Ltd.) | 60 | 0.3 |

As a result, it was found possible to form a line and space pattern of 0.15 μm in line width in any of examples.
(Synthesis Example II-53)

The preparation of copolymer performed in Synthesis Example II-43 was repeated except that the ratio of dimenthyl methacrylate, t-butyl methacrylate and methacrylic acid was changed to 25:30:45 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-418 to II-425, chemically amplified resists containing the copolymer obtained in the above Synthesis Example II-53 were respectively synthesized and were examined of their properties.

Example II-418 to Example II-421

The preparation of chemically amplified resists as performed in (Example II-4) to (Example II-7) were repeated except that the copolymer of Synthesis Example II-2 was replaced by the copolymer obtained in Synthesis Example II-53. Using the resists, patterns were formed in the same manner as explained above, and the properties of these patterns were evaluated.

Further, as in the case of Synthesis Example II-1, the transparency and dry etch resistance were evaluated. The results obtained were summarized in Table 212 below together with the photo-acid generator employed. The values of etch rate were based on that of PMMA.

TABLE 212

| Example | Photo-acid generator | Light transmittance (1 μm) % | Etch rate (relative value) |
|---|---|---|---|
| II-418 | Triphenyl sulfonium triflate | 60 | 0.3 |
| II-419 | Diphenyl iodonium triflate | 59 | 0.3 |
| II-420 | NAT · 105 (Midori Kagaku Co., Ltd.) | 61 | 0.3 |
| II-421 | NAI · 105 (Midori Kagaku Co., Ltd.) | 60 | 0.3 |

As a result, it was found possible to form a line and space pattern of 0.15 μm in line width in any of examples.

Example II-422 to Example II-425

The preparation of chemically amplified resists as performed in (Example II-8) to (Example II-11) were repeated except that the copolymer of Synthesis Example II-2 was replaced by the copolymer obtained in Synthesis Example II-53. Using the resists, patterns were formed in the same manner as explained above, and the properties of these patterns were evaluated.

Further, as in the case of Synthesis Example II-1, the transparency and dry etch resistance were evaluated. The results obtained were summarized in Table 213 below together with the photo-acid generator employed. The values of etch rate were based on that of PMMA.

TABLE 213

| Example | Photo-acid generator | Light transmittance (1 μm) % | Etch rate (relative value) |
|---|---|---|---|
| II-422 | Triphenyl sulfonium triflate | 55 | 0.3 |
| II-423 | Diphenyl iodonium triflate | 59 | 0.3 |
| II-424 | NAT · 105 (Midori Kagaku Co., Ltd.) | 61 | 0.3 |
| II-425 | NAI · 105 (Midori Kagaku Co., Ltd.) | 60 | 0.3 |

As a result, it was found possible to form a line and space pattern of 0.15 μm in line width in any of examples.

(Synthesis Example II-54)

The preparation of copolymer performed in Synthesis Example II-43 was repeated except that the ratio of dimenthyl methacrylate, t-butyl methacrylate and methacrylic acid was changed to 25:25:50 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-426 to II-433, chemically amplified resists containing the copolymer obtained in the above Synthesis Example II-54 were respectively synthesized and were examined of their properties.

Example II-426 to Example II-429

The preparation of chemically amplified resists as performed in (Example II-4) to (Example II-7) were repeated except that the copolymer of Synthesis Example II-2 was replaced by the copolymer obtained in Synthesis Example II-54. Using the resists, patterns were formed in the same manner as explained above, and the properties of these patterns were evaluated.

Further, as in the case of Synthesis Example II-1, the transparency and dry etch resistance were evaluated. The results obtained were summarized in Table 214 below together with the photo-acid generator employed. The values of etch rate were based on that of PMMA.

TABLE 214

| Example | Photo-acid generator | Light transmittance (1 μm) % | Etch rate (relative value) |
|---|---|---|---|
| II-426 | Triphenyl sulfonium triflate | 60 | 0.3 |
| II-427 | Diphenyl iodonium triflate | 59 | 0.3 |
| II-428 | NAT · 105 (Midori Kagaku Co., Ltd.) | 61 | 0.3 |
| II-429 | NAI · 105 (Midori Kagaku Co., Ltd.) | 60 | 0.3 |

As a result, it was found possible to form a line and space pattern of 0.15 μm in line width in any of examples.

Example II-430 to Example II-433

The preparation of chemically amplified resists as performed in (Example II-8) to (Example II-11) were repeated except that the copolymer of Synthesis Example II-2 was replaced by the copolymer obtained in Synthesis Example II-54. Using the resists, patterns were formed in the same manner as explained above, and the properties of these patterns were evaluated.

Further, as in the case of Synthesis Example II-1, the transparency and dry etch resistance were evaluated. The results obtained were summarized in Table 215 below together with the photo-acid generator employed. The values of etch rate were based on that of PMMA.

TABLE 215

| Example | Photo-acid generator | Light transmittance (1 μm) % | Etch rate (relative value) |
|---|---|---|---|
| II-430 | Triphenyl sulfonium triflate | 55 | 0.3 |
| II-431 | Diphenyl iodonium triflate | 59 | 0.3 |
| II-432 | NAT · 105 (Midori Kagaku Co., Ltd.) | 61 | 0.3 |
| II-433 | NAI · 105 (Midori Kagaku Co., Ltd.) | 60 | 0.3 |

As a result, it was found possible to form a line and space pattern of 0.15 μm in line width in any of examples.

(Synthesis Example II-55)

The preparation of copolymer performed in Synthesis Example II-43 was repeated except that the ratio of dimenthyl methacrylate, t-butyl methacrylate and methacrylic acid was changed to 20:55:25 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-434 to II-441, chemically amplified resists containing the copolymer obtained in the above Synthesis Example II-55 were respectively synthesized and were examined of their properties.

Example II-434 to Example II-437

The preparation of chemically amplified resists as performed in (Example II-4) to (Example II-7) were repeated except that the copolymer of Synthesis Example II-2 was replaced by the copolymer obtained in Synthesis Example II-55. Using the resists, patterns were formed in the same manner as explained above, and the properties of these patterns were evaluated.

Further, as in the case of Synthesis Example II-1, the transparency and dry etch resistance were evaluated. The results obtained were summarized in Table 216 below together with the photo-acid generator employed. The values of etch rate were based on that of PMMA.

TABLE 216

| Example | Photo-acid generating | Light transmittance (1 μm) % | Etch rate (relative value) |
| --- | --- | --- | --- |
| II-434 | Triphenyl sulfonium triflate | 60 | 0.3 |
| II-435 | Diphenyl iodonium triflate | 59 | 0.3 |
| II-436 | NAT · 105 (Midori Kagaku Co., Ltd.) | 61 | 0.3 |
| II-437 | NAI · 105 (Midori Kagaku Co., Ltd.) | 60 | 0.3 |

As a result, it was found possible to form a line and space pattern of 0.15 μm in line width in any of examples.

Example II-438 to Example II-441

The preparation of chemically amplified resists as performed in (Example II-8) to (Example II-11) were repeated except that the copolymer of Synthesis Example II-2 was replaced by the copolymer obtained in Synthesis Example II-55. Using the resists, patterns were formed in the same manner as explained above, and the properties of these patterns were evaluated.

Further, as in the case of Synthesis Example II-1, the transparency and dry etch resistance were evaluated. The results obtained were summarized in Table 217 below together with the photo-acid generator employed. The values of etch rate were based on that of PMMA.

TABLE 217

| Example | Photo-acid generator | Light transmittance (1 μm) % | Etch rate (relative value) |
| --- | --- | --- | --- |
| II-438 | Triphenyl sulfonium triflate | 55 | 0.3 |
| II-439 | Diphenyl iodonium triflate | 59 | 0.3 |

TABLE 217-continued

| Example | Photo-acid generator | Light transmittance (1 μm) % | Etch rate (relative value) |
| --- | --- | --- | --- |
| II-440 | NAT · 105 (Midori Kagaku Co., Ltd.) | 61 | 0.3 |
| II-441 | NAI · 105 (Midori Kagaku Co., Ltd.) | 60 | 0.3 |

As a result, it was found possible to form a line and space pattern of 0.15 μm in line width in any of examples.

(Synthesis Example II-56)

The preparation of copolymer performed in Synthesis Example II-43 was repeated except that the ratio of dimenthyl methacrylate, t-butyl methacrylate and methacrylic acid was changed to 20:50:30 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-442 to II-449, chemically amplified resists containing the copolymer obtained in the above Synthesis Example II-56 were respectively synthesized and were examined of their properties.

Example II-442 to Example II-445

The preparation of chemically amplified resists as performed in (Example II-4) to (Example II-7) were repeated except that the copolymer of Synthesis Example II-2 was replaced by the copolymer obtained in Synthesis Example II-56. Using the resists, patterns were formed in the same manner as explained above, and the properties of these patterns were evaluated.

Further, as in the case of Synthesis Example II-1, the transparency and dry etch resistance were evaluated. The results obtained were summarized in Table 218 below together with the photo-acid generator employed. The values of etch rate were based on that of PMMA.

TABLE 218

| Example | Photo-acid generator | Light transmittance (1 μm) % | Etch rate (relative value) |
| --- | --- | --- | --- |
| II-442 | Triphenyl sulfonium triflate | 60 | 0.3 |
| II-443 | Diphenyl iodonium triflate | 59 | 0.3 |
| II-444 | NAT · 105 (Midori Kagaku Co., Ltd.) | 61 | 0.3 |
| II-445 | NAI · 105 (Midori Kagaku Co., Ltd.) | 60 | 0.3 |

As a result, it was found possible to form a line and space pattern of 0.15 μm in line width in any of examples.

Example II-446 to Example II-449

The preparation of chemically amplified resists as performed in (Example II-8) to (Example II-11) were repeated except that the copolymer of Synthesis Example II-2 was replaced by the copolymer obtained in Synthesis Example II-56. Using the resists, patterns were formed in the same manner as explained above, and the properties of these patterns were evaluated.

Further, as in the case of Synthesis Example II-1, the transparency and dry etch resistance were evaluated. The results obtained were summarized in Table 219 below together with the photo-acid generator employed. The values of etch rate were based on that of PMMA.

TABLE 219

| Example | Photo-acid generator | Light transmittance (1 $\mu$m) % | Etch rate (relative value) |
| --- | --- | --- | --- |
| II-446 | Triphenyl sulfonium triflate | 55 | 0.3 |
| II-447 | Diphenyl iodonium triflate | 59 | 0.3 |
| II-448 | NAT · 105 (Midori Kagaku Co., Ltd.) | 61 | 0.3 |
| II-449 | NAI · 105 (Midori Kagaku Co., Ltd.) | 60 | 0.3 |

As a result, it was found possible to form a line and space pattern of 0.15 $\mu$m in line width in any of examples.

(Synthesis Example II-57)

The preparation of copolymer performed in Synthesis Example II-43 was repeated except that the ratio of dimenthyl methacrylate, t-butyl methacrylate and methacrylic acid was changed to 20:40:40 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-450 to II-457, chemically amplified resists containing the copolymer obtained in the above Synthesis Example II-57 were respectively synthesized and were examined of their properties.

Example II-450 to Example II-453

The preparation of chemically amplified resists as performed in (Example II-4) to (Example II-7) were repeated except that the copolymer of Synthesis Example II-2 was replaced by the copolymer obtained in Synthesis Example II-57. Using the resists, patterns were formed in the same manner as explained above, and the properties of these patterns were evaluated.

Further, as in the case of Synthesis Example II-1, the transparency and dry etch resistance were evaluated. The results obtained were summarized in Table 220 below together with the photo-acid generator employed. The values of etch rate were based on that of PMMA.

TABLE 220

| Example | Photo-acid generator | Light transmittance (1 $\mu$m) % | Etch rate (relative value) |
| --- | --- | --- | --- |
| II-450 | Triphenyl sulfonium triflate | 60 | 0.3 |
| II-451 | Diphenyl iodonium triflate | 59 | 0.3 |
| II-452 | NAT · 105 (Midori Kagaku Co., Ltd.) | 61 | 0.3 |
| II-453 | NAI · 105 (Midori Kagaku Co., Ltd.) | 60 | 0.3 |

As a result, it was found possible to form a line and space pattern of 0.15 $\mu$m in line width in any of examples.

Example II-454 to Example II-457

The preparation of chemically amplified resists as performed in (Example II-8) to (Example II-11) were repeated except that the copolymer of Synthesis Example II-2 was replaced by the copolymer obtained in Synthesis Example II-57. Using the resists, patterns were formed in the same manner as explained above, and the properties of these patterns were evaluated.

Further, as in the case of Synthesis Example II-1, the transparency and dry etch resistance were evaluated. The results obtained were summarized in Table 221 below together with the photo-acid generator employed. The values of etch rate were based on that of PMMA.

TABLE 221

| Example | Photo-acid generator | Light transmittance (1 $\mu$m) % | Etch rate (relative value) |
| --- | --- | --- | --- |
| II-454 | Triphenyl sulfonium triflate | 55 | 0.3 |
| II-455 | Diphenyl iodonium triflate | 59 | 0.3 |
| II-456 | NAT · 105 (Midori Kagaku Co., Ltd.) | 61 | 0.3 |
| II-457 | NAI · 105 (Midori Kagaku Co., Ltd.) | 60 | 0.3 |

As a result, it was found possible to form a line and space pattern of 0.15 $\mu$m in line width in any of examples.

(Synthesis Example II-58)

The preparation of copolymer performed in Synthesis Example II-43 was repeated except that the ratio of dimenthyl methacrylate, t-butyl methacrylate and methacrylic acid was changed to 20:35:45 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-458 to II-465, chemically amplified resists containing the copolymer obtained in the above Synthesis Example II-58 were respectively synthesized and were examined of their properties.

Example II-458 to Example II-461

The preparation of chemically amplified resists as performed in (Example II-4) to (Example II-7) were repeated except that the copolymer of Synthesis Example II-2 was replaced by the copolymer obtained in Synthesis Example II-58. Using the resists, patterns were formed in the same manner as explained above, and the properties of these patterns were evaluated.

Further, as in the case of Synthesis Example II-1, the transparency and dry etch resistance were evaluated. The results obtained were summarized in Table 222 below together with the photo-acid generator employed. The values of etch rate were based on that of PMMA.

TABLE 222

| Example | Photo-acid generator | Light transmittance (1 μm) % | Etch rate (relative value) |
|---|---|---|---|
| II-458 | Triphenyl sulfonium triflate | 60 | 0.3 |
| II-459 | Diphenyl iodonium triflate | 59 | 0.3 |
| II-460 | NAT · 105 (Midori Kagaku Co., Ltd.) | 61 | 0.3 |
| II-461 | NAI · 105 (Midori Kagaku Co., Ltd.) | 60 | 0.3 |

As a result, it was found possible to form a line and space pattern of 0.15 μm in line width in any of examples.

Example II-462 to Example II-465

The preparation of chemically amplified resists as performed in (Example II-8) to (Example II-11) were repeated except that the copolymer of Synthesis Example II-2 was replaced by the copolymer obtained in Synthesis Example II-58. Using the resists, patterns were formed in the same manner as explained above, and the properties of these patterns were evaluated.

Further, as in the case of Synthesis Example II-1, the transparency and dry etch resistance were evaluated. The results obtained were summarized in Table 223 below together with the photo-acid generator employed. The values of etch rate were based on that of PMMA.

TABLE 223

| Example | Photo-acid generator | Light transmittance (1 μm) % | Etch rate (relative value) |
|---|---|---|---|
| II-462 | Triphenyl sulfonium triflate | 55 | 0.3 |
| II-463 | Diphenyl iodonium triflate | 59 | 0.3 |
| II-464 | NAT · 105 (Midori Kagaku Co., Ltd.) | 61 | 0.3 |
| II-465 | NAI · 105 (Midori Kagaku Co., Ltd.) | 60 | 0.3 |

As a result, it was found possible to form a line and space pattern of 0.15 μm in line width in any of examples.

(Synthesis Example II-59)

The preparation of copolymer performed in Synthesis Example II-43 was repeated except that the ratio of dimenthyl methacrylate, t-butyl methacrylate and methacrylic acid was changed to 20:30:50 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-466 to II-473, chemically amplified resists containing the copolymer obtained in the above Synthesis Example II-59 were respectively synthesized and were examined of their properties.

Example II-466 to Example II-469

The preparation of chemically amplified resists as performed in (Example II-4) to (Example II-7) were repeated except that the copolymer of Synthesis Example II-2 was replaced by the copolymer obtained in Synthesis Example II-59. Using the resists, patterns were formed in the same manner as explained above, and the properties of these patterns were evaluated.

Further, as in the case of Synthesis Example II-1, the transparency and dry etch resistance were evaluated. The results obtained were summarized in Table 224 below together with the photo-acid generator employed. The values of etch rate were based on that of PMMA.

TABLE 224

| Example | Photo-acid generator | Light transmittance (1 μm) % | Etch rate (relative value) |
|---|---|---|---|
| II-466 | Triphenyl sulfonium triflate | 60 | 0.3 |
| II-467 | Diphenyl iodonium triflate | 59 | 0.3 |

TABLE 224-continued

| Example | Photo-acid generator | Light transmittance (1 μm) % | Etch rate (relative value) |
|---|---|---|---|
| II-468 | NAT · 105 (Midori Kagaku Co., Ltd.) | 61 | 0.3 |
| II-469 | NAI · 105 (Midori Kagaku Co., Ltd.) | 60 | 0.3 |

As a result, it was found possible to form a line and space pattern of 0.15 μm in line width in any of examples.

Example II-470 to Example II-473

The preparation of chemically amplified resists as performed in (Example II-8) to (Example II-11) were repeated except that the copolymer of Synthesis Example II-2 was replaced by the copolymer obtained in Synthesis Example II-59. Using the resists, patterns were formed in the same manner as explained above, and the properties of these patterns were evaluated.

Further, as in the case of Synthesis Example II-1, the transparency and dry etch resistance were evaluated. The results obtained were summarized in Table 225 below together with the photo-acid generator employed. The values of etch rate were based on that of PMMA.

TABLE 225

| Example | Photo-acid generator | Light transmittance (1 μm) % | Etch rate (relative value) |
|---|---|---|---|
| II-470 | Triphenyl sulfonium triflate | 55 | 0.3 |
| II-471 | Diphenyl iodonium triflate | 59 | 0.3 |
| II-472 | NAT · 105 (Midori Kagaku Co., Ltd.) | 61 | 0.3 |
| II-473 | NAI · 105 (Midori Kagaku Co., Ltd.) | 60 | 0.3 |

As a result, it was found possible to form a line and space pattern of 0.15 μm in line width in any of examples.
(Synthesis Example II-60)

The preparation of copolymer performed in Synthesis Example II-43 was repeated except that the ratio of dimenthyl methacrylate, t-butyl methacrylate and methacrylic acid was changed to 20:25:55 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-474 to II-481, chemically amplified resists containing the copolymer obtained in the above Synthesis Example II-60 were respectively synthesized and were examined of their properties.

Example II-474 to Example II-477

The preparation of chemically amplified resists as performed in (Example II-4) to (Example II-7) were repeated except that the copolymer of Synthesis Example II-2 was replaced by the copolymer obtained in Synthesis Example II-60. Using the resists, patterns were formed in the same manner as explained above, and the properties of these patterns were evaluated.

Further, as in the case of Synthesis Example II-1, the transparency and dry etch resistance were evaluated. The results obtained were summarized in Table 226 below together with the photo-acid generator employed. The values of etch rate were based on that of PMMA.

TABLE 226

| Example | Photo-acid generator | Light transmittance (1 μm) % | Etch rate (relative value) |
|---|---|---|---|
| II-474 | Triphenyl sulfonium triflate | 60 | 0.3 |
| II-475 | Diphenyl iodonium triflate | 59 | 0.3 |
| II-476 | NAT · 105 (Midori Kagaku Co., Ltd.) | 61 | 0.3 |
| II-477 | NAI · 105 (Midori Kagaku Co., Ltd.) | 60 | 0.3 |

As a result, it was found possible to form a line and space pattern of 0.15 μm in line width in any of examples.

Example II-478 to Example II-481

The preparation of chemically amplified resists as performed in (Example II-8) to (Example II-11) were repeated except that the copolymer of Synthesis Example II-2 was replaced by the copolymer obtained in Synthesis Example II-60. Using the resists, patterns were formed in the same manner as explained above, and the properties of these patterns were evaluated.

Further, as in the case of Synthesis Example II-1, the transparency and dry etch resistance were evaluated. The results obtained were summarized in Table 227 below together with the photo-acid generator employed. The values of etch rate were based on that of PMMA.

TABLE 227

| Example | Photo-acid generator | Light transmittance (1 μm) % | Etch rate (relative value) |
|---|---|---|---|
| II-478 | Triphenyl sulfonium triflate | 55 | 0.3 |
| II-479 | Diphenyl iodonium triflate | 59 | 0.3 |
| II-480 | NAT · 105 (Midori Kagaku Co., Ltd.) | 61 | 0.3 |

TABLE 227-continued

| Example | Photo-acid generator | Light transmittance (1 μm) % | Etch rate (relative value) |
|---|---|---|---|
| II-481 | NAI · 105 (Midori Kagaku Co., Ltd.) | 60 | 0.3 |

As a result, it was found possible to form a line and space pattern of 0.15 μm in line width in any of examples.

(Synthesis Example II-61)

The preparation of copolymer performed in Synthesis Example II-43 was repeated except that the ratio of dimenthyl methacrylate, t-butyl methacrylate and methacrylic acid was changed to 20:60:20 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-482 to II-489, chemically amplified resists containing the copolymer obtained in the above Synthesis Example II-61 were respectively synthesized and were examined of their properties.

Example II-482 to Example II-485

The preparation of chemically amplified resists as performed in (Example II-4) to (Example II-7) were repeated except that the copolymer of Synthesis Example II-2 was replaced by the copolymer obtained in Synthesis Example II-61. Using the resists, patterns were formed in the same manner as explained above, and the properties of these patterns were evaluated.

Further, as in the case of Synthesis Example II-1, the transparency and dry etch resistance were evaluated. The results obtained were summarized in Table 228 below together with the photo-acid generator employed. The values of etch rate were based on that of PMMA.

TABLE 228

| Example | Photo-acid generator | Light transmittance (1 μm) % | Etch rate (relative value) |
|---|---|---|---|
| II-482 | Triphenyl sulfonium triflate | 60 | 0.3 |
| II-483 | Diphenyl iodonium triflate | 59 | 0.3 |
| II-484 | NAT · 105 (Midori Kagaku Co., Ltd.) | 61 | 0.3 |
| II-485 | NAI · 105 (Midori Kagaku Co., Ltd.) | 60 | 0.3 |

As a result, it was found possible to form a line and space pattern of 0.15 μm in line width in any of examples.

Example II-486 to Example II-489

The preparation of chemically amplified resists as performed in (Example II-8) to (Example II-11) were repeated except that the copolymer of Synthesis Example II-2 was replaced by the copolymer obtained in Synthesis Example II-61. Using the resists, patterns were formed in the same manner as explained above, and the properties of these patterns were evaluated.

Further, as in the case of Synthesis Example II-1, the transparency and dry etch resistance were evaluated. The results obtained were summarized in Table 229 below together with the photo-acid generator employed. The values of etch rate were based on that of PMMA.

TABLE 229

| Example | Photo-acid generator | Light transmittance (1 μm) % | Etch rate (relative value) |
|---|---|---|---|
| II-486 | Triphenyl sulfonium triflate | 55 | 0.3 |
| II-487 | Diphenyl iodonium triflate | 59 | 0.3 |
| II-488 | NAT · 105 (Midori Kagaku Co., Ltd.) | 61 | 0.3 |
| II-489 | NAI · 105 (Midori Kagaku Co., Ltd.) | 60 | 0.3 |

As a result, it was found possible to form a line and space pattern of 0.15 μm in line width in any of examples.

(Synthesis Example II-62)

The preparation of copolymer performed in Synthesis Example II-43 was repeated except that the ratio of dimenthyl methacrylate, t-butyl methacrylate and methacrylic acid was changed to 20:45:35 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-490 to II-497, chemically amplified resists containing the copolymer obtained in the above Synthesis Example II-62 were respectively synthesized and were examined of their properties.

Example II-490 to Example II-493

The preparation of chemically amplified resists as performed in (Example II-4) to (Example II-7) were repeated except that the copolymer of Synthesis Example II-2 was replaced by the copolymer obtained in Synthesis Example II-62. Using the resists, patterns were formed in the same manner as explained above, and the properties of these patterns were evaluated.

Further, as in the case of Synthesis Example II-1, the transparency and dry etch resistance were evaluated. The results obtained were summarized in Table 230 below together with the photo-acid generator employed. The values of etch rate were based on that of PMMA.

TABLE 230

| Example | Photo-acid generator | Light transmittance (1 μm) % | Etch rate (relative value) |
|---|---|---|---|
| II-490 | Triphenyl sulfonium triflate | 60 | 0.3 |
| II-491 | Diphenyl iodonium triflate | 59 | 0.3 |
| II-492 | NAT · 105 (Midori Kagaku Co., Ltd.) | 61 | 0.3 |
| II-493 | NAI · 105 (Midori Kagaku Co., Ltd.) | 60 | 0.3 |

As a result, it was found possible to form a line and space pattern of 0.15 μm in line width in any of examples.

Example II-494 to Example II-497

The preparation of chemically amplified resists as performed in (Example II-8) to (Example II-11) were repeated except that the copolymer of Synthesis Example II-2 was replaced by the copolymer obtained in Synthesis Example II-62. Using the resists, patterns were formed in the same manner as explained above, and the properties of these patterns were evaluated.

Further, as in the case of Synthesis Example II-1, the transparency and dry etch resistance were evaluated. The results obtained were summarized in Table 231 below together with the photo-acid generator employed. The values of etch rate were based on that of PMMA.

TABLE 231

| Example | Photo-acid generator | Light transmittance (1 μm) % | Etch rate (relative value) |
|---|---|---|---|
| II-494 | Triphenyl sulfonium triflate | 55 | 0.3 |
| II-495 | Diphenyl iodonium triflate | 59 | 0.3 |
| II-496 | NAT · 105 (Midori Kagaku Co., Ltd.) | 61 | 0.3 |
| II-497 | NAI · 105 (Midori Kagaku Co., Ltd.) | 60 | 0.3 |

As a result, it was found possible to form a line and space pattern of 0.15 μm in line width in any of examples.
(Synthesis Example II-63)

The preparation of copolymer performed in Synthesis Example II-43 was repeated except that the ratio of dimenthyl methacrylate, t-butyl methacrylate and methacrylic acid was changed to 20:35:45 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-498 to II-505, chemically amplified resists containing the copolymer obtained in the above Synthesis Example II-63 were respectively synthesized and were examined of their properties.

Example II-498 to Example II-501

The preparation of chemically amplified resists as performed in (Example II-4) to (Example II-7) were repeated except that the copolymer of Synthesis Example II-2 was replaced by the copolymer obtained in Synthesis Example II-63. Using the resists, patterns were formed in the same manner as explained above, and the properties of these patterns were evaluated.

Further, as in the case of Synthesis Example II-1, the transparency and dry etch resistance were evaluated. The results obtained were summarized in Table 232 below together with the photo-acid generator employed. The values of etch rate were based on that of PMMA.

TABLE 232

| Example | Photo-acid generator | Light transmittance (1 μm) % | Etch rate (relative value) |
|---|---|---|---|
| II-498 | Triphenyl sulfonium triflate | 60 | 0.3 |
| II-499 | Diphenyl iodonium triflate | 59 | 0.3 |
| II-500 | NAT · 105 (Midori Kagaku Co., Ltd.) | 61 | 0.3 |
| II-501 | NAI · 105 (Midori Kagaku Co., Ltd.) | 60 | 0.3 |

As a result, it was found possible to form a line and space pattern of 0.15 μm in line width in any of examples.

Example II-502 to Example II-505

The preparation of chemically amplified resists as performed in (Example II-8) to (Example II-11) were repeated except that the copolymer of Synthesis Example II-2 was replaced by the copolymer obtained in Synthesis Example II-63. Using the resists, patterns were formed in the same manner as explained above, and the properties of these patterns were evaluated.

Further, as in the case of Synthesis Example II-1, the transparency and dry etch resistance were evaluated. The results obtained were summarized in Table 233 below together with the photo-acid generator employed. The values of etch rate were based on that of PMMA.

TABLE 233

| Example | Photo-acid generator | Light transmittance (1 μm) % | Etch rate (relative value) |
|---|---|---|---|
| II-502 | Triphenyl sulfonium triflate | 55 | 0.3 |
| II-503 | Diphenyl iodonium triflate | 59 | 0.3 |

TABLE 233-continued

| Example | Photo-acid generator | Light transmittance (1 μm) % | Etch rate (relative value) |
|---|---|---|---|
| II-504 | NAT · 105 (Midori Kagaku Co., Ltd.) | 61 | 0.3 |
| II-505 | NAI · 105 (Midori Kagaku Co., Ltd.) | 60 | 0.3 |

As a result, it was found possible to form a line and space pattern of 0.15 μm in line width in any of examples.

(Synthesis Example II-64)

The preparation of copolymer performed in Synthesis Example II-43 was repeated except that the ratio of dimenthyl methacrylate, t-butyl methacrylate and methacrylic acid was changed to 20:20:60 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-506 to II-513, chemically amplified resists containing the copolymer obtained in the above Synthesis Example II-64 were respectively synthesized and were examined of their properties.

Example II-506 to Example II-509

The preparation of chemically amplified resists as performed in (Example II-4) to (Example II-7) were repeated except that the copolymer of Synthesis Example II-2 was replaced by the copolymer obtained in Synthesis Example II-64. Using the resists, patterns were formed in the same manner as explained above, and the properties of these patterns were evaluated.

Further, as in the case of Synthesis Example II-1, the transparency and dry etch resistance were evaluated. The results obtained were summarized in Table 234 below together with the photo-acid generator employed. The values of etch rate were based on that of PMMA.

TABLE 234

| Example | Photo-acid generator | Light transmittance (1 μm) % | Etch rate (relative value) |
|---|---|---|---|
| II-506 | Triphenyl sulfonium triflate | 60 | 0.3 |
| II-507 | Diphenyl iodonium triflate | 59 | 0.3 |
| II-508 | NAT · 105 (Midori Kagaku Co., Ltd.) | 61 | 0.3 |

TABLE 234-continued

| Example | Photo-acid generator | Light transmittance (1 μm) % | Etch rate (relative value) |
|---|---|---|---|
| II-509 | NAI · 105 (Midori Kagaku Co., Ltd.) | 60 | 0.3 |

As a result, it was found possible to form a line and space pattern of 0.15 μm in line width in any of examples.

Example II-510 to Example II-513

The preparation of chemically amplified resists as performed in (Example II-8) to (Example II-11) were repeated except that the copolymer of Synthesis Example II-2 was replaced by the copolymer obtained in Synthesis Example II-64. Using the resists, patterns were formed in the same manner as explained above, and the properties of these patterns were evaluated.

Further, as in the case of Synthesis Example II-1, the transparency and dry etch resistance were evaluated. The results obtained were summarized in Table 235 below together with the photo-acid generator employed. The values of etch rate were based on that of PMMA.

TABLE 235

| Example | Photo-acid generator | Light transmittance (1 μm) % | Etch rate (relative value) |
|---|---|---|---|
| II-510 | Triphenyl sulfonium triflate | 55 | 0.3 |
| II-511 | Diphenyl iodonium triflate | 59 | 0.3 |
| II-512 | NAT · 105 (Midori Kagaku Co., Ltd.) | 61 | 0.3 |
| II-513 | NAI · 105 (Midori Kagaku Co., Ltd.) | 60 | 0.3 |

As a result, it was found possible to form a line and space pattern of 0.15 μm in line width in any of examples.

(Synthesis Example II-65)

The preparation of copolymer performed in Synthesis Example II-43 was repeated except that the ratio of dimenthyl methacrylate, t-butyl methacrylate and methacrylic acid was changed to 15:60:25 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-514 to II-521, chemically amplified resists containing the copolymer obtained in the above Synthesis Example II-65 were respectively synthesized and were examined of their properties.

Example II-514 to Example II-517

The preparation of chemically amplified resists as performed in (Example II-4) to (Example II-7) were repeated except that the copolymer of Synthesis Example II-2 was replaced by the copolymer obtained in Synthesis Example II-64. Using the resists, patterns were formed in the same manner as explained above, and the properties of these patterns were evaluated.

Further, as in the case of Synthesis Example II-1, the transparency and dry etch resistance were evaluated. The results obtained were summarized in Table 236 below together with the photo-acid generator employed. The values of etch rate were based on that of PMMA.

TABLE 236

| Example | Photo-acid generator | Light transmittance (1 μm) % | Etch rate (relative value) |
|---|---|---|---|
| II-514 | Triphenyl sulfonium triflate | 60 | 0.3 |
| II-515 | Diphenyl iodonium triflate | 59 | 0.3 |
| II-516 | NAT · 105 (Midori Kagaku Co., Ltd.) | 61 | 0.3 |
| II-517 | NAI · 105 (Midori Kagaku Co., Ltd.) | 60 | 0.3 |

As a result, it was found possible to form a line and space pattern of 0.15 μm in line width in any of examples.

Example II-518 to Example II-521

The preparation of chemically amplified resists as performed in (Example II-8) to (Example II-11) were repeated except that the copolymer of Synthesis Example II-2 was replaced by the copolymer obtained in Synthesis Example II-65. Using the resists, patterns were formed in the same manner as explained above, and the properties of these patterns were evaluated.

Further, as in the case of Synthesis Example II-1, the transparency and dry etch resistance were evaluated. The results obtained were summarized in Table 237 below together with the photo-acid generator employed. The values of etch rate were based on that of PMMA.

TABLE 237

| Example | Photo-acid generator | Light transmittance (1 μm) % | Etch rate (relative value) |
|---|---|---|---|
| II-518 | Triphenyl sulfonium triflate | 55 | 0.3 |
| II-519 | Diphenyl iodonium triflate | 59 | 0.3 |
| II-520 | NAT · 105 (Midori Kagaku Co., Ltd.) | 61 | 0.3 |
| II-521 | NAI · 105 (Midori Kagaku Co., Ltd.) | 60 | 0.3 |

As a result, it was found possible to form a line and space pattern of 0.15 μm in line width in any of examples.
(Synthesis Example II-66)

The preparation of copolymer performed in Synthesis Example II-43 was repeated except that the ratio of dimenthyl methacrylate, t-butyl methacrylate and methacrylic acid was changed to 15:55:30 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-522 to II-529, chemically amplified resists containing the copolymer obtained in the above Synthesis Example II-66 were respectively synthesized and were examined of their properties.

Example II-522 to Example II-525

The preparation of chemically amplified resists as performed in (Example II-4) to (Example II-7) were repeated except that the copolymer of Synthesis Example II-2 was replaced by the copolymer obtained in Synthesis Example II-66. Using the resists, patterns were formed in the same manner as explained above, and the properties of these patterns were evaluated.

Further, as in the case of Synthesis Example II-1, the transparency and dry etch resistance were evaluated. The results obtained were summarized in Table 238 below together with the photo-acid generator employed. The values of etch rate were based on that of PMMA.

TABLE 238

| Example | Photo-acid generator | Light transmittance (1 μm) % | Etch rate (relative value) |
|---|---|---|---|
| II-522 | Triphenyl sulfonium triflate | 60 | 0.3 |
| II-523 | Diphenyl iodonium triflate | 59 | 0.3 |
| II-524 | NAT · 105 (Midori Kagaku Co., Ltd.) | 61 | 0.3 |
| II-525 | NAI · 105 (Midori Kagaku Co., Ltd.) | 60 | 0.3 |

As a result, it was found possible to form a line and space pattern of 0.15 μm in line width in any of examples.

Example II-526 to Example II-529

The preparation of chemically amplified resists as performed in (Example II-8) to (Example II-11) were repeated except that the copolymer of Synthesis Example II-2 was replaced by the copolymer obtained in Synthesis Example II-66. Using the resists, patterns were formed in the same manner as explained above, and the properties of these patterns were evaluated.

Further, as in the case of Synthesis Example II-1, the transparency and dry etch resistance were evaluated. The results obtained were summarized in Table 239 below together with the photo-acid generator employed. The values of etch rate were based on that of PMMA.

TABLE 239

| Example | Photo-acid generator | Light transmittance (1 μm) % | Etch rate (relative value) |
| --- | --- | --- | --- |
| II-526 | Triphenyl sulfonium triflate | 55 | 0.3 |
| II-527 | Diphenyl iodonium triflate | 59 | 0.3 |
| II-528 | NAT · 105 (Midori Kagaku Co., Ltd.) | 61 | 0.3 |
| II-529 | NAI · 105 (Midori Kagaku Co., Ltd.) | 60 | 0.3 |

As a result, it was found possible to form a line and space pattern of 0.15 μm in line width in any of examples.

(Synthesis Example II-67)

The preparation of copolymer performed in Synthesis Example II-43 was repeated except that the ratio of dimenthyl methacrylate, t-butyl methacrylate and methacrylic acid was changed to 15:50:35 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-530 to II-537, chemically amplified resists containing the copolymer obtained in the above Synthesis Example II-67 were respectively synthesized and were examined of their properties.

Example II-530 to Example II-533

The preparation of chemically amplified resists as performed in (Example II-4) to (Example II-7) were repeated except that the copolymer of Synthesis Example II-2 was replaced by the copolymer obtained in Synthesis Example II-67. Using the resists, patterns were formed in the same manner as explained above, and the properties of these patterns were evaluated.

Further, as in the case of Synthesis Example II-1, the transparency and dry etch resistance were evaluated. The results obtained were summarized in Table 240 below together with the photo-acid generator employed. The values of etch rate were based on that of PMMA.

TABLE 240

| Example | Photo-acid generator | Light transmittance (1 μm) % | Etch rate (relative value) |
| --- | --- | --- | --- |
| II-530 | Triphenyl sulfonium triflate | 60 | 0.3 |
| II-531 | Diphenyl iodonium triflate | 59 | 0.3 |

TABLE 240-continued

| Example | Photo-acid generator | Light transmittance (1 μm) % | Etch rate (relative value) |
| --- | --- | --- | --- |
| II-532 | NAT · 105 (Midori Kagaku Co., Ltd.) | 61 | 0.3 |
| II-533 | NAI · 105 (Midori Kagaku Co., Ltd.) | 60 | 0.3 |

As a result, it was found possible to form a line and space pattern of 0.15 μm in line width in any of examples.

Example II-534 to Example II-537

The preparation of chemically amplified resists as performed in (Example II-8) to (Example II-11) were repeated except that the copolymer of Synthesis Example II-2 was replaced by the copolymer obtained in Synthesis Example II-67. Using the resists, patterns were formed in the same manner as explained above, and the properties of these patterns were evaluated.

Further, as in the case of Synthesis Example II-1, the transparency and dry etch resistance were evaluated. The results obtained were summarized in Table 241 below together with the photo-acid generator employed. The values of etch rate were based on that of PMMA.

TABLE 241

| Example | Photo-acid generator | Light transmittance (1 μm) % | Etch rate (relative value) |
| --- | --- | --- | --- |
| II-534 | Triphenyl sulfonium triflate | 55 | 0.3 |
| II-535 | Diphenyl iodonium triflate | 59 | 0.3 |
| II-536 | NAT · 105 (Midori Kagaku Co., Ltd.) | 61 | 0.3 |
| II-537 | NAI · 105 (Midori Kagaku Co., Ltd.) | 60 | 0.3 |

As a result, it was found possible to form a line and space pattern of 0.15 μm in line width in any of examples.

(Synthesis Example II-68)

The preparation of copolymer performed in Synthesis Example II-43 was repeated except that the ratio of dimenthyl methacrylate, t-butyl methacrylate and methacrylic acid was changed to 15:45:40 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-538 to II-545, chemically amplified resists containing the copolymer obtained in the above Synthesis Example II-68 were respectively synthesized and were examined of their properties.

Example II-538 to Example II-541

The preparation of chemically amplified resists as performed in (Example II-4) to (Example II-7) were repeated except that the copolymer of Synthesis Example II-2 was replaced by the copolymer obtained in Synthesis Example II-68. Using the resists, patterns were formed in the same manner as explained above, and the properties of these patterns were evaluated.

Further, as in the case of Synthesis Example II-1, the transparency and dry etch resistance were evaluated. The results obtained were summarized in Table 242 below together with the photo-acid generator employed. The values of etch rate were based on that of PMMA.

TABLE 242

| Example | Photo-acid generator | Light transmittance (1 μm) % | Etch rate (relative value) |
|---|---|---|---|
| II-538 | Triphenyl sulfonium triflate | 60 | 0.3 |
| II-539 | Diphenyl iodonium triflate | 59 | 0.3 |
| II-540 | NAT · 105 (Midori Kagaku Co., Ltd.) | 61 | 0.3 |
| II-541 | NAI · 105 (Midori Kagaku Co., Ltd.) | 60 | 0.3 |

As a result, it was found possible to form a line and space pattern of 0.15 μm in line width in any of examples.

Example II-542 to Example II-545

The preparation of chemically amplified resists as performed in (Example II-8) to (Example II-11) were repeated except that the copolymer of Synthesis Example II-2 was replaced by the copolymer obtained in Synthesis Example II-68. Using the resists, patterns were formed in the same manner as explained above, and the properties of these patterns were evaluated.

Further, as in the case of Synthesis Example II-1, the transparency and dry etch resistance were evaluated. The results obtained were summarized in Table 243 below together with the photo-acid generator employed. The values of etch rate were based on that of PMMA.

TABLE 243

| Example | Photo-acid generator | Light transmittance (1 μm) % | Etch rate (relative value) |
|---|---|---|---|
| II-542 | Triphenyl sulfonium triflate | 55 | 0.3 |
| II-543 | Diphenyl iodonium triflate | 59 | 0.3 |
| II-544 | NAT · 105 (Midori Kagaku Co., Ltd.) | 61 | 0.3 |

TABLE 243-continued

| Example | Photo-acid generator | Light transmittance (1 μm) % | Etch rate (relative value) |
|---|---|---|---|
| II-545 | NAI · 105 (Midori Kagaku Co., Ltd.) | 60 | 0.3 |

As a result, it was found possible to form a line and space pattern of 0.15 μm in line width in any of examples.
(Synthesis Example II-69)

The preparation of copolymer performed in Synthesis Example II-43 was repeated except that the ratio of dimenthyl methacrylate, t-butyl methacrylate and methacrylic acid was changed to 15:40:45 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-546 to II-553, chemically amplified resists containing the copolymer obtained in the above Synthesis Example II-69 were respectively synthesized and were examined of their properties.

Example II-546 to Example II-549

The preparation of chemically amplified resists as performed in (Example II-4) to (Example II-7) were repeated except that the copolymer of Synthesis Example II-2 was replaced by the copolymer obtained in Synthesis Example II-69. Using the resists, patterns were formed in the same manner as explained above, and the properties of these patterns were evaluated.

Further, as in the case of Synthesis Example II-1, the transparency and dry etch resistance were evaluated. The results obtained were summarized in Table 244 below together with the photo-acid generator employed. The values of etch rate were based on that of PMMA.

TABLE 244

| Example | Photo-acid generator | Light transmittance (1 μm) % | Etch rate (relative value) |
|---|---|---|---|
| II-546 | Triphenyl sulfonium triflate | 60 | 0.3 |
| II-547 | Diphenyl iodonium triflate | 59 | 0.3 |
| II-548 | NAT · 105 (Midori Kagaku Co., Ltd.) | 61 | 0.3 |
| II-549 | NAI · 105 (Midori Kagaku Co., Ltd.) | 60 | 0.3 |

As a result, it was found possible to form a line and space pattern of 0.15 μm in line width in any of examples.

Example II-550 to Example II-553

The preparation of chemically amplified resists as performed in (Example II-8) to (Example II-11) were repeated except that the copolymer of Synthesis Example II-2 was replaced by the copolymer obtained in Synthesis Example II-69. Using the resists, patterns were formed in the same manner as explained above, and the properties of these patterns were evaluated.

Further, as in the case of Synthesis Example II-1, the transparency and dry etch resistance were evaluated. The results obtained were summarized in Table 245 below together with the photo-acid generator employed. The values of etch rate were based on that of PMMA.

TABLE 245

| Example | Photo-acid generator | Light transmittance (1 μm) % | Etch rate (relative value) |
|---|---|---|---|
| II-550 | Triphenyl sulfonium triflate | 55 | 0.3 |
| II-551 | Diphenyl iodonium triflate | 59 | 0.3 |
| II-552 | NAT · 105 (Midori Kagaku Co., Ltd.) | 61 | 0.3 |
| II-553 | NAI · 105 (Midori Kagaku Co., Ltd.) | 60 | 0.3 |

As a result, it was found possible to form a line and space pattern of 0.15 μm in line width in any of examples.

(Synthesis Example II-70)

The preparation of copolymer performed in Synthesis Example II-43 was repeated except that the ratio of dimenthyl methacrylate, t-butyl methacrylate and methacrylic acid was changed to 15:35:50 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-554 to II-561, chemically amplified resists containing the copolymer obtained in the above Synthesis Example II-70 were respectively synthesized and were examined of their properties.

Example II-554 to Example II-557

The preparation of chemically amplified resists as performed in (Example II-4) to (Example II-7) were repeated except that the copolymer of Synthesis Example II-2 was replaced by the copolymer obtained in Synthesis Example II-70. Using the resists, patterns were formed in the same manner as explained above, and the properties of these patterns were evaluated.

Further, as in the case of Synthesis Example II-1, the transparency and dry etch resistance were evaluated. The results obtained were summarized in Table 246 below together with the photo-acid generator employed. The values of etch rate were based on that of PMMA.

TABLE 246

| Example | Photo-acid generator | Light transmittance (1 μm) % | Etch rate (relative value) |
|---|---|---|---|
| II-554 | Triphenyl sulfonium triflate | 60 | 0.3 |
| II-555 | Diphenyl iodonium triflate | 59 | 0.3 |
| II-556 | NAT · 105 (Midori Kagaku Co., Ltd.) | 61 | 0.3 |
| II-557 | NAI · 105 (Midori Kagaku Co., Ltd.) | 60 | 0.3 |

As a result, it was found possible to form a line and space pattern of 0.15 μm in line width in any of examples.

Example II-558 to Example II-561

The preparation of chemically amplified resists as performed in (Example II-8) to (Example II-11) were repeated except that the copolymer of Synthesis Example II-2 was replaced by the copolymer obtained in Synthesis Example II-70. Using the resists, patterns were formed in the same manner as explained above, and the properties of these patterns were evaluated.

Further, as in the case of Synthesis Example II-1, the transparency and dry etch resistance were evaluated. The results obtained were summarized in Table 247 below together with the photo-acid generator employed. The values of etch rate were based on that of PMMA.

TABLE 247

| Example | Photo-acid generator | Light transmittance (1 μm) % | Etch rate (relative value) |
|---|---|---|---|
| II-558 | Triphenyl sulfonium triflate | 55 | 0.3 |
| II-559 | Diphenyl iodonium triflate | 59 | 0.3 |
| II-560 | NAT · 105 (Midori Kagaku Co., Ltd.) | 61 | 0.3 |
| II-561 | NAI · 105 (Midori Kagaku Co., Ltd.) | 60 | 0.3 |

As a result, it was found possible to form a line and space pattern of 0.15 μm in line width in any of examples.

(Synthesis Example II-71)

The preparation of copolymer performed in Synthesis Example II-43 was repeated except that the ratio of dimenthyl methacrylate, t-butyl methacrylate and methacrylic acid was changed to 15:30:55 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-562 to II-569, chemically amplified resists containing the copolymer obtained in the above Synthesis Example II-71 were respectively synthesized and were examined of their properties.

Example II-562 to Example II-565

The preparation of chemically amplified resists as performed in (Example II-4) to (Example II-7) were repeated except that the copolymer of Synthesis Example II-2 was replaced by the copolymer obtained in Synthesis Example II-71. Using the resists, patterns were formed in the same manner as explained above, and the properties of these patterns were evaluated.

Further, as in the case of Synthesis Example II-1, the transparency and dry etch resistance were evaluated. The results obtained were summarized in Table 248 below together with the photo-acid generator employed. The values of etch rate were based on that of PMMA.

TABLE 248

| Example | Photo-acid generator | Light transmittance (1 μm) % | Etch rate (relative value) |
| --- | --- | --- | --- |
| II-562 | Triphenyl sulfonium triflate | 60 | 0.3 |
| II-563 | Diphenyl iodonium triflate | 59 | 0.3 |
| II-564 | NAT · 105 (Midori Kagaku Co., Ltd.) | 61 | 0.3 |
| II-565 | NAI · 105 (Midori Kagaku Co., Ltd.) | 60 | 0.3 |

As a result, it was found possible to form a line and space pattern of 0.15 μm in line width in any of examples.

Example II-566 to Example II-569

The preparation of chemically amplified resists as performed in (Example II-8) to (Example II-11) were repeated except that the copolymer of Synthesis Example II-2 was replaced by the copolymer obtained in Synthesis Example II-71. Using the resists, patterns were formed in the same manner as explained above, and the properties of these patterns were evaluated.

Further, as in the case of Synthesis Example II-1, the transparency and dry etch resistance were evaluated. The results obtained were summarized in Table 249 below together with the photo-acid generator employed. The values of etch rate were based on that of PMMA.

TABLE 249

| Example | Photo-acid generator | Light transmittance (1 μm) % | Etch rate (relative value) |
| --- | --- | --- | --- |
| II-566 | Triphenyl sulfonium triflate | 55 | 0.3 |
| II-567 | Diphenyl iodonium triflate | 59 | 0.3 |

TABLE 249-continued

| Example | Photo-acid generator | Light transmittance (1 μm) % | Etch rate (relative value) |
| --- | --- | --- | --- |
| II-568 | NAT · 105 (Midori Kagaku Co., Ltd.) | 61 | 0.3 |
| II-569 | NAI · 105 (Midori Kagaku Co., Ltd.) | 60 | 0.3 |

As a result, it was found possible to form a line and space pattern of 0.15 μm in line width in any of examples.

(Synthesis Example II-72)

The preparation of copolymer performed in Synthesis Example II-43 was repeated except that the ratio of dimenthyl methacrylate, t-butyl methacrylate and methacrylic acid was changed to 15:25:60 thereby obtaining a copolymer, which was then dissolved in cyclohexanone. The film formed on a quartz wafer using this solution was examined of its transparency to ArF excimer laser beam (193 nm). As a result, the light transmittance was found to be 74% indicating the superiority over that of PMMA.

The film was further measured of its etch rate by using carbon tetrafluoride ($CF_4$) gas in comparison with that of PMMA under the same conditions as in the Synthesis Example II-2, finding that the etch rate of this copolymer was found to be 0.3 when the etch rate of PMMA was assumed to be 1, thus indicating the superiority of the copolymer over that of PMMA.

In the following Examples II-570 to II-577, chemically amplified resists containing the copolymer obtained in the above Synthesis Example II-72 were respectively synthesized and were examined of their properties.

Example II-570 to Example II-573

The preparation of chemically amplified resists as performed in (Example II-4) to (Example II-7) were repeated except that the copolymer of Synthesis Example II-2 was replaced by the copolymer obtained in Synthesis Example II-72. Using the resists, patterns were formed in the same manner as explained above, and the properties of these patterns were evaluated.

Further, as in the case of Synthesis Example II-1, the transparency and dry etch resistance were evaluated. The results obtained were summarized in Table 250 below together with the photo-acid generator employed. The values of etch rate were based on that of PMMA.

TABLE 250

| Example | Photo-acid generator | Light transmittance (1 μm) % | Etch rate (relative value) |
| --- | --- | --- | --- |
| II-570 | Triphenyl sulfonium triflate | 60 | 0.3 |
| II-571 | Diphenyl iodonium triflate | 59 | 0.3 |
| II-572 | NAT · 105 (Midori Kagaku Co., Ltd.) | 61 | 0.3 |
| II-573 | NAI · 105 (Midori Kagaku Co., Ltd.) | 60 | 0.3 |

As a result, it was found possible to form a line and space pattern of 0.15 μm in line width in any of examples.

Example II-574 to Example II-577

The preparation of chemically amplified resists as performed in (Example II-8) to (Example II-11) were repeated except that the copolymer of Synthesis Example II-2 was replaced by the copolymer obtained in Synthesis Example II-72. Using the resists, patterns were formed in the same manner as explained above, and the properties of these patterns were evaluated.

Further, as in the case of Synthesis Example II-1, the transparency and dry etch resistance were evaluated. The results obtained were summarized in Table 251 below together with the photo-acid generator employed. The values of etch rate were based on that of PMMA.

TABLE 251

| Example | Photo-acid generator | Light transmittance (1 μm) % | Etch rate (relative value) |
|---|---|---|---|
| II-574 | Triphenyl sulfonium triflate | 55 | 0.3 |
| II-575 | Diphenyl iodonium triflate | 59 | 0.3 |
| II-576 | NAT · 105 (Midori Kagaku Co., Ltd.) | 61 | 0.3 |
| II-577 | NAI · 105 (Midori Kagaku Co., Ltd.) | 60 | 0.3 |

As a result, it was found possible to form a line and space pattern of 0.15 μm in line width in any of examples.

(Synthesis Example II-73)

26 g of acrylic acid, 24 g of menthol and 15 g of p-toluenesulfonic acid in 500 mL of toluene were heated under reflux at an oil temperature of 150° C. for 19 h. Subsequently, the reaction mixture was quenched by the addition of salt saturated sodium bicarbonate solution. The mixture was then extracted with ether, the organic layers were combined and washed with salt saturated sodium bicarbonate solution and then with an aqueous solution of sodium hydride, salt saturated ammonium chloride solution, and then dried over salt saturated brine and sodium sulfate anhydrous. Finally, the resultant oily product was evaporated under reduced pressure to obtain menthyl acrylate.

(Evaluation of homopolymer derived from the monomer obtained in Synthesis Example II-73)

5 g of menthyl acrylate and 0.25 g of azoisobutylonitrile as a polymerization initiator were dissolved in 20 mL of THF.

The resultant solution was frozen with liquid nitrogen, and warmed to room temperature after repeating a 20 minute degassing of it three times. Then, the solution was heated in a nitrogen stream at oil temperature of 70° C. for 16 h. Then, the reaction was quenched by the addition of 600 mL of methanol. After being reprecipitated with methanol, the product was filtered and evaporated under vacuum thereby obtaining polymenthyl acrylate.

This polymenthyl acrylate was dissolved in cyclohexanone, and the resultant solution was coated on a quartz wafer to examine of its transparency to ArF excimer laser beam (193 nm). As a result, the light transmittance of the polymenthyl acrylate film thus formed was found to be 43% which was almost equivalent to PMMA.

The film was further measured of its etch rate by using carbon tetrafluoride ($CF_4$) gas under the same conditions as in the case of the monomer obtained in Synthesis Example II-1. As a result, the etch rate of the polymenthyl acrylate film was found to be 0.3 when the etch rate of PMMA was assumed to be 1, indicating the excellency of the polymenthyl acrylate film over PMMA.

In the following Examples II-579 to II-581, copolymers containing polymenthyl acrylate obtained in the above Synthesis Example II-73 were respectively synthesized to prepare photosensitive materials containing the copolymer which were then examined of their properties.

Example II-579

9 g of menthyl acrylate, 1 g of glycidyl methacrylate and 0.5 g of azoisobutylonitrile as a polymerizing initiator were dissolved in 30 mL of toluene.

The resultant solution was subjected to reaction in the same manner as in Example II-1 to obtain an aimed copolymer, which was dissolved methyl 3-methoxypropionate and the resultant solution was coated on a silicon wafer in the same manner as in Example II-1 to form a pattern to which evaluation was made.

As result, it was found possible to form a negative line and space pattern of 0.5 μm in line width.

Example II-580

9 g of menthyl acrylate, 1 g of allyl methacrylate and 0.5 g of azoisobutylonitrile as a polymerization initiator were dissolved in 30 mL of toluene.

The resultant solution was subjected to reaction in the same manner as in Example II-2 to obtain an aimed copolymer, which was dissolved methyl 3-methoxypropionate and the resultant solution was coated on a silicon wafer in the same manner as in Example II-2 to form a pattern to which evaluation was made.

As result, it was found possible to form a negative line and space pattern of 0.5 μm in line width.

Example II-581

5 g of menthyl acrylate, 5 g of α-chlorotrifluoroethyl acrylate and 0.5 g of azoisobutylonitrile as a polymerization initiator were dissolved in 28 mL of THF.

The resultant solution was subjected to reaction in the same manner as in Example II-3 to obtain an aimed copolymer, which was dissolved methyl 3-methoxypropionate and the resultant solution was coated on a silicon wafer in the same manner as in Example II-3 to form a pattern to which evaluation was made.

As result, it was found possible to form a positive line and space pattern of 0.5 μm in line width.

(Synthesis Example II-74)

In this Synthesis Example, another copolymer containing a monomer obtained in the above Synthesis Example II-73 was synthesized and then examined of its properties.

Namely, menthyl acrylate, t-butyl methacrylate and methacrylic acid were mixed in the ratio of 50:30:20 to prepare 10 g of the mixture, which was then dissolved in 40 mL of THF together with 0.5 g of azoisobutylonitrile as a polymerization initiator.

The resultant solution was frozen with liquid nitrogen, and warmed to room temperature after repeating a 20 minute degassing of it five times. Then, the solution was heated in a nitrogen stream at oil temperature of 60° C. for 9 h. Then, the reaction was quenched by the addition of hexane. After being reprecipitated with hexane, the product was filtered and evaporated under vacuum thereby obtaining an aimed copolymer.

This copolymer was dissolved in cyclohexanone in the same manner as in Synthesis Example II-1, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-582 to II-589, chemically amplified resists containing the copolymer obtained in Synthesis Example II-74 were synthesized and were examined of their properties.

Example II-582 to Example II-585

The preparation of chemically amplified resists as performed in (Example II-4) to (Example II-7) were repeated except that the copolymer of Synthesis Example II-2 was replaced by the copolymer obtained in Synthesis Example II-74. Using the resists, patterns were formed in the same manner as explained above, and the properties of these patterns were evaluated.

Further, as in the case of Synthesis Example II-1, the transparency and dry etch resistance were evaluated. The results obtained were summarized in Table 252 below together with the photo-acid generator employed. The values of etch rate were based on that of PMMA.

TABLE 252

| Example | Photo-acid generator | Light transmittance (1 μm) % | Etch rate (relative value) |
|---|---|---|---|
| II-582 | Triphenyl sulfonium triflate | 60 | 0.3 |
| II-583 | Diphenyl iodonium triflate | 59 | 0.3 |
| II-584 | NAT · 105 (Midori Kagaku Co., Ltd.) | 61 | 0.3 |
| II-585 | NAI · 105 (Midori Kagaku Co., Ltd.) | 60 | 0.3 |

As a result, it was found possible to form a line and space pattern of 0.15 μm in line width in any of examples.

Example II-586 to Example II-589

The preparation of chemically amplified resists as performed in (Example II-8) to (Example II-11) were repeated except that the copolymer of Synthesis Example II-2 was replaced by the copolymer obtained in Synthesis Example II-74. Using the resists, patterns were formed in the same manner as explained above, and the properties of these patterns were evaluated.

Further, as in the case of Synthesis Example II-1, the transparency and dry etch resistance were evaluated. The results obtained were summarized in Table 253 below together with the photo-acid generator employed. The values of etch rate were based on that of PMMA.

TABLE 253

| Example | Photo-acid generator | Light transmittance (1 μm) % | Etch rate (relative value) |
|---|---|---|---|
| II-586 | Triphenyl sulfonium triflate | 55 | 0.3 |
| II-587 | Diphenyl iodonium triflate | 59 | 0.3 |
| II-588 | NAT · 105 (Midori Kagaku Co., Ltd.) | 61 | 0.3 |
| II-589 | NAI · 105 (Midori Kagaku Co., Ltd.) | 60 | 0.3 |

As a result, it was found possible to form a line and space pattern of 0.15 μm in line width in any of examples.

(Synthesis Example II-75)

The procedures of Synthesis Example II-74 were repeated except that menthyl acrylate, t-butyl methacrylate and methacrylic acid were mixed in the ratio of 50:25:25 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-590 to II-597, chemically amplified resists containing the copolymer obtained in Synthesis Example II-75 were synthesized and were examined of their properties.

Example II-590 to Example II-593

The preparation of chemically amplified resists as performed in (Example II-4) to (Example II-7) were repeated except that the copolymer of Synthesis Example II-2 was replaced by the copolymer obtained in Synthesis Example II-75. Using the resists, patterns were formed in the same manner as explained above, and the properties of these patterns were evaluated.

Further, as in the case of Synthesis Example II-1, the transparency and dry etch resistance were evaluated. The results obtained were summarized in Table 254 below together with the photo-acid generator employed. The values of etch rate were based on that of PMMA.

TABLE 254

| Example | Photo-acid generator | Light transmittance (1 μm) % | Etch rate (relative value) |
|---|---|---|---|
| II-590 | Triphenyl sulfonium triflate | 60 | 0.3 |
| II-591 | Diphenyl iodonium triflate | 59 | 0.3 |
| II-592 | NAT · 105 (Midori Kagaku Co., Ltd.) | 61 | 0.3 |
| II-593 | NAI · 105 (Midori Kagaku Co., Ltd.) | 60 | 0.3 |

As a result, it was found possible to form a line and space pattern of 0.15 μm in line width in any of examples.

Example II-594 to Example II-597

The preparation of chemically amplified resists as performed in (Example II-8) to (Example II-11) were repeated except that the copolymer of Synthesis Example II-2 was replaced by the copolymer obtained in Synthesis Example II-75. Using the resists, patterns were formed in the same manner as explained above, and the properties of these patterns were evaluated.

Further, as in the case of Synthesis Example II-1, the transparency and dry etch resistance were evaluated. The results obtained were summarized in Table 255 below together with the photo-acid generator employed. The values of etch rate were based on that of PMMA.

TABLE 255

| Example | Photo-acid generator | Light transmittance (1 μm) % | Etch rate (relative value) |
|---|---|---|---|
| II-594 | Triphenyl sulfonium triflate | 55 | 0.3 |
| II-595 | Diphenyl iodonium triflate | 59 | 0.3 |
| II-596 | NAT · 105 (Midori Kagaku Co., Ltd.) | 61 | 0.3 |
| II-597 | NAI · 105 (Midori Kagaku Co., Ltd.) | 60 | 0.3 |

As a result, it was found possible to form a line and space pattern of 0.15 μm in line width in any of examples.
(Synthesis Example II-76)

The procedures of Synthesis Example II-74 were repeated except that menthyl acrylate, t-butyl methacrylate and methacrylic acid were mixed in the ratio of 50:20:30 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-598 to II-601, chemically amplified resists containing the copolymer obtained in Synthesis Example II-76 were synthesized and were examined of their properties.

Example II-598 to Example II-601

The preparation of chemically amplified resists as performed in (Example II-4) to (Example II-7) were repeated except that the copolymer of Synthesis Example II-2 was replaced by the copolymer obtained in Synthesis Example II-76. Using the resists, patterns were formed in the same manner as explained above, and the properties of these patterns were evaluated.

Further, as in the case of Synthesis Example II-1, the transparency and dry etch resistance were evaluated. The results obtained were summarized in Table 256 below together with the photo-acid generator employed. The values of etch rate were based on that of PMMA.

TABLE 256

| Example | Photo-acid generator | Light transmittance (1 μm) % | Etch rate (relative value) |
|---|---|---|---|
| II-598 | Triphenyl sulfonium triflate | 60 | 0.3 |
| II-599 | Diphenyl iodonium triflate | 59 | 0.3 |
| II-600 | NAT · 105 (Midori Kagaku Co., Ltd.) | 61 | 0.3 |
| II-601 | NAI · 105 (Midori Kagaku Co., Ltd.) | 60 | 0.3 |

As a result, it was found possible to form a line and space pattern of 0.15 μm in line width in any of examples.

Example II-602 to Example II-605

The preparation of chemically amplified resists as performed in (Example II-8) to (Example II-11) were repeated except that the copolymer of Synthesis Example II-2 was replaced by the copolymer obtained in Synthesis Example II-76. Using the resists, patterns were formed in the same manner as explained above, and the properties of these patterns were evaluated.

Further, as in the case of Synthesis Example II-1, the transparency and dry etch resistance were evaluated. The results obtained were summarized in Table 257 below together with the photo-acid generator employed. The values of etch rate were based on that of PMMA.

TABLE 257

| Example | Photo-acid generator | Light transmittance (1 μm) % | Etch rate (relative value) |
|---|---|---|---|
| II-602 | Triphenyl sulfonium triflate | 55 | 0.3 |
| II-603 | Diphenyl iodonium triflate | 59 | 0.3 |
| II-604 | NAT · 105 (Midori Kagaku Co., Ltd.) | 61 | 0.3 |

TABLE 257-continued

| Example | Photo-acid generator | Light transmittance (1 μm) % | Etch rate (relative value) |
|---|---|---|---|
| II-605 | NAI · 105 (Midori Kagaku Co., Ltd.) | 60 | 0.3 |

As a result, it was found possible to form a line and space pattern of 0.15 μm in line width in any of examples.

(Synthesis Example II-77)

The procedures of Synthesis Example II-74 were repeated except that menthyl acrylate, t-butyl methacrylate and methacrylic acid were mixed in the ratio of 45:35:20 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-606 to II-613, chemically amplified resists containing the copolymer obtained in Synthesis Example II-77 were synthesized and were examined of their properties.

Example II-606 to Example II-609

The preparation of chemically amplified resists as performed in (Example II-4) to (Example II-7) were repeated except that the copolymer of Synthesis Example II-2 was replaced by the copolymer obtained in Synthesis Example II-77. Using the resists, patterns were formed in the same manner as explained above, and the properties of these patterns were evaluated.

Further, as in the case of Synthesis Example II-1, the transparency and dry etch resistance were evaluated. The results obtained were summarized in Table 258 below together with the photo-acid generator employed. The values of etch rate were based on that of PMMA.

TABLE 258

| Example | Photo-acid generator | Light transmittance (1 μm) % | Etch rate (relative value) |
|---|---|---|---|
| II-606 | Triphenyl sulfonium triflate | 60 | 0.3 |
| II-607 | Diphenyl iodonium triflate | 59 | 0.3 |
| II-608 | NAT · 105 (Midori Kagaku Co., Ltd.) | 61 | 0.3 |
| II-609 | NAI · 105 (Midori Kagaku Co., Ltd.) | 60 | 0.3 |

As a result, it was found possible to form a line and space pattern of 0.15 μm in line width in any of examples.

Example II-610 to Example II-613

The preparation of chemically amplified resists as performed in (Example II-8) to (Example II-11) were repeated except that the copolymer of Synthesis Example II-2 was replaced by the copolymer obtained in Synthesis Example II-77. Using the resists, patterns were formed in the same manner as explained above, and the properties of these patterns were evaluated.

Further, as in the case of Synthesis Example II-1, the transparency and dry etch resistance were evaluated. The results obtained were summarized in Table 259 below together with the photo-acid generator employed. The values of etch rate were based on that of PMMA.

TABLE 259

| Example | Photo-acid generator | Light transmittance (1 μm) % | Etch rate (relative value) |
|---|---|---|---|
| II-610 | Triphenyl sulfonium triflate | 55 | 0.3 |
| II-611 | Diphenyl iodonium triflate | 59 | 0.3 |
| II-612 | NAT · 105 (Midori Kagaku Co., Ltd.) | 61 | 0.3 |
| II-613 | NAI · 105 (Midori Kagaku Co., Ltd.) | 60 | 0.3 |

As a result, it was found possible to form a line and space pattern of 0.15 μm in line width in any of examples.

(Synthesis Example II-78)

The procedures of Synthesis Example II-74 were repeated except that menthyl acrylate, t-butyl methacrylate and methacrylic acid were mixed in the ratio of 45:30:25 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-614 to II-621, chemically amplified resists containing the copolymer obtained in Synthesis Example II-78 were synthesized and were examined of their properties.

Example II-614 to Example II-617

The preparation of chemically amplified resists as performed in (Example II-4) to (Example II-7) were repeated except that the copolymer of Synthesis Example II-2 was replaced by the copolymer obtained in Synthesis Example II-78. Using the resists, patterns were formed in the same manner as explained above, and the properties of these patterns were evaluated.

Further, as in the case of Synthesis Example II-1, the transparency and dry etch resistance were evaluated. The results obtained were summarized in Table 260 below together with the photo-acid generator employed. The values of etch rate were based on that of PMMA.

TABLE 260

| Example | Photo-acid generator | Light transmittance (1 μm) % | Etch rate (relative value) |
|---|---|---|---|
| II-614 | Triphenyl sulfonium triflate | 60 | 0.3 |
| II-615 | Diphenyl iodonium triflate | 59 | 0.3 |
| II-616 | NAT · 105 (Midori Kagaku Co., Ltd.) | 61 | 0.3 |
| II-617 | NAI · 105 (Midori Kagaku Co., Ltd.) | 60 | 0.3 |

As a result, it was found possible to form a line and space pattern of 0.15 μm in line width in any of examples.

Example II-618 to Example II-621

The preparation of chemically amplified resists as performed in (Example II-8) to (Example II-11) were repeated except that the copolymer of Synthesis Example II-2 was replaced by the copolymer obtained in Synthesis Example II-78. Using the resists, patterns were formed in the same manner as explained above, and the properties of these patterns were evaluated.

Further, as in the case of Synthesis Example II-1, the transparency and dry etch resistance were evaluated. The results obtained were summarized in Table 261 below together with the photo-acid generator employed. The values of etch rate were based on that of PMMA.

TABLE 261

| Example | Photo-acid generator | Light transmittance (1 μm) % | Etch rate (relative value) |
|---|---|---|---|
| II-618 | Triphenyl sulfonium triflate | 55 | 0.3 |
| II-619 | Diphenyl iodonium triflate | 59 | 0.3 |
| II-620 | NAT · 105 (Midori Kagaku Co., Ltd.) | 61 | 0.3 |
| II-621 | NAI · 105 (Midori Kagaku Co., Ltd.) | 60 | 0.3 |

As a result, it was found possible to form a line and space pattern of 0.15 μm in line width in any of examples.
(Synthesis Example II-79)

The procedures of Synthesis Example II-74 were repeated except that menthyl acrylate, t-butyl methacrylate and methacrylic acid were mixed in the ratio of 45:25:30 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-622 to II-629, chemically amplified resists containing the copolymer obtained in Synthesis Example II-79 were synthesized and were examined of their properties.

Example II-622 to Example II-625

The preparation of chemically amplified resists as performed in (Example II-4) to (Example II-7) were repeated except that the copolymer of Synthesis Example II-2 was replaced by the copolymer obtained in Synthesis Example II-79. Using the resists, patterns were formed in the same manner as explained above, and the properties of these patterns were evaluated.

Further, as in the case of Synthesis Example II-1, the transparency and dry etch resistance were evaluated. The results obtained were summarized in Table 262 below together with the photo-acid generator employed. The values of etch rate were based on that of PMMA.

TABLE 262

| Example | Photo-acid generator | Light transmittance (1 μm) % | Etch rate (relative value) |
|---|---|---|---|
| II-622 | Triphenyl sulfonium triflate | 60 | 0.3 |
| II-623 | Diphenyl iodonium triflate | 59 | 0.3 |
| II-624 | NAT · 105 (Midori Kagaku Co., Ltd.) | 61 | 0.3 |
| II-625 | NAI · 105 (Midori Kagaku Co., Ltd.) | 60 | 0.3 |

As a result, it was found possible to form a line and space pattern of 0.15 μm in line width in any of examples.

Example II-626 to Example II-629

The preparation of chemically amplified resists as performed in (Example II-8) to (Example II-11) were repeated except that the copolymer of Synthesis Example II-2 was replaced by the copolymer obtained in Synthesis Example II-79. Using the resists, patterns were formed in the same manner as explained above, and the properties of these patterns were evaluated.

Further, as in the case of Synthesis Example II-1, the transparency and dry etch resistance were evaluated. The results obtained were summarized in Table 263 below together with the photo-acid generator employed. The values of etch rate were based on that of PMMA.

TABLE 263

| Example | Photo-acid generator | Light transmittance (1 μm) % | Etch rate (relative value) |
|---|---|---|---|
| II-626 | Triphenyl sulfonium triflate | 55 | 0.3 |
| II-627 | Diphenyl iodonium triflate | 59 | 0.3 |
| II-628 | NAT · 105 (Midori Kagaku Co., Ltd.) | 61 | 0.3 |
| II-629 | NAI · 105 (Midori Kagaku Co., Ltd.) | 60 | 0.3 |

As a result, it was found possible to form a line and space pattern of 0.15 μm in line width in any of examples.
(Synthesis Example II-80)

The procedures of Synthesis Example II-74 were repeated except that menthyl acrylate, t-butyl methacrylate and methacrylic acid were mixed in the ratio of 45:20:35 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-630 to II-637, chemically amplified resists containing the copolymer obtained in Synthesis Example II-80 were synthesized and were examined of their properties.

Example II-630 to Example II-633

The preparation of chemically amplified resists as performed in (Example II-4) to (Example II-7) were repeated except that the copolymer of Synthesis Example II-2 was replaced by the copolymer obtained in Synthesis Example II-80. Using the resists, patterns were formed in the same manner as explained above, and the properties of these patterns were evaluated.

Further, as in the case of Synthesis Example II-1, the transparency and dry etch resistance were evaluated. The results obtained were summarized in Table 264 below together with the photo-acid generator employed. The values of etch rate were based on that of PMMA.

TABLE 264

| Example | Photo-acid generator | Light transmittance (1 μm) % | Etch rate (relative value) |
|---|---|---|---|
| II-630 | Triphenyl sulfonium triflate | 60 | 0.3 |
| II-631 | Diphenyl iodonium triflate | 59 | 0.3 |
| II-632 | NAT · 105 (Midori Kagaku Co., Ltd.) | 61 | 0.3 |
| II-633 | NAI · 105 (Midori Kagaku Co., Ltd.) | 60 | 0.3 |

As a result, it was found possible to form a line and space pattern of 0.15 μm in line width in any of examples.

Example II-634 to Example II-637

The preparation of chemically amplified resists as performed in (Example II-8) to (Example II-11) were repeated except that the copolymer of Synthesis Example II-2 was replaced by the copolymer obtained in Synthesis Example II-80. Using the resists, patterns were formed in the same manner as explained above, and the properties of these patterns were evaluated.

Further, as in the case of Synthesis Example II-1, the transparency and dry etch resistance were evaluated. The results obtained were summarized in Table 265 below together with the photo-acid generator employed. The values of etch rate were based on that of PMMA.

TABLE 265

| Example | Photo-acid generator | Light transmittance (1 μm) % | Etch rate (relative value) |
|---|---|---|---|
| II-634 | Triphenyl sulfonium triflate | 55 | 0.3 |
| II-635 | Diphenyl iodonium triflate | 59 | 0.3 |
| II-636 | NAT · 105 (Midori Kagaku Co., Ltd.) | 61 | 0.3 |
| II-637 | NAI · 105 (Midori Kagaku Co., Ltd.) | 60 | 0.3 |

As a result, it was found possible to form a line and space pattern of 0.15 μm in line width in any of examples.
(Synthesis Example II-81)

The procedures of Synthesis Example II-74 were repeated except that menthyl acrylate, t-butyl methacrylate and methacrylic acid were mixed in the ratio of 40:40:20 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-638 to II-645, chemically amplified resists containing the copolymer obtained in Synthesis Example II-81 were synthesized and were examined of their properties.

Example II-638 to Example II-641

The preparation of chemically amplified resists as performed in (Example II-4) to (Example II-7) were repeated except that the copolymer of Synthesis Example II-2 was replaced by the copolymer obtained in Synthesis Example II-81. Using the resists, patterns were formed in the same manner as explained above, and the properties of these patterns were evaluated.

Further, as in the case of Synthesis Example II-1, the transparency and dry etch resistance were evaluated. The results obtained were summarized in Table 266 below together with the photo-acid generator employed. The values of etch rate were based on that of PMMA.

TABLE 216

| Example | Photo-acid generator | Light transmittance (1 μm) % | Etch rate (relative value) |
| --- | --- | --- | --- |
| II-638 | Triphenyl sulfonium triflate | 60 | 0.3 |
| II-639 | Diphenyl iodonium triflate | 59 | 0.3 |
| II-640 | NAT · 105 (Midori Kagaku Co., Ltd.) | 61 | 0.3 |
| II-641 | NAI · 105 (Midori Kagaku Co., Ltd.) | 60 | 0.3 |

As a result, it was found possible to form a line and space pattern of 0.15 μm in line width in any of examples.

Example II-642 to Example II-645

The preparation of chemically amplified resists as performed in (Example II-8) to (Example II-11) were repeated except that the copolymer of Synthesis Example II-2 was replaced by the copolymer obtained in Synthesis Example II-81. Using the resists, patterns were formed in the same manner as explained above, and the properties of these patterns were evaluated.

Further, as in the case of Synthesis Example II-1, the transparency and dry etch resistance were evaluated. The results obtained were summarized in Table 267 below together with the photo-acid generator employed. The values of etch rate were based on that of PMMA.

TABLE 267

| Example | Photo-acid generator | Light transmittance (1 μm) % | Etch rate (relative value) |
| --- | --- | --- | --- |
| II-642 | Triphenyl sulfonium triflate | 55 | 0.3 |
| II-643 | Diphenyl iodonium triflate | 59 | 0.3 |
| II-644 | NAT · 105 (Midori Kagaku Co., Ltd.) | 61 | 0.3 |

TABLE 267-continued

| Example | Photo-acid generator | Light transmittance (1 μm) % | Etch rate (relative value) |
| --- | --- | --- | --- |
| II-645 | NAI · 105 (Midori Kagaku Co., Ltd.) | 60 | 0.3 |

As a result, it was found possible to form a line and space pattern of 0.15 μm in line width in any of examples.
(Synthesis Example II-82)

The procedures of Synthesis Example II-74 were repeated except that menthyl acrylate, t-butyl methacrylate and methacrylic acid were mixed in the ratio of 40:35:25 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-646 to II-653, chemically amplified resists containing the copolymer obtained in Synthesis Example II-82 were synthesized and were examined of their properties.

Example II-646 to Example II-649

The preparation of chemically amplified resists as performed in (Example II-4) to (Example II-7) were repeated except that the copolymer of Synthesis Example II-2 was replaced by the copolymer obtained in Synthesis Example II-82. Using the resists, patterns were formed in the same manner as explained above, and the properties of these patterns were evaluated.

Further, as in the case of Synthesis Example II-1, the transparency and dry etch resistance were evaluated. The results obtained were summarized in Table 268 below together with the photo-acid generator employed. The values of etch rate were based on that of PMMA.

TABLE 268

| Example | Photo-acid generator | Light transmittance (1 μm) % | Etch rate (relative value) |
| --- | --- | --- | --- |
| II-646 | Triphenyl sulfonium triflate | 60 | 0.3 |
| II-647 | Diphenyl iodonium triflate | 59 | 0.3 |
| II-648 | NAT · 105 (Midori Kagaku Co., Ltd.) | 61 | 0.3 |
| II-649 | NAI · 105 (Midori Kagaku Co., Ltd.) | 60 | 0.3 |

As a result, it was found possible to form a line and space pattern of 0.15 μm in line width in any of examples.

Example II-650 to Example II-653

The preparation of chemically amplified resists as performed in (Example II-8) to (Example II-11) were repeated except that the copolymer of Synthesis Example II-2 was replaced by the copolymer obtained in Synthesis Example II-82. Using the resists, patterns were formed in the same manner as explained above, and the properties of these patterns were evaluated.

Further, as in the case of Synthesis Example II-1, the transparency and dry etch resistance were evaluated. The results obtained were summarized in Table 269 below together with the photo-acid generator employed. The values of etch rate were based on that of PMMA.

TABLE 269

| Example | Photo-acid generator | Light transmittance (1 μm) % | Etch rate (relative value) |
|---|---|---|---|
| II-650 | Triphenyl sulfonium triflate | 55 | 0.3 |
| II-651 | Diphenyl iodonium triflate | 59 | 0.3 |
| II-652 | NAT · 105 (Midori Kagaku Co., Ltd.) | 61 | 0.3 |
| II-653 | NAI · 105 (Midori Kagaku Co., Ltd.) | 60 | 0.3 |

As a result, it was found possible to form a line and space pattern of 0.15 μm in line width in any of examples.

(Synthesis Example II-83)

The procedures of Synthesis Example II-74 were repeated except that menthyl acrylate, t-butyl methacrylate and methacrylic acid were mixed in the ratio of 40:30:30 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-654 to II-661, chemically amplified resists containing the copolymer obtained in Synthesis Example II-83 were synthesized and were examined of their properties.

Example II-654 to Example II-657

The preparation of chemically amplified resists as performed in (Example II-4) to (Example II-7) were repeated except that the copolymer of Synthesis Example II-2 was replaced by the copolymer obtained in Synthesis Example II-83. Using the resists, patterns were formed in the same manner as explained above, and the properties of these patterns were evaluated.

Further, as in the case of Synthesis Example II-1, the transparency and dry etch resistance were evaluated. The results obtained were summarized in Table 270 below together with the photo-acid generator employed. The values of etch rate were based on that of PMMA.

TABLE 270

| Example | Photo-acid generator | Light transmittance (1 μm) % | Etch rate (relative value) |
|---|---|---|---|
| II-654 | Triphenyl sulfonium triflate | 60 | 0.3 |
| II-655 | Diphenyl iodonium triflate | 59 | 0.3 |
| II-656 | NAT · 105 (Midori Kagaku Co., Ltd.) | 61 | 0.3 |
| II-657 | NAI · 105 (Midori Kagaku Co., Ltd.) | 60 | 0.3 |

As a result, it was found possible to form a line and space pattern of 0.15 μm in line width in any of examples.

Example II-658 to Example II-661

The preparation of chemically amplified resists as performed in (Example II-8) to (Example II-11) were repeated except that the copolymer of Synthesis Example II-2 was replaced by the copolymer obtained in Synthesis Example II-83. Using the resists, patterns were formed in the same manner as explained above, and the properties of these patterns were evaluated.

Further, as in the case of Synthesis Example II-1, the transparency and dry etch resistance were evaluated. The results obtained were summarized in Table 271 below together with the photo-acid generator employed. The values of etch rate were based on that of PMMA.

TABLE 271

| Example | Photo-acid generator | Light transmittance (1 μm) % | Etch rate (relative value) |
|---|---|---|---|
| II-658 | Triphenyl sulfonium triflate | 55 | 0.3 |
| II-659 | Diphenyl iodonium triflate | 59 | 0.3 |
| II-660 | NAT · 105 (Midori Kagaku Co., Ltd.) | 61 | 0.3 |
| II-661 | NAI · 105 (Midori Kagaku Co., Ltd.) | 60 | 0.3 |

As a result, it was found possible to form a line and space pattern of 0.15 μm in line width in any of examples.

(Synthesis Example II-84)

The procedures of Synthesis Example II-74 were repeated except that menthyl acrylate, t-butyl methacrylate and methacrylic acid were mixed in the ratio of 40:25:35 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-662 to II-669, chemically amplified resists containing the copolymer obtained in Synthesis Example II-84 were synthesized and were examined of their properties.

Example II-662 to Example II-665

The preparation of chemically amplified resists as performed in (Example II-4) to (Example II-7) were repeated except that the copolymer of Synthesis Example II-2 was replaced by the copolymer obtained in Synthesis Example II-84. Using the resists, patterns were formed in the same manner as explained above, and the properties of these patterns were evaluated.

Further, as in the case of Synthesis Example II-1, the transparency and dry etch resistance were evaluated. The results obtained were summarized in Table 272 below together with the photo-acid generator employed. The values of etch rate were based on that of PMMA.

TABLE 272

| Example | Photo-acid generator | Light transmittance (1 μm) % | Etch rate (relative value) |
| --- | --- | --- | --- |
| II-662 | Triphenyl sulfonium triflate | 60 | 0.3 |
| II-663 | Diphenyl iodonium triflate | 59 | 0.3 |
| II-664 | NAT · 105 (Midori Kagaku Co., Ltd.) | 61 | 0.3 |
| II-665 | NAI · 105 (Midori Kagaku Co., Ltd.) | 60 | 0.3 |

As a result, it was found possible to form a line and space pattern of 0.15 μm in line width in any of examples.

Example II-666 to Example II-669

The preparation of chemically amplified resists as performed in (Example II-8) to (Example II-11) were repeated except that the copolymer of Synthesis Example II-2 was replaced by the copolymer obtained in Synthesis Example II-84. Using the resists, patterns were formed in the same manner as explained above, and the properties of these patterns were evaluated.

Further, as in the case of Synthesis Example II-1, the transparency and dry etch resistance were evaluated. The results obtained were summarized in Table 273 below together with the photo-acid generator employed. The values of etch rate were based on that of PMMA.

TABLE 273

| Example | Photo-acid generator | Light transmittance (1 μm) % | Etch rate (relative value) |
| --- | --- | --- | --- |
| II-666 | Triphenyl sulfonium triflate | 55 | 0.3 |

TABLE 273-continued

| Example | Photo-acid generator | Light transmittance (1 μm) % | Etch rate (relative value) |
| --- | --- | --- | --- |
| II-667 | Diphenyl iodonium triflate | 59 | 0.3 |
| II-668 | NAT · 105 (Midori Kagaku Co., Ltd.) | 61 | 0.3 |
| II-669 | NAI · 105 (Midori Kagaku Co., Ltd.) | 60 | 0.3 |

As a result, it was found possible to form a line and space pattern of 0.15 μm in line width in any of examples.
(Synthesis Example II-85)

The procedures of Synthesis Example II-74 were repeated except that menthyl acrylate, t-butyl methacrylate and methacrylic acid were mixed in the ratio of 40:20:40 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-670 to II-677, chemically amplified resists containing the copolymer obtained in Synthesis Example II-85 were synthesized and were examined of their properties.

Example II-670 to Example II-673

The preparation of chemically amplified resists as performed in (Example II-4) to (Example II-7) were repeated except that the copolymer of Synthesis Example II-2 was replaced by the copolymer obtained in Synthesis Example II-85. Using the resists, patterns were formed in the same manner as explained above, and the properties of these patterns were evaluated.

Further, as in the case of Synthesis Example II-1, the transparency and dry etch resistance were evaluated. The results obtained were summarized in Table 274 below together with the photo-acid generator employed. The values of etch rate were based on that of PMMA.

TABLE 274

| Example | Photo-acid generator | Light transmittance (1 μm) % | Etch rate (relative value) |
| --- | --- | --- | --- |
| II-670 | Triphenyl sulfonium triflate | 60 | 0.3 |
| II-671 | Diphenyl iodonium triflate | 59 | 0.3 |
| II-672 | NAT · 105 (Midori Kagaku Co., Ltd.) | 61 | 0.3 |

TABLE 274-continued

| Example | Photo-acid generator | Light transmittance (1 μm) % | Etch rate (relative value) |
|---|---|---|---|
| II-673 | NAI · 105 (Midori Kagaku Co., Ltd.) | 60 | 0.3 |

As a result, it was found possible to form a line and space pattern of 0.15 μm in line width in any of examples.

Example II-674 to Example II-677

The preparation of chemically amplified resists as performed in (Example II-8) to (Example II-11) were repeated except that the copolymer of Synthesis Example II-2 was replaced by the copolymer obtained in Synthesis Example II-85. Using the resists, patterns were formed in the same manner as explained above, and the properties of these patterns were evaluated.

Further, as in the case of Synthesis Example II-1, the transparency and dry etch resistance were evaluated. The results obtained were summarized in Table 275 below together with the photo-acid generator employed. The values of etch rate were based on that of PMMA.

TABLE 275

| Example | Photo-acid generator | Light transmittance (1 μm) % | Etch rate (relative value) |
|---|---|---|---|
| II-674 | Triphenyl sulfonium triflate | 55 | 0.3 |
| II-675 | Diphenyl iodonium triflate | 59 | 0.3 |
| II-676 | NAT · 105 (Midori Kagaku Co., Ltd.) | 61 | 0.3 |
| II-677 | NAI · 105 (Midori Kagaku Co., Ltd.) | 60 | 0.3 |

As a result, it was found possible to form a line and space pattern of 0.15 μm in line width in any of examples.
(Synthesis Example II-86)

The procedures of Synthesis Example II-74 were repeated except that menthyl acrylate, t-butyl methacrylate and methacrylic acid were mixed in the ratio of 35:45:20 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-678 to II-685, chemically amplified resists containing the copolymer obtained in Synthesis Example II-86 were synthesized and were examined of their properties.

Example II-678 to Example II-681

The preparation of chemically amplified resists as performed in (Example II-4) to (Example II-7) were repeated except that the copolymer of Synthesis Example II-2 was replaced by the copolymer obtained in Synthesis Example II-86. Using the resists, patterns were formed in the same manner as explained above, and the properties of these patterns were evaluated.

Further, as in the case of Synthesis Example II-1, the transparency and dry etch resistance were evaluated. The results obtained were summarized in Table 276 below together with the photo-acid generator employed. The values of etch rate were based on that of PMMA.

TABLE 276

| Example | Photo-acid generator | Light transmittance (1 μm) % | Etch rate (relative value) |
|---|---|---|---|
| II-678 | Triphenyl sulfonium triflate | 60 | 0.3 |
| II-679 | Diphenyl iodonium triflate | 59 | 0.3 |
| II-680 | NAT · 105 (Midori Kagaku Co., Ltd.) | 61 | 0.3 |
| II-681 | NAI · 105 (Midori Kagaku Co., Ltd.) | 60 | 0.3 |

As a result, it was found possible to form a line and space pattern of 0.15 μm in line width in any of examples.

Example II-682 to Example II-685

The preparation of chemically amplified resists as performed in (Example II-8) to (Example II-11) were repeated except that the copolymer of Synthesis Example II-2 was replaced by the copolymer obtained in Synthesis Example II-86. Using the resists, patterns were formed in the same manner as explained above, and the properties of these patterns were evaluated.

Further, as in the case of Synthesis Example II-1, the transparency and dry etch resistance were evaluated. The results obtained were summarized in Table 277 below together with the photo-acid generator employed. The values of etch rate were based on that of PMMA.

TABLE 277

| Example | Photo-acid generator | Light transmittance (1 μm) % | Etch rate (relative value) |
|---|---|---|---|
| II-682 | Triphenyl sulfonium triflate | 55 | 0.3 |
| II-683 | Diphenyl iodonium triflate | 59 | 0.3 |
| II-684 | NAT · 105 (Midori Kagaku Co., Ltd.) | 61 | 0.3 |
| II-685 | NAI · 105 (Midori Kagaku Co., Ltd.) | 60 | 0.3 |

As a result, it was found possible to form a line and space pattern of 0.15 μm in line width in any of examples.
(Synthesis Example II-87)

The procedures of Synthesis Example II-74 were repeated except that menthyl acrylate, t-butyl methacrylate and methacrylic acid were mixed in the ratio of 35:40:25 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-686 to II-693, chemically amplified resists containing the copolymer obtained in Synthesis Example II-87 were synthesized and were examined of their properties.

Example II-686 to Example II-689

The preparation of chemically amplified resists as performed in (Example II-4) to (Example II-7) were repeated except that the copolymer of Synthesis Example II-2 was replaced by the copolymer obtained in Synthesis Example II-87. Using the resists, patterns were formed in the same manner as explained above, and the properties of these patterns were evaluated.

Further, as in the case of Synthesis Example II-1, the transparency and dry etch resistance were evaluated. The results obtained were summarized in Table 278 below together with the photo-acid generator employed. The values of etch rate were based on that of PMMA.

TABLE 278

| Example | Photo-acid generator | Light transmittance (1 μm) % | Etch rate (relative value) |
|---|---|---|---|
| II-686 | Triphenyl sulfonium triflate | 60 | 0.3 |
| II-687 | Diphenyl iodonium triflate | 59 | 0.3 |
| II-688 | NAT · 105 (Midori Kagaku Co., Ltd.) | 61 | 0.3 |
| II-689 | NAI · 105 (Midori Kagaku Co., Ltd.) | 60 | 0.3 |

As a result, it was found possible to form a line and space pattern of 0.15 μm in line width in any of examples.

Example II-690 to Example II-692

The preparation of chemically amplified resists as performed in (Example II-8) to (Example II-11) were repeated except that the copolymer of Synthesis Example II-2 was replaced by the copolymer obtained in Synthesis Example II-87. Using the resists, patterns were formed in the same manner as explained above, and the properties of these patterns were evaluated.

Further, as in the case of Synthesis Example II-1, the transparency and dry etch resistance were evaluated. The results obtained were summarized in Table 279 below together with the photo-acid generator employed. The values of etch rate were based on that of PMMA.

TABLE 279

| Example | Photo-acid generator | Light transmittance (1 μm) % | Etch rate (relative value) |
|---|---|---|---|
| II-690 | Triphenyl sulfonium triflate | 55 | 0.3 |
| II-691 | Diphenyl iodonium triflate | 59 | 0.3 |
| II-692 | NAT · 105 (Midori Kagaku Co., Ltd.) | 61 | 0.3 |
| II-693 | NAI · 105 (Midori Kagaku Co., Ltd.) | 60 | 0.3 |

As a result, it was found possible to form a line and space pattern of 0.15 μm in line width in any of examples.

(Synthesis Example II-88)

The procedures of Synthesis Example II-74 were repeated except that menthyl acrylate, t-butyl methacrylate and methacrylic acid were mixed in the ratio of 35:35:30 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-694 to II-701, chemically amplified resists containing the copolymer obtained in Synthesis Example II-88 were synthesized and were examined of their properties.

Example II-694 to Example II-697

The preparation of chemically amplified resists as performed in (Example II-4) to (Example II-7) were repeated except that the copolymer of Synthesis Example II-2 was replaced by the copolymer obtained in Synthesis Example II-88. Using the resists, patterns were formed in the same manner as explained above, and the properties of these patterns were evaluated.

Further, as in the case of Synthesis Example II-1, the transparency and dry etch resistance were evaluated. The results obtained were summarized in Table 280 below together with the photo-acid generator employed. The values of etch rate were based on that of PMMA.

TABLE 280

| Example | Photo-acid generator | Light transmittance (1 μm) % | Etch rate (relative value) |
|---|---|---|---|
| II-694 | Triphenyl sulfonium triflate | 60 | 0.3 |
| II-695 | Diphenyl iodonium triflate | 59 | 0.3 |

TABLE 280-continued

| Example | Photo-acid generator | Light transmittance (1 μm) % | Etch rate (relative value) |
|---|---|---|---|
| II-696 | NAT · 105 (Midori Kagaku Co., Ltd.) | 61 | 0.3 |
| II-697 | NAI · 105 (Midori Kagaku Co., Ltd.) | 60 | 0.3 |

As a result, it was found possible to form a line and space pattern of 0.15 μm in line width in any of examples.

Example II-698 to Example II-701

The preparation of chemically amplified resists as performed in (Example II-8) to (Example II-11) were repeated except that the copolymer of Synthesis Example II-2 was replaced by the copolymer obtained in Synthesis Example II-88. Using the resists, patterns were formed in the same manner as explained above, and the properties of these patterns were evaluated.

Further, as in the case of Synthesis Example II-1, the transparency and dry etch resistance were evaluated. The result s obtained were summarized in Table 281 below together with the photo-acid generator employed. The values of etch rate were based on that of PMMA.

TABLE 281

| Example | Photo-acid generator | Light transmittance (1 μm) % | Etch rate (relative value) |
|---|---|---|---|
| II-698 | Triphenyl sulfonium triflate | 55 | 0.3 |
| II-699 | Diphenyl iodonium triflate | 59 | 0.3 |
| II-700 | NAT · 105 (Midori Kagaku Co., Ltd.) | 61 | 0.3 |
| II-701 | NAI · 105 (Midori Kagaku Co., Ltd.) | 60 | 0.3 |

As a result, it was found possible to form a line and space pattern of 0.15 μm in line width in any of examples.
(Synthesis Example II-89)

The procedures of Synthesis Example II-74 were repeated except that menthyl acrylate, t-butyl methacrylate and methacrylic acid were mixed in the ratio of 35:30:35 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-702 to II-709, chemically amplified resists containing the copolymer obtained in Synthesis Example II-89 were synthesized and were examined of their properties.

Example II-702 to Example II-705

The preparation of chemically amplified resists as performed in (Example II-4) to (Example II-7) were repeated except that the copolymer of Synthesis Example II-2 was replaced by the copolymer obtained in Synthesis Example II-89. Using the resists, patterns were formed in the same manner as explained above, and the properties of these patterns were evaluated.

Further, as in the case of Synthesis Example II-1, the transparency and dry etch resistance were evaluated. The results obtained were summarized in Table 282 below together with the photo-acid generator employed. The values of etch rate were based on that of PMMA.

TABLE 282

| Example | Photo-acid generator | Light transmittance (1 μm) % | Etch rate (relative value) |
|---|---|---|---|
| II-702 | Triphenyl sulfonium triflate | 60 | 0.3 |
| II-703 | Diphenyl iodonium triflate | 59 | 0.3 |
| II-704 | NAT · 105 (Midori Kagaku Co., Ltd.) | 61 | 0.3 |
| II-705 | NAI · 105 (Midori Kagaku Co., Ltd.) | 60 | 0.3 |

As a result, it was found possible to form a line and space pattern of 0.15 μm in line width in any of examples.

Example II-706 to Example II-709

The preparation of chemically amplified resists as performed in (Example II-8) to (Example II-11) were repeated except that the copolymer of Synthesis Example II-2 was replaced by the copolymer obtained in Synthesis Example II-89. Using the resists, patterns were formed in the same manner as explained above, and the properties of these patterns were evaluated.

Further, as in the case of Synthesis Example II-1, the transparency and dry etch resistance were evaluated. The results obtained were summarized in Table 283 below together with the photo-acid generator employed. The values of etch rate were based on that of PMMA.

TABLE 283

| Example | Photo-acid generator | Light transmittance (1 μm) % | Etch rate (relative value) |
|---|---|---|---|
| II-706 | Triphenyl sulfonium triflate | 55 | 0.3 |
| II-707 | Diphenyl iodonium triflate | 59 | 0.3 |
| II-708 | NAT · 105 (Midori Kagaku Co., Ltd.) | 61 | 0.3 |

TABLE 283-continued

| Example | Photo-acid generator | Light transmittance (1 μm) % | Etch rate (relative value) |
|---|---|---|---|
| II-709 | NAI · 105 (Midori Kagaku Co., Ltd.) | 60 | 0.3 |

As a result, it was found possible to form a line and space pattern of 0.15 μm in line width in any of examples.

(Synthesis Example II-90)

The procedures of Synthesis Example II-74 were repeated except that menthyl acrylate, t-butyl methacrylate and methacrylic acid were mixed in the ratio of 35:25:40 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-710 to II-717, chemically amplified resists containing the copolymer obtained in Synthesis Example II-90 were synthesized and were examined of their properties.

Example II-710 to Example II-713

The preparation of chemically amplified resists as performed in (Example II-4) to (Example II-7) were repeated except that the copolymer of Synthesis Example II-2 was replaced by the copolymer obtained in Synthesis Example II-90. Using the resists, patterns were formed in the same manner as explained above, and the properties of these patterns were evaluated.

Further, as in the case of Synthesis Example II-1, the transparency and dry etch resistance were evaluated. The results obtained were summarized in Table 284 below together with the photo-acid generator employed. The values of etch rate were based on that of PMMA.

TABLE 284

| Example | Photo-acid generator | Light transmittance (1 μm) % | Etch rate (relative value) |
|---|---|---|---|
| II-710 | Triphenyl sulfonium triflate | 60 | 0.3 |
| II-711 | Diphenyl iodonium triflate | 59 | 0.3 |
| II-712 | NAT · 105 (Midori Kagaku Co., Ltd.) | 61 | 0.3 |
| II-713 | NAI · 105 (Midori Kagaku Co., Ltd.) | 60 | 0.3 |

As a result, it was found possible to form a line and space pattern of 0.15 μm in line width in any of examples.

Example II-714 to Example II-717

The preparation of chemically amplified resists as performed in (Example II-8) to (Example II-11) were repeated except that the copolymer of Synthesis Example II-2 was replaced by the copolymer obtained in Synthesis Example II-90. Using the resists, patterns were formed in the same manner as explained above, and the properties of these patterns were evaluated.

Further, as in the case of Synthesis Example II-1, the transparency and dry etch resistance were evaluated. The results obtained were summarized in Table 285 below together with the photo-acid generator employed. The values of etch rate were based on that of PMMA.

TABLE 285

| Example | Photo-acid generator | Light transmittance (1 μm) % | Etch rate (relative value) |
|---|---|---|---|
| II-714 | Triphenyl sulfonium triflate | 55 | 0.3 |
| II-715 | Diphenyl iodonium triflate | 59 | 0.3 |
| II-716 | NAT · 105 (Midori Kagaku Co., Ltd.) | 61 | 0.3 |
| II-717 | NAI · 105 (Midori Kagaku Co., Ltd.) | 60 | 0.3 |

As a result, it was found possible to form a line and space pattern of 0.15 μm in line width in any of examples.

(Synthesis Example II-91)

The procedures of Synthesis Example II-74 were repeated except that menthyl acrylate, t-butyl methacrylate and methacrylic acid were mixed in the ratio of 35:20:45 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-718 to II-725, chemically amplified resists containing the copolymer obtained in Synthesis Example II-91 were synthesized and were examined of their properties.

Example II-718 to Example II-721

The preparation of chemically amplified resists as performed in (Example II-4) to (Example II-7) were repeated except that the copolymer of Synthesis Example II-2 was replaced by the copolymer obtained in Synthesis Example II-91. Using the resists, patterns were formed in the same manner as explained above, and the properties of these patterns were evaluated.

Further, as in the case of Synthesis Example II-1, the transparency and dry etch resistance were evaluated. The results obtained were summarized in Table 286 below together with the photo-acid generator employed. The values of etch rate were based on that of PMMA.

TABLE 286

| Example | Photo-acid generator | Light transmittance (1 μm) % | Etch rate (relative value) |
| --- | --- | --- | --- |
| II-718 | Triphenyl sulfonium triflate | 60 | 0.3 |
| II-719 | Diphenyl iodonium triflate | 59 | 0.3 |
| II-720 | NAT · 105 (Midori Kagaku Co., Ltd.) | 61 | 0.3 |
| II-721 | NAI · 105 (Midori Kagaku Co., Ltd.) | 60 | 0.3 |

As a result, it was found possible to form a line and space pattern of 0.15 μm in line width in any of examples.

Example II-722 to Example II-725

The preparation of chemically amplified resists as performed in (Example II-8) to (Example II-11) were repeated except that the copolymer of Synthesis Example II-2 was replaced by the copolymer obtained in Synthesis Example II-91. Using the resists, patterns were formed in the same manner as explained above, and the properties of these patterns were evaluated.

Further, as in the case of Synthesis Example II-1, the transparency and dry etch resistance were evaluated. The results obtained were summarized in Table 287 below together with the photo-acid generator employed. The values of etch rate were based on that of PMMA.

TABLE 287

| Example | Photo-acid generator | Light transmittance (1 μm) % | Etch rate (relative value) |
| --- | --- | --- | --- |
| II-722 | Triphenyl sulfonium triflate | 55 | 0.3 |
| II-723 | Diphenyl iodonium triflate | 59 | 0.3 |
| II-724 | NAT · 105 (Midori Kagaku Co., Ltd.) | 61 | 0.3 |
| II-725 | NAI · 105 (Midori Kagaku Co., Ltd.) | 60 | 0.3 |

As a result, it was found possible to form a line and space pattern of 0.15 μm in line width in any of examples.
(Synthesis Example II-92)

The procedures of Synthesis Example II-74 were repeated except that menthyl acrylate, t-butyl methacrylate and methacrylic acid were mixed in the ratio of 30:50:20 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-726 to II-733, chemically amplified resists containing the copolymer obtained in Synthesis Example II-92 were synthesized and were examined of their properties.

Example II-726 to Example II-729

The preparation of chemically amplified resists as performed in (Example II-4) to (Example II-7) were repeated except that the copolymer of Synthesis Example II-2 was replaced by the copolymer obtained in Synthesis Example II-92. Using the resists, patterns were formed in the same manner as explained above, and the properties of these patterns were evaluated.

Further, as in the case of Synthesis Example II-1, the transparency and dry etch resistance were evaluated. The results obtained were summarized in Table 288 below together with the photo-acid generator employed. The values of etch rate were based on that of PMMA.

TABLE 288

| Example | Photo-acid generator | Light transmittance (1 μm) % | Etch rate (relative value) |
| --- | --- | --- | --- |
| II-726 | Triphenyl sulfonium triflate | 60 | 0.3 |
| II-727 | Diphenyl iodonium triflate | 59 | 0.3 |
| II-728 | NAT · 105 (Midori Kagaku Co., Ltd.) | 61 | 0.3 |
| II-729 | NAI · 105 (Midori Kagaku Co., Ltd.) | 60 | 0.3 |

As a result, it was found possible to form a line and space pattern of 0.15 μm in line width in any of examples.

Example II-730 to Example II-733

The preparation of chemically amplified resists as performed in (Example II-8) to (Example II-11) were repeated except that the copolymer of Synthesis Example II-2 was replaced by the copolymer obtained in Synthesis Example II-92. Using the resists, patterns were formed in the same manner as explained above, and the properties of these patterns were evaluated.

Further, as in the case of Synthesis Example II-1, the transparency and dry etch resistance were evaluated. The results obtained were summarized in Table 289 below together with the photo-acid generator employed. The values of etch rate were based on that of PMMA.

TABLE 289

| Example | Photo-acid generator | Light transmittance (1 μm) % | Etch rate (relative value) |
| --- | --- | --- | --- |
| II-730 | Triphenyl sulfonium triflate | 55 | 0.3 |
| II-731 | Diphenyl iodonium triflate | 59 | 0.3 |
| II-732 | NAT · 105 (Midori Kagaku Co., Ltd.) | 61 | 0.3 |

TABLE 289-continued

| Example | Photo-acid generator | Light transmittance (1 μm) % | Etch rate (relative value) |
|---|---|---|---|
| II-733 | NAI · 105 (Midori Kagaku Co., Ltd.) | 60 | 0.3 |

As a result, it was found possible to form a line and space pattern of 0.15 μm in line width in any of examples.

(Synthesis Example II-93)

The procedures of Synthesis Example II-74 were repeated except that menthyl acrylate, t-butyl methacrylate and methacrylic acid were mixed in the ratio of 30:45:25 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-734 to II-741, chemically amplified resists containing the copolymer obtained in Synthesis Example II-93 were synthesized and were examined of their properties.

Example II-734 to Example II-737

The preparation of chemically amplified resists as performed in (Example II-4) to (Example II-7) were repeated except that the copolymer of Synthesis Example II-2 was replaced by the copolymer obtained in Synthesis Example II-93. Using the resists, patterns were formed in the same manner as explained above, and the properties of these patterns were evaluated.

Further, as in the case of Synthesis Example II-1, the transparency and dry etch resistance were evaluated. The results obtained were summarized in Table 290 below together with the photo-acid generator employed. The values of etch rate were based on that of PMMA.

TABLE 290

| Example | Photo-acid generator | Light transmittance (1 μm) % | Etch rate (relative value) |
|---|---|---|---|
| II-734 | Triphenyl sulfonium triflate | 60 | 0.3 |
| II-735 | Diphenyl iodonium triflate | 59 | 0.3 |
| II-736 | NAT · 105 (Midori Kagaku Co., Ltd.) | 61 | 0.3 |
| II-737 | NAI · 105 (Midori Kagaku Co., Ltd.) | 60 | 0.3 |

As a result, it was found possible to form a line and space pattern of 0.15 μm in line width in any of examples.

Example II-738 to Example II-741

The preparation of chemically amplified resists as performed in (Example II-8) to (Example II-11) were repeated except that the copolymer of Synthesis Example II-2 was replaced by the copolymer obtained in Synthesis Example II-93. Using the resists, patterns were formed in the same manner as explained above, and the properties of these patterns were evaluated.

Further, as in the case of Synthesis Example II-1, the transparency and dry etch resistance were evaluated. The results obtained were summarized in Table 291 below together with the photo-acid generator employed. The values of etch rate were based on that of PMMA.

TABLE 291

| Example | Photo-acid generator | Light transmittance (1 μm) % | Etch rate (relative value) |
|---|---|---|---|
| II-738 | Triphenyl sulfonium triflate | 55 | 0.3 |
| II-739 | Diphenyl iodonium triflate | 59 | 0.3 |
| II-740 | NAT · 105 (Midori Kagaku Co., Ltd.) | 61 | 0.3 |
| II-741 | NAI · 105 (Midori Kagaku Co., Ltd.) | 60 | 0.3 |

As a result, it was found possible to form a line and space pattern of 0.15 μm in line width in any of examples.

(Synthesis Example II-94)

The procedures of Synthesis Example II-74 were repeated except that menthyl acrylate, t-butyl methacrylate and methacrylic acid were mixed in the ratio of 30:40:30 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-742 to II-749, chemically amplified resists containing the copolymer obtained in Synthesis Example II-94 were synthesized and were examined of their properties.

Example II-742 to Example II-745

The preparation of chemically amplified resists as performed in (Example II-4) to (Example II-7) were repeated except that the copolymer of Synthesis Example II-2 was replaced by the copolymer obtained in Synthesis Example II-94. Using the resists, patterns were formed in the same manner as explained above, and the properties of these patterns were evaluated.

Further, as in the case of Synthesis Example II-1, the transparency and dry etch resistance were evaluated. The results obtained were summarized in Table 292 below together with the photo-acid generator employed. The values of etch rate were based on that of PMMA.

TABLE 292

| Example | Photo-acid generator | Light transmittance (1 μm) % | Etch rate (relative value) |
|---|---|---|---|
| II-742 | Triphenyl sulfonium triflate | 60 | 0.3 |
| II-743 | Diphenyl iodonium triflate | 59 | 0.3 |
| II-744 | NAT · 105 (Midori Kagaku Co., Ltd.) | 61 | 0.3 |
| II-745 | NAI · 105 (Midori Kagaku Co., Ltd.) | 60 | 0.3 |

As a result, it was found possible to form a line and space pattern of 0.15 μm in line width in any of examples.

Example II-746 to Example II-749

The preparation of chemically amplified resists as performed in (Example II-8) to (Example II-11) were repeated except that the copolymer of Synthesis Example II-2 was replaced by the copolymer obtained in Synthesis Example II-94. Using the resists, patterns were formed in the same manner as explained above, and the properties of these patterns were evaluated.

Further, as in the case of Synthesis Example II-1, the transparency and dry etch resistance were evaluated. The results obtained were summarized in Table 293 below together with the photo-acid generator employed. The values of etch rate were based on that of PMMA.

TABLE 293

| Example | Photo-acid generator | Light transmittance (1 μm) % | Etch rate (relative value) |
|---|---|---|---|
| II-746 | Triphenyl sulfonium triflate | 55 | 0.3 |
| II-747 | Diphenyl iodonium triflate | 59 | 0.3 |
| II-748 | NAT · 105 (Midori Kagaku Co., Ltd.) | 61 | 0.3 |
| II-749 | NAI · 105 (Midori Kagaku Co., Ltd.) | 60 | 0.3 |

As a result, it was found possible to form a line and space pattern of 0.15 μm in line width in any of examples.

(Synthesis Example II-95)

The procedures of Synthesis Example II-74 were repeated except that menthyl acrylate, t-butyl methacrylate and methacrylic acid were mixed in the ratio of 30:35:35 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-750 to II-757, chemically amplified resists containing the copolymer obtained in Synthesis Example II-95 were synthesized and were examined of their properties.

Example II-750 to Example II-753

The preparation of chemically amplified resists as performed in (Example II-4) to (Example II-7) were repeated except that the copolymer of Synthesis Example II-2 was replaced by the copolymer obtained in Synthesis Example II-95. Using the resists, patterns were formed in the same manner as explained above, and the properties of these patterns were evaluated.

Further, as in the case of Synthesis Example II-1, the transparency and dry etch resistance were evaluated. The results obtained were summarized in Table 294 below together with the photo-acid generator employed. The values of etch rate were based on that of PMMA.

TABLE 294

| Example | Photo-acid generator | Light transmittance (1 μm) % | Etch rate (relative value) |
|---|---|---|---|
| II-750 | Triphenyl sulfonium triflate | 60 | 0.3 |
| II-751 | Diphenyl iodonium triflate | 59 | 0.3 |
| II-752 | NAT · 105 (Midori Kagaku Co., Ltd.) | 61 | 0.3 |
| II-753 | NAI · 105 (Midori Kagaku Co., Ltd.) | 60 | 0.3 |

As a result, it was found possible to form a line and space pattern of 0.15 μm in line width in any of examples.

Example II-754 to Example II-757

The preparation of chemically amplified resists as performed in (Example II-8) to (Example II-11) were repeated except that the copolymer of Synthesis Example II-2 was replaced by the copolymer obtained in Synthesis Example II-95. Using the resists, patterns were formed in the same manner as explained above, and the properties of these patterns were evaluated.

Further, as in the case of Synthesis Example II-1, the transparency and dry etch resistance were evaluated. The results obtained were summarized in Table 295 below together with the photo-acid generator employed. The values of etch rate were based on that of PMMA.

TABLE 295

| Example | Photo-acid generator | Light transmittance (1 μm) % | Etch rate (relative value) |
|---|---|---|---|
| II-754 | Triphenyl sulfonium triflate | 55 | 0.3 |
| II-755 | Diphenyl iodonium triflate | 59 | 0.3 |
| II-756 | NAT · 105 (Midori Kagaku Co., Ltd.) | 61 | 0.3 |
| II-757 | NAI · 105 (Midori Kagaku Co., Ltd.) | 60 | 0.3 |

As a result, it was found possible to form a line and space pattern of 0.15 μm in line width in any of examples.
(Synthesis Example II-96)

The procedures of Synthesis Example II-74 were repeated except that menthyl acrylate, t-butyl methacrylate and methacrylic acid were mixed in the ratio of 30:30:40 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-758 to II-765, chemically amplified resists containing the copolymer obtained in Synthesis Example II-96 were synthesized and were examined of their properties.

Example II-758 to Example II-761

The preparation of chemically amplified resists as performed in (Example II-4) to (Example II-7) were repeated except that the copolymer of Synthesis Example II-2 was replaced by the copolymer obtained in Synthesis Example II-96. Using the resists, patterns were formed in the same manner as explained above, and the properties of these patterns were evaluated.

Further, as in the case of Synthesis Example II-1, the transparency and dry etch resistance were evaluated. The results obtained were summarized in Table 296 below together with the photo-acid generator employed. The values of etch rate were based on that of PMMA.

TABLE 296

| Example | Photo-acid generator | Light transmittance (1 μm) % | Etch rate (relative value) |
|---|---|---|---|
| II-758 | Triphenyl sulfonium triflate | 60 | 0.3 |
| II-759 | Diphenyl iodonium triflate | 59 | 0.3 |

TABLE 296-continued

| Example | Photo-acid generator | Light transmittance (1 μm) % | Etch rate (relative value) |
|---|---|---|---|
| II-760 | NAT · 105 (Midori Kagaku Co., Ltd.) | 61 | 0.3 |
| II-761 | NAI · 105 (Midori Kagaku Co., Ltd.) | 60 | 0.3 |

As a result, it was found possible to form a line and space pattern of 0.15 μm in line width in any of examples.

Example II-762 to Example II-765

The preparation of chemically amplified resists as performed in (Example II-8) to (Example II-11) were repeated except that the copolymer of Synthesis Example II-2 was replaced by the copolymer obtained in Synthesis Example II-96. Using the resists, patterns were formed in the same manner as explained above, and the properties of these patterns were evaluated.

Further, as in the case of Synthesis Example II-1, the transparency and dry etch resistance were evaluated. The results obtained were summarized in Table 297 below together with the photo-acid generator employed. The values of etch rate were based on that of PMMA.

TABLE 297

| Example | Photo-acid generator | Light transmittance (1 μm) % | Etch rate (relative value) |
|---|---|---|---|
| II-762 | Triphenyl sulfonium triflate | 55 | 0.3 |
| II-763 | Diphenyl iodonium triflate | 59 | 0.3 |
| II-764 | NAT · 105 (Midori Kagaku Co., Ltd.) | 61 | 0.3 |
| II-765 | NAI · 105 (Midori Kagaku Co., Ltd.) | 60 | 0.3 |

As a result, it was found possible to form a line and space pattern of 0.15 μm in line width in any of examples.
(Synthesis Example II-97)

The procedures of Synthesis Example II-74 were repeated except that menthyl acrylate, t-butyl methacrylate and methacrylic acid were mixed in the ratio of 30:25:45 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-766 to II-773, chemically amplified resists containing the copolymer obtained in Synthesis Example II-97 were synthesized and were examined of their properties.

Example II-766 to Example II-769

The preparation of chemically amplified resists as performed in (Example II-4) to (Example II-7) were repeated except that the copolymer of Synthesis Example II-2 was replaced by the copolymer obtained in Synthesis Example II-97. Using the resists, patterns were formed in the same manner as explained above, and the properties of these patterns were evaluated.

Further, as in the case of Synthesis Example II-1, the transparency and dry etch resistance were evaluated. The results obtained were summarized in Table 298 below together with the photo-acid generator employed. The values of etch rate were based on that of PMMA.

TABLE 298

| Example | Photo-acid generator | Light transmittance (1 μm) % | Etch rate (relative value) |
|---|---|---|---|
| II-766 | Triphenyl sulfonium triflate | 60 | 0.3 |
| II-767 | Diphenyl iodonium triflate | 59 | 0.3 |
| II-768 | NAT · 105 (Midori Kagaku Co., Ltd.) | 61 | 0.3 |
| II-769 | NAI · 105 (Midori Kagaku Co., Ltd.) | 60 | 0.3 |

As a result, it was found possible to form a line and space pattern of 0.15 μm in line width in any of examples.

Example II-770 to Example II-773

The preparation of chemically amplified resists as performed in (Example II-8) to (Example II-11) were repeated except that the copolymer of Synthesis Example II-2 was replaced by the copolymer obtained in Synthesis Example II-97. Using the resists, patterns were formed in the same manner as explained above, and the properties of these patterns were evaluated.

Further, as in the case of Synthesis Example II-1, the transparency and dry etch resistance were evaluated. The results obtained were summarized in Table 299 below together with the photo-acid generator employed. The values of etch rate were based on that of PMMA.

TABLE 299

| Example | Photo-acid generator | Light transmittance (1 μm) % | Etch rate (relative value) |
|---|---|---|---|
| II-770 | Triphenyl sulfonium triflate | 55 | 0.3 |
| II-771 | Diphenyl iodonium triflate | 59 | 0.3 |
| II-772 | NAT · 105 (Midori Kagaku Co., Ltd.) | 61 | 0.3 |

TABLE 299-continued

| Example | Photo-acid generator | Light transmittance (1 μm) % | Etch rate (relative value) |
|---|---|---|---|
| II-773 | NAI · 105 (Midori Kagaku Co., Ltd.) | 60 | 0.3 |

As a result, it was found possible to form a line and space pattern of 0.15 μm in line width in any of examples.
(Synthesis Example II-98)

The procedures of Synthesis Example II-74 were repeated except that menthyl acrylate, t-butyl methacrylate and methacrylic acid were mixed in the ratio of 30:20:50 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-774 to II-781, chemically amplified resists containing the copolymer obtained in Synthesis Example II-98 were synthesized and were examined of their properties.

Example II-774 to Example II-777

The preparation of chemically amplified resists as performed in (Example II-4) to (Example II-7) were repeated except that the copolymer of Synthesis Example II-2 was replaced by the copolymer obtained in Synthesis Example II-98. Using the resists, patterns were formed in the same manner as explained above, and the properties of these patterns were evaluated.

Further, as in the case of Synthesis Example II-1, the transparency and dry etch resistance were evaluated. The results obtained were summarized in Table 300 below together with the photo-acid generator employed. The values of etch rate were based on that of PMMA.

TABLE 300

| Example | Photo-acid generator | Light transmittance (1 μm) % | Etch rate (relative value) |
|---|---|---|---|
| II-774 | Triphenyl sulfonium triflate | 60 | 0.3 |
| II-775 | Diphenyl iodonium triflate | 59 | 0.3 |
| II-776 | NAT · 105 (Midori Kagaku Co., Ltd.) | 61 | 0.3 |
| II-777 | NAI · 105 (Midori Kagaku Co., Ltd.) | 60 | 0.3 |

As a result, it was found possible to form a line and space pattern of 0.15 μm in line width in any of examples.

Example II-778 to Example II-781

The preparation of chemically amplified resists as performed in (Example II-8) to (Example II-11) were repeated except that the copolymer of Synthesis Example II-2 was replaced by the copolymer obtained in Synthesis Example II-98. Using the resists, patterns were formed in the same manner as explained above, and the properties of these patterns were evaluated.

Further, as in the case of Synthesis Example II-1, the transparency and dry etch resistance were evaluated. The results obtained were summarized in Table 301 below together with the photo-acid generator employed. The values of etch rate were based on that of PMMA.

TABLE 301

| Example | Photo-acid generator | Light transmittance (1 μm) % | Etch rate (relative value) |
|---|---|---|---|
| II-778 | Triphenyl sulfonium triflate | 55 | 0.3 |
| II-779 | Diphenyl iodonium triflate | 59 | 0.3 |
| II-780 | NAT · 105 (Midori Kagaku Co., Ltd.) | 61 | 0.3 |
| II-781 | NAI · 105 (Midori Kagaku Co., Ltd.) | 60 | 0.3 |

As a result, it was found possible to form a line and space pattern of 0.15 μm in line width in any of examples.

(Synthesis Example II-99)

The procedures of Synthesis Example II-74 were repeated except that menthyl acrylate, t-butyl methacrylate and methacrylic acid were mixed in the ratio of 25:55:20 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-782 to II-789, chemically amplified resists containing the copolymer obtained in Synthesis Example II-99 were synthesized and were examined of their properties.

Example II-782 to Example II-785

The preparation of chemically amplified resists as performed in (Example II-4) to (Example II-7) were repeated except that the copolymer of Synthesis Example II-2 was replaced by the copolymer obtained in Synthesis Example II-99. Using the resists, patterns were formed in the same manner as explained above, and the properties of these patterns were evaluated.

Further, as in the case of Synthesis Example II-1, the transparency and dry etch resistance were evaluated. The results obtained were summarized in Table 302 below together with the photo-acid generator employed. The values of etch rate were based on that of PMMA.

TABLE 302

| Example | Photo-acid generator | Light transmittance (1 μm) % | Etch rate (relative value) |
|---|---|---|---|
| II-782 | Triphenyl sulfonium triflate | 60 | 0.3 |
| II-783 | Diphenyl iodonium triflate | 59 | 0.3 |
| II-784 | NAT · 105 (Midori Kagaku Co., Ltd.) | 61 | 0.3 |
| II-785 | NAI · 105 (Midori Kagaku Co., Ltd.) | 60 | 0.3 |

As a result, it was found possible to form a line and space pattern of 0.15 μm in line width in any of examples.

Example II-786 to Example II-789

The preparation of chemically amplified resists as performed in (Example II-8) to (Example II-11) were repeated except that the copolymer of Synthesis Example II-2 was replaced by the copolymer obtained in Synthesis Example II-99. Using the resists, patterns were formed in the same manner as explained above, and the properties of these patterns were evaluated.

Further, as in the case of Synthesis Example II-1, the transparency and dry etch resistance were evaluated. The results obtained were summarized in Table 303 below together with the photo-acid generator employed. The values of etch rate were based on that of PMMA.

TABLE 303

| Example | Photo-acid generator | Light transmittance (1 μm) % | Etch rate (relative value) |
|---|---|---|---|
| II-786 | Triphenyl sulfonium triflate | 55 | 0.3 |
| II-787 | Diphenyl iodonium triflate | 59 | 0.3 |
| II-788 | NAT · 105 (Midori Kagaku Co., Ltd.) | 61 | 0.3 |
| II-789 | NAI · 105 (Midori Kagaku Co., Ltd.) | 60 | 0.3 |

As a result, it was found possible to form a line and space pattern of 0.15 μm in line width in any of examples.

(Synthesis Example II-100)

The procedures of Synthesis Example II-74 were repeated except that menthyl acrylate, t-butyl methacrylate and methacrylic acid were mixed in the ratio of 25:50:25 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-790 to II-797, chemically amplified resists containing the copolymer obtained in Synthesis Example II-100 were synthesized and were examined of their properties.

Example II-790 to Example II-793

The preparation of chemically amplified resists as performed in (Example II-4) to (Example II-7) were repeated except that the copolymer of Synthesis Example II-2 was replaced by the copolymer obtained in Synthesis Example II-100. Using the resists, patterns were formed in the same manner as explained above, and the properties of these patterns were evaluated.

Further, as in the case of Synthesis Example II-1, the transparency and dry etch resistance were evaluated. The results obtained were summarized in Table 304 below together with the photo-acid generator employed. The values of etch rate were based on that of PMMA.

TABLE 304

| Example | Photo-acid generator | Light transmittance (1 $\mu$m) % | Etch rate (relative value) |
| --- | --- | --- | --- |
| II-790 | Triphenyl sulfonium triflate | 60 | 0.3 |
| II-791 | Diphenyl iodonium triflate | 59 | 0.3 |
| II-792 | NAT · 105 (Midori Kagaku Co., Ltd.) | 61 | 0.3 |
| II-793 | NAI · 105 (Midori Kagaku Co., Ltd.) | 60 | 0.3 |

As a result, it was found possible to form a line and space pattern of 0.15 $\mu$m in line width in any of examples.

Example II-794 to Example II-797

The preparation of chemically amplified resists as performed in (Example II-8) to (Example II-11) were repeated except that the copolymer of Synthesis Example II-2 was replaced by the copolymer obtained in Synthesis Example II-100. Using the resists, patterns were formed in the same manner as explained above, and the properties of these patterns were evaluated.

Further, as in the case of Synthesis Example II-1, the transparency and dry etch resistance were evaluated. The results obtained were summarized in Table 305 below together with the photo-acid generator employed. The values of etch rate were based on that of PMMA.

TABLE 305

| Example | Photo-acid generator | Light transmittance (1 $\mu$m) % | Etch rate (relative value) |
| --- | --- | --- | --- |
| II-794 | Triphenyl sulfonium triflate | 55 | 0.3 |
| II-795 | Diphenyl iodonium triflate | 59 | 0.3 |
| II-796 | NAT · 105 (Midori Kagaku Co., Ltd.) | 61 | 0.3 |
| II-797 | NAI · 105 (Midori Kagaku Co., Ltd.) | 60 | 0.3 |

As a result, it was found possible to form a line and space pattern of 0.15 $\mu$m in line width in any of examples.

(Synthesis Example II-101)

The procedures of Synthesis Example II-74 were repeated except that menthyl acrylate, t-butyl methacrylate and methacrylic acid were mixed in the ratio of 25:45:30 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-798 to II-805, chemically amplified resists containing the copolymer obtained in Synthesis Example II-101 were synthesized and were examined of their properties.

Example II-798 to Example II-801

The preparation of chemically amplified resists as performed in (Example II-4) to (Example II-7) were repeated except that the copolymer of Synthesis Example II-2 was replaced by the copolymer obtained in Synthesis Example II-101. Using the resists, patterns were formed in the same manner as explained above, and the properties of these patterns were evaluated.

Further, as in the case of Synthesis Example II-1, the transparency and dry etch resistance were evaluated. The results obtained were summarized in Table 306 below together with the photo-acid generator employed. The values of etch rate were based on that of PMMA.

TABLE 306

| Example | Photo-acid generator | Light transmittance (1 $\mu$m) % | Etch rate (relative value) |
| --- | --- | --- | --- |
| II-798 | Triphenyl sulfonium triflate | 60 | 0.3 |
| II-799 | Diphenyl iodonium triflate | 59 | 0.3 |
| II-800 | NAT · 105 (Midori Kagaku Co., Ltd.) | 61 | 0.3 |

TABLE 306-continued

| Example | Photo-acid generator | Light transmittance (1 μm) % | Etch rate (relative value) |
|---|---|---|---|
| II-801 | NAI · 105 (Midori Kagaku Co., Ltd.) | 60 | 0.3 |

As a result, it was found possible to form a line and space pattern of 0.15 μm in line width in any of examples.

Example II-802 to Example II-805

The preparation of chemically amplified resists as performed in (Example II-8) to (Example II-11) were repeated except that the copolymer of Synthesis Example II-2 was replaced by the copolymer obtained in Synthesis Example II-101. Using the resists, patterns were formed in the same manner as explained above, and the properties of these patterns were evaluated.

Further, as in the case of Synthesis Example II-1, the transparency and dry etch resistance were evaluated. The results obtained were summarized in Table 307 below together with the photo-acid generator employed. The values of etch rate were based on that of PMMA.

TABLE 307

| Example | Photo-acid generator | Light transmittance (1 μm) % | Etch rate (relative value) |
|---|---|---|---|
| II-802 | Triphenyl sulfonium triflate | 55 | 0.3 |
| II-803 | Diphenyl iodonium triflate | 59 | 0.3 |
| II-804 | NAT · 105 (Midori Kagaku Co., Ltd.) | 61 | 0.3 |
| II-805 | NAI · 105 (Midori Kagaku Co., Ltd.) | 60 | 0.3 |

As a result, it was found possible to form a line and space pattern of 0.15 μm in line width in any of examples.

(Synthesis Example II-102)

The procedures of Synthesis Example II-74 were repeated except that menthyl acrylate, t-butyl methacrylate and methacrylic acid were mixed in the ratio of 25:40:35 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-806 to II-813, chemically amplified resists containing the copolymer obtained in Synthesis Example II-102 were synthesized and were examined of their properties.

Example II-806 to Example II-809

The preparation of chemically amplified resists as performed in (Example II-4) to (Example II-7) were repeated except that the copolymer of Synthesis Example II-2 was replaced by the copolymer obtained in Synthesis Example II-102. Using the resists, patterns were formed in the same manner as explained above, and the properties of these patterns were evaluated.

Further, as in the case of Synthesis Example II-1, the transparency and dry etch resistance were evaluated. The results obtained were summarized in Table 308 below together with the photo-acid generator employed. The values of etch rate were based on that of PMMA.

TABLE 308

| Example | Photo-acid generator | Light transmittance (1 μm) % | Etch rate (relative value) |
|---|---|---|---|
| II-806 | Triphenyl sulfonium triflate | 60 | 0.3 |
| II-807 | Diphenyl iodonium triflate | 59 | 0.3 |
| II-808 | NAT · 105 (Midori Kagaku Co., Ltd.) | 61 | 0.3 |
| II-809 | NAI · 105 (Midori Kagaku Co., Ltd.) | 60 | 0.3 |

As a result, it was found possible to form a line and space pattern of 0.15 μm in line width in any of examples.

Example II-810 to Example II-813

The preparation of chemically amplified resists as performed in (Example II-8) to (Example II-11) were repeated except that the copolymer of Synthesis Example II-2 was replaced by the copolymer obtained in Synthesis Example II-102. Using the resists, patterns were formed in the same manner as explained above, and the properties of these patterns were evaluated.

Further, as in the case of Synthesis Example II-1, the transparency and dry etch resistance were evaluated. The results obtained were summarized in Table 309 below together with the photo-acid generator employed. The values of etch rate were based on that of PMMA.

TABLE 309

| Example | Photo-acid generator | Light transmittance (1 μm) % | Etch rate (relative value) |
|---|---|---|---|
| II-810 | Triphenyl sulfonium triflate | 55 | 0.3 |
| II-811 | Diphenyl iodonium triflate | 59 | 0.3 |
| II-812 | NAT · 105 (Midori Kagaku Co., Ltd.) | 61 | 0.3 |
| II-813 | NAI · 105 (Midori Kagaku Co., Ltd.) | 60 | 0.3 |

As a result, it was found possible to form a line and space pattern of 0.15 μm in line width in any of examples.

(Synthesis Example II-103)

The procedures of Synthesis Example II-74 were repeated except that menthyl acrylate, t-butyl methacrylate and methacrylic acid were mixed in the ratio of 25:35:40 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-814 to II-821, chemically amplified resists containing the copolymer obtained in Synthesis Example II-103 were synthesized and were examined of their properties.

Example II-814 to Example II-817

The preparation of chemically amplified resists as performed in (Example II-4) to (Example II-7) were repeated except that the copolymer of Synthesis Example II-2 was replaced by the copolymer obtained in Synthesis Example II-103. Using the resists, patterns were formed in the same manner as explained above, and the properties of these patterns were evaluated.

Further, as in the case of Synthesis Example II-1, the transparency and dry etch resistance were evaluated. The results obtained were summarized in Table 310 below together with the photo-acid generator employed. The values of etch rate were based on that of PMMA.

TABLE 310

| Example | Photo-acid generator | Light transmittance (1 μm) % | Etch rate (relative value) |
|---|---|---|---|
| II-814 | Triphenyl sulfonium triflate | 60 | 0.3 |
| II-815 | Diphenyl iodonium triflate | 59 | 0.3 |
| II-816 | NAT · 105 (Midori Kagaku Co., Ltd.) | 61 | 0.3 |
| II-817 | NAI · 105 (Midori Kagaku Co., Ltd.) | 60 | 0.3 |

As a result, it was found possible to form a line and space pattern of 0.15 μm in line width in any of examples.

Example II-818 to Example II-821

The preparation of chemically amplified resists as performed in (Example II-8) to (Example II-11) were repeated except that the copolymer of Synthesis Example II-2 was replaced by the copolymer obtained in Synthesis Example II-103. Using the resists, patterns were formed in the same manner as explained above, and the properties of these patterns were evaluated.

Further, as in the case of Synthesis Example II-1, the transparency and dry etch resistance were evaluated. The results obtained were summarized in Table 311 below together with the photo-acid generator employed. The values of etch rate were based on that of PMMA.

TABLE 311

| Example | Photo-acid generator | Light transmittance (1 μm) % | Etch rate (relative value) |
|---|---|---|---|
| II-818 | Triphenyl sulfonium triflate | 55 | 0.3 |
| II-819 | Diphenyl iodonium triflate | 59 | 0.3 |
| II-820 | NAT · 105 (Midori Kagaku Co., Ltd.) | 61 | 0.3 |
| II-821 | NAI · 105 (Midori Kagaku Co., Ltd.) | 60 | 0.3 |

As a result, it was found possible to form a line and space pattern of 0.15 μm in line width in any of examples.

(Synthesis Example II-104)

The procedures of Synthesis Example II-74 were repeated except that menthyl acrylate, t-butyl methacrylate and methacrylic acid were mixed in the ratio of 25:30:45 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-822 to II-829, chemically amplified resists containing the copolymer obtained in Synthesis Example II-104 were synthesized and were examined of their properties.

Example II-822 to Example II-825

The preparation of chemically amplified resists as performed in (Example II-4) to (Example II-7) were repeated except that the copolymer of Synthesis Example II-2 was replaced by the copolymer obtained in Synthesis Example II-104. Using the resists, patterns were formed in the same manner as explained above, and the properties of these patterns were evaluated.

Further, as in the case of Synthesis Example II-1, the transparency and dry etch resistance were evaluated. The results obtained were summarized in Table 312 below together with the photo-acid generator employed. The values of etch rate were based on that of PMMA.

TABLE 312

| Example | Photo-acid generator | Light transmittance (1 μm) % | Etch rate (relative value) |
|---|---|---|---|
| II-822 | Triphenyl sulfonium triflate | 55 | 0.3 |
| II-823 | Diphenyl iodonium triflate | 59 | 0.3 |

TABLE 312-continued

| Example | Photo-acid generator | Light transmittance (1 μm) % | Etch rate (relative value) |
|---|---|---|---|
| II-824 | NAT · 105 (Midori Kagaku Co., Ltd.) | 61 | 0.3 |
| II-825 | NAI · 105 (Midori Kagaku Co., Ltd.) | 60 | 0.3 |

As a result, it was found possible to form a line and space pattern of 0.15 μm in line width in any of examples.

Example II-826 to Example II-829

The preparation of chemically amplified resists as performed in (Example II-8) to (Example II-11) were repeated except that the copolymer of Synthesis Example II-2 was replaced by the copolymer obtained in Synthesis Example II-104. Using the resists, patterns were formed in the same manner as explained above, and the properties of these patterns were evaluated.

Further, as in the case of Synthesis Example II-1, the transparency and dry etch resistance were evaluated. The results obtained were summarized in Table 313 below together with the photo-acid generator employed. The values of etch rate were based on that of PMMA.

TABLE 313

| Example | Photo-acid generator | Light transmittance (1 μm) % | Etch rate (relative value) |
|---|---|---|---|
| II-826 | Triphenyl sulfonium triflate | 55 | 0.3 |
| II-827 | Diphenyl iodonium triflate | 59 | 0.3 |
| II-828 | NAT · 105 (Midori Kagaku Co., Ltd.) | 61 | 0.3 |
| II-829 | NAI · 105 (Midori Kagaku Co., Ltd.) | 60 | 0.3 |

As a result, it was found possible to form a line and space pattern of 0.15 μm in line width in any of examples.
(Synthesis Example II-105)

The procedures of Synthesis Example II-74 were repeated except that menthyl acrylate, t-butyl methacrylate and methacrylic acid were mixed in the ratio of 25:25:50 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-830 to II-837, chemically amplified resists containing the copolymer obtained in Synthesis Example II-105 were synthesized and were examined of their properties.

Example II-830 to Example II-833

The preparation of chemically amplified resists as performed in (Example II-4) to (Example II-7) were repeated except that the copolymer of Synthesis Example II-2 was replaced by the copolymer obtained in Synthesis Example II-105. Using the resists, patterns were formed in the same manner as explained above, and the properties of these patterns were evaluated.

Further, as in the case of Synthesis Example II-1, the transparency and dry etch resistance were evaluated. The results obtained were summarized in Table 314 below together with the photo-acid generator employed. The values of etch rate were based on that of PMMA.

TABLE 314

| Example | Photo-acid generator | Light transmittance (1 μm) % | Etch rate (relative value) |
|---|---|---|---|
| II-830 | Triphenyl sulfonium triflate | 60 | 0.3 |
| II-831 | Diphenyl iodonium triflate | 59 | 0.3 |
| II-832 | NAT · 105 (Midori Kagaku Co., Ltd.) | 61 | 0.3 |
| II-833 | NAI · 105 (Midori Kagaku Co., Ltd.) | 60 | 0.3 |

As a result, it was found possible to form a line and space pattern of 0.15 μm in line width in any of examples.

Example II-834 to Example II-837

The preparation of chemically amplified resists as performed in (Example II-8) to (Example II-11) were repeated except that the copolymer of Synthesis Example II-2 was replaced by the copolymer obtained in Synthesis Example II-105. Using the resists, patterns were formed in the same manner as explained above, and the properties of these patterns were evaluated.

Further, as in the case of Synthesis Example II-1, the transparency and dry etch resistance were evaluated. The results obtained were summarized in Table 315 below together with the photo-acid generator employed. The values of etch rate were based on that of PMMA.

TABLE 315

| Example | Photo-acid generator | Light transmittance (1 μm) % | Etch rate (relative value) |
|---|---|---|---|
| II-834 | Triphenyl sulfonium triflate | 55 | 0.3 |
| II-835 | Diphenyl iodonium triflate | 59 | 0.3 |
| II-836 | NAT · 105 (Midori Kagaku Co., Ltd.) | 61 | 0.3 |
| II-837 | NAI · 105 (Midori Kagaku Co., Ltd.) | 60 | 0.3 |

As a result, it was found possible to form a line and space pattern of 0.15 μm in line width in any of examples.
(Synthesis Example II-106)

The procedures of Synthesis Example II-74 were repeated except that menthyl acrylate, t-butyl methacrylate and methacrylic acid were mixed in the ratio of 25:20:55 to prepare a mixture, which was then dissolved in cyclohexanone in the same manner as in Synthesis Example II-74, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

In the following Examples II-838 to II-845, chemically amplified resists containing the copolymer obtained in Synthesis Example II-106 were synthesized and were examined of their properties.

Example II-838 to Example II-841

The preparation of chemically amplified resists as performed in (Example II-4) to (Example II-7) were repeated except that the copolymer of Synthesis Example II-2 was replaced by the copolymer obtained in Synthesis Example II-106. Using the resists, patterns were formed in the same manner as explained above, and the properties of these patterns were evaluated.

Further, as in the case of Synthesis Example II-1, the transparency and dry etch resistance were evaluated. The results obtained were summarized in Table 316 below together with the photo-acid generator employed. The values of etch rate were based on that of PMMA.

TABLE 316

| Example | Photo-acid generator | Light transmittance (1 μm) % | Etch rate (relative value) |
|---|---|---|---|
| II-838 | Triphenyl sulfonium triflate | 60 | 0.3 |
| II-839 | Diphenyl iodonium triflate | 59 | 0.3 |
| II-840 | NAT · 105 (Midori Kagaku Co., Ltd.) | 61 | 0.3 |
| II-841 | NAI · 105 (Midori Kagaku Co., Ltd.) | 60 | 0.3 |

As a result, it was found possible to form a line and space pattern of 0.15 μm in line width in any of examples.

Example II-842 to Example II-845

The preparation of chemically amplified resists as performed in (Example II-8) to (Example II-11) were repeated except that the copolymer of Synthesis Example II-2 was replaced by the copolymer obtained in Synthesis Example II-106. Using the resists, patterns were formed in the same manner as explained above, and the properties of these patterns were evaluated.

Further, as in the case of Synthesis Example II-1, the transparency and dry etch resistance were evaluated. The results obtained were summarized in Table 317 below together with the photo-acid generator employed. The values of etch rate were based on that of PMMA.

TABLE 317

| Example | Photo-acid generator | Light transmittance (1 μm) % | Etch rate (relative value) |
|---|---|---|---|
| II-842 | Triphenyl sulfonium triflate | 55 | 0.3 |
| II-843 | Diphenyl iodonium triflate | 59 | 0.3 |
| II-844 | NAT · 105 (Midori Kagaku Co., Ltd.) | 61 | 0.3 |
| II-845 | NAI · 105 (Midori Kagaku Co., Ltd.) | 60 | 0.3 |

As a result, it was found possible to form a line and space pattern of 0.15 μm in line width in any of examples.

(Synthesis Example II-107)

In this Synthesis Example, another copolymer containing a monomer obtained in the above Synthesis Example II-1 was synthesized and then examined of its properties.

Namely, menthyl methacrylate and methacrylic acid were mixed in the ratio of 30:70 to prepare 10 g of the mixture, which was then dissolved in 40 mL of THF together with 0.5 g of azoisobutylonitrile as a polymerization initiator.

The resultant solution was frozen with liquid nitrogen, and warmed to room temperature after repeating a 20 minute degassing of it five times. Then, the solution was heated in a nitrogen stream at oil temperature of 60° C. for 9 h. Then, the reaction was quenched by the addition of hexane. After being reprecipitated with hexane, the product was filtered and evaporated under vacuum thereby obtaining an aimed copolymer.

This copolymer was dissolved in cyclohexanone in the same manner as in Synthesis Example II-1, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

Example II-846 to Example II-849

The preparation of chemically amplified resists as performed in (Example II-8) to (Example II-11) were repeated except that the copolymer of Synthesis Example II-2 was replaced by the copolymer obtained in Synthesis Example II-107. Using the resists, patterns were formed in the same manner as explained above, and the properties of these patterns were evaluated.

Further, as in the case of Synthesis Example II-1, the transparency and dry etch resistance were evaluated. The results obtained were summarized in Table 318 below together with the photo-acid generator employed. The values of etch rate were based on that of PMMA.

TABLE 318

| Example | Photo-acid generator | Light transmittance (1 μm) % | Etch rate (relative value) |
|---|---|---|---|
| II-846 | Triphenyl sulfonium triflate | 60 | 0.3 |
| II-847 | Diphenyl iodonium triflate | 59 | 0.3 |
| II-848 | NAT · 105 (Midori Kagaku Co., Ltd.) | 61 | 0.3 |
| II-849 | NAI · 105 (Midori Kagaku Co., Ltd.) | 60 | 0.3 |

As a result, it was found possible to form a line and space pattern of 0.15 μm in line width in any of examples.

(Synthesis Example II-108)

The procedures of Synthesis Example II-74 were repeated except that menthyl methacrylate and methacrylic acid were mixed in the ratio of 35:65 to prepare a mixture, which was then dissolved in cyclohexanone in the same manner as in Synthesis Example II-107, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

Example II-850 to Example II-853

The preparation of chemically amplified resists as performed in (Example II-8) to (Example II-11) were repeated except that the copolymer of Synthesis Example II-2 was replaced by the copolymer obtained in Synthesis Example II-108 and that 3,3-bis-4'-t-butoxycarbonyloxy naphtalenyl-1(3H)-isobenzofuranone was replaced by 3,3-bis-3'-t-butoxycarbonyloxy naphtalenyl-1(3H)-isobenzofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 319 below together with the photo-acid generator employed. The values of etch rate were based on that of PMMA.

TABLE 319

| Example | Photo-acid generator | Light transmittance (1 μm) % | Etch rate (relative value) |
|---|---|---|---|
| II-850 | Triphenyl sulfonium triflate | 55 | 0.3 |

TABLE 319-continued

| Example | Photo-acid generator | Light transmittance (1 μm) % | Etch rate (relative value) |
|---|---|---|---|
| II-851 | Diphenyl iodonium triflate | 59 | 0.3 |
| II-852 | NAT · 105 (Midori Kagaku Co., Ltd.) | 61 | 0.3 |
| II-853 | NAI · 105 (Midori Kagaku Co., Ltd.) | 60 | 0.3 |

As a result, it was found possible to form a line and space pattern of 0.15 μm in line width in any of examples.

(Synthesis Example II-109)

The procedures of Synthesis Example II-74 were repeated except that menthyl methacrylate and methacrylic acid were mixed in the ratio of 40:60 to prepare a mixture, which was then dissolved in cyclohexanone in the same manner as in Synthesis Example II-107, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

Example II-854 to Example II-857

The preparation of chemically amplified resists as performed in (Example II-8) to (Example II-11) were repeated except that the copolymer of Synthesis Example II-2 was replaced by the copolymer obtained in Synthesis Example II-109 and that 3,3-bis-4'-t-butoxycarbonyloxy naphtalenyl-1(3H)-isobenzofuranone was replaced by 3,3-bis-2'-t-butoxycarbonyloxy naphtalenyl-1(3H)-isobenzofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 320 below together with the photo-acid generator employed. The values of etch rate were based on that of PMMA.

TABLE 320

| Example | Photo-acid generator | Light transmittance (1 μm) % | Etch rate (relative value) |
|---|---|---|---|
| II-854 | Triphenyl sulfonium triflate | 60 | 0.3 |
| II-855 | Diphenyl iodonium triflate | 59 | 0.3 |
| II-856 | NAT · 105 (Midori Kagaku Co., Ltd.) | 61 | 0.3 |

TABLE 320-continued

| Example | Photo-acid generator | Light transmittance (1 μm) % | Etch rate (relative value) |
|---|---|---|---|
| II-857 | NAI · 105 (Midori Kagaku Co., Ltd.) | 60 | 0.3 |

As a result, it was found possible to form a line and space pattern of 0.15 μm in line width in any of examples.

(Synthesis Example II-110)

The procedures of Synthesis Example II-74 were repeated except that menthyl methacrylate and methacrylic acid were mixed in the ratio of 45:55 to prepare a mixture, which was then dissolved in cyclohexanone in the same manner as in Synthesis Example II-107, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

Example II-858 to Example II-861

The preparation of chemically amplified resists as performed in (Example II-8) to (Example II-11) were repeated except that the copolymer of Synthesis Example II-2 was replaced by the copolymer obtained Synthesis Example II-110 and that 3,3-bis-4'-t-butoxycarbonyloxy naphtalenyl-1(3H)-isobenzofuranone was replaced by 3,3-bis-5'-t-butoxycarbonyloxy naphtalenyl-1(3H)-isobenzofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 321 below together with the photo-acid generator employed. The values of etch rate were based on that of PMMA.

TABLE 321

| Example | Photo-acid generator | Light transmittance (1 μm) % | Etch rate (relative value) |
|---|---|---|---|
| II-858 | Triphenyl sulfonium triflate | 55 | 0.3 |
| II-859 | Diphenyl iodonium triflate | 59 | 0.3 |
| II-860 | NAT · 105 (Midori Kagaku Co., Ltd.) | 61 | 0.3 |
| II-861 | NAI · 105 (Midori Kagaku Co., Ltd.) | 60 | 0.3 |

As a result, it was found possible to form a line and space pattern of 0.15 μm in line width in any of examples.

(Synthesis Example II-111)

The procedures of Synthesis Example II-74 were repeated except that menthyl methacrylate and methacrylic acid were mixed in the ratio of 50:50 to prepare a mixture, which was then dissolved in cyclohexanone in the same manner as in Synthesis Example II-107, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

Example II-862 to Example II-865

The preparation of chemically amplified resists as performed in (Example II-8) to (Example II-11) were repeated except that the copolymer of Synthesis Example II-2 was replaced by the copolymer obtained in Synthesis Example II-111 and that 3,3-bis-4'-t-butoxycarbonyloxy naphtalenyl-1(3H)-isobenzofuranone was replaced by 3,3-bis-6'-butoxycarbonyloxy naphtalenyl-1(3H)-isobenzofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 322 below together with the photo-acid generator employed. The values of etch rate were based on that of PMMA.

TABLE 322

| Example | Photo-acid generator | Light transmittance (1 μm) % | Etch rate (relative value) |
|---|---|---|---|
| II-862 | Triphenyl sulfonium triflate | 60 | 0.3 |
| II-863 | Diphenyl iodonium triflate | 59 | 0.3 |
| II-864 | NAT · 105 (Midori Kagaku Co., Ltd.) | 61 | 0.3 |
| II-865 | NAI · 105 (Midori Kagaku Co., Ltd.) | 60 | 0.3 |

As a result, it was found possible to form a line and space pattern of 0.15 μm in line width in any of examples.

(Synthesis Example II-112)

The procedures of Synthesis Example II-74 were repeated except that menthyl methacrylate and methacrylic acid were mixed in the ratio of 55:45 to prepare a mixture, which was then dissolved in cyclohexanone in the same manner as in Synthesis Example II-107, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

Example II-866 to Example II-869

The preparation of chemically amplified resists as performed in (Example II-8) to (Example II-11) were repeated except that the copolymer of Synthesis Example II-2 was replaced by the copolymer obtained in Synthesis Example II-112 and that 3,3-bis-4'-t-butoxycarbonyloxy naphtalenyl-1(3H)-isobenzofuranone was replaced by 3,3-bis-7'-t-butoxycarbonyloxy naphtalenyl-1(3H)-isobenzofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 323 below together with the photo-acid generator employed. The values of etch rate were based on that of PMMA.

TABLE 323

| Example | Photo-acid generator | Light transmittance (1 $\mu$m) % | Etch rate (relative value) |
|---------|---------------------|---------------------------------|---------------------------|
| II-866 | Triphenyl sulfonium triflate | 55 | 0.3 |
| II-867 | Diphenyl iodonium triflate | 59 | 0.3 |
| II-868 | NAT · 105 (Midori Kagaku Co., Ltd.) | 61 | 0.3 |
| II-869 | NAI · 105 (Midori Kagaku Co., Ltd.) | 60 | 0.3 |

As a result, it was found possible to form a line and space pattern of 0.15 $\mu$m in line width in any of examples.
(Synthesis Example II-113)

The procedures of Synthesis Example II-74 were repeated except that menthyl methacrylate and methacrylic acid were mixed in the ratio of 60:40 to prepare a mixture, which was then dissolved in cyclohexanone in the same manner as in Synthesis Example II-107, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

Example II-870 to Example II-873

The preparation of chemically amplified resists as performed in (Example II-8) to (Example II-11) were repeated except that the copolymer of Synthesis Example II-2 was replaced by the copolymer obtained in Synthesis Example II-113 and that 3,3-bis-4'-t-butoxycarbonyloxy naphtalenyl-1(3H)-isobenzofuranone was replaced by 3,3-bis-8'-t-butoxycarbonyloxy naphtalenyl-1(3H)-isobenzofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 324 below together with the photo-acid generator employed. The values of etch rate were based on that of PMMA.

TABLE 324

| Example | Photo-acid generator | Light transmittance (1 $\mu$m) % | Etch rate (relative value) |
|---------|---------------------|---------------------------------|---------------------------|
| II-870 | Triphenyl sulfonium triflate | 60 | 0.3 |
| II-871 | Diphenyl iodonium triflate | 59 | 0.3 |
| II-872 | NAT · 105 (Midori Kagaku Co., Ltd.) | 61 | 0.3 |
| II-873 | NAI · 105 (Midori Kagaku Co., Ltd.) | 60 | 0.3 |

As a result, it was found possible to form a line and space pattern of 0.15 $\mu$m in line width in any of examples.
(Synthesis Example II-114)

In this Synthesis Example, another copolymer containing a monomer obtained in the above Synthesis Example II-73 was synthesized and then examined of its properties.

Namely, menthyl acrylate and methacrylic acid were mixed in the ratio of 30:70 to prepare 10 g of the mixture, which was then dissolved in 40 mL of THF together with 0.5 g of azoisobutylonitrile as a polymerization initiator.

The resultant solution was frozen with liquid nitrogen, and warmed to room temperature after repeating a 20 minute degassing of it five times. Then, the solution was heated in a nitrogen stream at oil temperature of 60° C. for 9 h. Then, the reaction was quenched by the addition of hexane. After being reprecipitated with hexane, the product was filtered and evaporated under vacuum thereby obtaining an aimed copolymer.

This copolymer was dissolved in cyclohexanone in the same manner as in Synthesis Example II-1, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

Example II-874 to Example II-877

The preparation of chemically amplified resists as performed in (Example II-8) to (Example II-11) were repeated except that the copolymer of Synthesis Example II-2 was replaced by the copolymer obtained in Synthesis Example II-114 and that 3,3-bis-4'-t-butoxycarbonyloxy naphtalenyl-1(3H)-isobenzofuranone was replaced by 3,3-bis-1'-t-butoxycarbonyloxy naphtalenyl-1(3H)-isonaphtalenofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 325 below-together with the photo-acid generator employed. The values of etch rate were based on that of PMMA.

TABLE 325

| Example | Photo-acid generator | Light transmittance (1 μm) % | Etch rate (relative value) |
|---------|---------------------|------------------------------|----------------------------|
| II-874  | Triphenyl sulfonium triflate | 55 | 0.3 |
| II-875  | Diphenyl iodonium triflate | 59 | 0.3 |
| II-876  | NAT · 105 (Midori Kagaku Co., Ltd.) | 61 | 0.3 |
| II-877  | NAI · 105 (Midori Kagaku Co., Ltd.) | 60 | 0.3 |

As a result, it was found possible to form a line and space pattern of 0.15 μm in line width in any of examples.

(Synthesis Example II-115)

The procedures of Synthesis Example II-74 were repeated except that menthyl acrylate and methacrylic acid were mixed in the ratio of 35:65 to prepare a mixture, which was then dissolved in cyclohexanone in the same manner as in Synthesis Example II-114, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

Example II-878 to Example II-881

The preparation of chemically amplified resists as performed in (Example II-8) to (Example II-11) were repeated except that the copolymer of Synthesis Example II-2 was replaced by the copolymer obtained in Synthesis Example II-115 and that 3,3-bis-4'-t-butoxycarbonyloxy naphtalenyl-1(3H)-isobenzofuranone was replaced by 3,3-bis-2'-t-butoxycarbonyloxy naphtalenyl-1(3H)-isonaphtalenofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 326 below together with the photo-acid generator employed. The values of etch rate were based on that of PMMA.

TABLE 326

| Example | Photo-acid generator | Light transmittance (1 μm) % | Etch rate (relative value) |
|---------|---------------------|------------------------------|----------------------------|
| II-878  | Triphenyl sulfonium triflate | 60 | 0.3 |
| II-879  | Diphenyl iodonium triflate | 59 | 0.3 |

TABLE 326-continued

| Example | Photo-acid generator | Light transmittance (1 μm) % | Etch rate (relative value) |
|---------|---------------------|------------------------------|----------------------------|
| II-880  | NAT · 105 (Midori Kagaku Co., Ltd.) | 61 | 0.3 |
| II-881  | NAI · 105 (Midori Kagaku Co., Ltd.) | 60 | 0.3 |

As a result, it was found possible to form a line and space pattern of 0.15 μm in line width in any of examples.

(Synthesis Example II-116)

The procedures of Synthesis Example II-74 were repeated except that menthyl acrylate and methacrylic acid were mixed in the ratio of 40:60 to prepare a mixture, which was then dissolved in cyclohexanone in the same manner as in Synthesis Example II-114, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

Example II-882 to Example II-885

The preparation of chemically amplified resists as performed in (Example II-8) to (Example II-11) were repeated except that the copolymer of Synthesis Example II-2 was replaced by the copolymer obtained in Synthesis Example II-116 and that 3,3-bis-4'-t-butoxycarbonyloxy naphtalenyl-1(3H)-isobenzofuranone was replaced by 3,3-bis-3'-t-butoxycarbonyloxy naphtalenyl-1(3H)-isonaphtalenofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 327 below together with the photo-acid generator employed. The values of etch rate were based on that of PMMA.

TABLE 327

| Example | Photo-acid generator | Light transmittance (1 μm) % | Etch rate (relative value) |
|---------|---------------------|------------------------------|----------------------------|
| II-882  | Triphenyl sulfonium triflate | 55 | 0.3 |
| II-883  | Diphenyl iodonium triflate | 59 | 0.3 |
| II-884  | NAT · 105 (Midori Kagaku Co., Ltd.) | 61 | 0.3 |
| II-885  | NAI · 105 (Midori Kagaku Co., Ltd.) | 60 | 0.3 |

As a result, it was found possible to form a line and space pattern of 0.15 μm in line width in any of examples.

(Synthesis Example II-117)

The procedures of Synthesis Example II-74 were repeated except that menthyl acrylate and methacrylic acid were mixed in the ratio of 45:55 to prepare a mixture, which was then dissolved in cyclohexanone in the same manner as in Synthesis Example II-114, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

Example II-886 to Example II-889

The preparation of chemically amplified resists as performed in (Example II-8) to (Example II-11) were repeated except that the copolymer of Synthesis Example II-2 was replaced by the copolymer obtained in Synthesis Example II-117 and that 3,3-bis-4'-t-butoxycarbonyloxy naphtalenyl-1(3H)-isobenzofuranone was replaced by 3,3-bis-4'-t-butoxycarbonyloxy naphtalenyl-1(3H)-isonaphtalenofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 328 below together with the photo-acid generator employed. The values of etch rate were based on that of PMMA.

TABLE 328

| Example | Photo-acid generator | Light transmittance (1 μm) % | Etch rate (relative value) |
|---|---|---|---|
| II-886 | Triphenyl sulfonium triflate | 60 | 0.3 |
| II-887 | Diphenyl iodonium triflate | 59 | 0.3 |
| II-888 | NAT · 105 (Midori Kagaku Co., Ltd.) | 61 | 0.3 |
| II-889 | NAI · 105 (Midori Kagaku Co., Ltd.) | 60 | 0.3 |

As a result, it was found possible to form a line and space pattern of 0.15 μm in line width in any of examples.
(Synthesis Example II-118)

The procedures of Synthesis Example II-74 were repeated except that menthyl acrylate and methacrylic acid were mixed in the ratio of 50:50 to prepare a mixture, which was then dissolved in cyclohexanone in the same manner as in Synthesis Example II-114, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

Example II-890 to Example II-893

The preparation of chemically amplified resists as performed in (Example II-8) to (Example II-11) were repeated except that the copolymer of Synthesis Example II-2 was replaced by the copolymer obtained in Synthesis Example II-118 and that 3,3-bis-4'-t-butoxycarbonyloxy naphtalenyl-1(3H)-isobenzofuranone was replaced by 3,3-bis-5'-t-butoxycarbonyloxy naphtalenyl-1(3H)-isonaphtalenofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 329 below together with the photo-acid generator employed. The values of etch rate were based on that of PMMA.

TABLE 339

| Example | Photo-acid generator | Light transmittance (1 μm) % | Etch rate (relative value) |
|---|---|---|---|
| II-890 | Triphenyl sulfonium triflate | 55 | 0.3 |
| II-891 | Diphenyl iodonium triflate | 59 | 0.3 |
| II-892 | NAT · 105 (Midori Kagaku Co., Ltd.) | 61 | 0.3 |
| II-893 | NAI · 105 (Midori Kagaku Co., Ltd.) | 60 | 0.3 |

As a result, it was found possible to form a line and space pattern of 0.15 μm in line width in any of examples.
(Synthesis Example II-119)

The procedures of Synthesis Example II-74 were repeated except that menthyl acrylate and methacrylic acid were mixed in the ratio of 55:45 to prepare a mixture, which was then dissolved in cyclohexanone in the same manner as in Synthesis Example II-114, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

Example II-894 to Example II-897

The preparation of chemically amplified resists as performed in (Example II-8) to (Example II-11) were repeated except that the copolymer of Synthesis Example II-2 was replaced by the copolymer obtained in Synthesis Example II-119 and that 3,3-bis-4'-t-butoxycarbonyloxy naphtalenyl-1(3H)-isobenzofuranone was replaced by 3,3-bis-6'-t-butoxycarbonyloxy naphtalenyl-1(3H)-isonaphtalenofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 330 below together with the photo-acid generator employed. The values of etch rate were based on that of PMMA.

TABLE 330

| Example | Photo-acid generator | Light transmittance (1 $\mu$m) % | Etch rate (relative value) |
|---|---|---|---|
| II-894 | Triphenyl sulfonium triflate | 60 | 0.3 |
| II-895 | Diphenyl iodonium triflate | 59 | 0.3 |
| II-896 | NAT · 105 (Midori Kagaku Co., Ltd.) | 61 | 0.3 |
| II-897 | NAI · 105 (Midori Kagaku Co., Ltd.) | 60 | 0.3 |

As a result, it was found possible to form a line and space pattern of 0.15 $\mu$m in line width in any of examples.

(Synthesis Example II-120)

The procedures of Synthesis Example II-74 were repeated except that menthyl acrylate and methacrylic acid were mixed in the ratio of 60:40 to prepare a mixture, which was then dissolved in cyclohexanone in the same manner as in Synthesis Example II-114, and the resultant solution was coated on a quartz wafer to examine of its transparency to ArF excimer laser beam (193 nm). As a result, the light transmittance thereof was found to be 74% indicating the superiority over that of PMMA.

The film was further measured of its etch rate by using carbon tetrafluoride ($CF_4$) gas in comparison with that of PMMA under the same conditions as mentioned above, finding that the etch rate of this copolymer was found to be 0.3 when the etch rate of PMMA was assumed to be 1, thus indicating the superiority of the copolymer over that of PMMA.

Example II-898 to Example II-901

The preparation of chemically amplified resists as performed in (Example II-8) to (Example II-11) were repeated except that the copolymer of Synthesis Example II-2 was replaced by the copolymer obtained in Synthesis Example II-120 and that 3,3-bis-4'-t-butoxycarbonyloxy naphtalenyl-1(3H)-isobenzofuranone was replaced by 3,3-bis-7'-t-butoxycarbonyloxy naphtalenyl-1(3H)-isonaphtalenofuranone. Using the resists, patterns were formed in the same manner as explained above, and the properties of these patterns were evaluated.

Further, as in the case of Synthesis Example II-1, the transparency and dry etch resistance were evaluated. The results obtained were summarized in Table 331 below together with the photo-acid generator employed. The values of etch rate were based on that of PMMA.

TABLE 331

| Example | Photo-acid generator | Light transmittance (1 $\mu$m) % | Etch rate (relative value) |
|---|---|---|---|
| II-898 | Triphenyl sulfonium triflate | 55 | 0.3 |
| II-899 | Diphenyl iodonium triflate | 59 | 0.3 |
| II-900 | NAT · 105 (Midori Kagaku Co., Ltd.) | 61 | 0.3 |
| II-901 | NAI · 105 (Midori Kagaku Co., Ltd.) | 60 | 0.3 |

As a result, it was found possible to form a line and space pattern of 0.15 $\mu$m in line width in any of examples.

Example III

In this example, compounds having a terpenoid skeleton were used as a photo-acid generator to synthesize chemically amplified resists, on which evaluation was made.

(Synthesis Example III-1)

10 g of menthylmercaptomethane was dissolved in 30 mL of nitromethane, and 54 g of iodomethane was added dropwise to the solution. The resultant solution was stirred for one hour at room temperature and then added dropwise with a solution of 12 g of silver trifluoromethan sulfonate in 200 mL of nitromethane. After being stirred for 15 h, the product was filtered and then evaporated. After being added with ether, the product was finally reprecipitated to obtain colorless menthyldimethyl sulfonium triflate.

(Synthesis Example III-2)

24 g of methacrylic acid, 31 g of menthol and 15 g of p-toluenesulfonic acid in 500 mL of toluene were heated under reflux at a oil temperature of 150° C. for 19 h. Subsequently, the reaction mixture was quenched by the addition of salt saturated sodium bicarbonate, solution. The mixture was extracted with ether, the organic layers were combined and washed with salt saturated sodium bicarbonate solution and then with an aqueous solution of sodium hydroxide, salt saturated ammonium chloride solution, then dried over salt saturated brine and sodium sulfate anhydrous. Finally, the resultant oily product was evaporated under reduced pressure to obtain menthyl methacrylate.

2.1 g of menthyl methacrylate and 0.4 g of azoisobutylonitrile as a polymerization initiator were dissolved in 6 mL of toluene.

The resultant solution was frozen with liquid nitrogen, and warmed to room temperature after repeating a 20 minute degassing of it three times. Then, the solution was heated in a nitrogen stream at oil temperature of 70° C. for 16 h. Then, the reaction was quenched by the addition of 600 mL of methanol. After being reprecipitated with methanol, the product was filtered and evaporated under vacuum thereby obtaining polymenthyl methacrylate.

(Evaluation of photo-acid generator obtained in Synthesis Example III-1)

1 g of polymenthyl methacrylate obtained in Synthesis Example III-2 and 0.1 g of menthyldimethyl sulfonium triflate as a photo-acid generator were dissolved in cyclohexanone, and the resultant solution was coated on a quartz wafer to a film thickness of 1 $\mu$m. The resultant film was examined of its transparency to ArF excimer laser beam (193 nm). As a result, the light transmittance of the film to the light of 193 nm in wavelength was found to be 50% as measured by converting it to the thickness of 1 μm.

For the preparation of Comparative Example III-1, 0.1 g of triphenylsulfonium hexafluoroantimonate was used in place of menthyldimethyl sulfonium triflate in the above process, then 1 g of polymenthyl methacrylate was added thereto, and the resultant mixture was dissolved in cyclohexanone. The solution of Comparative Example III-1 was coated on a quartz wafer to examine of its transparency to ArF excimer laser beam (193 nm). As a result, the light transmittance of the film to the light of 193 nm in wavelength was found to be 5% as converted to the thickness of 1 μm.

As evident from these result, a photo-acid generator comprising a terpenoid skeleton is high in light transmittance to the wavelength of 193 nm even if it is used in a concentration of 10%, whereas a photo-acid generator comprising a benzene ring is very poor in light transmittance.

In the following Examples III-1 to III-54, chemically amplified resists containing various kinds of copolymers and menthyldimethyl sulfonium triflate as a photo-acid generator obtained in Synthesis Example III-1 were synthesized and were examined of their properties.

Example III-1

Namely, menthyl methacrylate, t-butyl methacrylate and methacrylic acid were mixed in the ratio of 30:30:40 to prepare 10 g of the mixture, which was then dissolved in 40 mL of THF together with 0.5 g of azoisobutylonitrile as a polymerization initiator.

The resultant solution was frozen with liquid nitrogen, and warmed to room temperature after repeating a 20 minute degassing of it five times. Then, the solution was heated in a nitrogen stream at oil temperature of 60° C. for 9 h. Then, the reaction was quenched by the addition of hexane. After being reprecipitated with hexane, the product was filtered and evaporated under vacuum thereby obtaining an aimed copolymer.

2 g of this copolymer and 0.04 g of menthyldimethyl sulfonium triflate as a photo-acid generator were dissolved in 8 mL of 2-ethoxyethyl acetate. The resultant solution was coated on a silicon wafer to a thickness of 0.8 μm, prebaked at a temperature of 100° C., and exposed to ArF excimer laser beam (40 mJcm$^{-2}$). Then, the film was developed in an aqueous solution of tetramethyl ammonium hydroxide to form a pattern on which an evaluation was made. As a result, it was found possible to form a line and space pattern 0.15 μm in line width.

On the other hand the copolymer was dissolved in cyclohexanone and the resultant solution was coated on a quartz wafer to a thickness of 1 μm to examine its transparency to ArF excimer laser beam (193 nm). As a result, the light transmittance thereof was found to be 70%.

The film was further measured of its etch rate by using carbon tetrafluoride (CF$_4$) gas. The evaluation of dry etch resistance was performed under the following conditions. Namely, the flow rate of CF$_4$ was adjusted to 12.6 sccm, vacuum degree to 10 mTorr and the output of microwave to 150 W. As a result, the etch rate of the film was 0.3 as compared with that of PMMA.

In these examples, the monomer represented by the general formula (2), t-butylmethacrylate (a functional group to be decomposed by an acid) and methacrylate (an alkali-soluble group) may be mixed together in any ratio as long as the amount of these components fall within the shaded region in FIGURE.

Example III-2 to Example III-54

The same procedures as described in Example III-1 were repeated in the following Examples III-2 to III-54 except that copolymers respectively containing components shown in Tables 332 to 333 were employed for the copolymer of Example III-1 to study the characteristics of them. The etch rates shown therein were based on that of PMMA. In Tables 332 to 333, only the monomer components represented by the general formula (2) excluding t-butyl methacrylate and methacrylic acid are shown. The copolymer in each of these Examples was synthesized in the same manner as in the case of Example I.

TABLE 332

| Ex. | Monomer represented by general formula (2) in copolymer | Light transmittance (1 μm) % | Etching rate (relative value) |
|---|---|---|---|
| III-2 | Citronellyl methacrylate | 70 | 0.3 |
| III-3 | Pinocamphyl methacrylate | 71 | 0.3 |
| III-4 | Geranyl methacrylate | 73 | 0.3 |
| III-5 | Fenchyl methacrylate | 69 | 0.3 |
| III-6 | Neryl methacrylate | 70 | 0.3 |
| III-7 | Bornyl methacrylate | 70 | 0.3 |
| III-8 | Cineryl methacrylate | 71 | 0.3 |
| III-9 | Pinyl methacrylate | 73 | 0.3 |
| III-10 | Ascaridyl methacrylate | 72 | 0.3 |
| III-11 | Famesyl methacrylate | 71 | 0.3 |
| III-12 | Patchoulyl methacrylate | 70 | 0.3 |
| III-13 | Nerolidyl methacrylate | 68 | 0.3 |
| III-14 | Carotyl methacrylate | 69 | 0.3 |
| III-15 | Cadinyl methacrylate | 71 | 0.3 |
| III-16 | Lancyl methacrylate | 70 | 0.3 |
| III-17 | Eudesmyl methacrylate | 71 | 0.3 |
| III-18 | Cedryl methacrylate | 69 | 0.3 |
| III-19 | Guajyl methacrylate | 68 | 0.3 |
| III-20 | Kessoglycoxyl methacrylate | 70 | 0.3 |
| III-21 | Phytyl methacrylate | 68 | 0.3 |
| III-22 | Sclaryl methacrylate | 7i | 0.3 |
| III-23 | Manyl methacrylate | 71 | 0.3 |
| III-24 | Hinokyl methacrylate | 72 | 0.3 |
| III-25 | Ferruginyl methacrylate | 70 | 0.3 |

TABLE 332-continued

| Ex. | Monomer represented by general formula (2) in copolymer | Light transmittance (1 μm) % | Etching rate (relative value) |
|---|---|---|---|
| III-26 | Totaryl methacrylate | 68 | 0.3 |
| III-27 | Sugyl methacrylate | 70 | 0.3 |

TABLE 333

| Ex. | Monomer represented by general formula (2) in copolymer | Light transmittance (1 μm) % | Etching rate (relative value) |
|---|---|---|---|
| III-28 | Menthyl acrylate | 70 | 0.3 |
| III-29 | Citronellyl acrylate | 71 | 0.3 |
| III-30 | Pinocamphyl acrylate | 73 | 0.3 |
| III-31 | Geranyl acrylate | 69 | 0.3 |
| III-32 | Fenchyl acrylate | 70 | 0.3 |
| III-33 | Neryl acrylate | 70 | 0.3 |
| III-34 | Bornyl acrylate | 71 | 0.3 |
| III-35 | Cineryl acrylate | 73 | 0.3 |
| III-36 | Pinyl acrylate | 72 | 0.3 |
| III-37 | Ascaridyl acrylate | 71 | 0.3 |
| III-38 | Farnesyl acrylate | 70 | 0.3 |
| III-39 | Patchoulyl acrylate | 68 | 0.3 |
| III-40 | Nerolidyl acrylate | 69 | 0.3 |
| III-41 | Carotyl acrylate | 71 | 0.3 |
| III-42 | Cadinyl acrylate | 70 | 0.3 |
| III-43 | Lancyl acrylate | 71 | 0.3 |
| III-44 | Eudesmyl acrylate | 69 | 0.3 |
| III-45 | Cedryl acrylate | 68 | 0.3 |
| III-46 | Guajyl acrylate | 70 | 0.3 |
| III-47 | Kessoglycoxyl acrylate | 68 | 0.3 |
| III-48 | Phytyl acrylate | 71 | 0.3 |
| III-49 | Sclaryl acrylate | 71 | 0.3 |
| III-50 | Manyl acrylate | 72 | 0.3 |
| III-51 | Hinokyl acrylate | 70 | 0.3 |
| III-52 | Ferruginyl acrylate | 68 | 0.3 |
| III-53 | Totaryl acrylate | 70 | 0.3 |
| III-54 | Sugyl acrylate | 70 | 0.3 |

As a result, it was found possible to form a line and space pattern 0.15 μm in line width.

Example III-55 to Example III-108

In the following Examples III-55 to III-108, 0.04 g of menthyldimethyl sulfonium triflate obtained in Synthesis Example III-1 was employed as a photo-acid generator and dissolved in 8 mL of 2-ethoxyethyl acetate together with 2 g of copolymers shown in Tables 334 to 335 below and 3,3-bis-4'-t-butoxycarbonyl naphtalenyl-1(3H)-isobenzofuranone as a solubility-inhibiting agent. The products thus obtained were examined of their characteristics. The etch rates shown therein were based on that of PMMA.

TABLE 334

| Ex. | Monomer represented by general formula (2) in copolymer | Light transmittance (1 μm) % | Etching rate (relative value) |
|---|---|---|---|
| III-55 | Menthyl methacrylate | 70 | 0.3 |
| III-56 | Citronellyl methacrylate | 70 | 0.3 |
| III-57 | Pinocamphyl methacrylate | 71 | 0.3 |
| III-58 | Geranyl methacrylate | 73 | 0.3 |
| III-59 | Fenchyl methacrylate | 69 | 0.3 |
| III-60 | Neryl methacrylate | 70 | 0.3 |
| III-61 | Bornyl methacrylate | 70 | 0.3 |
| III-62 | Cineryl methacrylate | 71 | 0.3 |
| III-63 | Pinyl methacrylate | 73 | 0.3 |
| III-64 | Ascaridyl methacrylate | 72 | 0.3 |
| III-65 | Farnesyl methacrylate | 71 | 0.3 |
| III-66 | Patchoulyl methacrylate | 70 | 0.3 |
| III-67 | Nerolidyl methacrylate | 68 | 0.3 |
| III-68 | Carotyl methacrylate | 69 | 0.3 |
| III-69 | Cadinyl methacrylate | 71 | 0.3 |
| III-70 | Lancyl methacrylate | 70 | 0.3 |
| III-71 | Eudesmyl methacrylate | 71 | 0.3 |
| III-72 | Cedryl methacrylate | 69 | 0.3 |

TABLE 334-continued

| Ex. | Monomer represented by general formula (2) in copolymer | Light transmittance (1 μm) % | Etching rate (relative value) |
|---|---|---|---|
| III-73 | Guajyl methacrylate | 68 | 0.3 |
| III-74 | Kessoglycoxyl methacrylate | 70 | 0.3 |
| III-75 | Phytyl methacrylate | 68 | 0.3 |
| III-76 | Sclaryl methacrylate | 71 | 0.3 |
| III-77 | Manyl methacrylate | 71 | 0.3 |
| III-78 | Hinokyl methacrylate | 72 | 0.3 |
| III-79 | Ferruginyl methacrylate | 70 | 0.3 |
| III-80 | Totaryl methacrylate | 68 | 0.3 |
| III-81 | Sugyl methacrylate | 70 | 0.3 |

TABLE 335

| Ex. | Monomer represented by general formula (2) in copolymer | Light transmittance (1 μm) % | Etching rate (relative value) |
|---|---|---|---|
| III-82 | Menthyl acrylate | 70 | 0.3 |
| III-83 | Citronellyl acrylate | 71 | 0.3 |
| III-84 | Pinocamphyl acrylate | 73 | 0.3 |
| III-85 | Geranyl acrylate | 69 | 0.3 |
| III-86 | Fenchyl acrylate | 70 | 0.3 |
| III-87 | Neryl acrylate | 70 | 0.3 |
| III-88 | Bornyl acrylate | 71 | 0.3 |
| III-89 | Cineryl acrylate | 73 | 0.3 |
| III-90 | Pinyl acrylate | 72 | 0.3 |
| III-91 | Ascaridyl acrylate | 71 | 0.3 |
| III-92 | Farnesyl acrylate | 70 | 0.3 |
| III-93 | Patchoulyl acrylate | 68 | 0.3 |
| III-94 | Nerolidyl acrylate | 69 | 0.3 |
| III-95 | Carotyl acrylate | 71 | 0.3 |
| III-96 | Cadinyl acrylate | 70 | 0.3 |
| III-97 | Lancyl acrylate | 71 | 0.3 |
| III-98 | Eudesmyl acrylate | 69 | 0.3 |
| III-99 | Cedryl acrylate | 68 | 0.3 |
| III-100 | Guajyl acrylate | 70 | 0.3 |
| III-101 | Kessoglycoxyl acrylate | 68 | 0.3 |
| III-102 | Phytyl acrylate | 71 | 0.3 |
| III-103 | Sclaryl acrylate | 71 | 0.3 |
| III-104 | Manyl acrylate | 72 | 0.3 |
| III-105 | Hinokyl acrylate | 70 | 0.3 |
| III-106 | Ferruginyl acrylate | 68 | 0.3 |
| III-107 | Totaryl acrylate | 70 | 0.3 |
| III-108 | Sugyl acrylate | 70 | 0.3 |

As a result, it was found possible to form a line and space pattern 0.15 μm in line width.

(Synthesis Example III-3)

The same processes as described in Synthesis Example III-1 were undergone except that menthylmercaptomethane was replaced by the same amount of citronellylmercaptomethane thereby obtaining citronellyldimethyl sulfonium triflate.

Example III-109 to Example III-162

The same procedures as described in Examples III-1 to III-54 were repeated except that citronellyldimethyl sulfonium triflate obtained in Synthesis Example III-3 was employed as a photo-acid generator thereby obtaining chemically amplified resists to study the characteristics of them.

The results obtained are summarized in the following Tables 336 to 337. The etch rates shown are based on that of PMMA.

TABLE 336

| III-109 | Menthyl methacrylate | 70 | 0.3 |
|---|---|---|---|
| III-110 | Citronellyl methacrylate | 70 | 0.3 |
| III-111 | Pinocamphyl methacrylate | 71 | 0.3 |
| III-112 | Ceranyl methacrylate | 73 | 0.3 |
| III-113 | Fenchyl methacrylate | 69 | 0.3 |
| III-114 | Neryl methacrylate | 70 | 0.3 |
| III-115 | Bornyl methacrylate | 70 | 0.3 |
| III-116 | Cineryl methacrylate | 7i | 0.3 |
| III-117 | Pinyl methacrylate | 73 | 0.3 |

TABLE 336-continued

| | | | |
|---|---|---|---|
| III-118 | Ascaridyl methacrylate | 72 | 0.3 |
| III-119 | Farnesyl methacrylate | 71 | 0.3 |
| III-120 | Patchoulyl methacrylate | 70 | 0.3 |
| III-121 | Nerolidyl methacrylate | 68 | 0.3 |
| III-122 | Carotyl methacrylate | 69 | 0.3 |
| III-123 | Cadinyl methacrylate | 71 | 0.3 |
| III-124 | Lancyl methacrylate | 70 | 0.3 |
| III-125 | Eudesmyl methacrylate | 71 | 0.3 |
| III-126 | Cedryl methacrylate | 69 | 0.3 |
| III-127 | Guajyl methacrylate | 68 | 0.3 |
| III-128 | Kessoglycoxyl methacrylate | 70 | 0.3 |
| III-129 | Phytyl methacrylate | 68 | 0.3 |
| III-130 | Sclaryl methacrylate | 71 | 0.3 |
| III-131 | Manyl methacrylate | 71 | 0.3 |
| III-132 | Hinokyl methacrylate | 72 | 0.3 |
| III-133 | Ferruginyl methacrylate | 70 | 0.3 |
| III-134 | Totaryl methacrylate | 68 | 0.3 |
| III-135 | Sugyl methacrylate | 70 | 0.3 |

TABLE 337

| Ex. | Monomer represented by general formula (2) in copolymer | Light transmittance (1 μm) % | Etching rate (relative value) |
|---|---|---|---|
| III-136 | Menthyl acrylate | 70 | 0.3 |
| III-137 | Citronellyl acrylate | 71 | 0.3 |
| III-138 | Pinocamphyl acrylate | 73 | 0.3 |
| III-139 | Geranyl acrylate | 69 | 0.3 |
| III-140 | Fenchyl acrylate | 70 | 0.3 |
| III-141 | Neryl acrylate | 70 | 0.3 |
| III-142 | Bornyl acrylate | 71 | 0.3 |
| III-143 | Cineryl acrylate | 73 | 0.3 |
| III-144 | Pinyl acrylate | 72 | 0.3 |
| III-145 | Ascaridyl acrylate | 71 | 0.3 |
| III-146 | Farnesyl acrylate | 70 | 0.3 |
| III-147 | Patchoulyl acrylate | 68 | 0.3 |
| III-148 | Nerolidyl acrylate | 69 | 0.3 |
| III-149 | Carotyl acrylate | 71 | 0.3 |
| III-150 | Cadinyl acrylate | 70 | 0.3 |
| III-151 | Lancyl acrylate | 71 | 0.3 |
| III-152 | Eudesmyl acrylate | 69 | 0.3 |
| III-153 | Cedryl acrylate | 68 | 0.3 |
| III-154 | Guajyl acrylate | 70 | 0.3 |
| III-155 | Kessoglycoxyl acrylate | 68 | 0.3 |
| III-156 | Phytyl acrylate | 71 | 0.3 |
| III-157 | Sclaryl acrylate | 71 | 0.3 |
| III-158 | Manyl acrylate | 72 | 0.3 |
| III-159 | Hinokyl acrylate | 70 | 0.3 |
| III-160 | Ferruginyl acrylate | 68 | 0.3 |
| III-161 | Totaryl acrylate | 70 | 0.3 |
| III-162 | Sugyl acrylate | 70 | 0.3 |

As a result, it was found possible to form a line and space pattern 0.15 μm in line width.

Example III-163 to Example III-216

The same procedures as described in Examples III-55 to III-108 were repeated except that citronellyldimethyl sulfonium triflate obtained in Synthesis Example III-3 was employed as a photo-acid generator thereby obtaining chemically amplified resists to study the characteristics of them.

The results obtained are summarized in the following Tables 338 to 339. The etch rates shown are based on that of PMMA.

TABLE 338

| Ex. | Monomer represented by general formula (2) in copolymer | Light transmittance (1 μm) % | Etching rate (relative value) |
|---|---|---|---|
| III-163 | Menthyl methacrylate | 70 | 0.3 |
| III-164 | Citronellyl methacrylate | 70 | 0.3 |
| III-165 | Pinocamphyl methacrylate | 71 | 0.3 |
| III-166 | Geranyl methacrylate | 73 | 0.3 |
| III-167 | Fenchyl methacrylate | 69 | 0.3 |
| III-168 | Neryl methacrylate | 70 | 0.3 |

TABLE 338-continued

| Ex. | Monomer represented by general formula (2) in copolymer | Light transmittance (1 μm) % | Etching rate (relative value) |
|---|---|---|---|
| III-169 | Bornyl methacrylate | 70 | 0.3 |
| III-170 | Cineryl methacrylate | 71 | 0.3 |
| III-171 | Pinyl methacrylate | 73 | 0.3 |
| III-172 | Ascaridyl methacrylate | 72 | 0.3 |
| III-173 | Farnesyl methacrylate | 71 | 0.3 |
| III-174 | Patchoulyl methacrylate | 70 | 0.3 |
| III-175 | Nerolidyl methacrylate | 68 | 0.3 |
| III-176 | Carotyl methacrylate | 69 | 0.3 |
| III-177 | Cadinyl methacrylate | 71 | 0.3 |
| III-178 | Lancyl methacrylate | 70 | 0.3 |
| III-179 | Eudesmyl methacrylate | 71 | 0.3 |
| III-180 | Cedryl methacrylate | 69 | 0.3 |
| III-181 | Guajyl methacrylate | 68 | D.3 |
| III-182 | Kessoglycoxyl methacrylate | 70 | 0.3 |
| III-183 | Phytyl methacrylate | 68 | 0.3 |
| III-184 | Sclaryl methacrylate | 71 | 0.3 |
| III-185 | Manyl methacrylate | 71 | 0.3 |
| III-186 | Hinokyl methacrylate | 72 | 0.3 |
| III-187 | Ferruginyl methacrylate | 70 | 0.3 |
| III-188 | Totaryl methacrylate | 68 | 0.3 |
| III-189 | Sugyl methacrylate | 70 | 0.3 |

TABLE 339

| Ex. | Monomer represented by general formula (2) in copolymer | Light transmittance (1 μm) % | Etching rate (relative value) |
|---|---|---|---|
| III-190 | Menthyl acrylate | 70 | 0.3 |
| III-191 | Citronellyl acrylate | 71 | 0.3 |
| III-192 | Pinocamphyl acrylate | 73 | 0.3 |
| III-193 | Geranyl acrylate | 69 | 0.3 |
| III-194 | Fenchyl acrylate | 70 | 0.3 |
| III-195 | Neryl acrylate | 70 | 0.3 |
| III-196 | Bornyl acrylate | 71 | 0.3 |
| III-197 | Cineryl acrylate | 73 | 0.3 |
| III-198 | Pinyl acrylate | 72 | 0.3 |
| III-199 | Ascaridyl acrylate | 71 | 0.3 |
| III-200 | Farnesyl acrylate | 70 | 0.3 |
| III-201 | Patchoulyl acrylate | 68 | 0.3 |
| III-202 | Nerolidyl acrylate | 69 | 0.3 |
| III-203 | Carotyl acrylate | 71 | 0.3 |
| III-204 | Cadinyl acrylate | 70 | 0.3 |
| III-205 | Lancyl acrylate | 71 | 0.3 |
| III-206 | Eudesmyl acrylate | 69 | 0.3 |
| III-207 | Cedryl acrylate | 68 | 0.3 |
| III-208 | Guajyl acrylate | 70 | 0.3 |
| III-209 | Kessoglycoxyl acrylate | 68 | 0.3 |
| III-210 | Phytyl acrylate | 71 | 0.3 |
| III-211 | Sclaryl acrylate | 71 | 0.3 |
| III-212 | Manyl acrylate | 72 | 0.3 |
| III-213 | Hinokyl acrylate | 70 | 0.3 |
| III-214 | Ferruginyl acrylate | 68 | 0.3 |
| III-215 | Totaryl acrylate | 70 | 0.3 |
| III-216 | Sugyl acrylate | 70 | 0.3 |

As a result, it was found possible to form a line and space pattern 0.15 μm in line width.

(Synthesis Example III-4)

The same processes as described in Synthesis Example III-1 were undergone except that menthylmercaptomethane was replaced by the same amount of pinocamphylmercaptomethane thereby obtaining pinocamphyldimethyl sulfonium triflate.

Example III-217 to Example III-270

The same procedures as described in Examples III-1 to III-54 were repeated except that pinocamphyldimethyl sulfonium triflate obtained in Synthesis Example III-4 was employed as a photo-acid generator thereby obtaining chemically amplified resists to study the characteristics of them.

The results obtained are summarized in the following Tables 340 to 341. The etch rates shown are based on that of PMMA.

TABLE 340

| Ex. | Monomer represented by general formula (2) in copolymer | Light transmittance (1 μm) % | Etching rate (relative value) |
|---|---|---|---|
| III-217 | Menthyl methacrylate | 70 | 0.3 |
| III-218 | Citronellyl methacrylate | 70 | 0.3 |
| III-219 | Pinocamphyl methacrylate | 71 | 0.3 |
| III-220 | Geranyl methacrylate | 73 | 0.3 |
| III-221 | Fenchyl methacrylate | 69 | 0.3 |
| III-222 | Neryl methacrylate | 70 | 0.3 |
| III-223 | Bornyl methacrylate | 70 | 0.3 |
| III-224 | Cineryl methacrylate | 71 | 0.3 |
| III-225 | Pinyl methacrylate | 73 | 0.3 |
| III-226 | Ascaridyl methacrylate | 72 | 0.3 |
| III-227 | Farnesyl methacrylate | 71 | 0.3 |
| III-228 | Patchoulyl methacrylate | 70 | 0.3 |
| III-229 | Nerolidyl methacrylate | 68 | 0.3 |
| III-230 | Carotyl methacrylate | 69 | 0.3 |
| III-231 | Cadinyl methacrylate | 71 | 0.3 |
| III-232 | Lancyl methacrylate | 70 | 0.3 |
| III-233 | Eudesmyl methacrylate | 71 | 0.3 |
| III-234 | Cedryl methacrylate | 69 | 0.3 |
| III-235 | Guajyl methacrylate | 68 | 0.3 |
| III-236 | Kessoglycoxyl methacrylate | 70 | 0.3 |
| III-237 | Phytyl methacrylate | 68 | 0.3 |
| III-238 | Sclaryl methacrylate | 71 | 0.3 |
| III-239 | Manyl methacrylate | 71 | 0.3 |
| III-240 | Hinokyl methacrylate | 72 | 0.3 |
| III-241 | Ferruginyl methacrylate | 70 | 0.3 |
| III-242 | Totaryl methacrylate | 68 | 0.3 |
| III-243 | Sugyl methacrylate | 70 | 0.3 |

TABLE 341

| Ex. | Monomer represented by general formula (2) in copolymer | Light transmittance (1 μm) % | Etching rate (relative value) |
|---|---|---|---|
| III-244 | Menthyl acrylate | 70 | 0.3 |
| III-245 | Citronellyl acrylate | 71 | 0.3 |
| III-246 | Pinocamphyl acrylate | 73 | 0.3 |
| III-247 | Geranyl acrylate | 69 | 0.3 |
| III-248 | Fenchyl acrylate | 70 | 0.3 |
| III-249 | Neryl acrylate | 70 | 0.3 |
| III-250 | Bornyl acrylate | 71 | 0.3 |
| III-251 | Cineryl acrylate | 73 | 0.3 |
| III-252 | Pinyl acrylate | 72 | 0.3 |
| III-253 | Ascaridyl acrylate | 71 | 0.3 |
| III-254 | Farnesyl acrylate | 70 | 0.3 |
| III-255 | Patchoulyl acrylate | 68 | 0.3 |
| III-256 | Nerolidyl acrylate | 69 | 0.3 |
| III-257 | Carotyl acrylate | 71 | 0.3 |
| III-258 | Cadinyl acrylate | 70 | 0.3 |
| III-259 | Lancyl acrylate | 71 | 0.3 |
| III-260 | Eudesmyl acrylate | 69 | 0.3 |
| III-261 | Cedryl acrylate | 68 | 0.3 |
| III-262 | Guajyl acrylate | 70 | 0.3 |
| III-263 | Kessoglycoxyl acrylate | 68 | 0.3 |
| III-264 | Phytyl acrylate | 71 | 0.3 |
| III-265 | Sclaryl acrylate | 71 | 0.3 |
| III-266 | Manyl acrylate | 72 | 0.3 |
| III-267 | Hinokyl acrylate | 70 | 0.3 |
| III-268 | Ferruginyl acrylate | 68 | 0.3 |
| III-269 | Totaryl acrylate | 70 | 0.3 |
| III-270 | Sugyl acrylate | 70 | 0.3 |

As a result, it was found possible to form a line and space pattern 0.15 μm in line width.

Example III-271 to Example III-324

The same procedures as described in Examples III-55 to III-108 were repeated except that pinocamphyldimethyl sulfonium triflate obtained in Synthesis Example III-4 was employed as a photo-acid generator thereby obtaining chemically amplified resists to study the characteristics of them.

The results obtained are summarized in the following Tables 342 to 343. The etch rates shown are based on that of PMMA.

TABLE 342

| Ex. | Monomer represented by general formula (2) in copolymer | Light transmittance (1 μm) % | Etching rate (relative value) |
|---|---|---|---|
| III-271 | Menthyl methacrylate | 70 | 0.3 |
| III-272 | Citronellyl methacrylate | 70 | 0.3 |
| III-273 | Pinocamphyl methacrylate | 71 | 0.3 |
| III-274 | Geranyl methacrylate | 73 | 0.3 |
| III-275 | Fenchyl methacrylate | 69 | 0.3 |
| III-276 | Neryl methacrylate | 70 | 0.3 |
| III-277 | Bornyl methacrylate | 70 | 0.3 |
| III-278 | Cineryl methacrylate | 71 | 0.3 |
| III-279 | Pinyl methacrylate | 73 | 0.3 |
| III-280 | Ascaridyl methacrylate | 72 | 0.3 |
| III-281 | Farnesyl methacrylate | 71 | 0.3 |
| III-282 | Patchoulyl methacrylate | 70 | 0.3 |
| III-283 | Nerolidyl methacrylate | 68 | 0.3 |
| III-284 | Carotyl methacrylate | 69 | 0.3 |
| III-285 | Cadinyl methacrylate | 71 | 0.3 |
| III-286 | Lancyl methacrylate | 70 | 0.3 |
| III-287 | Eudesmyl methacrylate | 71 | 0.3 |
| III-288 | Cedryl methacrylate | 69 | 0.3 |
| III-289 | Guajyl methacrylate | 68 | 0.3 |
| III-290 | Kessoglycoxyl methacrylate | 70 | 0.3 |
| III-291 | Phytyl methacrylate | 68 | 0.3 |
| III-292 | Sclaryl methacrylate | 71 | 0.3 |
| III-293 | Manyl methacrylate | 71 | 0.3 |
| III-294 | Hinokyl methacrylate | 72 | 0.3 |
| III-295 | Ferruginyl methacrylate | 70 | 0.3 |
| III-296 | Totaryl methacrylate | 68 | 0.3 |
| III-297 | Sugyl methacrylate | 70 | 0.3 |

TABLE 343

| Ex. | Monomer represented by general formula (2) in copolymer | Light transmittance (1 μm) % | Etching rate (relative value) |
|---|---|---|---|
| III-298 | Menthyl acrylate | 70 | 0.3 |
| III-299 | Citronellyl acrylate | 71 | 0.3 |
| III-300 | Pinocamphyl acrylate | 73 | 0.3 |
| III-301 | Geranyl acrylate | 69 | 0.3 |
| III-302 | Fenchyl acrylate | 70 | 0.3 |
| III-303 | Neryl acrylate | 70 | 0.3 |
| III-304 | Bornyl acrylate | 71 | 0.3 |
| III-305 | Cineryl acrylate | 73 | 0.3 |
| III-306 | Pinyl acrylate | 72 | 0.3 |
| III-307 | Ascaridyl acrylate | 71 | 0.3 |
| III-308 | Farnesyl acrylate | 70 | 0.3 |
| III-309 | Patchoulyl acrylate | 68 | 0.3 |
| III-310 | Nerolidyl acrylate | 69 | 0.3 |
| III-311 | Carotyl acrylate | 71 | 0.3 |
| III-312 | Cadinyl acrylate | 70 | 0.3 |
| III-313 | Lancyl acrylate | 71 | 0.3 |
| III-314 | Eudesmyl acrylate | 69 | 0.3 |
| III-315 | Cedryl acrylate | 68 | 0.3 |
| III-316 | Guajyl acrylate | 70 | 0.3 |
| III-317 | Kessoglycoxyl acrylate | 68 | 0.3 |
| III-318 | Phytyl acrylate | 71 | 0.3 |
| III-319 | Sclaryl acrylate | 71 | 0.3 |
| III-320 | Manyl acrylate | 72 | 0.3 |
| III-321 | Hinokyl acrylate | 70 | 0.3 |
| III-322 | Ferruginyl acrylate | 68 | 0.3 |
| III-323 | Totaryl acrylate | 70 | 0.3 |
| III-324 | Sugyl acrylate | 70 | 0.3 |

As a result, it was found possible to form a line and space pattern 0.15 μm in line width.

(Synthesis Example III-5)

The same processes as described in Synthesis Example III-1 were undergone except that menthylmercaptomethane was replaced by the same amount of geranylmercaptomethane thereby obtaining geranyldimethyl sulfonium triflate.

Example III-325 to Example III-378

The same procedures as described in Examples III-1 to III-54 were repeated except that geranyldimethyl sulfonium triflate obtained in Synthesis Example III-5 was employed as a photo-acid generator thereby obtaining chemically amplified resists to study the characteristics of them.

The results obtained are summarized in the following Tables 344 to 345. The etch rates shown are based on that of PMMA.

TABLE 344

| Ex. | Monomer represented by general formula (2) in copolymer | Light transmittance (1 μm) % | Etching rate (relative value) |
|---|---|---|---|
| III-325 | Menthyl acrylate | 70 | 0.3 |
| III-326 | Citronellyl methacrylate | 70 | 0.3 |
| III-327 | Pinocamphyl methacrylate | 71 | 0.3 |
| III-328 | Geranyl methacrylate | 73 | 0.3 |
| III-329 | Fenchyl methacrylate | 69 | 0.3 |
| III-330 | Neryl methacrylate | 70 | 0.3 |
| III-331 | Bornyl methacrylate | 70 | 0.3 |
| III-332 | Cineryl methacrylate | 71 | 0.3 |
| III-333 | Pinyl methacrylate | 73 | 0.3 |
| III-334 | Ascaridyl methacrylate | 72 | 0.3 |
| III-335 | Farnesyl methacrylate | 71 | 0.3 |
| III-336 | Patchoulyl methacrylate | 70 | 0.3 |
| III-337 | Nerolidyl methacrylate | 68 | 0.3 |
| III-338 | Carotyl methacrylate | 69 | 0.3 |
| III-339 | Cadinyl methacrylate | 71 | 0.3 |
| III-340 | Lancyl methacrylate | 70 | 0.3 |
| III-341 | Eudesmyl methacrylate | 71 | 0.3 |
| III-342 | Cedryl methacrylate | 69 | 0.3 |
| III-343 | Guajyl methacrylate | 68 | 0.3 |
| III-344 | Kessoglycoxyl methacrylate | 70 | 0.3 |
| III-345 | Phytyl methacrylate | 68 | 0.3 |
| III-346 | Sclaryl methacrylate | 71 | 0.3 |
| III-347 | Manyl methacrylate | 71 | 0.3 |
| III-348 | Hinokyl methacrylate | 72 | 0.3 |
| III-349 | Ferruginyl methacrylate | 70 | 0.3 |
| III-350 | Totaryl methacrylate | 68 | 0.3 |
| III-351 | Sugyl methacrylate | 70 | 0.3 |

TABLE 345

| Ex. | Monomer represented by general formula (2) in copolymer | Light transmittance (1 μm) % | Etching rate (relative value) |
|---|---|---|---|
| III-352 | Menthyl acrylate | 70 | 0.3 |
| III-353 | Citronellyl acrylate | 71 | 0.3 |
| III-354 | Pinocamphyl acrylate | 73 | 0.3 |
| III-355 | Geranyl acrylate | 69 | 0.3 |
| III-356 | Fenchyl acrylate | 70 | 0.3 |
| III-357 | Neryl acrylate | 70 | 0.3 |
| III-358 | Bornyl acrylate | 71 | 0.3 |
| III-359 | Cineryl acrylate | 73 | 0.3 |
| III-360 | Pinyl acrylate | 72 | 0.3 |
| III-361 | Ascaridyl acrylate | 71 | 0.3 |
| III-362 | Farnesyl acrylate | 70 | 0.3 |
| III-363 | Patchoulyl acrylate | 68 | 0.3 |
| III-364 | Nerolidyl acrylate | 69 | 0.3 |
| III-365 | Carotyl acrylate | 71 | 0.3 |
| III-366 | Gadinyl acrylate | 70 | 0.3 |
| III-367 | Lancyl acrylate | 71 | 0.3 |
| III-368 | Eudesmyl acrylate | 69 | 0.3 |
| III-369 | Cedryl acrylate | 68 | 0.3 |
| III-370 | Guajyl acrylate | 70 | 0.3 |
| III-371 | Kessoglycoxyl acrylate | 68 | 0.3 |
| III-372 | Phytyl acrylate | 71 | 0.3 |
| III-373 | Sclaryl acrylate | 71 | 0.3 |
| III-374 | Manyl acrylate | 72 | 0.3 |
| III-375 | Hinokyl acrylate | 70 | 0.3 |
| III-376 | Ferruginyl acrylate | 68 | 0.3 |
| III-377 | Totaryl acrylate | 70 | 0.3 |
| III-378 | Sugyl acrylate | 70 | 0.3 |

As a result, it was found possible to form a line and space pattern 0.15 μm in line width.

Example III-379 to Example III-432

The same procedures as described in Examples III-55 to III-108 were repeated except that geranyldimethyl sulfonium triflate obtained in Synthesis Example III-5 was employed as a photo-acid generator thereby obtaining chemically amplified resists to study the characteristics of them.

The results obtained are summarized in the following Tables 346 to 347. The etch rates shown are based on that of PMMA.

TABLE 346

| Ex. | Monomer represented by general formula (2) in copolymer | Light transmittance (1 μm) % | Etching rate (relative value) |
| --- | --- | --- | --- |
| III-379 | Menthyl methacrylate | 70 | 0.3 |
| III-380 | Citronellyl methacrylate | 70 | 0.3 |
| III-381 | Pinocamphyl methacrylate | 71 | 0.3 |
| III-382 | Geranyl methacrylate | 73 | 0.3 |
| III-383 | Fenchyl methacrylate | 69 | 0.3 |
| III-384 | Neryl methacrylate | 70 | 0.3 |
| III-385 | Bornyl methacrylate | 70 | 0.3 |
| III-386 | Cineryl methacrylate | 71 | 0.3 |
| III-387 | Pinyl methacrylate | 73 | 0.3 |
| III-388 | Ascaridyl methacrylate | 72 | 0.3 |
| III-389 | Farnesyl methacrylate | 71 | 0.3 |
| III-390 | Patchoulyl methacrylate | 70 | 0.3 |
| III-391 | Nerolidyl methacrylate | 68 | 0.3 |
| III-392 | Carotyl methacrylate | 69 | 0.3 |
| III-393 | Cadinyl methacrylate | 71 | 0.3 |
| III-394 | Lancyl methacrylate | 70 | 0.3 |
| III-395 | Eudesmyl methacrylate | 71 | 0.3 |
| III-396 | Cedryl methacrylate | 69 | 0.3 |
| III-397 | Guajyl methacrylate | 68 | 0.3 |
| III-398 | Kessoglycoxyl methacrylate | 70 | 0.3 |
| III-399 | Phytyl methacrylate | 68 | 0.3 |
| III-400 | Sclaryl methacrylate | 71 | 0.3 |
| III-401 | Manyl methacrylate | 71 | 0.3 |
| III-402 | Hinokyl methacrylate | 72 | 0.3 |
| III-403 | Ferruginyl methacrylate | 70 | 0.3 |
| III-404 | Totaryl methacrylate | 68 | 0.3 |
| III-405 | Sugyl methacrylate | 70 | 0.3 |

TABLE 347

| Ex. | Monomer represented by general formula (2) in copolymer | Light transmittance (1 μm) % | Etching rate (relative value) |
| --- | --- | --- | --- |
| III-406 | Menthyl acrylate | 70 | 0.3 |
| III-407 | Citronellyl acrylate | 71 | D.3 |
| III-408 | Pinocamphyl acrylate | 73 | 0.3 |
| III-409 | Geranyl acrylate | 69 | 0.3 |
| III-410 | Fenchyl acrylate | 70 | 0.3 |
| III-411 | Neryl acrylate | 70 | 0.3 |
| III-412 | Bornyl acrylate | 71 | 0.3 |
| III-413 | Cineryl acrylate | 73 | 0.3 |
| III-414 | Pinyl acrylate | 72 | 0.3 |
| III-415 | Ascaridyl acrylate | 71 | 0.3 |
| III-416 | Farnesyl acrylate | 70 | 0.3 |
| III-417 | Patchoulyl acrylate | 68 | 0.3 |
| III-418 | Nerolidyl acrylate | 69 | 0.3 |
| III-419 | Carotyl acrylate | 71 | 0.3 |
| III-420 | Cadinyl acrylate | 70 | 0.3 |
| III-421 | Lancyl acrylate | 71 | 0.3 |
| III-422 | Eudesmyl acrylate | 69 | 0.3 |
| III-423 | Cedryl acrylate | 68 | 0.3 |
| III-424 | Guajyl acrylate | 70 | 0.3 |
| III-425 | Kessoglycoxyl acrylate | 68 | 0.3 |
| III-426 | Phytyl acrylate | 71 | 0.3 |
| III-427 | Sclaryl acrylate | 71 | 0.3 |
| III-428 | Manyl acrylate | 72 | 0.3 |
| III-429 | Hinokyl acrylate | 70 | 0.3 |
| III-430 | Ferruginyl acrylate | 68 | 0.3 |
| III-431 | Totaryl acrylate | 70 | 0.3 |
| III-432 | Sugyl acrylate | 70 | 0.3 |

As a result, it was found possible to form a line and space pattern 0.15 μm in line width.

(Synthesis Example III-6)

The same processes as described in Synthesis Example III-1 were undergone except that fenchylmercaptomethane was replaced by the same amount of fenchylmercaptomethane thereby obtaining fenchyldimethyl sulfonium triflate.

Example III-433 to Example III-486

The same procedures as described in Examples III-1 to III-54 were repeated except that fenchyldimethyl sulfonium triflate obtained in Synthesis Example III-6 was employed as a photo-acid generator thereby obtaining chemically amplified resists to study the characteristics of them.

The results obtained are summarized in the following Tables 348 to 349. The etch rates shown are based on that of PMMA.

TABLE 348

| Ex. | Monomer represented by general formula (2) in copolymer | Light transmittance (1 μm) % | Etching rate (relative value) |
|---|---|---|---|
| III-433 | Menthyl methacrylate | 70 | 0.3 |
| III-434 | Citronellyl methacrylate | 70 | 0.3 |
| III-435 | Pinocamphyl methacrylate | 71 | 0.3 |
| III-436 | Geranyl methacrylate | 73 | 0.3 |
| III-437 | Fenchyl methacrylate | 69 | 0.3 |
| III-438 | Neryl methacrylate | 70 | 0.3 |
| III-439 | Bornyl methacrylate | 70 | 0.3 |
| III-440 | Cineryl methacrylate | 71 | 0.3 |
| III-441 | Pinyl methacrylate | 73 | 0.3 |
| III-442 | Ascaridyl methacrylate | 72 | 0.3 |
| III-443 | Farnesyl methacrylate | 71 | 0.3 |
| III-444 | Patchoulyl methacrylate | 70 | 0.3 |
| III-445 | Nerolidyl methacrylate | 68 | 0.3 |
| III-446 | Carotyl methacrylate | 69 | 0.3 |
| III-447 | Cadinyl methacrylate | 71 | 0.3 |
| III-448 | Lancyl methacrylate | 70 | 0.3 |
| III-449 | Eudesmyl methacrylate | 71 | 0.3 |
| III-450 | Cedryl methacrylate | 69 | 0.3 |
| III-451 | Guajyl methacrylate | 68 | 0.3 |
| III-452 | Kessoglycoxyl methacrylate | 70 | 0.3 |
| III-453 | Phytyl methacrylate | 68 | 0.3 |
| III-454 | Sclaryl methacrylate | 71 | 0.3 |
| III-455 | Manyl methacrylate | 71 | 0.3 |
| III-456 | Hinokyl methacrylate | 72 | 0.3 |
| III-457 | Ferruginyl methacrylate | 70 | 0.3 |
| III-458 | Totaryl methacrylate | 68 | 0.3 |
| III-459 | Sugyl methacrylate | 70 | 0.3 |

TABLE 349

| Ex. | Monomer represented by general formula (2) in copolymer | Light transmittance (1 μm) % | Etching rate (relative value) |
|---|---|---|---|
| III-460 | Menthyl acrylate | 70 | 0.3 |
| III-461 | Citronellyl acrylate | 71 | 0.3 |
| III-462 | Pinocamphyl acrylate | 73 | 0.3 |
| III-463 | Geranyl acrylate | 69 | 0.3 |
| III-464 | Fenchyl acrylate | 70 | 0.3 |
| III-465 | Neryl acrylate | 70 | 0.3 |
| III-466 | Bornyl acrylate | 71 | 0.3 |
| III-467 | Cineryl acrylate | 73 | 0.3 |
| III-468 | Pinyl acrylate | 72 | 0.3 |
| III-469 | Ascaridyl acrylate | 71 | 0.3 |
| III-470 | Farnesyl acrylate | 70 | 0.3 |
| III-471 | Patchoulyl acrylate | 68 | 0.3 |
| III-472 | Nerolidyl acrylate | 69 | 0.3 |
| III-473 | Carotyl acrylate | 71 | 0.3 |
| III-474 | Cadinyl acrylate | 70 | 0.3 |
| III-475 | Lancyl acrylate | 71 | 0.3 |
| III-476 | Eudesmyl acrylate | 69 | 0.3 |
| III-477 | Cedryl acrylate | 68 | 0.3 |
| III-478 | Guajyl acrylate | 70 | 0.3 |
| III-479 | Kessoglycoxyl acrylate | 68 | 0.3 |
| III-480 | Phytyl acrylate | 71 | 0.3 |
| III-481 | Sclaryl acrylate | 71 | 0.3 |
| III-482 | Manyl acrylate | 72 | 0.3 |
| III-483 | Hinokyl acrylate | 70 | 0.3 |
| III-484 | Ferruginyl acrylate | 68 | 0.3 |
| III-485 | Totaryl acrylate | 70 | 0.3 |
| III-486 | Sugyl acrylate | 70 | 0.3 |

As a result, it was found possible to form a line and space pattern 0.15 μm in line width.

Example III-487 to Example III-540

The same procedures as described in Examples III-55 to III-108 were repeated except that fenchyldimethyl sulfonium triflate obtained in Synthesis Example III-6 was employed as a photo-acid generator thereby obtaining chemically amplified resists to study the characteristics of them.

The results obtained are summarized in the following Tables 350 to 351. The etch rates shown are based on that of PMMA.

TABLE 350

| Ex. | Monomer represented by general formula (2) in copolymer | Light transmittance (1 μm) % | Etching rate (relative value) |
|---|---|---|---|
| III-487 | Menthyl methacrylate | 70 | 0.3 |
| III-488 | Citronellyl methacrylate | 70 | 0.3 |
| III-489 | Pinocamphyl methacrylate | 71 | 0.3 |
| III-490 | Geranyl methacrylate | 73 | 0.3 |
| III-491 | Fenchyl methacrylate | 69 | 0.3 |
| III-492 | Neryl methacrylate | 70 | 0.3 |
| III-493 | Bornyl methacrylate | 70 | 0.3 |
| III-494 | Cineryl methacrylate | 71 | 0.3 |
| III-495 | Pinyl methacrylate | 73 | 0.3 |
| III-496 | Ascaridyl methacrylate | 72 | 0.3 |
| III-497 | Farnesyl methacrylate | 71 | 0.3 |
| III-498 | Patchoulyl methacrylate | 70 | 0.3 |
| III-499 | Nerolidyl methacrylate | 68 | 0.3 |
| III-500 | Carotyl methacrylate | 69 | 0.3 |
| III-501 | Cadinyl methacrylate | 71 | 0.3 |
| III-502 | Lancyl methacrylate | 70 | 0.3 |
| III-503 | Eudesmyl methacrylate | 71 | 0.3 |
| III-504 | Cedryl methacrylate | 69 | 0.3 |
| III-505 | Guajyl methacrylate | 68 | 0.3 |
| III-506 | Kessoglycoxyl methacrylate | 70 | 0.3 |
| III-507 | Phytyl methacrylate | 68 | 0.3 |
| III-508 | Sclaryl methacrylate | 71 | 0.3 |
| III-509 | Manyl methacrylate | 71 | 0.3 |
| III-510 | Hinokyl methacrylate | 72 | 0.3 |
| III-511 | Ferruginyl methacrylate | 70 | 0.3 |
| III-512 | Totaryl methacrylate | 68 | 0.3 |
| III-513 | Sugyl methacrylate | 70 | 0.3 |

TABLE 351

| Ex. | Monomer represented by general formula (2) in copolymer | Light transmittance (1 μm) % | Etching rate (relative value) |
|---|---|---|---|
| III-514 | Menthyl acrylate | 70 | 0.3 |
| III-515 | Citronellyl acrylate | 71 | 0.3 |
| III-516 | Pinocamphyl acrylate | 73 | 0.3 |
| III-517 | Geranyl acrylate | 69 | 0.3 |
| III-518 | Fenchyl acrylate | 70 | 0.3 |
| III-519 | Neryl acrylate | 70 | 0.3 |
| III-520 | Bornyl acrylate | 71 | 0.3 |
| III-521 | Cineryl acrylate | 73 | 0.3 |
| III-522 | Pinyl acrylate | 72 | 0.3 |
| III-523 | Ascaridyl acrylate | 71 | 0.3 |
| III-524 | Farnesyl acrylate | 70 | 0.3 |
| III-525 | Patchoulyl acrylate | 68 | 0.3 |
| III-526 | Nerolidyl acrylate | 69 | 0.3 |
| III-527 | Carotyl acrylate | 71 | 0.3 |
| III-528 | Cadinyl acrylate | 70 | 0.3 |
| III-529 | Lancyl acrylate | 71 | 0.3 |
| III-530 | Eudesmyl acrylate | 69 | 0.3 |
| III-531 | Cedryl acrylate | 68 | 0.3 |
| III-532 | Guajyl acrylate | 70 | 0.3 |
| III-533 | Kessoglycoxyl acrylate | 68 | 0.3 |
| III-534 | Phytyl acrylate | 71 | 0.3 |
| III-535 | Sclaryl acrylate | 71 | 0.3 |
| III-536 | Manyl acrylate | 72 | 0.3 |
| III-537 | Hinokyl acrylate | 70 | 0.3 |
| III-538 | Ferruginyl acrylate | 68 | 0.3 |
| III-539 | Totaryl acrylate | 70 | 0.3 |
| III-540 | Sugyl acrylate | 70 | 0.3 |

As a result, it was found possible to form a line and space pattern 0.15 μm in line width.

Various kinds of photo-acid generator were synthesized to use them for synthesizing chemically amplified resists in the same manner as in the cases of Examples III-1 to III-54 and Examples III-55 to III-108. Then, the transparency of each resist thus synthesized to ArF excimer laser beam was measured finding that any of these resists indicated the light transmittance ranging from 60% to 75% to a wavelength of 193 nm as converted to a thickness of 1 μm. It was also found possible in each resist to form a line and space pattern 0.15 μm in line width.

The synthesis of these photo-acid generator was performed as indicated in the following Synthesis Examples III-7 to III-30.

(Synthesis Examples III-7)

The processes of Synthesis Examples III-1 were repeated except that menthylmercaptomethane was replaced by the same amount of nerylmercaptomethane thereby obtaining neryldimethyl sulfonium triflate.

(Synthesis Examples III-8)
The processes of Synthesis Examples III-1 were repeated except that menthylmercaptomethane was replaced by the same amount of bornylmercaptomethane thereby obtaining bornyldimethyl sulfonium triflate.
(Synthesis Examples III-9)
The processes of Synthesis Examples III-1 were repeated except that menthylmercaptomethane was replaced by the same amount of cinerylmercaptomethane thereby obtaining cineryldimethyl sulfonium triflate.
(Synthesis Examples III-10)
The processes of Synthesis Examples III-1 were repeated except that menthylmercaptomethane was replaced by the same amount of pinylmercaptomethane thereby obtaining pinyldimethyl sulfonium triflate.
(Synthesis Examples III-11)
The processes of Synthesis Examples III-1 were repeated except that menthylmercaptomethane was replaced by the same amount of ascaridylmercaptomethane thereby obtaining ascaridyldimethyl sulfonium triflate.
(Synthesis Examples III-12)
The processes of Synthesis Examples III-1 were repeated except that menthylmercaptomethane was replaced by the same amount of farnesylmercaptomethane thereby obtaining farnesyldimethyl sulfonium triflate.
(Synthesis Examples III-13)
The processes of Synthesis Examples III-1 were repeated except that menthylmercaptomethane was replaced by the same amount of patchoulyldimercaptomethane thereby obtaining patchoulylmethyl sulfonium triflate.
(Synthesis Examples III-14)
The processes of Synthesis Examples III-1 were repeated except that menthylmercaptomethane was replaced by the same amount of nerolidylmercaptomethane thereby obtaining nerolidyldimethyl sulfonium triflate.
(Synthesis Examples III-15)
The processes of Synthesis Examples III-1 were repeated except that menthylmercaptomethane was replaced by the same amount of carotylmercaptomethane thereby obtaining carotyldimethyl sulfonium triflate.
(Synthesis Examples III-16)
The processes of Synthesis Examples III-1 were repeated except that menthylmercaptomethane was replaced by the same amount of cadinylmercaptomethane thereby obtaining cadinyldimethyl sulfonium triflate.
(Synthesis Examples III-17)
The processes of Synthesis Examples III-1 were repeated except that menthylmercaptomethane was replaced by the same amount of lancylmercaptomethane thereby obtaining lancyldimethyl sulfonium triflate.
(Synthesis Examples III-18)
The processes of Synthesis Examples III-1 were repeated except that menthylmercaptomethane was replaced by the same amount of eudesmylmercaptomethane thereby obtaining eudesmyldimethyl sulfonium triflate.
(Synthesis Examples III-19)
The processes of Synthesis Examples III-1 were repeated except that menthylmercaptomethane was replaced by the same amount of cedrylmercaptomethane thereby obtaining cedryldimethyl sulfonium triflate.
(Synthesis Examples III-20)
The processes of Synthesis Examples III-1 were repeated except that menthylmercaptomethane was replaced by the same amount of guajylmercaptomethane thereby obtaining guajyldimethyl sulfonium triflate.
(Synthesis Examples III-21)
The processes of Synthesis Examples III-1 were repeated except that menthylmercaptomethane was replaced by the same amount of kessoglycoxylmercaptomethane thereby obtaining kessoglycoxyldimethyl sulfonium triflate.
(Synthesis Examples III-22)
The processes of Synthesis Examples III-1 were repeated except that menthylmercaptomethane was replaced by the same amount of phytylmercaptomethane thereby obtaining phytyldimethyl sulfonium triflate.
(Synthesis Examples III-23)
The processes of Synthesis Examples III-1 were repeated except that menthylmercaptomethane was replaced by the same amount of sclarylmercaptomethane thereby obtaining sclaryldimethyl sulfonium triflate.
(Synthesis Examples III-24)
The processes of Synthesis Examples III-1 were repeated except that menthylmercaptomethane was replaced by the same amount of manylmercaptomethane thereby obtaining manyldimethyl sulfonium triflate.
(Synthesis Examples III-25)
The processes of Synthesis Examples III-1 were repeated except that menthylmercaptomethane was replaced by the same amount of hinokylmercaptomethane thereby obtaining hinokyldimethyl sulfonium triflate.
(Synthesis Examples III-26)
The processes of Synthesis Examples III-1 were repeated except that menthylmercaptomethane was replaced by the same amount of ferruginyl- mercaptomethane thereby obtaining ferruginyldimethyl sulfonium triflate.
(Synthesis Examples III-27)
The processes of Synthesis Examples III-1 were repeated except that menthylmercaptomethane was replaced by the same amount of totarylmercaptomethane thereby obtaining totaryldimethyl sulfonium triflate.
(Synthesis Examples III-28)
The processes of Synthesis Examples III-1 were repeated except that menthylmercaptomethane was replaced by the same amount of sugylmercaptomethane thereby obtaining sugyldimethyl sulfonium triflate.
(Synthesis Examples III-29)
The processes of Synthesis Examples III-1 were repeated except that menthylmercaptomethane was replaced by the same amount of menthylmercaptomethane thereby obtaining dimenthylmethyl sulfonium triflate.
(Synthesis Examples III-30)
The processes of Synthesis Examples III-1 were repeated except that menthylmercaptomethane was replaced by the same amount of menthylmercaptomethane and at the same time iodomethane was replaced by menthyl iodide thereby obtaining trimenthylmethyl sulfonium triflate.

As explained above, it has been made possible according to this invention to provide a photosensitive material which is very low in absorption of a light source of short wavelength and excellent in dry etch resistance. In addition to these features, the photosensitive material of this invention is excellent in heat resistance and adherence to a substrate. Therefore, with the utilization of a photosensitive material of this invention, it is possible to form a precisely-shaped fine pattern of the order of a quarter micron.

The photosensitive material of this invention is effective in particular for the formation of pattern through the utilization of KrF excimer laser beam and ArF excimer laser beam. However, it is also useful for the formation of pattern through the utilization of i-ray beam, deep UV light, electron ray beam and X-rays beam. Therefore, the photosensitive material of this invention can be effectively utilized in the lithography in the manufacturing process of semiconductor device, and is very useful in industry.

Additional advantages and modifications will readily occur to those skilled in the art. Therefore, the invention in its broader aspects is not limited to the specific details, and representative materials shown and described herein. Accordingly, various modifications may be made without departing from the spirit or scope of the general inventive concept as defined by the appended claims and their equivalents.

What is claimed is:

1. A photosensitive material comprising a compound containing a functional group decomposable or cross-linkable with an acid as a base resin and a compound having a terpenoid skeleton as a photo-acid generator, wherein said photo-acid generator is a sulfonium salt or an iodonium salt, each having a menthyl group or menthyl derivative group, and wherein said base resin is a polymer derived from a monomer compound containing a functional group to be decomposed or cross-linked with an acid represented by the general formula (4);

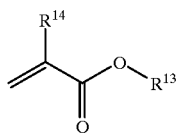

formula (4)

wherein $R^{13}$ is a monovalent organic group and $R^{14}$ is an alkyl group, a halogen atom or a hydrogen atom.

2. The photosensitive material according to claim 1, wherein said terpenoid skeleton includes a monovalent menthyl group or menthyl derivative group represented by a general formula (1);

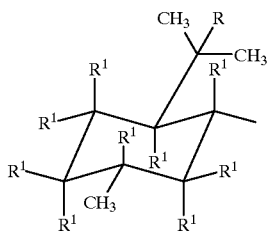

formula (I)

wherein R is a hydrogen atom or a monovalent hydrocarbon group, $R^1$ is the same or different from each other and individually represents a hydrogen atom, a halogen atom, a hydrocarbon group, a hydroxyl group, an alkoxyl group, an amino group, an imide group, an amide group, a sulfonyl group, a carboxyl group, a carbonyl group and a sulfonamide group, and a pair of neighboring $R^1$ connected together to form a closed ring.

3. The photosensitive material according to claim 2, wherein said photo-acid generator is a sulfonium salt or an iodonium salt, each having a menthyl group or menthyl derivative group of the formula (1).

4. The photosensitive material according to claim 1, wherein said base resin is a polymer of a monomer compound containing a functional group decomposable or cross-linkable with an acid represented by the formula (4);

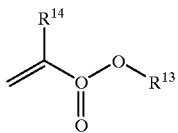

formula (4)

wherein $R^{13}$ is a monovalent organic group and $R^{14}$ is an alkyl group, a halogen atom or a hydrogen atom.

5. The photosensitive material according to claim 1, wherein said base resin is a copolymer of a monomer compound containing a group decomposable or cross-linkable with an acid represented by the general formula (4) and a monomer compound represented by the general formula (2) or the general formula (3); or a polymer of a monomer compound containing a functional group decomposable or cross-linkable with an acid represented by the general formula (3);

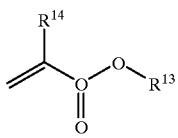

formula (4)

wherein $R^{13}$ is a monovalent organic group and $R^{14}$ is an alkyl group, a halogen atom or a hydrogen atom;

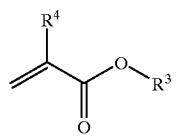

formula (2)

wherein $R^3$ is an organic group comprising a menthyl group or menthyl derivative group represented by the general formula (1), $R^4$ is an alkyl group, a carboxyl group, an alkoxycarbonyl group, a halogen atom or a hydrogen atom;

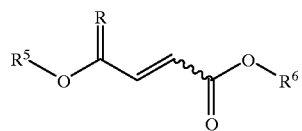

formula (3)

wherein $R^5$ and $R^6$ are selected from a monovalent organic group or a hydrogen atom, and at least one of $R^5$ and $R^6$ comprises a menthyl group or menthyl derivative group represented by the general formula (1);

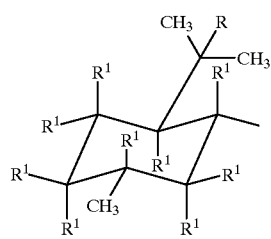

formula (I)

wherein R is a hydrogen atom or a monovalent hydrocarbon group, $R^1$ is the same or different from each other and individually represents a hydrogen atom, a halogen atom, a hydrocarbon group, a hydroxyl group, an alkoxyl group, an amino group, an imide group, an amide group, a sulfonyl group, a carboxyl group, a carbonyl group or a sulfonamide group, or a pair of neighboring $R^1$ connected together to form a closed ring.

6. The photosensitive material according to claim 5, wherein said copolymer or polymer as a base resin comprises a unit of a monomer compound containing an alkali-soluble group.

7. The photosensitive material according to claim 1, which further comprises a compound containing a functional group decomposable by an acid, the products obtained as a result of the decomposition being capable of generating, —O(C=O)—, —OS(=O)$_2$, or —O— linkages in the presence of an alkaline solution.

8. A photosensitive material comprising a compound containing an alkali-soluble group as a base resin a solubility inhibitor and a compound having a terpenoid skeleton as a photo-acid generator, wherein said terpenoid skeleton includes a monovalent menthyl group or menthyl derivative group represented by a general formula (1);

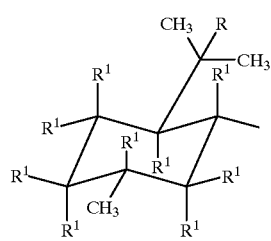

formula (I)

wherein R is a hydrogen atom or a monovalent hydrocarbon group, $R^1$ is the same or different from each other and individually represents a hydrogen atom, a halogen atom, a hydrocarbon group, a hydroxyl group, an alkoxyl group, an amino group, an imide group, an amide group, a sulfonyl group, a carboxyl group, a carbonyl group or a sulfonamide group, or a pair of neighboring $R^1$ connected together to form a closed ring.

9. The photosensitive material according to claim 8, wherein said photo-acid generator is a sulfonium salt or an iodonium salt, each having a menthyl group or menthyl derivative group of the formula (1).

10. A photosensitive material comprising:
a compound having a terpenoid skeleton and an alkali-soluble group;
a solubility inhibitor; and
a photo-acid generator.

11. The photosensitive material according to claim 10; wherein said solubility-inhibitor is a compound containing a functional group decomposable by an acid, products obtained as a result of the decomposition being capable of generating —O(C=O), —OS(=O)$_2$, or —O— linkages in the presence of an alkaline solution.

12. A photosensitive material comprising:
a compound having a terpenoid skeleton and an alkali-soluble group;
an solubility-inhibitor; and
a photo-acid generator that is a compound having a naphthalene skeleton.

13. A photosensitive material comprising a compound having a terpenoid skeleton, wherein said terpenoid skeleton includes a monovalent menthyl group or menthyl derivative group represented by a general formula (1);

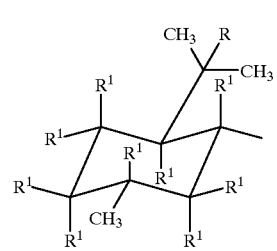

formula (I)

wherein R is a hydrogen atom or a monovalent hydrocarbon group, $R^1$ is the same or different from each other and individually represents a hydrogen atom, a halogen atom, a hydrocarbon group, a hydroxyl group, an alkoxyl group, an amino group, an imide group, an amide group, a sulfonyl group, a carboxyl group, a carbonyl group or a sulfonamide group, or a pair of neighboring $R^1$ connected together to form a closed ring, wherein said compound having a terpenoid skeleton is a polymer of at least one monomer compound selected from the group consisting of a compound represented by the general formula (2) and a compound represented by the general formula (3), said polymer being included in a base resin;

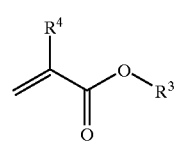

formula (2)

wherein $R^3$ is an organic group having a menthyl group or menthyl derivative group represented by the general formula (1), $R^4$ is an alkyl group, a carboxyl group, an alkoxycarbonyl group, a halogen atom or a hydrogen atom;

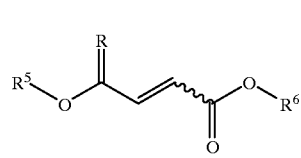

formula (3)

wherein $R^5$ and $R^6$ are selected from a monovalent organic group or a hydrogen atom, and at least one of $R^5$ and $R^6$ comprises a menthyl group or menthyl derivative group represented by the general formula (1), and wherein said base resin is a copolymer of a monomer compound containing a group decomposable or cross-linkable with an acid represented by the general formula (4) and a monomer compound represented by the general formula (2) or the general formula (3); or a polymer of a monomer compound containing a group decomposable or cross-linkable with an acid represented by the general formula (3); said base resin being mixed with a photo-acid generator;

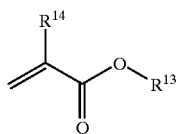

formula (4)

wherein $R^{13}$ is a monovalent organic group and $R^{14}$ is an alkyl group, a halogen atom or a hydrogen atom.

14. The photosensitive material according to claim 13, wherein said copolymer or a polymer as a base resin comprises a unit of a monomer compound containing an alkali-soluble group.

15. The photosensitive material according to claim 13, wherein said photo-acid generator is a compound having a naphthalene skeleton.

16. The photosensitive material according to claim 13, wherein said base resin is a copolymer of a monomer compound containing an alkali-soluble group and a monomer compound represented by the general formula (2) or the general formula (3); or a polymer of a monomer compound containing an alkali-soluble group represented by the general formula (3); said base resin being mixed with a solubility-inhibitor and a photo-acid generator.

17. The photosensitive material according to claim 17, wherein said base resin is a copolymer of a monomer compound containing an alkali-soluble group and a monomer compound represented by the general formula (2) or the general formula (3); or a polymer of a monomer compound containing an alkali-soluble group represented by the general formula (3);

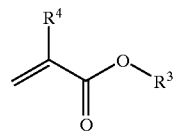

formula (2)

wherein $R^3$ is an organic group comprising a menthyl group or menthyl derivative group represented by the general formula (1), $R^4$ is an alkyl group, a carboxyl group, an alkoxycarbonyl group, a halogen atom or a hydrogen atom;

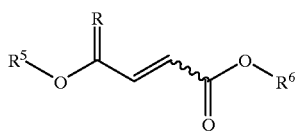

formula (3)

wherein $R^5$ and $R^6$ are selected from a monovalent organic group or a hydrogen atom, and at least one of $R^1$ and $R^6$ comprises a menthyl group or menthyl derivative group represented by the general formula (1);

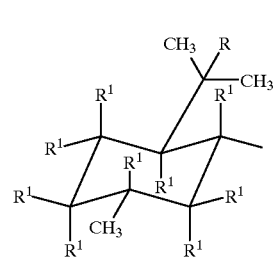

formula (I)

wherein R is a hydrogen atom or a monovalent hydrocarbon group, $R^1$ is the same or different from each other and individually represents a hydrogen atom, a halogen atom, a hydrocarbon group, a hydroxyl group, an alkoxyl group, an amino group, an imide group, an amide group, a sulfonyl group, a carboxyl group, a carbonyl group or a sulfonamide group, or a pair of neighboring $R^1$ connected together to form a closed ring.

18. A photosensitive material which comprises a compound having a terpenoid skeleton as a solubility-inhibitor in a base resin, and in which solubility to developer of said material changes by irradiation of chemical radiation.

19. The photosensitive material according to claim 18, wherein said compound having a terpenoid skeleton contains a group to be decomposed or cross-linked with an acid and is mixed with a photo-acid generator.

20. The photosensitive material according to claim 18, wherein said compound having a terpenoid skeleton is a polymer of at least one monomer compound selected from the group consisting of a compound represented by the general formula (2) and a compound represented by the general formula (3), said polymer being included in a base resin;

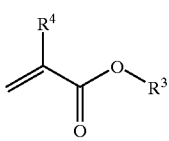

formula (2)

wherein $R^3$ is an organic group having a menthyl group or menthyl derivative group represented by the general formula (1), $R^4$ is an alkyl group, a carboxyl group, an alkoxycarbonyl group, a halogen atom or a hydrogen atom;

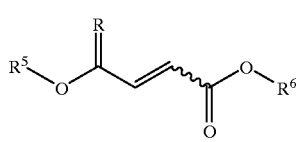

formula (3)

wherein $R^5$ and $R^6$ are selected from a monovalent organic group or a hydrogen atom, and at least one of $R^5$ and $R^6$ comprises a menthyl group or menthyl derivative group represented by the general formula (1);

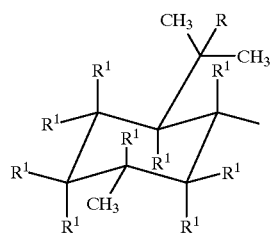

formula (I)

wherein R is a hydrogen atom or a monovalent hydrocarbon group, $R^1$ is the same or different from each other and individually represents a hydrogen atom, a halogen atom, a hydrocarbon group, a hydroxyl group, an alkoxyl group, an amino group, an imide group, an amide group, a sulfonyl group, a carboxyl group, a carbonyl group or a sulfonamide group, or a pair of neighboring $R^1$ connected together to form a closed ring.

21. A photosensitive material comprising a compound containing an alkali-soluble group in a base resin, a solubility-inhibitor and a compound having a terpenoid skeleton as a photo-acid generator, wherein said photo-acid generator contains at least one member selected from the group consisting of onium salt, sulfonate compound, sulfamide compound, sulfimide compound, alkyl halide, hetero polyacid, diazide compound, diazomethane compound, disulfone compound and halogenated triazine.

* * * * *